(12) United States Patent
Kimura et al.

(10) Patent No.: US 12,719,465 B2
(45) Date of Patent: Aug. 25, 2026

(54) SEMICONDUCTOR DEVICE, DISPLAY APPARATUS, AND ELECTRONIC DEVICE

(71) Applicant: SEMICONDUCTOR ENERGY LABORATORY CO., LTD., Atsugi (JP)

(72) Inventors: Hajime Kimura, Atsugi (JP); Shunpei Yamazaki, Setagaya (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

(21) Appl. No.: 18/218,264

(22) Filed: Jul. 5, 2023

(65) Prior Publication Data

US 2024/0030905 A1 Jan. 25, 2024

(30) Foreign Application Priority Data

Jul. 15, 2022 (JP) ................................ 2022-113595
Apr. 11, 2023 (JP) ................................ 2023-064030

(51) Int. Cl.
*H03K 17/041* (2006.01)
*G09G 3/32* (2016.01)
(Continued)

(52) U.S. Cl.
CPC ......... *H03K 17/04106* (2013.01); *G09G 3/32* (2013.01); *G09G 3/36* (2013.01); *H10K 59/35* (2023.02)

(58) Field of Classification Search
CPC ................................................ H03K 17/04106
(Continued)

(56) References Cited

U.S. PATENT DOCUMENTS 8,476,625 B2 7/2013 Kimura
8,999,750 B2 4/2015 Kimura
(Continued)

FOREIGN PATENT DOCUMENTS

JP 2010-156963 A 7/2010
JP 2017-010000 A 1/2017

OTHER PUBLICATIONS

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
(Continued)

*Primary Examiner* — Long D Pham
(74) *Attorney, Agent, or Firm* — NIXON PEABODY LLP; Jeffrey L. Costellia

(57) ABSTRACT

A semiconductor device with a high driving speed is provided. The semiconductor device includes first to third transistors and a first capacitor. One of a source and a drain of the third transistor is electrically connected to a gate of the second transistor, and the other of the source and the drain of the third transistor is electrically connected to a gate of the first transistor and a first terminal of the first capacitor. One of a source and a drain of the first transistor is electrically connected to one of a source and a drain of the second transistor, and the other of the source and the drain of the first transistor is electrically connected to the other of the source and the drain of the second transistor and a second terminal of the first capacitor.

24 Claims, 53 Drawing Sheets

(51) Int. Cl.
*G09G 3/36* (2006.01)
*H10K 59/35* (2023.01)

(58) Field of Classification Search
USPC .......................................................... 345/204
See application file for complete search history.

(56) References Cited

U.S. PATENT DOCUMENTS

| | | | | |
|---|---|---|---|---|
| 9,201,280 | B2 | 12/2015 | Kimura | |
| 10,002,972 | B2 | 6/2018 | Miyake | |
| 2008/0074359 | A1 | 3/2008 | Chung | |
| 2013/0264574 | A1* | 10/2013 | Kimura | G09G 5/003 257/59 |
| 2017/0132985 | A1* | 5/2017 | Umezaki | H10D 86/441 |
| 2018/0366067 | A1* | 12/2018 | Jang | G09G 3/3266 |
| 2020/0193912 | A1 | 6/2020 | Park et al. | |
| 2020/0312223 | A1* | 10/2020 | Yuan | G09G 3/32 |
| 2022/0366845 | A1 | 11/2022 | Kimura et al. | |
| 2023/0140806 | A1* | 5/2023 | In | G09G 3/3258 345/55 |

OTHER PUBLICATIONS

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7, The Japan Society of Applied Physics.

* cited by examiner

VAL1
TMi
MNc
TMo
$V_{in}$
$V_{out}$
BSAB

VAL1
MNb
BB
TMi
Ca
TMo
$V_{in}$
$V_{out}$
Bi
Bo
N
BSPR

VAL1
Bo
Bi
N
MNb
TMi1
BB
Ca
TMo
$V_{in1}$
$V_{out}$
BSPR
BSAB
MNc
TMi2
MNg
$V_{in2}$
BSTR5
VAL4

VAL2
VAL1
MNa
BB
N
MNb
TMi1
Bi
Ca
Bo
TMo
$V_{in1}$
$V_{out}$
BSPR
BSAB
MNc
TMi2
MNg
$V_{in2}$
BSTR5A
VAL4

VAL1
BB
MNa
N
MNb
TMi1
MNc
Bi
Bo
TMo
$V_{in1}$
Ca
$V_{out}$
BSPR
BSAB
TMi2
MNg
$V_{in2}$
BSTR5B
VAL4

VAL1
BB
MNa
Bo
N
MNb
TMi1
MNc
Bi
TMo
$V_{in1}$
Ca
RST
$V_{out}$
BSPR
MNd
BSAB
TMi2
MNg
$V_{in2}$
BSTR5C
VAL3
VAL4

VAL2
VAL1
MNa
BB
TMi1
$V_{in1}$
Bi
N
MNb
MNc
Bo
Ca
TMo
$V_{out}$
BSPR
BSAB
TMi2
MNg
$V_{in2}$
BSTR5D
VAL4

VAL2
VAL1
MNa
BB
Bo
TMi1
N
MNb
$V_{in1}$
Bi
MNc
RST
TMo
Ca
$V_{out}$
MNd
BSPR
BSAB
TMi2
MNg
$V_{in2}$
BSTR5E
VAL3
VAL4

VAL2
VAL1
BSPR
BB
Bo
MNb
N
MNe
Ca
MNc
TMi1
TMo
$V_{in1}$
Bi
$V_{out}$
MNf
TMi1b
$V_{in1b}$
BSAB
TMi2
MNg
$V_{in2}$
BSTR5F
VAL3
VAL4

FIG. 9

DSP
SD
SL[1] ••• SL[n]
GD
GL [1]
GL [m]
PX [1,1] ••• PX [1,n]
PX [m,1] ••• PX [m,n]
PA

SS
CLK1
IT
GL
[1]
GT
100[1]
CLK2
PWC
OT
CLK1
IT
GL
[2]
GT
100[2]
CLK2
PWC
OT
CLK1
IT
GL
[m]
GT
100[m]
CLK2
PWC
OT
CL1
CL2
PL
GD

SS
CLK1
IT
BF
[1]
GL
[1]
GT
100[1]
CLK2
PWC
OT
CLK1
IT
BF
[2]
GL
[2]
GT
100[2]
CLK2
PWC
OT
CLK1
IT
BF
[m]
GL
[m]
GT
100[m]
CLK2
PWC
OT
CL1
CL2
PL
GD

Figure 11:
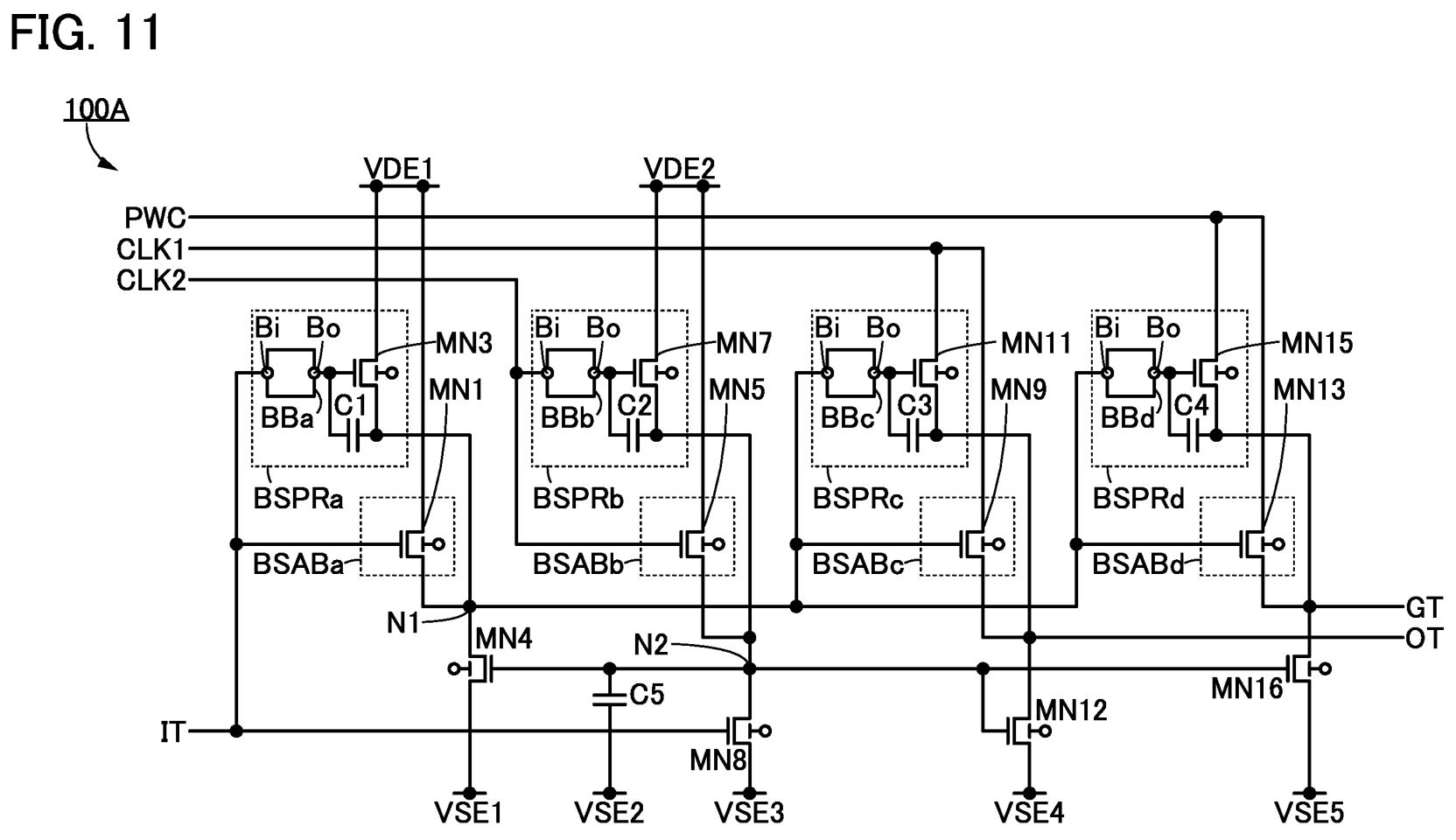

PWC CLK1 CLK2 VDE1 VDE2 IT GT OT

BSPRa BSPRb BSPRc BSPRd BSABa BSABb BSABc BSABd

BBa BBb BBc BBd Bi Bo

MN1 MN3 MN4 MN5 MN7 MN8 MN9 MN11 MN12 MN13 MN15 MN16

C1 C2 C3 C4 C5 N1 N2

VSE1 VSE2 VSE3 VSE4 VSE5

Figure 13:
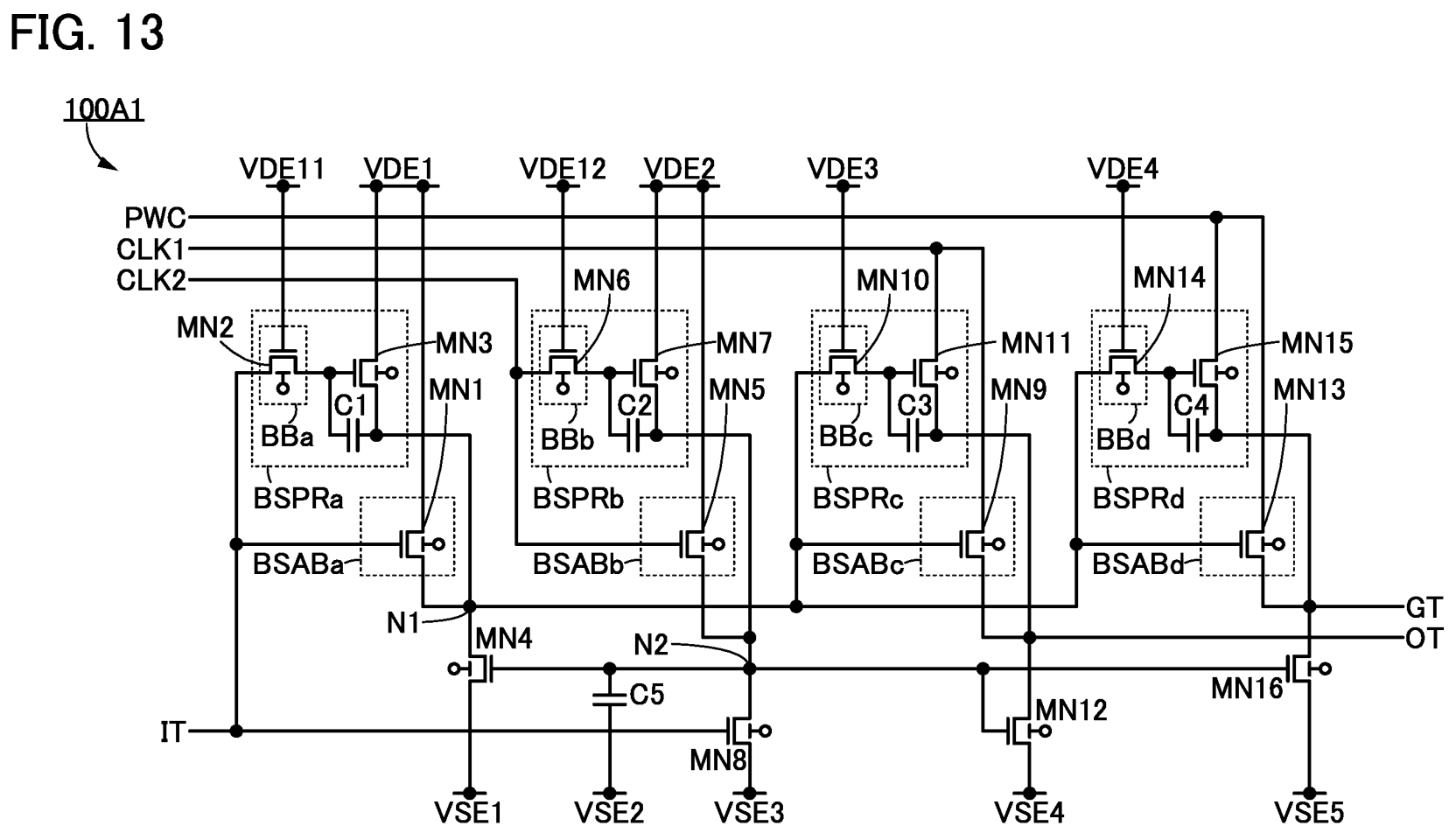

PWC
CLK1
CLK2
VDE11
VDE1
VDE12
VDE2
VDE3
VDE4
MN1
MN2
MN3
MN4
MN5
MN6
MN7
MN8
MN9
MN10
MN11
MN12
MN13
MN14
MN15
MN16
C1
C2
C3
C4
C5
BBa
BBb
BBc
BBd
BSPRa
BSPRb
BSPRc
BSPRd
BSABa
BSABb
BSABc
BSABd
N1
N2
GT
OT
IT
VSE1
VSE2
VSE3
VSE4
VSE5

Figure 14:
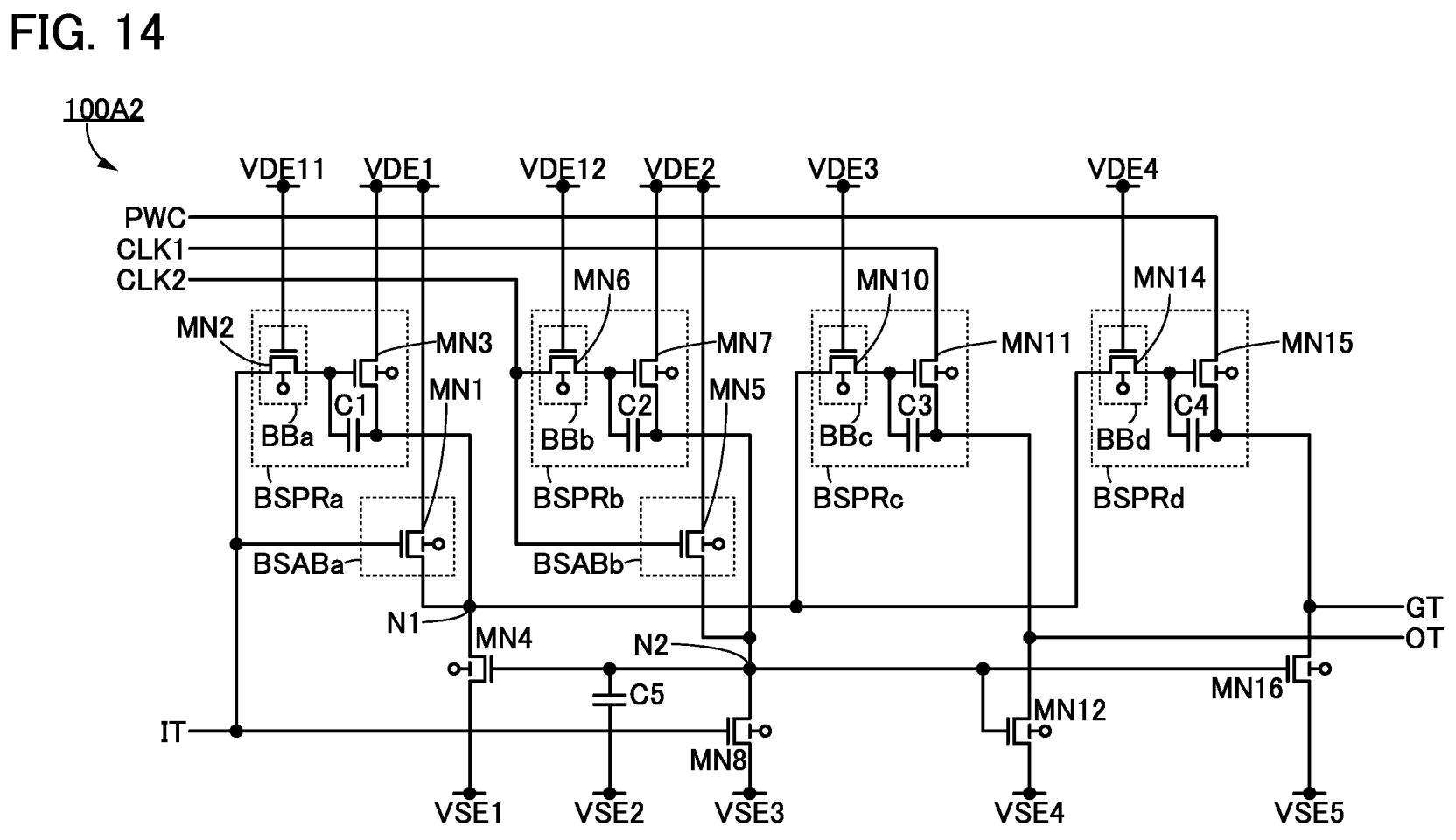

PWC
CLK1
CLK2
MN2
VDE11
VDE1
VDE12
VDE2
VDE3
VDE4
MN3
MN1
MN6
MN7
MN5
MN10
MN11
MN14
MN15
C1
C2
C3
C4
C5
BBa
BBb
BBc
BBd
BSPRa
BSPRb
BSPRc
BSPRd
BSABa
BSABb
N1
N2
MN4
MN8
MN12
MN16
GT
OT
IT
VSE1
VSE2
VSE3
VSE4
VSE5

Figure 15:
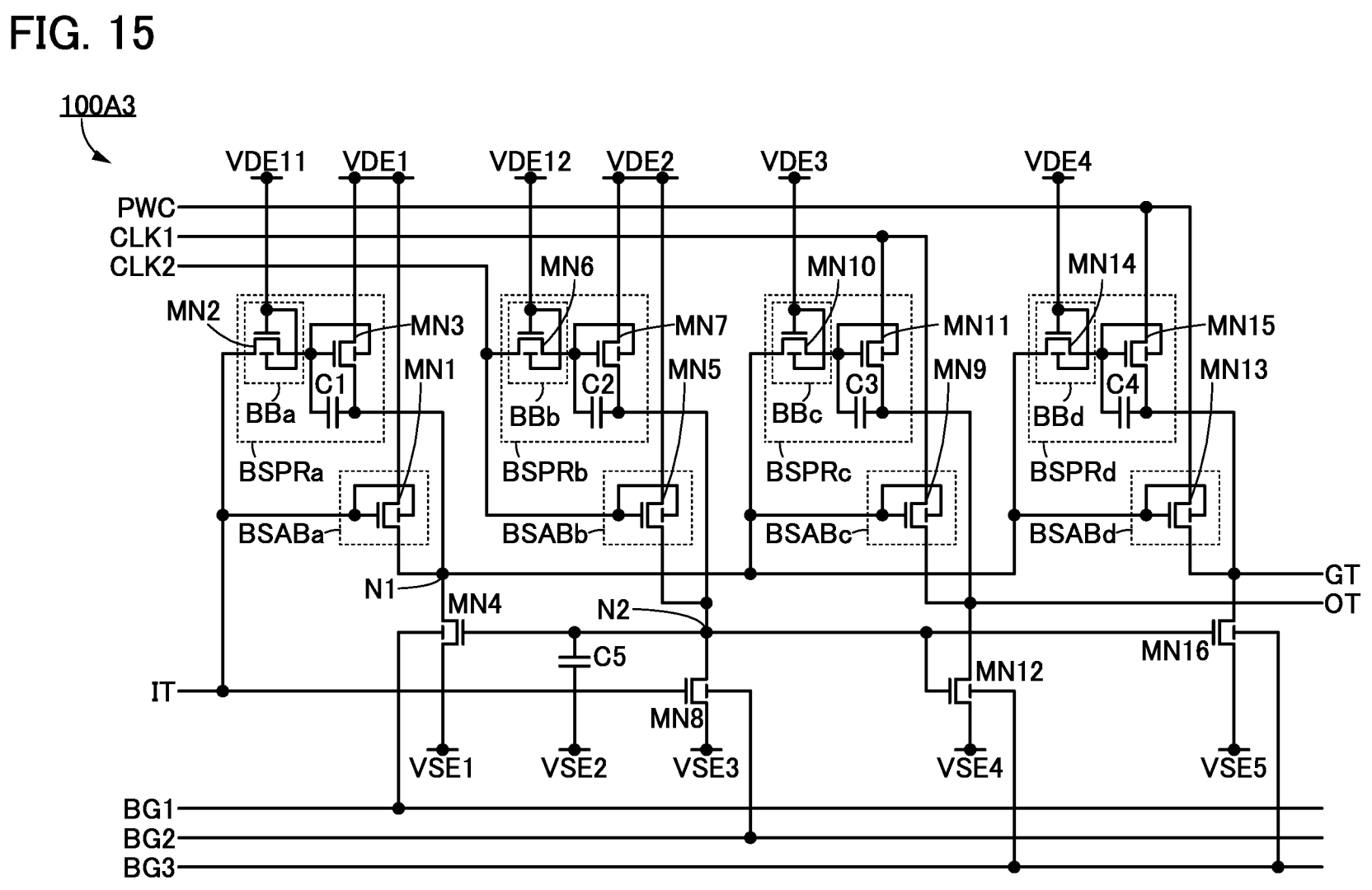

PWC
CLK1
CLK2
IT
BG1
BG2
BG3
GT
OT
VDE11
VDE1
VDE12
VDE2
VDE3
VDE4
VSE1
VSE2
VSE3
VSE4
VSE5
MN1
MN2
MN3
MN4
MN5
MN6
MN7
MN8
MN9
MN10
MN11
MN12
MN13
MN14
MN15
MN16
C1
C2
C3
C4
C5
N1
N2
BBa
BBb
BBc
BBd
BSPRa
BSPRb
BSPRc
BSPRd
BSABa
BSABb
BSABc
BSABd

SD
SR
CLKLA
CLKLB
CLKLC
CLKLD
PWCLA
PWCLB
PWCLC
PWCLD
VDL
SPR
LAT
DAC
200[1]
200[2]
200[3]
200[4]
200[5]
200[6]
CLK1
CLK2
CLK3
SRT
RT
IT
OT
PWC
SL[1]
SL[2]
SL[3]
SL[4]
SL[5]
SL[6]

200A1
PWC
CLK1
CLK2
RT
CLK3
IT
BBe
MN22
VDE31
VDE21
MN23
MN21
C21
BSPRe
BSABe
VSE11
MN24
VDE32
VDE33
VDE22
MN26
BBf
MN27
MN25
C22
BSPRf
BSABf
MN29
BBg
MN30
MN28
C23
BSPRg
BSABg
VSE12
VDE34
VDE23
BBh
MN32
MN33
MN31
C24
BSPRh
BSABh
MN34
VSE13
VDE35
MN35
BBi
MN36
MN38
BSABi1
MN40
VSE14
MN37
BSPRi
C25
MN39
BSABi2
MN41
VSE15
SRT
OT

200A2
PWC
CLK1
CLK2
RT
CLK3
IT
BBe
MN22
VDE31
VDE21
VDE32
VDE33
VDE22
VDE34
VDE23
VDE35
MN21
MN23
MN24
MN25
MN26
MN27
MN28
MN29
MN30
MN31
MN32
MN33
MN34
MN35
MN36
MN37
MN40
MN41
C21
C22
C23
C24
C25
BSPRe
BSABe
BSPRf
BSABf
BBf
BSPRg
BSABg
BBg
BSPRh
BSABh
BBh
BSPRi
BBi
SRT
OT
VSE11
VSE12
VSE13
VSE14
VSE15

FIG. 26

VAL7
VAL9
VAL1
BGi
MNa
BGf
BBG
TMi1
$V_{in1}$
TMi3
$V_{in3}$
BSPR
MNb
BGo
TMo
Ca
$V_{out}$
MNh
MNi
TMi2
$V_{in2}$
MNg
BSTS2
VAL8
VAL4

VAL7
VAL9
VAL1
BGi
MNa
BGf
BBG
TMi1
$V_{in1}$
BSPR
TMi3
$V_{in3}$
BGo
MNb
TMo
Ca
$V_{out}$
MNh
MNd
MNi
RST
TMi2
$V_{in2}$
MNg
BSTS2A
VAL3
VAL8
VAL4

100D
PWC
CLK1
TMS
CLK2
IT
VDE1
VDE2
VDE41
VDE42
MN1
N1
MN4
C5
N2
MN5
MN8
VSE1
VSE2
VSE3
VSE4
VSE41
VSE42
VSE5
MN71
MN72
MN11
MN12
BBGc
Bi
Bo
Bf
N
C3
BSPRc
BSTSc
MN75
MN76
MN15
MN16
BBGd
C4
BSPRd
BSTSd
OT
GT

DSP1A
110
140
118a
128
130B
B
113c
129c
126c
112c
107
131
115
114
130G
G
113b
129b
126b
112b
127
125
118a
112a
130R
R
113a
129a
126a
599
598
594
592
314b
317
316
313
315
314a
300p
312
328
596
300p
322
320
300p
310
300d
DIS
DRV

DSP1B
110
140
118a
128
130B
B
113c
129c
126c
112c
107
131
115
114
130G
G
113b
129b
126b
112b
596
540
127
125
118a
112a
130R
R
113a
129a
126a
500p
500p
500p
500d
DIS
DRV
310
599
598
594
592
581
574
514

DSP1C
110
140
118a
128
130B
B
113c
129c
126c
112c
107
131
115
114
130G
G
113b
129b
126b
112b
127
125
118a
112a
130R
R
113a
129a
126a
596
590
500Ap
584
545
544
533
593
500Ap
555
583b
583a
583
DIS
DRV
500Ad
310
599
598
594
592

500A
601, 603
533
565
544
545
A1
A2
Y
Z
X 544
601, 603
533
545
Y
Z
X 544
601, 603
545
Y
Z
X 545
565
603
555
545
583b
583
583a
Z
A1
544
601
533
500A
501
A2
Y
X

DSP2A
R
G
B
126a
129a
113a
130R
112a
118a
125
127
112b
126b
129b
113b
130G
114
115
131
107
112c
126c
129c
113c
130B
128
118a
140
110
599
598
594
592
581
574
514
512
354
352
350
326
324
322
320
310
540
596
500p
500p
500p
DIS
LIN
SIC
356
300d
300d
330
328
312
300d
314a
315
313
316
317
314b

DSP2B
DIS
LIN
SIC
110
140
118a
128
130B
B
113cA
129c
126c
112c
107
131
115
114
130G
G
113bA
129b
126b
112b
127
125
118a
112a
130R
R
113aA
129a
126a
596
500Ap
314b
317
316
313
315
314a
300d
312
328
330
300d
300d
356
599
598
594
592
514
512
354
352
350
326
324
322
320
310

5500
5511
5510

5900
5905
5902
5901
5903
5904

5300
5330a
5331
5330b
5350

8100
8101
8102
8006
8103
8004
8001
8002
8003
8000

5200
5203
5202
5201

9000
9002
9001
9007
9003
9005
9006
9003

5703
5704
5701
5702

6201
6200

8300
8301
8305
8302
8304a
8304
8305

SEMICONDUCTOR DEVICE, DISPLAY APPARATUS, AND ELECTRONIC DEVICE

BACKGROUND OF THE INVENTION

1. Field of the Invention

Embodiments of the present invention relate to a semiconductor device, a display apparatus, and an electronic device.

Note that one embodiment of the present invention is not limited to the above technical field. The technical field of the invention disclosed in this specification and the like relates to an object, an operation method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a sensor, a processor, an electronic device, a system, a method for driving any of them, a method for manufacturing any of them, and a method for inspecting any of them.

2. Description of the Related Art

Display apparatuses included in, for example, electronic devices for extended reality or cross reality (XR) such as virtual reality (VR) or augmented reality (AR), mobile phones (e.g., smartphones), tablet information terminals, and notebook personal computers (PCs) have undergone various improvements in recent years. For example, there have been developed display apparatuses with features such as higher resolution, higher color reproducibility (higher NTSC ratio), a smaller driver circuit, and lower power consumption.

Furthermore, for example, a circuit for reducing variations in the characteristics of a driving transistor included in a pixel has been under development in order to improve the display quality of a display apparatus. In particular, Patent Document 1 discloses the invention of a pixel circuit that includes a circuit for correcting the threshold voltage of a driving transistor.

Another example is a technique of using a transistor including an oxide semiconductor in a semiconductor thin film, as a switching element included in a pixel circuit of a display apparatus.

A silicon-based semiconductor material is widely known as a material for a semiconductor thin film applicable to a transistor. Other than the silicon-based semiconductor material, an oxide semiconductor has attracted attention. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively researched.

A transistor that includes IGZO as an active layer has an extremely low off-state current (see Non-Patent Document 1), and large-scale integration (LSI) and a display apparatus that utilize the characteristics have been reported (see Non-Patent Documents 2 and 3). Patent Document 2 discloses the invention in which a transistor including IGZO in an active layer is used in a pixel circuit of a display apparatus.

REFERENCES

Patent Documents

[Patent Document 1] Japanese Published Patent Application No. 2017-10000

[Patent Document 2] Japanese Published Patent Application No. 2010-156963

Non-Patent Documents

[Non-Patent Document 1] K. Kato et al., "Japanese Journal of Applied Physics", 2012, volume 51, pp. 021201-1-021201-7

[Non-Patent Document 2] S. Matsuda et al., "2015 Symposium on VLSI Technology Digest of Technical Papers", 2015, pp. T216-T217

[Non-Patent Document 3] S. Amano et al., "SID Symposium Digest of Technical Papers", 2010, volume 41, issue 1, pp. 626-629

SUMMARY OF THE INVENTION

An object of one embodiment of the present invention is to provide a semiconductor device that operates stably. Another object of one embodiment of the present invention is to provide a semiconductor device with a high driving speed. Another object of one embodiment of the present invention is to provide a semiconductor device with high reliability. Another object of one embodiment of the present invention is to provide a display apparatus including any of the above semiconductor devices. Another object of one embodiment of the present invention is to provide an electronic device including the above display apparatus. Another object of one embodiment of the present invention is to provide a novel semiconductor device, a novel display apparatus, or a novel electronic device.

Note that the objects of one embodiment of the present invention are not limited to the objects mentioned above. The objects described above do not preclude the existence of other objects. The other objects are the ones that are not described above and will be described below. The other objects that are not described above will be apparent from and can be derived from the description of the specification, the drawings, and the like by those skilled in the art. One embodiment of the present invention achieves at least one of the above objects and the other objects. Therefore, one embodiment of the present invention does not necessarily achieve all the above objects and the other objects depending on the case.

(1) One embodiment of the present invention is a semiconductor device including a first transistor, a second transistor, a third transistor, and a first capacitor. One of a source and a drain of the third transistor is electrically connected to a gate of the second transistor, and the other of the source and the drain of the third transistor is electrically connected to a gate of the first transistor and a first terminal of the first capacitor. One of a source and a drain of the first transistor is electrically connected to one of a source and a drain of the second transistor, and the other of the source and the drain of the first transistor is electrically connected to the other of the source and the drain of the second transistor and a second terminal of the first capacitor.

(2) According to another embodiment, a fourth transistor may be included in the structure of (1). In particular, it is preferable that one of a source and a drain of the third transistor be electrically connected to a gate of the second transistor and the other of the source and the drain of the third transistor be electrically connected to one of a source and a drain of the fourth transistor.

(3) According to another embodiment, the semiconductor device includes a first transistor, a second transistor, a third transistor, a fourth transistor, and a first capacitor and has a structure different from the structure of (2). A gate of the third transistor is electrically connected to a gate of the second transistor, and one of a source and a drain of the third transistor is electrically connected to a gate of the first transistor, a first terminal of the first capacitor, and one of a source and a drain of the fourth transistor. One of a source and a drain of the first transistor is electrically connected to one of a source and a drain of the second transistor, and the other of the source and the drain of the first transistor is electrically connected to the other of the source and the drain of the second transistor and a second terminal of the first capacitor.

(4) According to another embodiment, a fifth layer may be included in any one of the structures of (1) to (3). In particular, it is preferable that one of a source and a drain of the fifth transistor be electrically connected to the other of the source and the drain of the first transistor.

(5) According to another embodiment, a sixth transistor, a seventh transistor, an eighth transistor, and a second capacitor may be included in the structure of (4). In particular, it is preferable that one of a source and a drain of the eighth transistor be electrically connected to a gate of the sixth transistor and a first terminal of the second capacitor. Furthermore, it is preferable that a gate of the seventh transistor be electrically connected to the other of the source and the drain of the first transistor and one of a source and a drain of the sixth transistor be electrically connected to one of a source and a drain of the seventh transistor and a second terminal of the second capacitor.

(6) According to another embodiment, a sixth transistor, a seventh transistor, an eighth transistor, and a second capacitor may be included in the structure of (4) and the structure may be different from the structure of (5). In particular, it is preferable that one of a source and a drain of the eighth transistor be electrically connected to a gate of the sixth transistor and a first terminal of the second capacitor. It is preferable that the other of the source and the drain of the eighth transistor be electrically connected to the other of the source and the drain of the first transistor. It is preferable that one of a source and a drain of the sixth transistor be electrically connected to one of a source and a drain of the seventh transistor and a second terminal of the second capacitor. It is preferable that a gate of the seventh transistor be electrically connected to a gate of the fifth transistor.

(7) According to another embodiment, a ninth transistor may be included in the structure of (6). In particular, it is preferable that a gate of the ninth transistor be electrically connected to the one of the source and the drain of the first transistor, one of a source and a drain of the ninth transistor be electrically connected to the other of the source and the drain of the sixth transistor, and the other of the source and the drain of the ninth transistor be electrically connected to the one of the source and the drain of the sixth transistor.

(8) Another embodiment is a display apparatus including a driver circuit and a display device. The driver circuit includes the semiconductor device having any one of the structures of (1) to (7). The driver circuit is configured to transmit a signal for image display to the display device.

(9) According to another embodiment, in the display apparatus with the structure of (8), the display device may include a light-emitting device or a liquid crystal display device.

(10) Another embodiment of the present invention is an electronic device including the display apparatus having the structure of (9) and a housing.

According to one embodiment of the present invention, a semiconductor device that operates stably can be provided. According to another embodiment of the present invention, a semiconductor device with a high driving speed can be provided. According to another embodiment, a semiconductor device with high reliability can be provided. According to another embodiment, a display apparatus including any of the above semiconductor devices can be provided. According to another embodiment, an electronic device including the above display apparatus can be provided. According to another embodiment, a novel semiconductor device, a novel display apparatus, or a novel electronic device can be provided.

Note that the effects of one embodiment of the present invention are not limited to the effects mentioned above. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have all the above effects depending on the case.

BRIEF DESCRIPTION OF THE DRAWINGS

FIG. 9 is a block diagram showing an example of a display apparatus.

FIG. 11 is a circuit diagram showing an example of a circuit included in a driver circuit.

FIG. 13 is a circuit diagram showing an example of a circuit included in a driver circuit.

FIG. 14 is a circuit diagram showing an example of a circuit included in a driver circuit.

FIG. 15 is a circuit diagram showing an example of a circuit included in a driver circuit.

FIG. 26 is a circuit diagram showing an example of a circuit included in a driver circuit.

FIGS. 33A and 33B are circuit diagrams each showing an example of a circuit included in a driver circuit.

DETAILED DESCRIPTION OF THE INVENTION

Figure 1A:
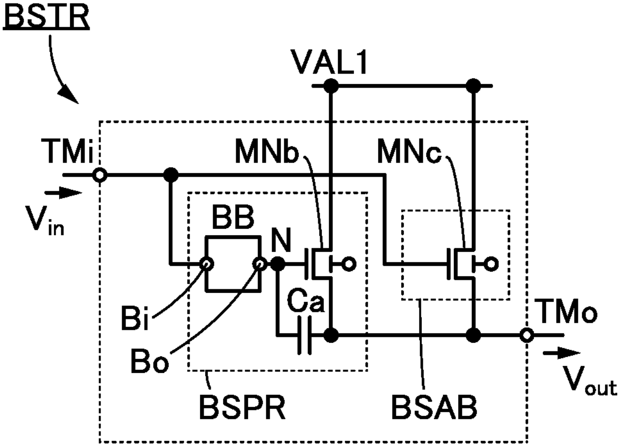
FIGS. 1A and 1B are circuit diagrams each showing an example of an amplifier circuit.

In this specification and the like, a semiconductor device means a device that utilizes semiconductor characteristics, and refers to a circuit including a semiconductor element (e.g., a transistor, a diode, or a photodiode), and a device including the circuit. The semiconductor device also means devices that can function by utilizing semiconductor characteristics. For example, an integrated circuit, a chip including an integrated circuit, and an electronic component including a chip in a package are examples of the semiconductor device. For another example, a memory device, a display apparatus, a light-emitting apparatus, a lighting device, and an electronic device themselves might be semiconductor devices, or might each include a semiconductor device.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor element, an inductor, a resistor element, a diode, a display device, a light-emitting device, or a load) can be connected between X and Y. Note that a switch has a function of being controlled to be turned on or off. That is, the switch has a function of being in a conduction state (on state) or a non-conduction state (off state) to control whether a current flows or not.

In the case where an element and a power supply line (e.g., a wiring supplying VDD (high power supply potential), VSS (low power supply potential), GND (the ground potential), or a desired potential) are both provided between X and Y, X and Y are not defined as being electrically connected. In the case where only a power supply line is provided between X and Y, there is no element between X and Y; therefore, X and Y are directly connected. Accordingly, in the case where only a power supply line is provided between X and Y, X and Y can be expressed as being "electrically connected". However, in the case where an element and a power supply line are both provided between X and Y, X and Y are not defined as being electrically connected although X and the power supply line are electrically connected (through the element), and Y and the power supply line are electrically connected. Note that in the case where a gate and a source of a transistor are located between X and Y, X and Y are not defined as being electrically connected. Similarly, in the case where a gate and a drain of a transistor are located between X and Y, X and Y are not defined as being electrically connected. That is, in the case where a drain and a source of a transistor are located between X and Y, X and Y are defined as being electrically connected. In the case where a capacitor is provided between X and Y, X and Y are defined as being electrically connected in some cases and not defined in other cases. For example, in the case where a capacitor is provided between X and Y in a digital circuit or a logic circuit, X and Y are not defined as being electrically connected in some cases. On the other hand, for example, in the case where a capacitor is provided between X and Y in an analog circuit, X and Y are defined as being electrically connected in some cases.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit structure is defined by an expression similar to the above examples, a source and a drain of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor element" can be, for example, a circuit element or a wiring having a resistance higher than 0Ω. Therefore, in this specification and the like, a "resistor element" includes a wiring having a resistance, a transistor in which a current flows between its source and drain, a diode, and a coil. Thus, the term "resistor element" can be sometimes replaced with the terms "resistor", "load", or "region having a resistance"; conversely, the terms "resistor", "load", or "region having a resistance" can be sometimes replaced with the term "resistor element". The resistance can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance may be higher than or equal to 1Ω and lower than or equal to $1\times10^9$Ω.

In this specification and the like, a "capacitor element" can be, for example, a circuit element having an electrostatic capacitance greater than 0 F, a region of a wiring having an electrostatic capacitance greater than 0 F, parasitic capacitance, or gate capacitance of a transistor. The terms "capacitor element", "parasitic capacitance", or "gate capacitance" can be sometimes replaced with the term "capacitor"; conversely, the term "capacitor" can be sometimes replaced with the terms "capacitor element", "parasitic capacitance", or "gate capacitance". In addition, the "capacitor" (including a capacitor with three or more terminals) includes an insulator and a pair of conductors between which an insulator is interposed. The term "a pair of conductors" of a capacitor can be replaced with the terms "a pair of electrodes", "a pair of conductive regions" "a pair of regions", or "a pair of terminals". In addition, the terms "one of a pair of terminals" and "the other of the pair of terminals" are referred to as a first terminal and a second terminal, respectively, in some cases. Note that the electrostatic capacitance can be greater than or equal to 0.05 fF and less than or equal to 10 pF, for example. As another example, the electrostatic capacitance may be greater than or equal to 1 pF and less than or equal to 10 μF.

In this specification and the like, a transistor includes three terminals called a gate, a source, and a drain. The gate is a control terminal for controlling the on/off state of the transistor. The two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be sometimes used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include aback gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the withstand voltage of the transistor can be increased (the reliability can be improved). Alternatively, with the multi-gate structure, a drain-source current does not change very much even if a drain-source voltage changes when the transistor operates in a saturation region, so that a flat slope of voltage-current characteristics can be obtained. By utilizing the flat slope of the voltage-current characteristics, an ideal current source circuit or an active load having an extremely high resistance can be obtained. Accordingly, a differential circuit, a current mirror circuit, or the like having excellent properties can be obtained.

A single circuit element shown in a circuit diagram may include a plurality of circuit elements. For example, a single resistor shown in a circuit diagram may be two or more resistors electrically connected to each other in series. For another example, a single capacitor shown in a circuit diagram may be two or more capacitors electrically connected to each other in parallel. For another example, a single transistor shown in a circuit diagram may be two or more transistors which are electrically connected to each other in series and whose gates are electrically connected to each other. For another example, a single switch shown in a circuit diagram may be a switch including two or more transistors which are electrically connected to each other in series or in parallel and whose gates are electrically connected to each other.

In this specification and the like, a node can be referred to as a terminal, a wiring, an electrode, a conductive layer, a conductor, or an impurity region depending on the circuit configuration and the device structure. Furthermore, a terminal, a wiring, and the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials that these wirings supply are not necessarily equal to each other. Similarly, in the case where two wirings are both described as "functioning as a wiring for supplying a low-level potential", the levels of the low-level potentials that these wirings supply are not necessarily equal to each other.

A current means an electric charge transfer (electrical conduction); for example, the expression "electrical conduction of positively charged particles is caused" can be rephrased as "electrical conduction of negatively charged particles is caused in the opposite direction". Therefore, unless otherwise specified, a current in this specification and the like refers to an electric charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a carrier with a positive electric charge moves, and the amount of a current is expressed as a positive value. In other words, the direction in which a carrier with a negative electric charge moves is opposite to the direction of a current, and the amount of a current is expressed as a negative value. Thus, in the case where the polarity of a current (or the direction of a current) is not specified in this specification and the like, the expression "a current flows from an element A to an element B" can be replaced with "a current flows from an element B to an element A." The expression "a current is input to an element A" can be replaced with "a current is output from an element A."

Ordinal numbers such as "first", "second", and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments or claims. For another example, a "first" component in one embodiment in this specification and the like can be omitted in other embodiments or claims.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

The terms such as "over", "above", "under", and "below" do not necessarily mean that a component is placed directly on or under and directly in contact with another component. For example, the expression "electrode B over insulating layer A" does not necessarily mean that the electrode B is on and in direct contact with the insulating layer A, and can mean the case where another component is provided between the insulating layer A and the electrode B. In a similar manner, for example, the expression "electrode B above insulating layer A" does not necessarily mean that the electrode B is over and in direct contact with the insulating layer A, and can mean the case where another component is provided between the insulating layer A and the electrode B. In a similar manner, for example, the expression "electrode B below insulating layer A" does not necessarily mean that the electrode B is under and in direct contact with the insulating layer A, and can mean the case where another component is provided between the insulating layer A and the electrode B.

In this specification and the like, components arranged in a matrix and their positional relation are sometimes described using terms such as "row" and "column". The positional relation between components is changed as appropriate in accordance with the direction from which each component is described. Thus, the positional relation is not limited to that described with a term used in this specification and the like and can be explained with another term as appropriate depending on the situation. For example, the term "row direction" can be replaced with the term "column direction" when the direction of the diagram is rotated by 90°.

In this specification and the like, the terms "film" and "layer" can be interchanged with each other depending on circumstances. For example, the term "conductive layer" can be changed to the term "conductive film" in some cases. Moreover, the term "insulating film" can be changed into the term "insulating layer" in some cases. Moreover, such terms can be replaced with a word not including the term "film" or "layer" depending on the case or circumstances. For example, the term "conductive layer" or "conductive film" can be changed into the term "conductor" in some cases. For example, in some cases, the term "insulating layer" or "insulating film" can be changed into the term "insulator" in some cases.

In this specification and the like, the terms "electrode", "wiring", and "terminal" do not have functional limitations. For example, an "electrode" is used as part of a wiring in some cases, and vice versa. Furthermore, the term "electrode" or "wiring" can also mean a combination of a plurality of electrodes or wirings provided in an integrated manner, for example. For another example, a "terminal" can be used as part of a wiring or an electrode, and a "wiring" and an "electrode" can be used as part of a terminal. Furthermore, the term "terminal" includes the case where at least two of electrodes, wirings, terminals, and the like are formed in an integrated manner. Therefore, for example, an "electrode" can be part of a wiring or a terminal, and a "terminal" can be part of a wiring or an electrode. Moreover, the terms "electrode", "wiring", or "terminal" is sometimes replaced with the term "region", for example.

In this specification and the like, the terms "wiring", "signal line", "power supply line", and the like can be interchanged with each other depending on the case or in accordance with circumstances. For example, the term "wiring" can be changed into the term "signal line" in some cases. Also, for example, the term "wiring" can be changed into the term "power supply line" in some cases. Inversely, the term "signal line," "power supply line," or the like can be changed into the term "wiring" in some cases. The term "power supply line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or in accordance with circumstances. Inversely, the term "signal" or the like can be changed into the term "potential" in some cases.

In this specification and the like, a timing chart is used in some cases to describe an operation method of a semiconductor device. In this specification and the like, the timing chart shows an ideal operation example and a period, a level of a signal (e.g., a potential or current), and a timing described in the timing chart are not limited unless otherwise specified. In the timing chart described in this specification and the like, the level of a signal (e.g., a potential or current) input to a wiring (including a node) and a timing can be changed as appropriate depending on the circumstances. For example, even when two periods are shown to have an equal length, the two periods have different lengths in some cases. Furthermore, for example, even when one of two periods is shown longer than the other, the two periods can have the equal length in some cases, or the one of the two periods has a shorter length than the other in other cases.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide included in a channel formation region of a transistor is called an oxide semiconductor in some cases. That is, a metal oxide included in a channel formation region of a transistor that has at least one of an amplifying function, a rectifying function, and a switching function can be referred to as a metal oxide semiconductor. In addition, an OS transistor is a transistor including a metal oxide or an oxide semiconductor.

In this specification and the like, a metal oxide containing nitrogen is also referred to as a metal oxide in some cases. In addition, a metal oxide containing nitrogen may be referred to as a metal oxynitride.

In this specification and the like, an impurity in a semiconductor refers to, for example, elements other than the main components of a semiconductor layer. For instance, an element with a concentration lower than 0.1 atomic % is an impurity. When an impurity is contained, at least one of the following may occur: an increase in the density of defect states in the semiconductor; a decrease in carrier mobility; and a decrease in crystallinity. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples are hydrogen (included also in water), lithium, sodium, silicon, boron, phosphorus, carbon, and nitrogen.

In this specification and the like, a switch is in a conduction state (on state) or in a non-conduction state (off state) to control whether a current flows therethrough or not. Alternatively, a switch has a function of selecting and changing a current path. Thus, a switch may have two or more terminals through which a current flows, in addition to a control terminal. For example, an electrical switch or a mechanical switch can be used. That is, a switch is not limited to a certain element and can be any element capable of controlling a current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the conduction state of the transistor refers to a state in which a source electrode and a drain electrode of the transistor are regarded as being electrically short-circuited or a state in which a current can flow between the source electrode and the drain electrode, for example. The non-conduction state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

In this specification, "parallel" indicates a state where the angle formed between two straight lines is greater than or equal to −10° and less than or equal to 10°. Thus, the case where the angle is greater than or equal to −5° and less than or equal to 5° is also included. The terms "approximately parallel" and "substantially parallel" indicate that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 850 and less than or equal to 950 is also included. The terms "approximately perpendicular" and "substantially perpendicular" indicate that the angle formed between two straight lines is greater than or equal to 600 and less than or equal to 120°.

In this specification and the like, one embodiment of the present invention can be constituted with an appropriate combination of a structure shown in one embodiment and any of the structures shown in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

The embodiments in this specification are described with reference to the drawings. Note that the embodiments can be implemented in many different modes, and it will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. In perspective views and the like, some of components might not be illustrated for clarity of the drawings.

In this specification, a plan view is sometimes used to explain a structure in each embodiment. A plan view is a diagram showing the appearance of a plane (section) of a structure cut in the horizontal direction, for example. Hidden lines (e.g., dashed lines) in a plan view can indicate the positional relation between a plurality of components included in a structure or the overlapping relation between the plurality of components. In this specification and the like, the term "plan view" can be replaced with the term "schematic plan view", "projection view", "top view", or "bottom view". A plane (section) of a structure cut in a direction other than the horizontal direction may be referred to as a plan view depending on circumstances.

In this specification, a cross-sectional view is sometimes used to explain a structure in each embodiment. A cross-sectional view is a diagram showing the appearance of a plane (section) of a structure cut in the vertical direction, for example. In this specification and the like, the term "cross-sectional view" can be replaced with the term "front view" or "side view". A plane (section) of a structure cut in a direction other than the vertical direction may be referred to as a cross-sectional view depending on circumstances.

In this specification and the like, when a plurality of components denoted by the same reference numerals need to be distinguished from each other, identification signs such as "_1", "[n]", and "[m,n]" are sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings of this specification, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes, values, or the like shown in the drawings. For example, the following can be included: a variation in a signal, a voltage, or a current due to noise or difference in timing.

Embodiment 1

In this embodiment, an amplifier circuit which is a semiconductor device of one embodiment of the present invention is described.

<Amplifier Circuit>

Figures 2A, 2B:
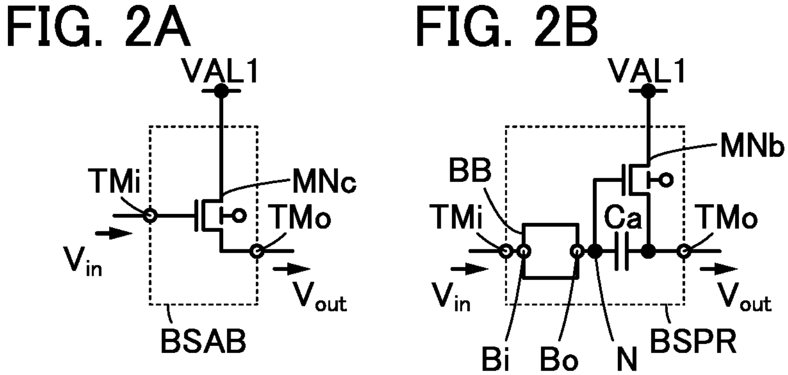
FIGS. 2A and 2B are circuit diagrams each showing an example of an amplifier circuit.

A circuit BSAB illustrated in FIG. 2A is an example of an amplifier circuit and includes a transistor MNc. The circuit BSAB includes, for example, a terminal TMi serving as an input terminal and a terminal TMo serving as an output terminal.

For example, the transistor MNc is preferably an OS transistor. In particular, as a metal oxide included in a channel formation region of the OS transistor, an In-M-Zn oxide containing indium, the element M, and zinc (the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, cobalt, magnesium, and antimony) or the like is preferably used. A transistor including silicon in a channel formation region (hereinafter referred to as a Si transistor) may be employed as the transistors. As the silicon, single crystal silicon, amorphous silicon (referred to as hydrogenated amorphous silicon in some cases), microcrystalline silicon, or polycrystalline silicon can be used, for example. As transistors other than the OS transistor and the Si transistor, for example, a transistor including germanium (Ge) or the like in a channel formation region, a transistor including a compound semiconductor, such as zinc selenide (ZnSe), cadmium sulfide (CdS), gallium arsenide (GaAs), indium phosphide (InP), gallium nitride (GaN), or silicon germanium (SiGe), in a channel formation region, a transistor including carbon nanotube in a channel formation region, or a transistor including an organic semiconductor in a channel formation region can be used.

The transistor MNc illustrated in FIG. 2A is an n-channel transistor having a multi-gate structure including gates over and under a channel; the transistor MNc includes a first gate and a second gate. Note that in this specification and the like, for convenience, the first gate is referred to as a gate (sometimes referred to as a front gate) and the second gate is referred to as a back gate so that they are distinguished from each other in some cases. In this specification and the like, the first gate and the second gate can be interchanged, and thus the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

In FIG. 2A, the back gate of the transistor MNc is illustrated. The connection of the back gate is not illustrated, and the destination to which the back gate is electrically connected can be determined at the design stage. For example, in a transistor including a back gate, a gate and the back gate may be electrically connected to each other to increase the on-state current of the transistor. In other words, for example, the gate and back gate of the transistor MNc may be electrically connected. Alternatively, for example, in a transistor including a back gate, a wiring for electrically connecting the back gate of the transistor to an external circuit or the like may be provided and a potential may be supplied to the back gate of the transistor with the external circuit or the like to change the threshold voltage of the transistor or to reduce the off-state current of the transistor.

The semiconductor device of one embodiment of the present invention does not depend on the structure of a transistor included in the semiconductor device. For example, the transistor MNc in FIG. 2A may have a structure not including a back gate, that is, a single-gate structure. It is also possible that some transistors include back gates and the other transistors do not include back gates.

Note that the same applies to a transistor described in other parts of the specification and a transistor illustrated in other drawings, not only to the transistors in FIG. 2A.

A first terminal of the transistor MNc is electrically connected to a wiring VAL1, a second terminal of the transistor MNc is electrically connected to the terminal TMo, and a gate of the transistor MNc is electrically connected to the terminal TMi.

The wiring VAL1 serves as a wiring supplying a fixed potential or a variable potential, for example. As a fixed potential, for example, a high-level potential, a low-level potential, a ground potential, or a negative potential can be given. As a variable potential, a pulse signal (also referred to as a pulse voltage in some cases) or a clock signal can be given.

In FIG. 2A, the potential of the terminal TMi is denoted by $V_{in}$ and the potential of the terminal TMo is denoted by $V_{out}$.

A high-level potential $V_{High}$ is assumed to be input to the input terminal TMi of the circuit BSAB in FIG. 2A. That is, $V_{in}=V_{High}$. In addition, a low-level potential $V_{Low}$ is assumed to be supplied to the first terminal of the transistor MNc from the wiring VAL1.

The transistor MNc is normally off and its threshold voltage is set to $V_{th\_MNc}$. The threshold voltage $V_{th\_MNc}$ is set to satisfy the formula: $V_{High}-V_{Low}>V_{th\_MNc}$.

In this specification and the like, "normally off" means a state where a current does not flow through a transistor when no potential or the ground potential is applied to a gate. In addition, "normally off" in an OS transistor means that a current per micrometer of a channel width flowing through a transistor is lower than or equal to $1\times10^{-20}$ A at room temperature, lower than or equal to $1\times10^{-18}$ A at 85° C., or lower than or equal to $1\times10^{-16}$ A at 125° C. when no potential or the ground potential is applied to a gate. Meanwhile, "normally on" means a state where a channel exists without applying voltage to a gate and current flows through a transistor. Alternatively, "normally on" means a state where a channel exists even when the gate-source voltage is 0 V, and a current flows through a transistor.

At this time, the gate-source voltage (gate-first terminal voltage here) of the transistor MNc is $V_{High}-V_{Low}$, whereby the transistor MNc is turned on. Consequently, the wiring VAL1 outputs the low-level potential $V_{Low}$ to the terminal TMo of the circuit BSAB through the transistor MNc, whereby $V_{out}=V_{Low}$.

Next, the potential supplied to the first terminal of the transistor MNc from the wiring VAL1 is assumed to change from the low-level potential $V_{Low}$ to the high-level potential $V_{High}$. In this case, the gate-source voltage (gate-second terminal voltage here) of the transistor MNc is $V_{High}-V_{Low}$, whereby the transistor MNc is turned on. Consequently, current flows from the wiring VAL1 to the terminal TMo of the circuit BSAB through the transistor MNc, which renders the potential of the terminal TMo higher than $V_{Low}$. Note that since the potential of the terminal TMo increases over time, the gate-source voltage (gate-second terminal voltage here) of the transistor MNc decreases gradually. When the gate-source voltage of the transistor MNc becomes $V_{th\_MNc}$, the transistor MNc is turned off. In other words, when the potential of the terminal TMo reaches $V_{High}$-$V_{th\_MNc}$, the transistor MNc is turned off.

As described above, in the circuit BSAB, when the high-level potential $V_{High}$ is input to the terminal TMi and the high-level potential $V_{High}$ is supplied to the first terminal of the transistor MNc through the wiring VAL1, the potential $V_{High}-V_{th\_MNc}$ (obtained by subtraction of the threshold voltage of the transistor MNc from the potential of the terminal TMi) is output from the terminal TMo.

A circuit BSPR illustrated in FIG. 2B is an example of an amplifier circuit and includes a circuit BB, a transistor MNb, and a capacitor Ca. The circuit BSPR includes, for example, the terminal TMi serving as an input terminal and the terminal TMo serving as an output terminal. The circuit BB includes, for example, a terminal Bi serving as an input terminal and a terminal Bo serving as an output terminal.

As the transistor MNb, a transistor that can be used as the transistor MNc can be used, for example.

The terminal Bi of the circuit BB is electrically connected to the terminal TMi, and the terminal Bo of the circuit BB is electrically connected to a gate of the transistor MNb and a first terminal of the capacitor Ca. A first terminal of the transistor MNb is electrically connected to the wiring VAL1, and a second terminal of the transistor MNb is electrically connected to a second terminal of the capacitor Ca and the terminal TMo.

In this embodiment, a portion where the terminal Bo of the circuit BB, the gate of the transistor MNb, and the first terminal of the capacitor Ca are electrically connected is referred to as a node N.

The circuit BB has a function of bringing the node N into a floating state, for example. Thus, the circuit BB can include a switching element, for example. The circuit BB also has a function of outputting, to the terminal Bo, a potential corresponding to the potential input to the terminal Bi.

The wiring VAL1 in FIG. 2B serves as, for example, a wiring supplying a fixed potential or a variable potential, like the wiring VAL1 in FIG. 2A.

In FIG. 2B, the potential of the terminal TMi is denoted by $V_{in}$ and the potential of the terminal TMo is denoted by $V_{out}$, as in FIG. 2A.

Here, the potential of the node N of the circuit BSPR in FIG. 2B is assumed to be a potential $V_{Mid}$, which is lower than the high-level potential $V_{High}$. In this case, the node N is assumed not to be in a floating state. In addition, the low-level potential $V_{Low}$ is assumed to be supplied to the first terminal of the transistor MNc from the wiring VAL1.

The transistor MNb is normally off and its threshold voltage is set to $V_{th\_MNb}$. The threshold voltage $V_{th\_MNb}$ is set to satisfy the formula: $V_{High}-V_{Low}>V_{th\_MNb}$.

At this time, the gate-source voltage (gate-first terminal voltage here) of the transistor MNb is $V_{Mid}-V_{Low}$, whereby the transistor MNb is turned on. Consequently, the wiring VAL1 outputs the low-level potential $V_{Low}$ to the terminal TMo of the circuit 30 BSPR through the transistor MNb, whereby $V_{out}=V_{Low}$.

Next, the potential supplied to the first terminal of the transistor MNb from the wiring VAL1 is assumed to change from the low-level potential $V_{Low}$ to the high-level potential $V_{High}$. In addition, the node N is assumed to be brought into a floating state by the circuit BB. At this time, the gate-source voltage (gate-second terminal voltage here) of the transistor MNb is $V_{Mid}-V_{Low}$, whereby the transistor MNb is turned on. Consequently, current flows from the wiring VAL1 to the terminal TMo of the circuit BSPR through the transistor MNb, which renders the potential of the terminal TMo higher than $V_{Low}$. Note that since the node N is in a floating state, the capacitive coupling with the capacitor Ca causes an increase in the potential of the node N from $V_{Mid}$ in response to the increase in the potential of the terminal TMo. Accordingly, the gate-source voltage of the transistor MNb is retained by the capacitor Ca, whereby the potential of the terminal TMo increases to $V_{High}$. Ideally, the potential of the node N is in the following points: $V_{Mid}|V_{High}-V_{Low}$.

As described above, in the circuit BSPR, when $V_{Mid}$ lower than the high-level potential is input to the node N and the high-level potential $V_{High}$ is supplied to the first terminal of the transistor MNc through the wiring VAL1, $V_{High}$ is output as a potential from the terminal TMo. In this specification and the like, increasing the gate potential of a transistor with an increase in the potential of the first or second terminal of a transistor by utilizing capacitive coupling is referred to as a bootstrap.

In the circuit BSAB in FIG. 2A, when the high-level potential $V_{High}$ is supplied to the first terminal of the transistor MNc form the wiring VAL1 and the potential of the terminal TMi is the high-level potential $V_{High}$, the potential output to the terminal TMo is $V_{High}-V_{th\_MNc}$. Meanwhile, in the circuit BSPR in FIG. 2B, when the high-level potential $V_{High}$ is supplied to the first terminal of the transistor MNb from the wiring VAL1 and the potential of the node N is the high-level potential $V_{High}$, the potential output to the terminal TMo in the circuit BSPR is increased to $V_{High}$ with the use of a bootstrap.

When the potential of the gate of the transistor MNb is $V_{Mid}$, the amount of current flowing between the first and second terminals of the transistor MNb is smaller than that when the potential of the gate of the transistor MNc is $V_{High}$. Thus, the time taken to increase the potential of the second terminal (terminal TMo) of the transistor MNb in which the potential of the gate is $V_{Mid}$ to $V_{High}$ might be longer than the time taken to increase the potential of the second terminal (the terminal TMo) of the transistor MNc in which the potential of the gate is $V_{High}$ to $V_{High}-V_{th\_MNc}$. In other words, in the case where the potential of the terminal TMo is increased using a bootstrap in the circuit BSPR, the potential rise of the terminal TMo might occur slowly than the potential rise of the second terminal of the transistor MNc in the circuit BSAB.

FIG. 1A illustrates an amplifier circuit of the semiconductor device of one embodiment of the present invention, which is to solve the above problem. A circuit BSTR illustrated in FIG. 1A includes the circuit BSAB in FIG. 2A and the circuit BSPR in FIG. 2B.

The terminal TMi of the circuit BSAB and the terminal TMi of the circuit BSPR are electrically connected to each other. The terminal TMo of the circuit BSAB and the terminal TMo of the circuit BSPR are electrically connected to each other. In FIG. 1A, the terminal TMi of the circuit BSAB and the terminal TMi of the circuit BSPR are shown as one terminal TMi, and the terminal TMo of the circuit BSAB and the terminal TMo of the circuit BSPR are shown as one terminal TMo.

Thus, in the circuit BSTR, the circuit BSPR performing a bootstrap and the circuit BSAB not performing a bootstrap are electrically connected in parallel.

When the high-level potential $V_{High}$ is input to the terminal TMi of the circuit BSTR in FIG. 1A, the potential of the gate of the transistor MNc becomes $V_{High}$. In addition, the high-level potential $V_{High}$ is supplied from the terminal TMi to the terminal Bi of the circuit BB. At this time, the potential $V_{Mid}$ is output from the terminal Bo of the circuit BB. Consequently, the potential of the transistor MNb becomes $V_{Mid}$.

Furthermore, the high-level potential $V_{High}$ is assumed to be supplied from the wiring VAL1 to the first terminals of the transistors MNb and MNc. Since the potential of the gate of the transistor MNc is $V_{High}$ and the potential of the gate of the transistor MNb is $V_{Mid}$, when the structures and sizes (e.g., channel lengths and channel widths) of the transistors MNc and MNb are the same, the amount of current flowing between the first and second terminals of the transistor MNc is larger than that of current flowing between the first and second terminals of the transistor MNb.

Electric charge is accumulated in the terminal TMo because of the current flowing between the first and second terminals of the transistor MNb and the current flowing between the first and second terminals of the transistor MNc. In the circuit BSTR in FIG. 1A, since electric charge is accumulated in the terminal TMo from the circuits BSPR and BSAB, the potential of the terminal TMo rises more steeply than in the circuit BSPR in FIG. 2B. In addition, since a bootstrap is performed by the circuit BSPR, the potential of the terminal TMo increases to $V_{High}$.

As described above, the circuit BSPR performing a bootstrap and the circuit BSAB not performing a bootstrap are electrically connected in parallel, whereby the potential of the terminal TMo as the output destination can rise more steeply than that in the circuit BSPR in FIG. 2B. Furthermore, the circuit BSPR performing a bootstrap and the circuit BSAB not performing a bootstrap are electrically connected in parallel, whereby the potential of the terminal TMo as the output destination can be increased to $V_{High}$.

Figure 1B:
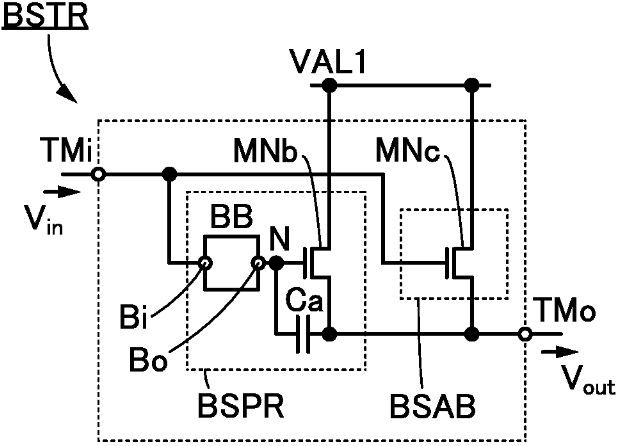

Note that the semiconductor device of one embodiment of the present invention is not limited to the circuit BSTR illustrated in FIG. 1A. In the semiconductor device of one embodiment of the present invention, for example, each of the transistors MNb and MNc may have a single gate structure as illustrated in FIG. 1B. In other words, each of the transistors MNb and MNc may be a transistor not including a back gate.

Configuration Example 1 of Amplifier Circuit

Next, configuration examples of the circuit BSTR illustrated in FIG. 1A are described. FIGS. 3A to 3C, FIGS. 4A to 4C, FIGS. 5A to 5D, FIGS. 6A to 6C, FIGS. 7A and 7B, and FIG. 8 show the configuration examples of the circuit BSTR in FIG. 1A.

Figure 3A:
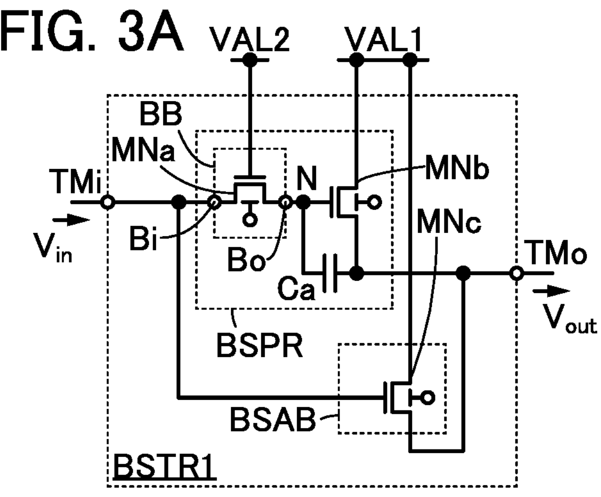
FIGS. 3A to 3C are circuit diagrams each showing an example of an amplifier circuit.

A circuit BSTR1 illustrated in FIG. 3A includes a transistor MNa in the circuit BB. As the transistor MNa, a transistor that can be used as the transistor MNb or MNc can be used, for example.

A first terminal of the transistor MNa is electrically connected to the terminal Bi, and a second terminal of the transistor MNa is electrically connected to the terminal Bo. A gate of the transistor MNa is electrically connected to the wiring VAL2.

The wiring VAL2 serves as a wiring supplying a fixed potential or a variable potential, for example, like the wiring VAL1. As a fixed potential, for example, a high-level potential, a low-level potential, a ground potential, or a negative potential can be given. As a variable potential, a pulse signal (also referred to as a pulse voltage in some cases) or a clock signal can be given.

The wiring VAL2 may be electrically connected to the wiring VAL1. In other words, the wirings VAL1 and VAL2 may be a single wiring.

An operation example of the circuit BSTR1 in FIG. 3A is described. The high-level potential $V_{High}$ is assumed to be input to the input terminal TMi of the circuit BSTR1, for example. That is, $V_{in}=V_{High}$. In addition, the high-level potential $V_{High}$ is assumed to be supplied to the gate of the transistor MNa from the wiring VAL2. The potential of the node N (the potential of the gate of the transistor MNb or the potential of the first terminal of the capacitor Ca) is the low-level potential $V_{Low}$.

The transistor MNa is normally off and its threshold voltage is set to $V_{th\_MNa}$. The threshold voltage $V_{th\_MNa}$ is set to satisfy the formula: $V_{High}-V_{Low}>V_{th\_MNa}$.

The gate-source voltage (gate-second terminal voltage here) of the transistor MNa is $V_{High}-V_{Low}$, whereby the transistor MNa is turned on. Consequently, electric charge is accumulated in the node N because of current flowing from the terminal TMi through the transistor MNa, so that the potential of the node N increases until the transistor MNa is turned off. Specifically, the transistor MNa is turned off when the gate-source voltage of the transistor MNa increases to $V_{th\_MNa}$; thus, the potential of the node N (the potential of the second terminal of the transistor MNa) is $V_{High}-V_{th\_MNa}$. Note that $V_{High}-V_{th\_MNa}$ corresponds to $V_{Mid}$ described in FIG. 2B.

Configuration Example 2 of Amplifier Circuit

Figure 3B:
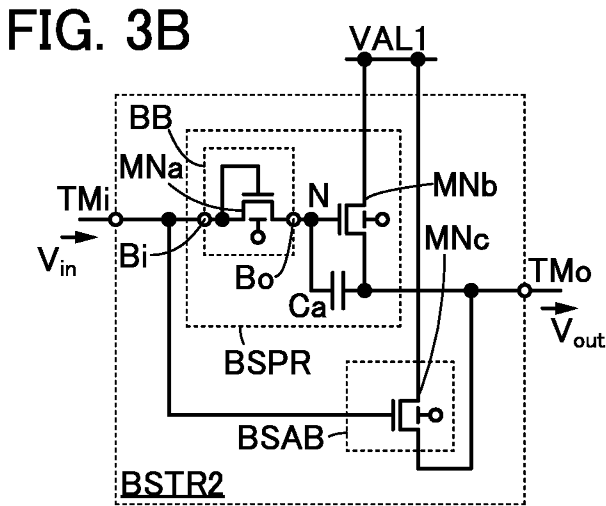

A circuit BSTR2 illustrated in FIG. 3B is a modification example of the circuit BSTR1 in FIG. 3A and is different from the circuit BSTR1 in that the gate of the transistor MNa is electrically connected not to the wiring VAL2 but to the first terminal of the transistor MNa.

In FIG. 3B, since the gate of the transistor MNa is electrically connected to the first terminal of the transistor MNa, the transistor MNa can be said to be diode-connected. Hence, for example, when the high-level potential $V_{High}$ is input to the terminal TMi of the circuit BSTR1, the potentials of the first terminal and the gate of the transistor MNa each become the high-level potential $V_{High}$; thus, the potential of the node N (the potential of the second terminal of the transistor MNa) becomes $V_{High}-V_{th\_MNa}$.

When the potential $V_{High}-V_{th\_MNa}$ of the node N (the potential of the second terminal of the transistor MNa) is to be decreased, that is, when the electric charge accumulated in the node N is to be released, the circuit BSTR2 should be further modified.

Figure 3C:
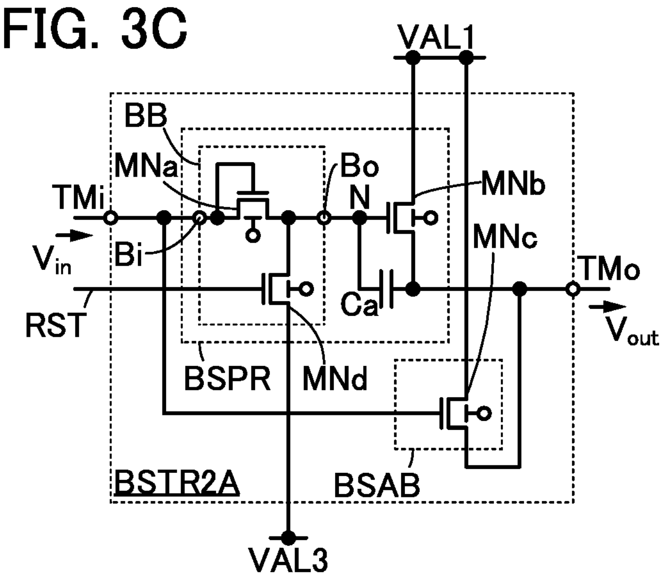

A circuit BSTR2A illustrated in FIG. 3C is a modification example of the circuit BSTR2 in FIG. 3B and is different from the circuit BSTR2 in that the electric charge accumulated in the node N can be released.

In the circuit BSTR2A in FIG. 3C, the circuit BB includes a transistor MNd in addition to the transistor MNa.

As the transistor MNd, a transistor that can be used as the transistor MNa, MNb, or MNc can be used, for example.

A first terminal of the transistor MNd is electrically connected to the second terminal of the transistor MNa and the terminal Bo, a second terminal of the transistor MNd is electrically connected to the wiring VAL3, and a gate of the transistor MNd is electrically connected to a wiring RST.

The wiring VAL3 serves as a wiring for supplying a fixed potential, for example. An example of the fixed potential is a low-level potential. Other examples of the fixed potential include a ground potential and a negative potential. Depending on the circumstances, the wiring VAL3 may serve as a wiring that supplies a variable potential.

The wiring RST serves as a wiring that transmits a signal for selecting whether the electric charge accumulated in the node N is released or not, for example. Specifically, for example, when electric charge in the node N is not released, the wiring RST is supplied with the low-level potential $V_{Low}$ as a signal to turn off the transistor MNd. For example, when the electric charge accumulated in the node N is released, the wiring RST is supplied with the high-level potential $V_{High}$ as a signal to turn on the transistor MNd.

When the potential of the node N is to be increased (when the potential of the node N is to be $V_{High}-V_{th\_MNa}$), for example, the low-level potential $V_{Low}$ is supplied to the wiring RST to turn off the transistor MNd and then the high-level potential $V_{High}$ is supplied to the terminal TMi. When the potential of the node Nis to be decreased (when the potential of the node N is to be $V_{Low}$), for example, the low-level potential $V_{Low}$ is supplied to the terminal TMi to turn off the transistor MNa and then the high-level potential $V_{High}$ is supplied to the wiring RST to turn on the transistor MNd. Here, when the potential supplied to the wiring VAL3 is the low-level potential $V_{Low}$, the electric charge in the node N flows to the wiring VAL3, whereby the potential of the node N becomes $V_{Low}$.

Configuration Example 3 of Amplifier Circuit

Figure 4A:
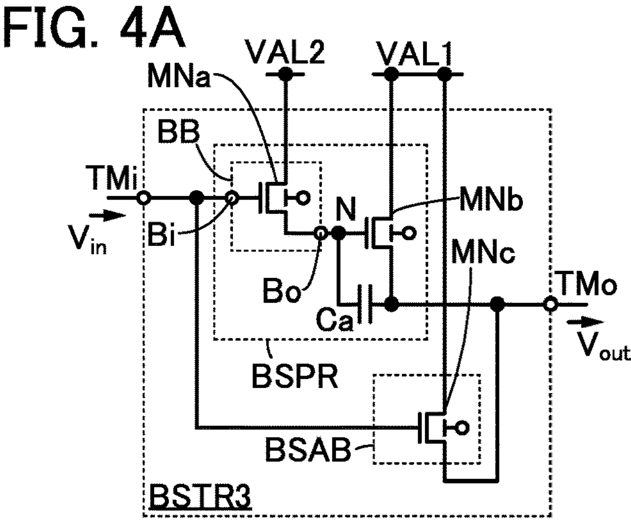
FIGS. 4A to 4C are circuit diagrams each showing an example of an amplifier circuit.

A circuit BSTR3 illustrated in FIG. 4A is a modification example of the circuit BSTR1 in FIG. 3A and is different from the circuit BSTR1 in that the gate of the transistor MNa is electrically connected not to the wiring VAL2 but to the terminal Bi and that the first terminal of the transistor MNa is electrically connected not to the terminal Bi but to the wiring VAL2.

An operation example of the circuit BSTR3 in FIG. 4A is described. The high-level potential $V_{High}$ is assumed to be input to the input terminal TMi of the circuit BSTR3, for example. In addition, the high-level potential $V_{High}$ is supplied to the gate of the transistor MNa from the wiring VAL2. The potential of the node N is the low-level potential $V_{Low}$.

The gate-source voltage (gate-second terminal voltage here) of the transistor MNa is $V_{High}-V_{Low}$, whereby the transistor MNa is turned on. Consequently, electric charge is accumulated in the node N because of current flowing from the wiring VAL2 through the transistor MNa, so that the potential of the node N increases until the transistor MNa is turned off. Specifically, the transistor MNa is turned off when the gate-source voltage of the transistor MNa increases to $V_{th\_MNa}$; thus, the potential of the node N (the potential of the second terminal of the transistor MNa) is $V_{High}-V_{th\_MNa}$. Note that $V_{High}-V_{th\_MNa}$ corresponds to $V_{Mid}$ described in FIG. 2B.

When the potential $V_{High}-V_{th\_MNa}$ of the node N ((the potential of the second terminal of the transistor MNa) is to be decreased, that is, when the electric charge accumulated in the node N is to be released, the circuit BSTR3 should be further modified.

Figure 4B:
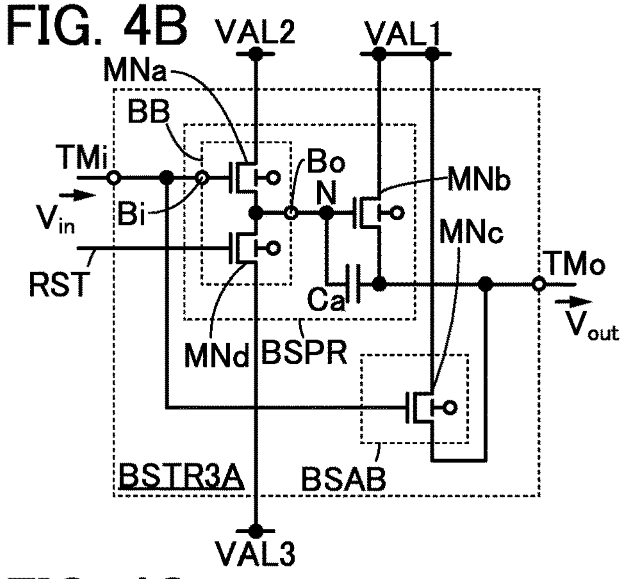

A circuit BSTR3A illustrated in FIG. 4B is a modification example of the circuit BSTR3 in FIG. 3B and is different from the circuit BSTR3 in that the electric charge accumulated in the node N can be released.

In the circuit BSTR3A in FIG. 4B, the circuit BB includes a transistor MNd in addition to the transistor MNa.

The first terminal of the transistor MNd is electrically connected to the second terminal of the transistor MNa and the terminal Bo, the second terminal of the transistor MNd is electrically connected to the wiring VAL3, the a gate of the transistor MNd is electrically connected the a wiring RST.

For the transistor MNd and the wirings VAL3 and RST, the description of the transistor MNd and the wirings VAL3 and RST in the circuit BSTR2A in FIG. 3C can be referred to.

When the potential of the node N is to be increased (when the potential of the node N is to be $V_{High}-V_{th\_MNa}$), for example, the low-level potential $V_{Low}$ is supplied to the wiring RST to turn off the transistor MNd and then the high-level potential $V_{High}$ is supplied to the terminal TMi. When the potential of the node Nis to be decreased (when the potential of the node N is to be $V_{Low}$), for example, the low-level potential $V_{Low}$ is supplied to the terminal TMi to turn off the transistor MNa and then the high-level potential $V_{High}$ is supplied to the wiring RST to turn on the transistor MNd. Here, when the potential supplied to the wiring VAL3 is the low-level potential $V_{Low}$, the electric charge in the node N flows to the wiring VAL3, whereby the potential of the node N becomes $V_{Low}$.

Configuration Example 4 of Amplifier Circuit

Figure 4C:
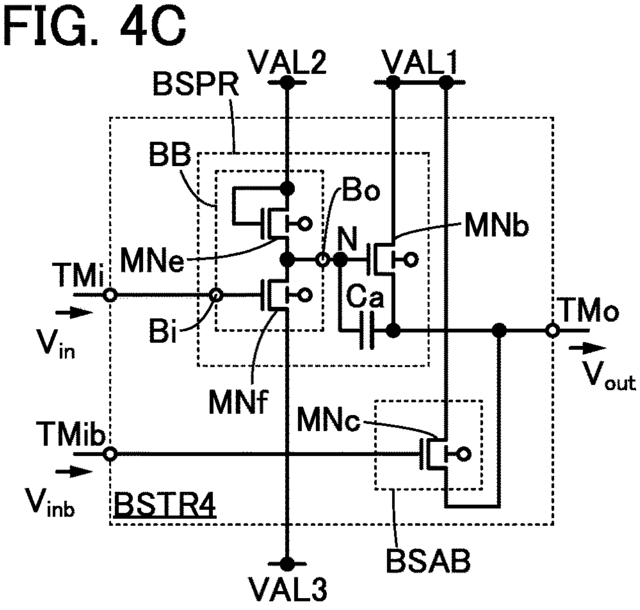

A circuit BSTR4 illustrated in FIG. 4C includes an inverter circuit in the circuit BB. Specifically, the circuit BB includes a transistor MNe and a transistor MNf, and the transistors MNe and MNf form the inverter circuit. The circuit BSTR4 is different from the circuits BSTR1, BSTR2, BSTR2A, BSTR3, and BSTR3A in that the circuit BSTR4 includes a terminal TMib and that the gate of the transistor MNc is electrically connected not to the terminal TMi but to the terminal TMib.

As each of the transistors MNe and MNf, a transistor that can be used as the transistor MNb or MNc can be used, for example.

A first terminal of the transistor MNe is electrically connected to a gate of the transistor MNe and the wiring VAL2, and a second terminal of the transistor MNe is electrically connected to the terminal Bo and a first terminal of the transistor MNf. A second terminal of the transistor MNf is electrically connected to the wiring VAL3, and the gate of the transistor MNf is electrically connected to the terminal Bi.

A signal with logic inverted from that of the signal input to the terminal TMi is input to the terminal TMib, for example. For example, a low-level potential is input to the terminal TMib when a high-level potential is input to the terminal TMi. For example, a high-level potential is input to the terminal TMib when a low-level potential is input to the terminal TMi. Note that in FIG. 4C, the potential of the terminal TMib is denoted by $V_{inb}$.

For the wiring VAL2, the description of the wiring VAL2 of the circuit BSTR1 in FIG. 3A can be referred to. For the wiring VAL3, the description of the wiring VAL3 of the circuit BSTR2A in FIG. 3C can be referred to.

An operation example of the circuit BSTR4 in FIG. 4C is described. The high-level potential $V_{High}$ is assumed to be input to the first terminal of the transistor MNe from the wiring VAL2, for example. In addition, the low-level potential $V_{Low}$ is assumed to be supplied to the second terminal of the transistor MNf from the wiring VAL3. The potential of the node N (the potential of the gate of the transistor MNb or the potential of the first terminal of the capacitor Ca) is set to the low-level potential $V_{Low}$.

The transistors MNe and MNf are normally-off transistors. The threshold voltage of the transistor MNe is $V_{th\_MNe}$, and $V_{th\_MNe}$ is the voltage in particular satisfying the formula: $V_{High}-V_{Low}>V_{th\_MNe}$.

First, a case is considered in which the low-level potential $V_{Low}$ is input to the terminal TMi. In this case, $V_{Low}$ is input to the gate of the transistor MNf, so that the transistor MNf is turned off. Since the transistor MNf is turned off, electric charge is accumulated in the node N because of current flowing from the wiring VAL2 through the transistor MNe, so that the potential of the node N increases until the transistor MNe is turned off. Specifically, the transistor MNe is turned off when the gate-source voltage of the transistor MNe increases to $V_{th\_MNe}$; thus, the potential of the node N (the potential of the second terminal of the transistor MNe) is $V_{High}-V_{th\_MNe}$. Note that $V_{High}-V_{th\_MNe}$ corresponds to $V_{Mid}$ described in FIG. 2B.

When the low-level potential $V_{Low}$ is input to the terminal TMi, the high-level potential $V_{High}$ is input to the terminal TMib. In other words, as described referring to FIG. 2A, the potential $V_{High}-V_{th\_MNc}$, which is obtained by subtraction of the threshold voltage of the transistor MNc from the potential supplied through the wiring VAL1, is output to the second terminal of the transistor MNc.

Then, a case is considered in which the high-level potential $V_{High}$ is input to the terminal TMi. In this case, $V_{High}$ is input to the gate of the transistor MNf, so that the transistor MNf is turned on. Since the transistor MNf is in the on state, current flows from the node N to the wiring VAL3 through the transistor MNf, whereby the potential of the node N ideally becomes the low-level potential $V_{Low}$ supplied through the wiring VAL3. Note that a reduction in the potential of the second terminal (node N) of the transistor MNe turns on the transistor MNe, so that the potential of the node N actually becomes higher than or equal to the low-level potential $V_{Low}$ and lower than or equal to the high-level potential $V_{High}$.

When the high-level potential $V_{High}$ is input to the terminal TMi, the low-level potential $V_{Low}$ is input to the terminal TMib. Consequently, the gate-source voltage of the transistor MNc becomes lower than the threshold voltage of the transistor MNc, whereby the transistor MNc is turned off and no current flows from the wiring VAL1 to the terminal TMo, as described referring to FIG. 2A.

Configuration Example 5 of Amplifier Circuit

Figures 5A, 5B, 5C, 5D:
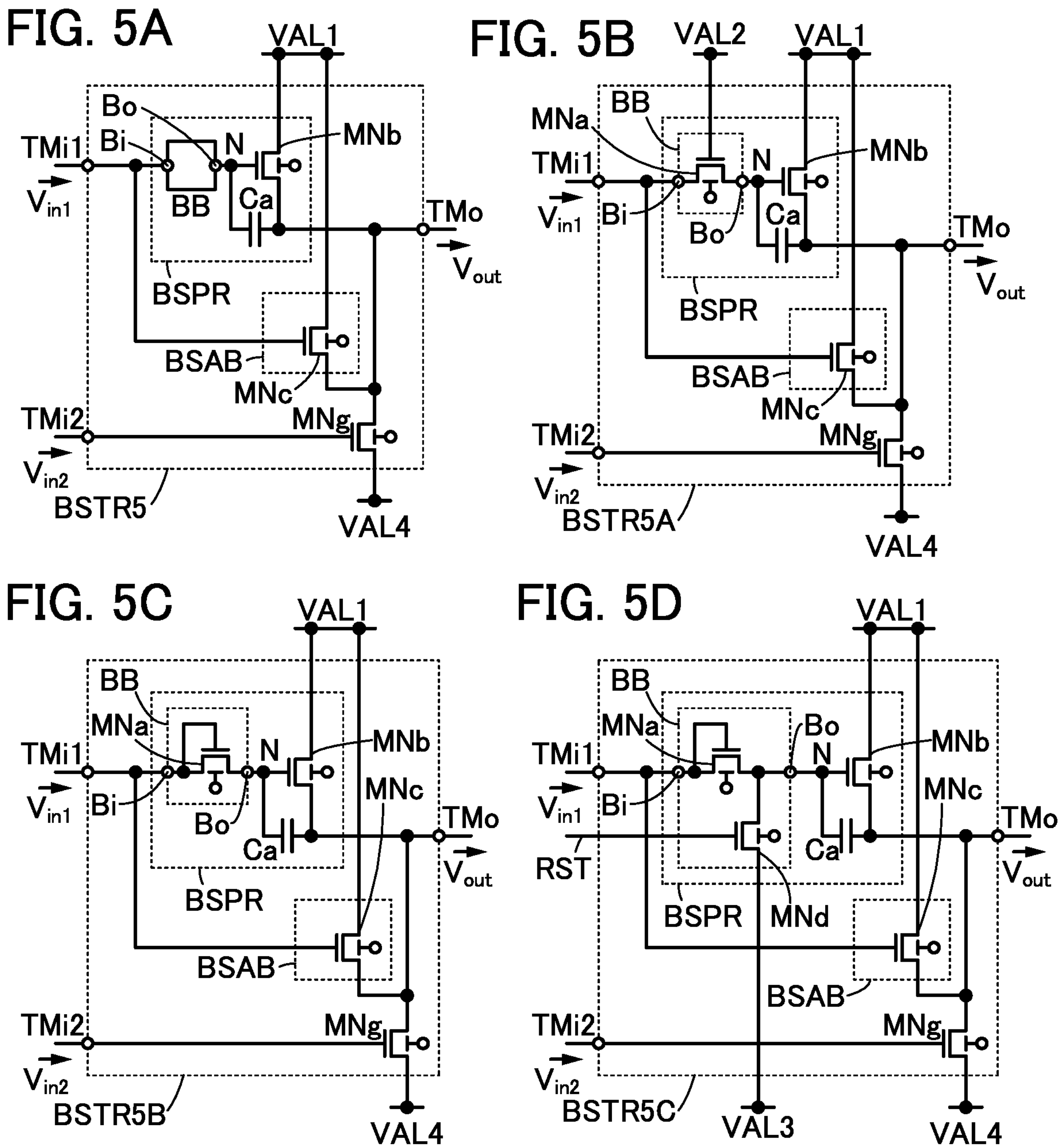
FIGS. 5A to 5D are circuit diagrams each showing an example of an amplifier circuit.

A circuit BSTR5 illustrated in FIG. 5A is a modification example of the circuit BSTR in FIG. 1A and different from the circuit BSTR in including a transistor MNg and a terminal TMi2.

As the transistor MNg, a transistor that can be used as the transistor MNb or MNc can be used, for example.

A terminal TMi1 of the circuit BSTR5 in FIG. 5A corresponds to the terminal TMi of the circuit BSTR in FIG. 1A. The terminals TMi1 and TMi2 each serve as an input terminal of the circuit BSTR5.

In FIG. 5A, the potential of the terminal TMi1 is denoted by $V_{in1}$ and the potential of the terminal TMi2 is denoted by $V_{in2}$.

A first terminal of the transistor MNg is electrically connected to the second terminal of the transistor MNb, the second terminal of the transistor MNc, the second terminal of the capacitor Ca, and the terminal TMo. A second terminal of the transistor MNg is electrically connected to a wiring VAL4. A gate of the transistor MNg is electrically connected to the terminal TMi2.

For the wiring VAL4, the description of the wiring VAL3 of the circuit BSTR2A in FIG. 3C can be referred to.

An operation example of the circuit BSTR5 in FIG. 5A is described. The high-level potential $V_{High}$ is assumed to be input to the first terminal of the transistor MNb and the first terminal of the transistor MNc from the wiring VAL1, for example. In addition, the low-level potential $V_{Low}$ is assumed to be supplied to the second terminal of the transistor MNg from the wiring VAL4.

For output of the high-level potential $V_{High}$ from the terminal TMo of the circuit BSTR5, the low-level potential $V_{Low}$ is first input to the terminal TMi2 to turn off the transistor MNg. Then, input of the high-level potential $V_{High}$ to the terminal TMi1 allows the high-level potential $V_{High}$ to be output from the terminal TMo. For the output operation of the high-level potential $V_{High}$ from the terminal TMo, the operation example of the circuit BSTR in FIG. 1A can be referred to.

Then, for output of the low-level potential $V_{Low}$ from the terminal TMo of the circuit BSTR5, the high-level potential $V_{High}$ is input to the terminal TMi2 to turn on the transistor MNg. Thus, electrical continuity is established between the terminal TMo and the wiring VAL4, so that the electric charge accumulated in the terminal TMo flows to the wiring VAL4, which makes the potential of the terminal TMo become the low-level potential $V_{Low}$. At this time, the potentials of the gates of the transistors MNb and MNc are each set to the low-level potential $V_{Low}$, whereby the transistors MNb and MNc are each turned off and electrical continuity is not established between the wiring VAL1 and the terminal TMo; hence, the potential of the terminal TMo can steeply drop to the low-level potential $V_{Low}$.

There is no limitation on the configuration of the circuit BB of the circuit BSTR5 in FIG. 5A. For example, as in the circuit BSTR5A illustrated in FIG. 5B, the circuit BB of the circuit BSTR5 may be the circuit BB of the circuit BSTR1 in FIG. 3A. For example, as in the circuit BSTR5B illustrated in FIG. 5C, the circuit BB of the circuit BSTR5 may be the circuit BB of the circuit BSTR2 in FIG. 3B. For example, as in the circuit BSTR5C illustrated in FIG. 5D, the circuit BB of the circuit BSTR5 may be the circuit BB of the circuit BSTR2A in FIG. 3C. For example, as in the circuit BSTR5D illustrated in FIG. 6A, the circuit BB of the circuit BSTR5 may be the circuit BB of the circuit BSTR3 in FIG. 4A. For example, as in the circuit BSTR5E illustrated in FIG. 6B, the circuit BB of the circuit BSTR5 may be the circuit BB of the circuit BSTR3A in FIG. 4B.

Figures 6A, 6B, 6C:
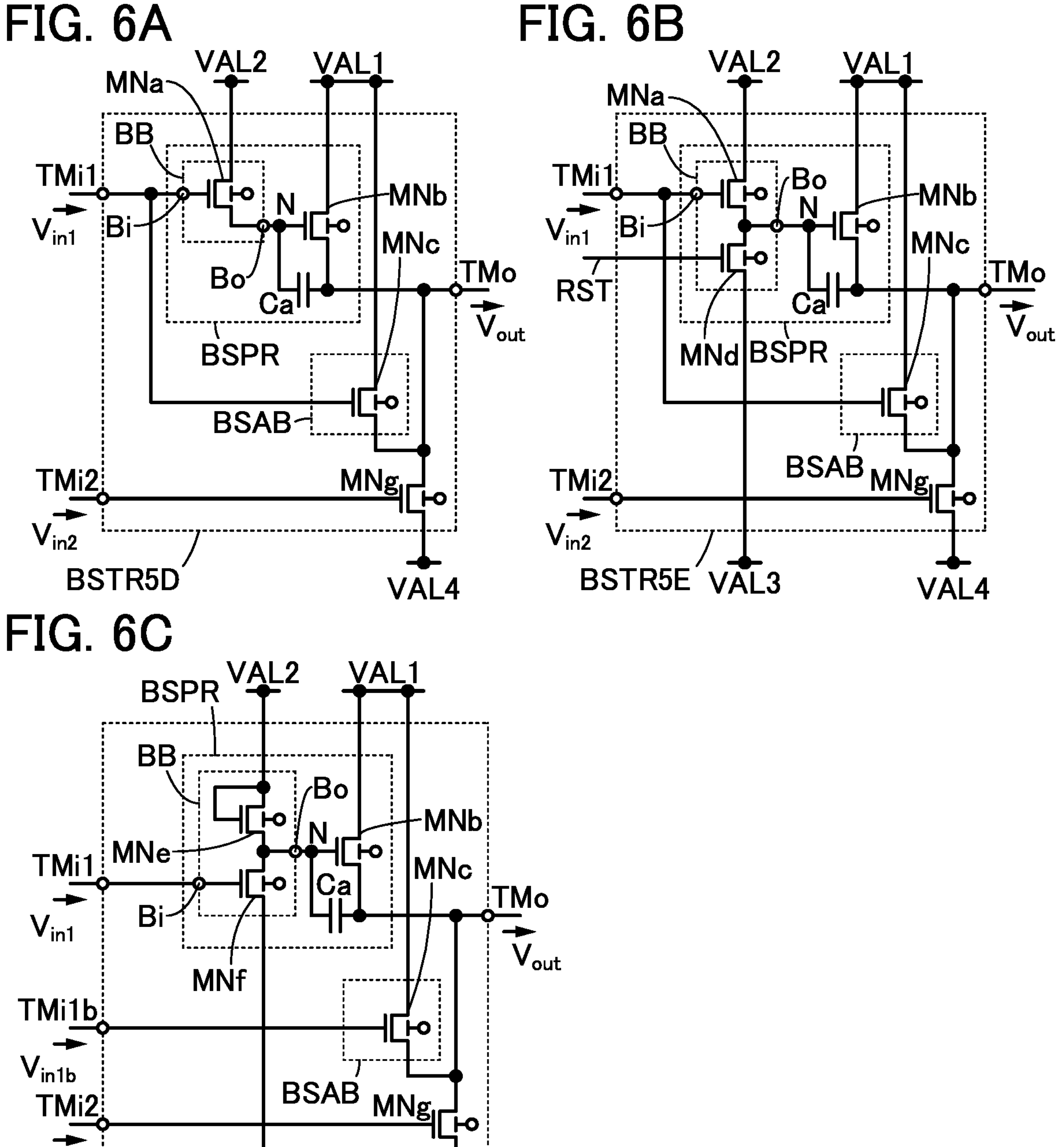
FIGS. 6A to 6C are circuit diagrams each showing an example of an amplifier circuit.

For example, as in the circuit BSTR5F illustrated in FIG. 6C, the circuit BB of the circuit BSTR5 may be the circuit BB of the circuit BSTR4 in FIG. 4C. Note that in the circuit BSTR5F in FIG. 6C, a terminal TMi1*b* corresponds to the terminal TMib of the circuit BSTR4 in FIG. 4C. In FIG. 6C, the potential of the terminal TMi1*b* is denoted by $V_{in1b}$.

Configuration Example 6 of Amplifier Circuit

Figure 7A:
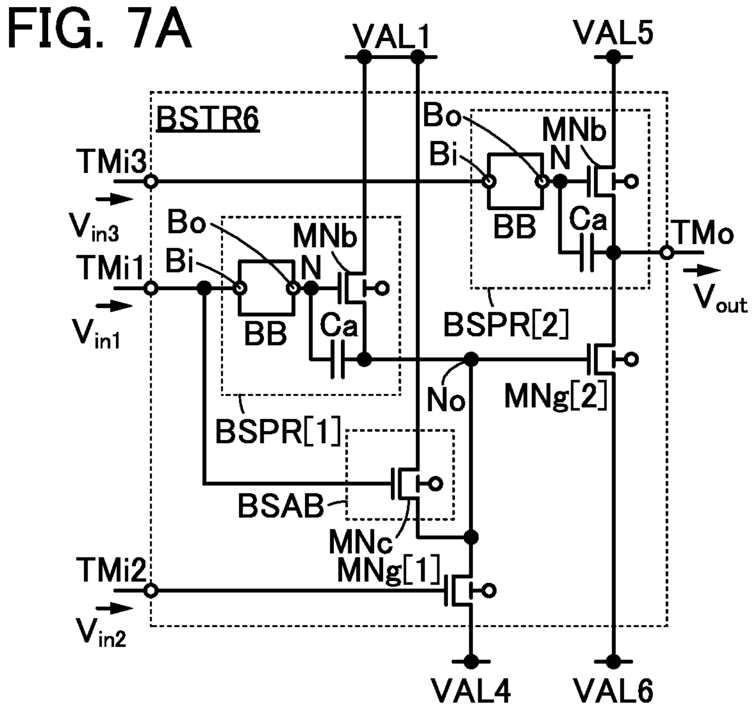
FIGS. 7A and 7B are circuit diagrams each showing an example of an amplifier circuit.

A circuit BSTR6 illustrated in FIG. 7A is a modification example of the circuit BSTR5 in FIG. 5A and different from the circuit BSTR5 in including two circuits BSPR, two transistors MNg, and a terminal TMi3.

The circuit BSTR6 includes a circuit BSPR[1] and a circuit BSPR[2] each having the same configuration as the circuit BSPR in FIG. 2B, the circuit BSAB, and a transistor MNg[1] and a transistor MNg[2] as two transistors MNg. In the circuit BSTR6 in FIG. 7A, in particular, the circuit BSPR[1] corresponds to the circuit BSPR included in the circuit BSTR5 in FIG. 5A. In the circuit BSTR6 in FIG. 7A, the transistor MNg[1] corresponds to the circuit MNg included in the circuit BSTR5 in FIG. 5A.

A gate of the transistor MNg[2] is electrically connected to the second terminal of the capacitor Ca in the circuit BSPR[1], the second terminal of the transistor MNb in the circuit BSPR[1], the second terminal of the transistor MNc, and a first terminal of the transistor MNg[1]. A first terminal of the transistor MNg[2] is electrically connected to the second terminal of the capacitor Ca in the circuit BSPR[2], the second terminal of the transistor MNb in the circuit BSPR[2], and the terminal TMo. A second terminal of the transistor MNg[2] is electrically connected to a wiring VAL6. The terminal Bi of the circuit BB in the circuit BSPR[2] is electrically connected to a terminal TiM3. The first terminal of the transistor MNb in the circuit BSPR[2] is electrically connected to a wiring VAL5.

In FIG. 7A, a node No is a point where the gate of the transistor MNg[2], the second terminal of the capacitor Ca in the circuit BSPR[1], the second terminal of the transistor MNb in the circuit BSPR[1], the second terminal of the transistor MNc, and the first terminal of the transistor MNg[1] are electrically connected.

Like the terminals TMi1 and TMi2, the terminal TMi3 serves as an input terminal of the circuit BSTR6. In FIG. 7A, the potential of the terminal TMi3 is denoted by $V_{in3}$.

For the wiring VAL5, the description of the wiring VAL1 of the circuit BSTR in FIG. 1A can be referred to. This means that the wirings VAL1 and VAL5 may be a single wiring. For the wiring VAL6, the description of the wiring VAL4 of the circuit BSTR2A in FIG. 5A can be referred to. This means that the wirings VAL4 and VAL6 may be a single wiring in FIG. 7A.

The node No corresponds to the terminal TMo of the circuit BSTR5 in FIG. 5A. Thus, for the potential supplied to the node No of the circuit BSTR6 in FIG. 7A, the potential output from the terminal TMo of the circuit BSTR5 in FIG. 5A in the operation example of the circuit BSTR5 can be referred to.

For the operation of the circuit BSPR[2] of the circuit BSTR6, the operation example of the circuit BSPR in FIG. 2B can be referred to. Specifically, the operation of the circuit BSPR[2] includes acquiring a potential $V_{in3}$ input to the terminal TMi3 and retaining the potential corresponding to the potential $V_{in3}$ in the node N of the circuit BSPR[2].

When the potential of the node No is the low-level potential $V_{Low}$ and the low-level potential $V_{Low}$ is supplied to the wiring VAL6, the transistor MNg[2] is turned off. Next, when the high-level potential $V_{High}$ is supplied to the terminal TMi3 and the potential corresponding to the potential $V_{in3}$ is retained in the node N of the circuit BSPR[2], the transistor MNb of the circuit BSPR[2] is turned on and electric charge from the wiring VAL5 is accumulated in the terminal TMo. Since a bootstrap occurs in the circuit BSPR [2], the potential of the terminal TMo increases to the high-level potential $V_{High}$ supplied through the wiring VAL5.

When the potential of the node No is the high-level potential $V_{High}$, the transistor MNg[2] is turned on. Thus, electrical continuity is established between the terminal TMo and the wiring VAL6, so that the electric charge accumulated in the terminal TMo flows to the wiring VAL6, which makes the potential of the terminal TMo become the low-level potential $V_{Low}$. At this time, the potential of the gate of the transistor MNb in the circuit BSPR[2] is each set to the low-level potential $V_{Low}$, whereby the transistor MNb in the circuit BSPR[2] is turned off and electrical continuity is not established between the wiring VAL5 and the terminal TMo; hence, the potential of the terminal TMo can steeply drop to the low-level potential $V_{Low}$.

Next, a modification example of the circuit BSTR6 is described.

Figure 7B:
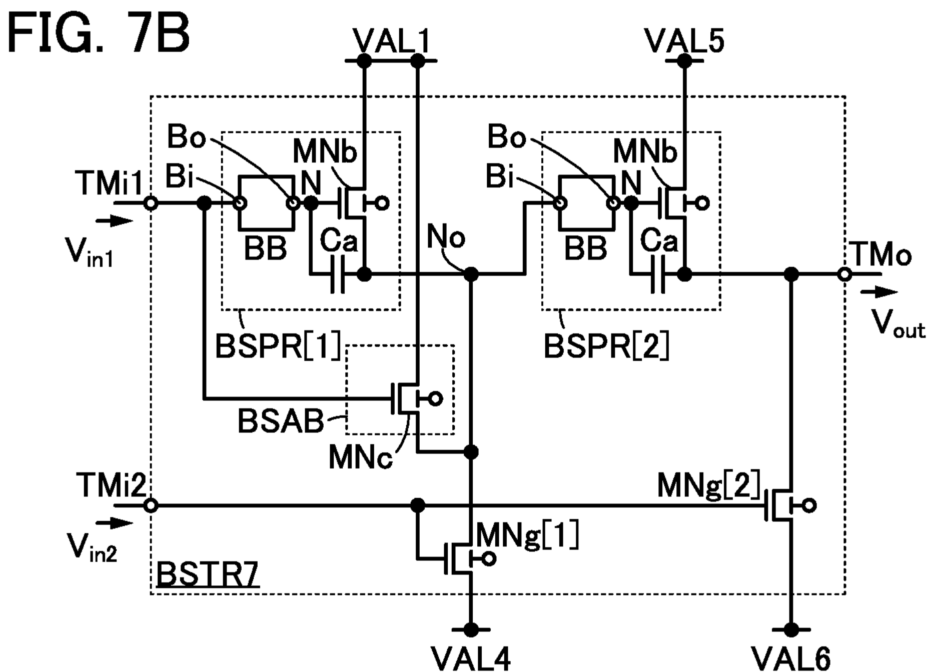

A circuit BSTR7 illustrated in FIG. 7B is a modification example of the circuit BSTR6 in FIG. 7A and different from the circuit BSTR6 in that the terminal Bi of the circuit BB in the circuit BSPR[2] is electrically connected not to the terminal TMi3 but to the second terminal of the transistor MNb and the second terminal of the capacitor Ca in the circuit BSPR[1], the second terminal of the transistor MNc in the circuit BSAB, and the first terminal of the transistor MNg[1]. The circuit BSTR7 is different from the circuit BSTR6 also in that the gate of the transistor MNg[2] is electrically connected not to the node No but to the terminal TMi2.

For the operation of the circuit BSPR[2] of the circuit BSTR7, the operation example of the circuit BSPR in FIG. 2B can be referred to. Specifically, the operation of the circuit BSPR[2] includes acquiring the potential of the node No and retaining the potential corresponding to the potential of the node No in the node N of the circuit BSPR[2].

When the potential input to the terminal TMi2 is the low-level potential $V_{Low}$ and the low-level potential $V_{Low}$ is supplied to the wiring VAL6, the transistor MNg[2] is turned off. Next, when the potential corresponding to the potential of the node No is retained in the node N of the circuit BSPR[2], the transistor MNb of the circuit BSPR[2] is turned on and electric charge from the wiring VAL5 is accumulated in the terminal TMo. Since a bootstrap occurs in the circuit BSPR[2], the potential of the terminal TMo increases to the high-level potential $V_{High}$ supplied through the wiring VAL5.

When the potential input to the terminal TMi2 is the high-level potential $V_{High}$, the transistor MNg[2] is turned on. Thus, electrical continuity is established between the terminal TMo and the wiring VAL6, so that the electric charge accumulated in the terminal TMo flows to the wiring VAL6, which makes the potential of the terminal TMo become the low-level potential $V_{Low}$. At this time, the potential of the gate of the transistor MNb in the circuit BSPR[2] is each set to the low-level potential $V_{Low}$, whereby the transistor MNb in the circuit BSPR[2] is turned off and electrical continuity is not established between the wiring VAL5 and the terminal TMo; hence, the potential of the terminal TMo can steeply drop to the low-level potential $V_{Low}$.

Next, another modification example of the circuit BSTR6, which is different from the circuit BSTR7, is described.

Figure 8:
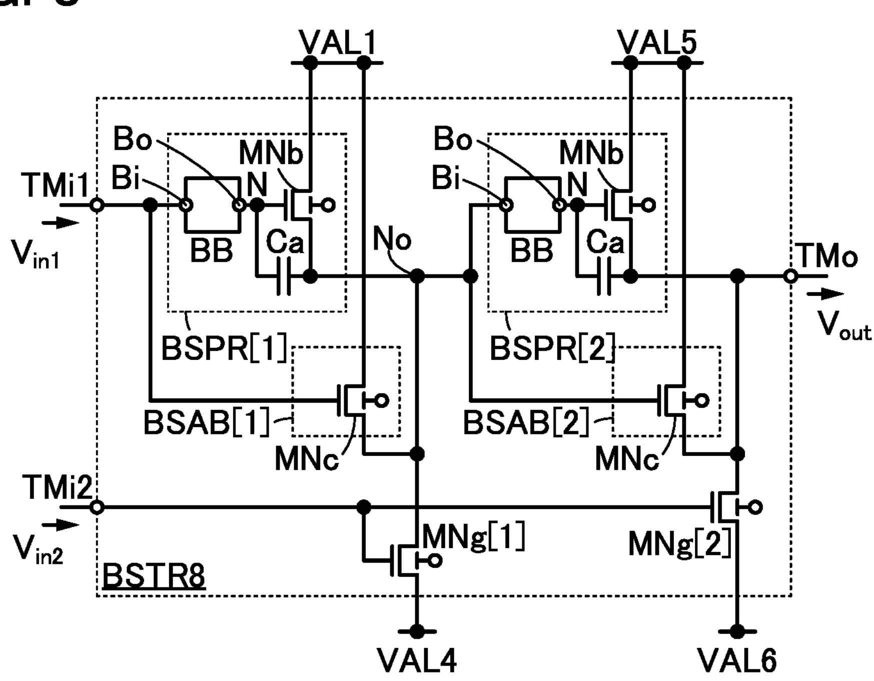
FIG. 8 is a circuit diagram showing an example of an amplifier circuit.

A circuit BSTR8 illustrated in FIG. 8 is a modification example of the circuit BSTR7 in FIG. 7B and different from the circuit BSTR7 in including two circuits BSAB.

The circuit BSTR8 includes a circuit BSAB[1] and a circuit BSAB[2] each having the same configuration as the circuit BSAB in FIG. 2A. In the circuit BSTR8 in FIG. 8, in particular, the circuit BSPR[1] corresponds to the circuit BSPR[1] included in the circuit BSTR7 in FIG. 7B.

The gate of the transistor MNc in the circuit BSAB[2] is electrically connected to the second terminal of the transistor MNb in the circuit BSPR[1], the second terminal of the capacitor Ca in the circuit BSPR[1], the second terminal of the transistor MNc in the circuit BSAB[1], the first terminal of the transistor MNg[1], and the terminal Bi of the circuit BB in the circuit BSPR[2]. The first terminal of the transistor MNc in the circuit BSAB[2] is electrically connected to the wiring VAL5. The second terminal of the transistor MNc in the circuit BSAB[2] is electrically connected to the second terminal of the transistor MNb in the circuit BSPR[2], the second terminal of the capacitor Ca in the circuit BSPR[2], the terminal TMo, and the first terminal of the transistor MNg[2].

In the circuit BSTR8, the circuit BSTR7 is provided with the circuit BSAB[2], and the circuit BSPR[2] performing a bootstrap and the circuit BSAB[2] not performing a bootstrap are electrically connected in parallel. Thus, for the operation of the circuit BSTR8, the operation example of the circuit BSTR7 can be referred to. In the circuit BSTR8, the potential of the terminal TMo can more steeply rise to the high-level potential $V_{High}$ than that in the circuit BSTR7.

Example of Application to Display Apparatus

Next, a driver circuit including the above-described circuit BSTR (including the amplifier circuits described in Configuration examples 1 to 6 of amplifier circuit) and a display apparatus including the driver circuit are described.

Figure 9:
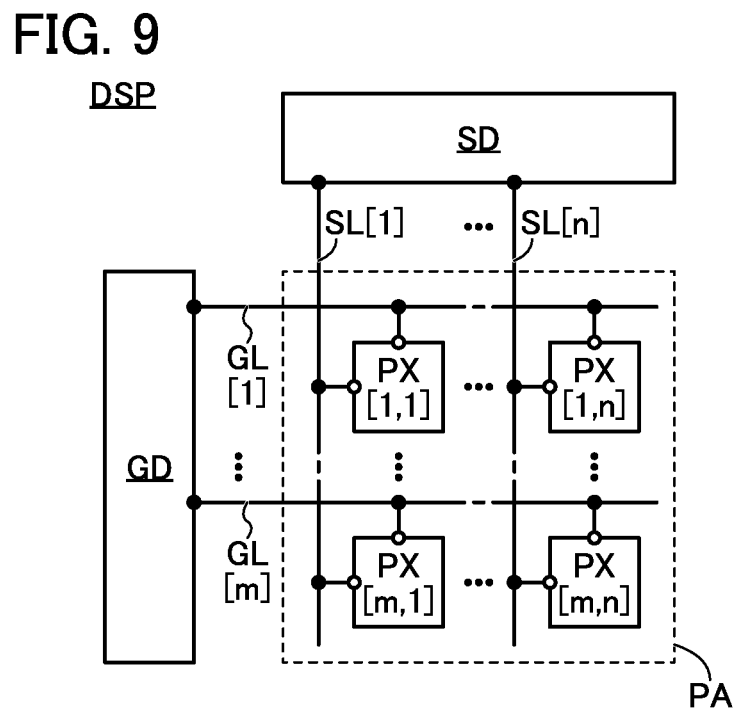

First, the display apparatus is described. FIG. 9 illustrates a configuration example of the display apparatus including the driver circuit including the amplifier circuit described above. As an example, a display apparatus DSP in FIG. 9 includes a driver circuit GD, a driver circuit SD, and a pixel array PA.

Note that in FIG. 9, the driver circuit GD, the driver circuit SD, the pixel array PA, a wiring GL[1], a wiring GL[m], a wiring SL[1], a wiring SL[n], a pixel circuit PX[1, 1], a pixel circuit PX[m, 1], a pixel circuit PX[1, n], and a pixel circuit PX[m, n] are selectively illustrated.

The pixel array PA includes a plurality of pixel circuits PX, for example. The pixel circuits PX are arranged in a matrix of m rows and n columns in the pixel array PA.

Note that the symbol accompanying the reference characters of the pixel circuit PX in FIG. 9 represents an address in the pixel circuit. For example, the symbol in the reference characters of the pixel circuit PX[1, 1] means that the pixel circuit PX is placed in the first row and the first column in the pixel array PA. For another example, the symbol in the reference characters of the pixel circuit PX[m, 1] means that the pixel circuit PX is placed in the m-th row and the first column in the pixel array PA. For another example, the symbol in the reference characters of the pixel circuit PX[1, n] means that the pixel circuit PX is placed in the first row and the n-th column in the pixel array PA. For another example, the symbol in the reference characters of the pixel circuit PX[m, n] means that the pixel circuit PX is placed in the m-th row and the n-th column in the pixel array PA.

The pixel circuit PX placed in the i-th row and the j-th column (i is an integer greater than or equal to 1 and less than or equal to m, and j is an integer greater than or equal to 1 and less than or equal to n) in the pixel array PA is referred to as a pixel circuit PX[i, j] (not illustrated). The pixel circuit PX[i, j] is electrically connected to a wiring GL[i], for example. The pixel circuit PX[i, j] is electrically connected to a wiring SL[j], for example.

The driver circuit GD is electrically connected to the wirings GL[1] to GL[m], for example. The driver circuit SD is electrically connected to the wirings SL[1] to SL[n], for example.

The wirings GL[1] to GL[m] are extended in the row direction in the pixel array PA, for example. Furthermore, the symbol [x] accompanying the reference characters of the wiring GL represents the number of the row in which the wiring is provided. For example, the reference of the wiring GL[1] represents a wiring provided in the first row in the pixel array PA. For another example, the reference of the wiring GL[m] represents a wiring provided in the m-th row in the pixel array PA.

The wirings SL[1] to SL[n] are extended in the column direction in the pixel array PA, for example. Furthermore, the symbol [y] accompanying the reference characters of the wiring GL represents the number of the column in which the wiring is provided. For example, the reference of the wiring GL[1] represents a wiring provided in the first column in the pixel array PA. For another example, the reference of the wiring GL[n] represents a wiring provided in the n-th column in the pixel array PA.

For example, one or more selected from a liquid crystal display device, a light-emitting device including an organic EL material, and a light-emitting device including a light-emitting diode (e.g., a micro LED) can be used in the pixel circuit PX. Note that in the description in this embodiment, the pixel circuit PX in the pixel array PA includes a light-emitting device including an organic EL material. The luminance of light emitted from a light-emitting device capable of high luminance light emission can be, for example, higher than or equal to 500 cd/m$^2$, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

The driver circuit GD has a function of selecting the pixel circuit PX to which image data is to be transmitted in the pixel array PA of the display apparatus DSP, for example. Accordingly, the driver circuit GD can be referred to as a gate driver circuit or the like.

The wiring GL, which electrically connects the driver circuit GD and the pixel circuit PX, serves as a wiring transmitting a selection signal. Note that the wiring GL may function as, for example, a wiring supplying a fixed potential, not a wiring transmitting a selection signal.

The driver circuit SD has a function of transmitting image data to the pixel circuit PX in the pixel array PA of the display apparatus DSP, for example. Accordingly, the driver circuit SD can be referred to as a source driver circuit or the like.

The wiring SL, which electrically connects the driver circuit SD and the pixel circuit PX, serves as a wiring transmitting image data as a signal. Note that the wiring SL may function as, for example, a wiring supplying a fixed potential, not a wiring transmitting image data.

Note that in the display apparatus DSP illustrated in FIG. 9, a wiring other than the wirings GL[1] to GL[m] and the wirings SL[1] to SL[n] may be provided. For example, a wiring supplying a fixed potential to the pixel circuit PX may be provided in the display apparatus DSP.

Configuration Example 1 of Driver Circuit GD

Figures 10A, 10B:
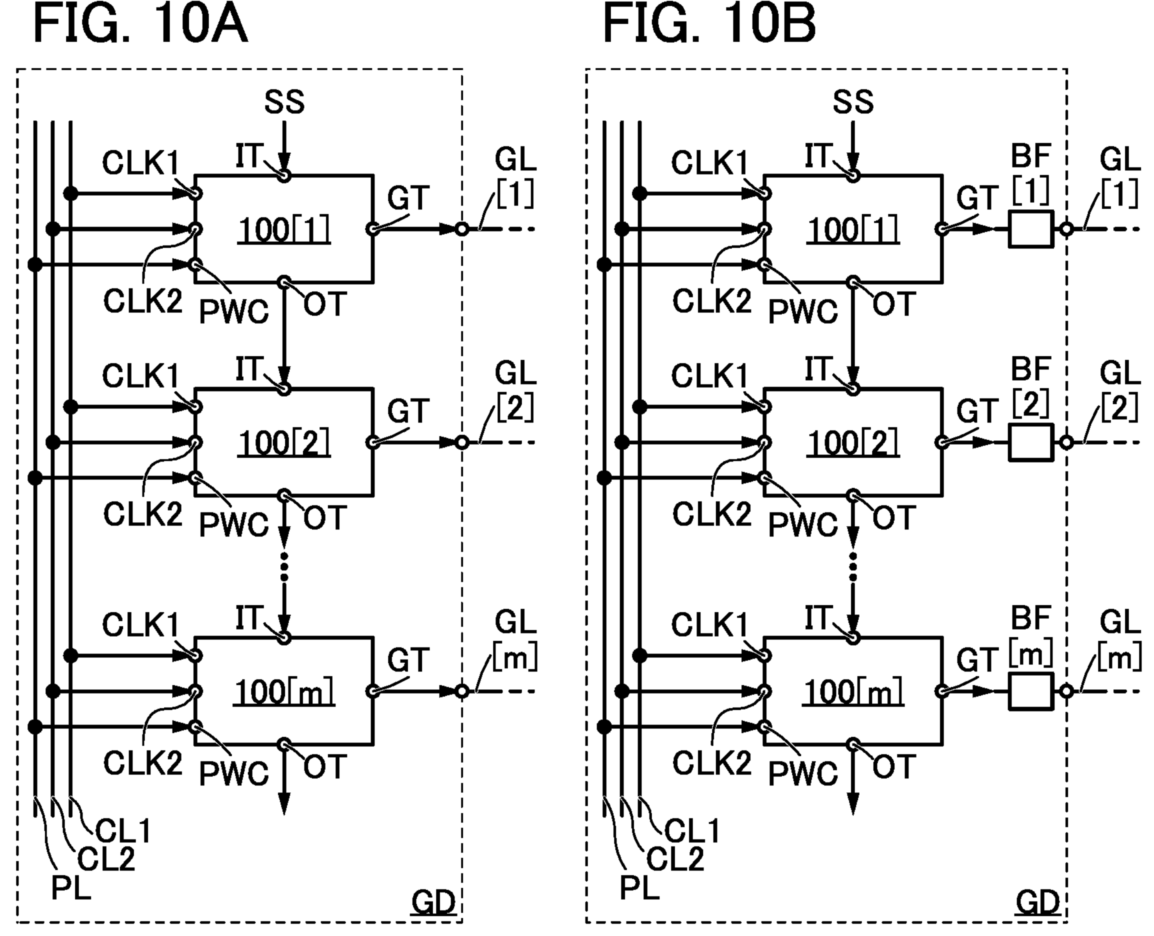
FIGS. 10A and 10B are block diagrams each showing an example of a driver circuit.

FIG. 10A illustrates a configuration example of the driver circuit GD of one embodiment of the present invention which can be used for the display apparatus DSP in FIG. 9. The driver circuit GD illustrated in FIG. 10A includes a circuit 100[1] to a circuit 100[*m*], for example.

Each of the circuits 100[1] to 100[*m*] includes, for example, a terminal IT, a terminal OT, a terminal CLK1, a terminal CLK2, a terminal GT, and a terminal PWC.

In each of the circuits 100[1] to 100[*m*], for example, the terminal CLK1 is electrically connected to a wiring CL1, the terminal CLK2 is electrically connected to a wiring CL2, and a terminal PWC is electrically connected to a wiring PL.

Each of the wirings CL1, CL2, and PL has, for example, a function of supplying a variable potential (referred to as a pulse voltage in some cases in this specification), such as a clock signal. Note that one or more of the wirings CL1, CL2, and PL may supply a fixed potential, not the variable potential.

The terminal OT of the circuit 100[*k*] (k is an integer greater than or equal to 1 and less than or equal to m−1) is electrically connected to the terminal IT of the circuit 100[*k*+1], for example.

The terminal GT of the circuit 100[*i*] is electrically connected to the wiring GL[i], for example.

Each of the circuits 100[1] to 100[*m*] has functions of, for example, retaining data input to the terminal IT and outputting the retained data to one or both of the terminals OT and GT.

For example, the circuit 100[*i*] has a function of outputting data retained in the circuit 100[*i*] to the terminal OT when the high-level potential is input to the terminal CLK1. For another example, the circuit 100[*i*] has a function of outputting data retained in the circuit 100[*i*] to the terminal GT when the high-level potential is input to the terminal PWC. For another example, the circuit 100[*i*] has a function of resetting data retained in the circuit 100[*i*] when the high-level potential is input to the terminal CLK2. The circuit 100[*i*] is preferably configured to retain new data that is input to the terminal IT of the circuit 100[*i*] after the data retained in the circuit 100[*i*] is reset.

As described above, in the circuits 100[1] to 100[*m*], data is input to the terminal IT of the circuit 100[1] and then a variable potential is input to the terminal CLK1 and the terminal CLK2 at an appropriate timing, whereby the data can be transmitted to the circuit 100[2] and the subsequent circuits 100[*m*]. Furthermore, data is input to the terminal IT of the circuit 100[1] and then a variable potential is input to the terminal PWC at an appropriate timing, whereby data retained in the circuits 100[1] to 100[*m*] can be output from the terminals GT of the circuits 100[1] to 100[*m*]. Accordingly, the configuration of the circuits 100[1] to 100[*m*] can be referred to as a shift register in this specification and the like.

The above-described data can be, for example, a selection signal for selecting the pixel circuit PX to which image data is to be written in the pixel array PA. Note that in FIG. 10A, the selection signal is illustrated as a signal SS.

Note that although the circuit 100[*m*] in the driver circuit GD in FIG. 10A includes the terminal OT, the circuit 100[*m*] is not necessarily provided with the terminal OT because the circuits 100[1] to 100[*m*] form a shift register.

The configuration of the driver circuit GD applicable to the display apparatus DSP in FIG. 9 is not limited to the configuration in FIG. 10A. For example, the driver circuit GD illustrated in FIG. 10B may be employed as the driver circuit GD applicable to the display apparatus DSP in FIG. 9. The driver circuit GD in FIG. 10B is different from the driver circuit GD in FIG. 10A in including circuits BF[1] to BF[m].

In the driver circuit GD in FIG. 10B, input terminals of the circuits BF[1] to BF[m] are electrically connected to the respective terminals GT of the circuits 100[1] to 100[*m*], and output terminals of the circuits BF[1] to BF[m] are electrically connected to the wirings GL[1] to GL[m], respectively.

Each of the circuits BF[1] to BF[m] can include an amplifier circuit such as a buffer circuit, an inverter circuit, or a latch circuit, for example. Specifically, each of the circuits BF[1] to BF[m] can have a function of referring to and amplifying a potential of the terminal GT and outputting the amplified potential to the wiring GL.

Note that a wiring other than the wiring CL1, the wiring CL2, and the wiring PL may be provided in the driver circuits GD illustrated in FIGS. 10A and 10B. For example, a wiring for supplying a fixed potential to drive the circuits 100[1] to 100[*m*] may be provided.

Configuration Example of Circuit 100A

A circuit 100A in FIG. 11 can be employed for each of the circuits 100[1] to 100[*m*] included in the driver circuit GD illustrated in each of FIGS. 10A and 10B.

The circuit 100A includes the circuits BSABa to BSABd, the circuits BSPRa to BSPRd, a transistor MN4, a transistor MN8, a transistor MN12, a transistor MN16, and a capacitor C5, for example. The circuit 100A further includes the terminals IT, PWC, CLK1, CLK2, GT, and OT, for example.

In the circuit 100A in FIG. 11, the circuit BSAB illustrated in FIG. 2A is employed for each of the circuits BSABa to BSABd. The circuit BSABa includes a transistor MN1, the circuit BSABb includes a transistor MN5, the circuit BSABc includes a transistor MN9, and the circuit BSABd includes a transistor MN13.

In the circuit 100A in FIG. 11, the circuit BSPR illustrated in FIG. 2B is employed for each of the circuits BSPRa to BSPRd. The circuit BSPRa includes a circuit BBa, a transistor MN3, and a capacitor C1. The circuit BSPRb includes a circuit BBb, a transistor MN7, and a capacitor C2. The circuit BSPRc includes a circuit BBc, a transistor iMN11, and a capacitor C3. The circuit BSPRd includes a circuit BBd, a transistor iMN15, and a capacitor C4.

For the circuits BBa to BBd, the description of the circuit BB included in the circuit BSPR in FIG. 2B can be referred to.

A gate of the transistor MN1 is electrically connected to the terminal Bi of the circuit BBa, a gate of the transistor MN8, and the terminal IT, and a first terminal of the transistor MN1 is electrically connected to a wiring VDE1. Agate of the transistor MN3 is electrically connected to the terminal Bo of the circuit BBa and the first terminal of the capacitor C1, and a first terminal of the transistor MN3 is electrically connected to the wiring VDE1. A second terminal of the transistor MN3 is electrically connected to a second terminal of the capacitor C1, a second terminal of the transistor MN1, a first terminal of the transistor MN4, the terminal Bi of the circuit BBc, a gate of the transistor MN9, the terminal Bi of the circuit BBd, and a gate of the transistor MN13.

A gate of the transistor MN5 is electrically connected to the terminal Bi of the circuit BBb and the terminal CLK2, and a first terminal of the transistor MN5 is electrically connected to a wiring VDE2. A gate of the transistor MN7 is electrically connected to the terminal Bo of the circuit BBb and the first terminal of the capacitor C2, and a first terminal of the transistor MN7 is electrically connected to the wiring VDE2. A second terminal of the transistor MN7 is electrically connected to a second terminal of the capacitor C2, a second terminal of the transistor MN5, a gate of the transistor MN4, a first terminal of the capacitor C5, a first terminal of the transistor MN8, a gate of the transistor MN12, and a gate of the transistor MN16.

A first terminal of the transistor MN9 is electrically connected to the terminal CLK1. A gate of the transistor MN11 is electrically connected to the terminal Bo of the circuit BBc and the first terminal of the capacitor C3, and a first terminal of the transistor MN11 is electrically connected to the wiring CLK1. A second terminal of the transistor MN11 is electrically connected to a second terminal of the capacitor C3, a second terminal of the transistor MN9, a first terminal of the transistor MN12, and the terminal OT.

A first terminal of the transistor MN13 is electrically connected to the terminal PWC. A gate of the transistor MN15 is electrically connected to the terminal Bo of the circuit BBd and the first terminal of the capacitor C4, and a first terminal of the transistor MN15 is electrically connected to the terminal PWC. A second terminal of the transistor MN15 is electrically connected to a second terminal of the capacitor C4, a second terminal of the transistor MN13, a first terminal of the transistor MN16, and the terminal GT.

A second terminal of the transistor MN4 is electrically connected to a wiring VSE1. A second terminal of the capacitor C5 is electrically connected to a wiring VSE2. A second terminal of the transistor MN8 is electrically connected to a wiring VSE3. A second terminal of the transistor MN12 is electrically connected to a wiring VSE4. A second terminal of the transistor MN16 is electrically connected to a wiring VSE5.

In FIG. 11, a node N1 is a point where the second terminal of the transistor MN1, a second terminal of the transistor MN3, the first terminal of the transistor MN4, the gate of the transistor MN9, the gate of the transistor MN13, the terminal Bi of the circuit BBc, the terminal Bi of the circuit BBd, and the second terminal of the capacitor C1 are electrically connected. In addition, in FIG. 11, a node N2 is a point where the second terminal of the transistor MN5, the second terminal of the transistor MN7, the gate of the transistor MN4, the first terminal of the transistor MN8, the gate of the transistor MN12, the gate of the transistor MN16, the second terminal of the capacitor C2, and the first terminal of the capacitor C5 are electrically connected.

As described above, the circuits BSABa to BSABd each correspond to the circuit BSAB illustrated in FIG. 2A, and the circuits BSPRa to BSPRd each correspond to the circuit BSPR illustrated in FIG. 2B. In other words, the circuit BSTR in FIG. 1A corresponds to the pair of circuits BSABa and BSPRa in FIG. 11, the pair of circuits BSABb and BSPRb in FIG. 11, the pair of circuits BSABc and BSPRc in FIG. 11, and the pair of circuits BSABd and BSPRd in FIG. 11.

Each of the wirings VDE1 and VDE2 serves as a wiring supplying a fixed potential, for example. The fixed potential can be a high-level potential, for example. Note that the wirings VDE1 and VDE2 may supply the same fixed potential or different fixed potentials. For example, in the case where the wirings VDE1 and VDE2 supply the same fixed potential, the wirings VDE1 and VDE2 may be a single wiring.

One or both of the wirings VDE1 and VDE2 may supply a variable potential, instead of a fixed potential.

Each of the wirings VSE1 to VSE5 serves as a wiring supplying a fixed potential, for example. The fixed voltage can be, for example, a low-level potential, the ground potential, or a negative potential. Note that the wirings VSE1 to VSE5 may supply the same fixed potential or different fixed potentials. Alternatively, two or more of the wirings VSE1 to VSE5 may supply the same fixed potential, and the other wiring(s) may supply a potential different from the fixed potential. Furthermore, the two or more of the wirings VSE1 to VSE5 which supply the same fixed potential may be a single wiring. For example, in the case where the wiring VSE1 and wiring VSE2 supply the same fixed potential, the wiring VSE1 and the wiring VSE2 may be a single wiring.

One or more of the wirings VSE1 to VSE5 may supply a variable potential, instead of a fixed potential.

As described above, since the circuit BSPR performing a bootstrap and the circuit BSAB not performing a bootstrap are connected in parallel as in the circuit 100A in FIG. 11, the potentials of the nodes N1 and N2 can rise steeply in the circuit 100A. The potentials output from the terminals GT and OT can also rise steeply.

Operation Example of Circuit 100A

Figure 12:
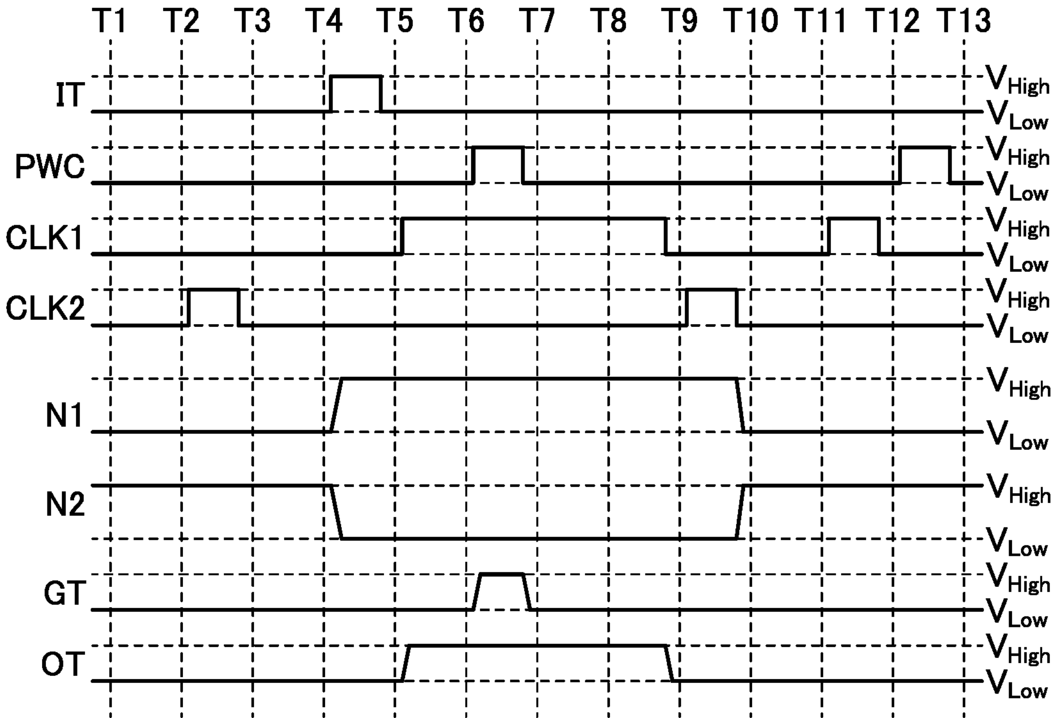
FIG. 12 is a timing chart showing an operation example of a circuit included in a driver circuit.

FIG. 12 is a timing chart showing an operation example of the circuit 100A. The timing chart in FIG. 12 shows, as an example, changes in potentials of the terminal IT, the terminal PWC, the terminal CLK1, the terminal CLK2, the node N1, the node N2, the terminal GT, and the terminal OT. In FIG. 12, high- and low-level potentials are expressed as $V_{High}$ and $V_{Low}$, respectively.

To simply describe the operation of the circuit 100A, the lengths and the like of an input period and an output period of a signal shown in the timing chart in FIG. 12 are different from those in the actual circuit operation in some cases.

In this operation example, the fixed potentials supplied by the wirings VDE1 and VDE2 are the same high-level potential $V_{High}$. The fixed potentials supplied by the wirings VSE1 to VSE5 are the same low-level potential $V_{Low}$.

Preferably, the high-level potential $V_{High}$ and the low-level potential $V_{Low}$ are each set such that a difference between the high-level potential $V_{High}$ and the low-level potential $V_{Low}$ is preferably greater than the threshold voltage of each of the transistors described in FIG. 11.

[From Time T1 to Time T2]

In a period from Time T1 to Time T2, $V_{Low}$ is supplied to the terminal IT, the low-level potential $V_{Low}$ is supplied to the terminal PWC, the low-level potential $V_{Low}$ is supplied to the terminal CLK1, and the low-level potential $V_{Low}$ is supplied to the terminal CLK2. At the node N2, the high-level potential $V_{High}$ is retained as an example.

It is assumed that when the low-level potential $V_{Low}$ is supplied to the terminal CLK2, the potential of the gate of each of the transistors MN5 and MN7 is the low-level potential $V_{Low}$. It is also assumed that the threshold voltage of each of the transistors MN5 and MN7 is within an appropriate range. Consequently, the transistors MN5 and MN7 are turned off.

The potential of the gate of the transistor MN4 (node N2) is the high-level potential $V_{High}$, and the second terminal of the transistor MN4 is supplied with the low-level potential $V_{Low}$ from the wiring VSE1, whereby the transistor MN4 is turned on. Thus, electrical continuity is established between the node N1 and the wiring VSE1, so that the potential of the node N1 becomes the low-level potential $V_{Low}$.

It is assumed that when the low-level potential $V_{Low}$ is supplied to the terminal IT, the potential of the gate of each of the transistors MN1 and MN3 is the low-level potential $V_{Low}$. It is also assumed that the threshold voltage of each of the transistors MN1 and MN3 is within an appropriate range. Consequently, the transistors MN1 and MN3 are turned off.

It is assumed that since the potential of the node N1 is the low-level potential $V_{Low}$, the potential of the gate of each of the transistors MN9 and MN11 is the low-level potential $V_{Low}$. It is also assumed that the threshold voltage of each of the transistors MN9 and MN11 is within an appropriate range. Consequently, the transistors MN9 and MN11 are turned off.

It is assumed that since the potential of the node N1 is the low-level potential $V_{Low}$, the potential of the gate of each of the transistors MN13 and MN15 is also the low-level potential $V_{Low}$. It is also assumed that the threshold voltage of each of the transistors MN13 and MN15 is within an appropriate range. Consequently, the transistors MN13 and MN15 are turned off.

The potential of the first gate of the transistor MN12 (the node N2) is the high-level potential $V_{High}$, and the second terminal of the transistor MN12 is supplied with the low-level potential $V_{Low}$ from the wiring VSE4, whereby the transistor MN12 is turned on. Thus, electrical continuity is established between the terminal OT and the wiring VSE4, so that the potential of the terminal OT becomes the low-level potential $V_{Low}$.

The potential of the gate of the transistor MN16 (node N2) is the high-level potential $V_{High}$, and the second terminal of the transistor MN16 is supplied with the low-level potential $V_{Low}$ from the wiring VSE5, whereby the transistor MN16 is turned on. Thus, electrical continuity is established between the terminal GT and the wiring VSE5, so that the potential of the terminal GT becomes the low-level potential $V_{Low}$.

The potential of the gate of the transistor MN8 (terminal IT) is the low-level potential $V_{Low}$, and the second terminal of the transistor MN8 is supplied with the low-level potential $V_{Low}$ from the wiring VSE3, whereby the transistor MN8 is turned off.

[From Time T2 to Time T3]

In a period from Time T2 to Time T3, the high-level potential $V_{High}$ is supplied to the terminal CLK2.

When the high-level potential $V_{High}$ is supplied to the terminal CLK2, the potential of the second terminal (node N2) of each of the transistors MN5 and MN7 becomes the high-level potential $V_{High}$ in accordance with the description of the circuit BSAB in FIG. 2A and the circuit BSPR in FIG. 2B.

In the period from Time T2 to Time T3, the terminal CLK2 is supplied with the high-level potential $V_{High}$ and then supplied with the low-level potential $V_{Low}$. It is thus assumed that the potential of the gate of each of the transistors MN5 and MN7 is the low-level potential $V_{Low}$ and the transistors MN5 and MN7 are turned off.

By the above operation, in the circuit 100A, the high-level potential $V_{High}$ is supplied to the terminal CLK2, whereby the potential of the node N2 can be refreshed to be the high-level potential $V_{High}$.

[From Time T3 to Time T4]

In a period from Time T3 to Time T4, the low-level potential $V_{Low}$ is supplied to the terminal IT, the low-level potential $V_{Low}$ is supplied to the terminal PWC, the low-level potential $V_{Low}$ is supplied to the terminal CLK1, and the low-level potential $V_{Low}$ is supplied to the terminal CLK2. Potentials input to the terminal IT, the terminal PWC, the terminal CLK1, and the terminal CLK2 in the period from Time T3 to Time T4 are equal to those in the period from Time T1 to Time T2; therefore, for an operation example of the circuit 100A in the period from Time T3 to Time T4, the description of the operation example in the period from Time T1 to Time T2 is referred to.

[From Time T4 to Time T5]

In a period from Time T4 to Time T5, the high-level potential $V_{High}$ is supplied to the terminal IT.

The high-level potential $V_{High}$ is supplied from the terminal IT to the gate of the transistor MN8, and $V_{Low}$ is supplied from the wiring VSE3 to the second terminal of the transistor MN8, whereby the transistor MN8 is turned on. Thus, electrical continuity is established between the node N2 and the wiring VSE3, so that the potential of the node N2 changes from the high-level potential $V_{High}$ to the low-level potential $V_{Low}$.

In the above manner, the potential of the gate of the transistor MN4 (the node N2) is the low-level potential $V_{Low}$ and the low-level potential $V_{Low}$ is supplied from the wiring VSE1 to the second terminal of the transistor MN4, whereby the transistor MN4 is turned off.

In the above manner, the potential of the gate of the transistor MN12 (the node N2) is the low-level potential $V_{Low}$ and the low-level potential $V_{Low}$ is supplied from the wiring VSE4 to the second terminal of the transistor MN12, whereby the transistor MN12 is turned off.

In the above manner, the potential of the gate of the transistor MN16 (the node N2) is the low-level potential $V_{Low}$ and the low-level potential $V_{Low}$ is supplied from the wiring VSE5 to the second terminal of the transistor MN16, whereby the transistor MN16 is turned off.

When the high-level potential $V_{High}$ is supplied to the terminal IT, the potential of the second terminal (node N1) of each of the transistors MN1 and MN3 becomes the high-level potential $V_{High}$ in accordance with the description of the circuit BSAB in FIG. 2A and the circuit BSPR in FIG. 2B.

In the period from Time T4 to Time T5, after the high-level potential $V_{High}$ is supplied to the terminal IT, the low-level potential $V_{Low}$ is supplied to the terminal IT. It is thus assumed that the potential of the gate of each of the transistors MN1 and MN3 is the low-level potential $V_{Low}$ and the transistors MN1 and MN3 are turned off.

$V_{Low}$ is supplied from the terminal IT to the gate of the transistor MN8, and the low-level potential $V_{Low}$ is supplied from the wiring VSE3 to the second terminal of the transistor MN8, whereby the transistor MN8 is turned off. Thus, the low-level potential $V_{Low}$ is retained in the node N2.

[From Time T5 to Time T6]

In a period from Time T5 to Time T6, the high-level potential $V_{High}$ is supplied to the terminal CLK1.

In a period from Time T4 to Time T6, the potential of the node N1 is the high-level potential $V_{High}$. When the high-level potential $V_{High}$ is supplied to the terminal CLK1, the potential of the second terminal (terminal OT) of each of the transistors MN9 and MN11 becomes the high-level potential $V_{High}$ in accordance with the description of the circuit BSAB in FIG. 2A and the circuit BSPR in FIG. 2B.

[From Time T6 to Time T7]

In a period from Time T6 to Time T7, $V_{High}$ is supplied to the terminal PWC.

In a period from Time T4 to Time T6, the potential of the node N1 is the high-level potential $V_{High}$. When the high-level potential $V_{High}$ is supplied to the terminal PWC, the potential of the second terminal (terminal GT) of each of the transistors MN13 and MN15 also becomes the high-level potential $V_{High}$ in accordance with the description of the circuit BSAB in FIG. 2A and the circuit BSPR in FIG. 2B.

In the period from Time T6 to Time T7, after the high-level potential $V_{High}$ is supplied to the terminal PWC, the low-level potential $V_{Low}$ is supplied thereto. Thus, the potential of the second terminal (the terminal GT) of each of the transistors MN13 and MN15 becomes the low-level potential $V_{Low}$ as in the operation example in the period from Time T5 to Time T6.

[From Time T8 to Time T9]

In a period from Time T8 to Time T9, the low-level potential $V_{Low}$ is supplied to the terminal CLK1.

Thus, the potential of the second terminal (the terminal OT) of each of the transistors MN9 and MN11 becomes the low-level potential $V_{Low}$ as in the operation example in the period from Time T4 to Time T5.

[From Time T9 to Time T10]

In a period from Time T9 to Time T10, the high-level potential $V_{High}$ is supplied to the terminal CLK2. At this time, operation of the circuit 100A in the period from Time T9 to Time T10 is the same as that in the period from Time T2 to Time T3.

For example, when the high-level potential $V_{High}$ is supplied to the terminal CLK2, the potential of the second terminal (node N2) of each of the transistors MN5 and MN7 becomes the high-level potential $V_{High}$ in accordance with the description of the circuit BSAB in FIG. 2A and the circuit BSPR in FIG. 2B. Thus, the transistors MN4, MN12, and MN16 are turned on, and each of the potentials of the node N1, the terminal OT, and the terminal GT becomes $V_{Low}$.

[After Time T10]

After Time T10, for example, a variable potential with the low-level potential $V_{Low}$ is input to the terminal CLK2 to set the potential of the node N1 to $V_{Low}$ and the potential of the node N2 to $V_{High}$, and after that, $V_{High}$ is supplied to the terminal CLK1 or the terminal PWC without input of $V_{High}$ to the terminal IT. A specific operation example is described below.

[From Time T11 to Time T12]

In a period from Time T11 to Time T12, $V_{High}$ is supplied to the terminal CLK1.

The potential of the gate of the transistor MN11 is $V_{Low}$, $V_{High}$ is supplied from the terminal CLK1 to the first terminal of the transistor MN11, and the potential of the second terminal of the transistor MN11 is $V_{Low}$. At this time, the potential of the second terminal of the transistor MN11 is lower than the potential of the first terminal thereof, so that the second terminal of the transistor MN11 serves as a source, and the transistor MN11 is turned off. Thus, electrical continuity is not established between the terminal CLK1 and the terminal OT.

The potential of the gate of the transistor MN12 is $V_{High}$, and the second terminal of the transistor MN12 is supplied with $V_{Low}$ from the wiring VSE4, whereby the transistor MN12 is turned on. Thus, electrical continuity is established between the terminal OT and the wiring VSE4, so that the potential of the terminal OT becomes $V_{Low}$.

In the period from Time T11 to Time T12, after $V_{High}$ is supplied to the terminal CLK1, $V_{Low}$ is supplied to the terminal CLK1. The potential of the first gate of the transistor MN11 is $V_{Low}$, the terminal of the transistor MN11 is supplied with $V_{Low}$ from the terminal CLK1, and the potential of the second terminal of the transistor MN11 is $V_{Low}$; thus, the transistor MN11 is turned off when the threshold voltage of the transistor MN11 is in an appropriate range.

The transistor MN11 remains off even when the variable potential with $V_{Low}$ is input to the terminal CLK2 to set the potential of the node N1 to $V_{Low}$ and the potential of the node N2 to $V_{High}$, and then $V_{High}$ is supplied to the terminal CLK1 without input of $V_{High}$ to the terminal IT as described above. After that, even when $V_{Low}$ is supplied to the terminal CLK1, the transistor MN11 remains off.

[From Time T12 to Time T13]

In a period from Time T12 to Time T13, $V_{High}$ is supplied to the terminal PWC.

The potential of the gate of the transistor MN15 is $V_{Low}$, $V_{High}$ is supplied from the terminal PWC to the first terminal of the transistor MN15, and the potential of the second terminal of the transistor MN15 is $V_{Low}$. At this time, the potential of the second terminal of the transistor MN15 is lower than the potential of the first terminal thereof, so that the second terminal of the transistor MN15 serves as a source and the transistor MN15 is turned off. Thus, electrical continuity is not established between the terminal PWC and the terminal GT.

The potential of the gate of the transistor MN16 is $V_{High}$, and the second terminal of the transistor MN16 is supplied with $V_{Low}$ from the wiring VSE5, whereby the transistor MN16 is turned on. Thus, electrical continuity is established between the terminal GT and the wiring VSE5, so that the potential of the terminal GT becomes $V_{Low}$.

In the period from Time T12 to Time T13, the terminal PWC is supplied with the high-level potential $V_{High}$ and then supplied with the low-level potential $V_{Low}$. The potential of the gate of each of the transistors MN13 and MN15 is $V_{Low}$, the first terminal thereof is supplied with $V_{Low}$ from the terminal PWC, and the potential of the second terminal of thereof is $V_{Low}$, whereby the transistors MN13 and MN15 are turned off.

The transistors MN13 and MN15 remain off even when the variable potential with $V_{Low}$ is input to the terminal CLK2 to set the potential of the node N1 to $V_{Low}$ and the potential of the node N2 to $V_{High}$, and then $V_{High}$ is supplied to the terminal PWC without input of $V_{High}$ to the terminal IT as described above. After that, even when $V_{Low}$ is supplied to the terminal PWC, the transistors MN13 and MN15 remain off.

Modification Example of Circuit 100A

For example, a circuit 100A1 in FIG. 13 may be employed for each of the circuits 100[1] to 100[*m*] of the driver circuit GD0.

The circuit 100A1 is a modification example of the circuit 100A in FIG. 11 and employs a configuration in which the circuit BSPR included in the circuit BSTR1 in FIG. 3A is employed for each of the circuits BSPRa to BSPRd. Thus, the circuit BBa includes the transistor MN2, the circuit BBb includes the transistor MN6, the circuit BBc includes the transistor MN10, and the circuit BBd includes the transistor MN14.

A gate of the transistor MN2 is electrically connected to the wiring VDE11, a gate of the transistor MN6 is electrically connected to a wiring VDE12, a gate of the transistor MN10 is electrically connected to a wiring VDE3, and a gate of the transistor MN14 is electrically connected to a wiring VDE4.

For each of the wirings VDE11, VDE12, VDE3, and VDE4, the description of the wirings VDE1 and VDE2 can be referred to. Note that the wirings VDE1 to VDE4, VDE11, and VDE12 may supply the same fixed potential or different fixed potentials. Alternatively, two or more of the wirings VDE1 to VDE4, VDE11, and VDE12 may supply the same fixed potential, and the other wiring(s) may supply a potential different from the fixed potential. Furthermore, the two or more of the wirings VDE1 to VDE4, VDE11, and VDE12 which supply the same fixed potential may be a single wiring.

As each of the circuits 100[1] to 100[*m*] in the driver circuit GD, for example, a circuit 100A2 illustrated in FIG. 14 may be used.

A circuit 100A2 is a modification example of the circuit 100A1 in FIG. 13 and different from the circuit 100A1 in not including the circuits BSABc and BSABd.

Since the circuit 100A2 is not provided with the circuit BSABc not performing a bootstrap to be paired with the circuit BSPRc performing a bootstrap, the potential rise of the terminal OT to a high-level potential might occur more slowly than that in the circuit 100A1. Since the circuit 100A2 is not provided with the circuit BSABd not performing a bootstrap to be paired with the circuit BSPRd performing a bootstrap, the potential rise of the terminal GT to a high-level potential might occur more slowly than that in the circuit 100A1. Meanwhile, since the circuit 100A2 is not provided with the circuits BSABc and BSABd, the circuit areas of the circuits 100[1] to 100[*m*] in the driver circuit GD can be reduced. In other words, in the case where the requirements for the driver circuit GD are not a high operation speed but an area reduction, the circuit 100A2 in FIG. 14 is preferably used as the circuits 100[1] to 100[*m*] in the driver circuit GD.

As each of the circuits 100[1] to 100[*m*] in the driver circuit GD, for example, a circuit 100A3 illustrated in FIG. 15 may be used.

The circuit 100A3 is a modification example of the circuit 100A1 in FIG. 13. In the circuit 100A3, the portion to which a back gate of each of the transistors MN1 to MN16 is connected is clearly specified.

In each of the transistors MN1 to MN3, MN5 to MN7, MN9 to MN11, and MN13 to MN15, the gate is electrically connected to the back gate. A back gate of the transistor MN4 is electrically connected to the wiring BG1. Aback gate of the transistor MN8 is electrically connected to the wiring BG2. The back gate of each of the transistors MN12 and MN16 is electrically connected to a wiring BG3.

Each of the wirings BG1 to BG3 serves as a wiring supplying a fixed potential, for example. The fixed voltage can be, for example, a low-level potential, the ground potential, or a negative potential. Note that the wirings BG1 to BG3 may supply the same fixed potential or different fixed potentials. In the case where two or more selected from the wirings BG1 to BG3 supply the same fixed potential, the two or more wirings may be a single wiring. One or more of the wirings BG1 to BG3 may supply a variable potential, not a fixed potential.

In the circuit 100A3 in FIG. 15, the back gate of the transistor MN4 is electrically connected to the wiring BG1, the back gate of the transistor MN8 is electrically connected to the wiring BG2, and the back gate of each of the transistors MN12 and MN16 is electrically connected to the wiring BG3. In the case where the wirings BG1 to BG3 are different from one another, different fixed potentials can be supplied to the back gates of the transistors MN4, MN8, MN12, and MN16. That is, the threshold voltages of the transistors MN4 and MN8 can be controlled independently of the threshold voltages of the transistors MN12 and MN16.

With this configuration, for example, when a negative potential is supplied to the back gate of the transistor MN4 and the ground potential or a low-level potential (a potential higher than the negative potential) is supplied to the back gates of the transistors MN12 and MN16, the amounts of off-state currents of the transistors MN12 and MN16 can be larger than the amount of an off-state current of the transistor MN4. Accordingly, in the case where the circuit 100A3 in FIG. 15 is employed for each of the circuits 100[1] to 100[*m*] in the driver circuit GD in each of FIGS. 10A and 10B, the driving speed of the driver circuit GD can be further increased.

Configuration Example of Circuit 100B

Figure 16:
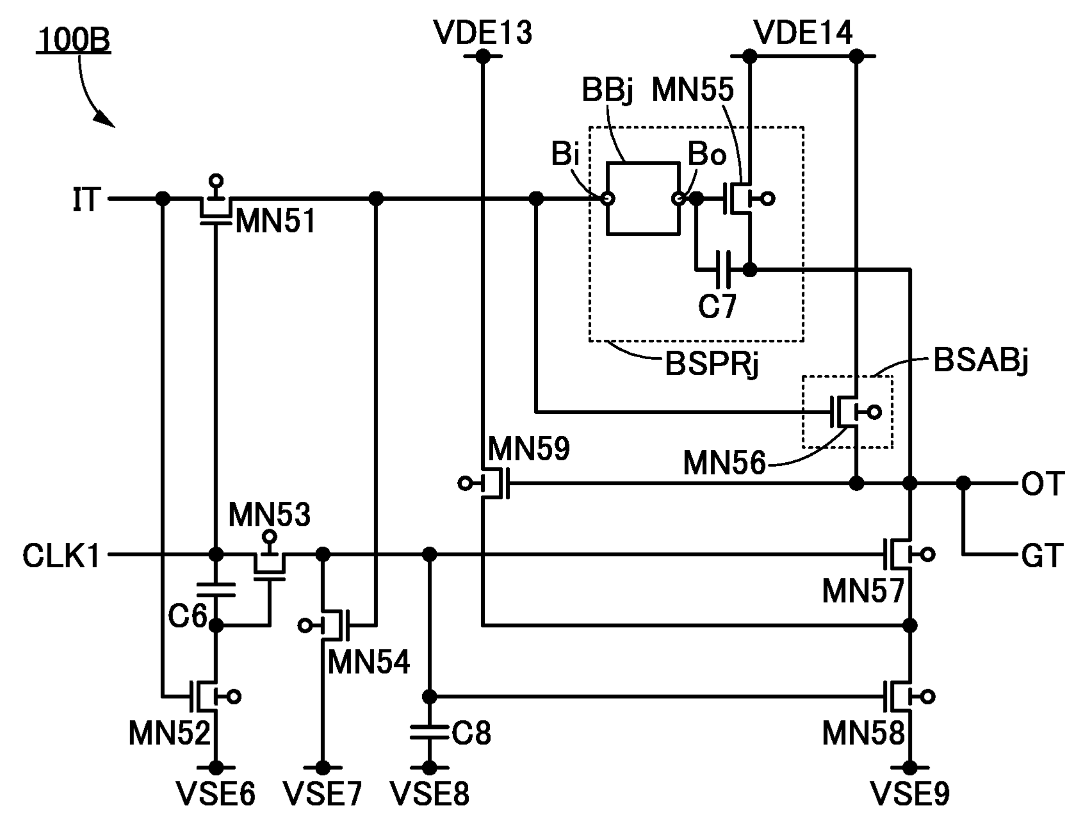
FIG. 16 is a circuit diagram showing an example of a circuit included in a driver circuit.

A circuit 100B in FIG. 16 is different from the circuits 100A and 100A1 to 100A3, and can be employed for each of the circuits 100[1] to 100[*m*] included in the driver circuit GD illustrated in each of FIGS. 10A and 10B.

For example, the terminals CLK2 and PWC illustrated in each of FIGS. 10A and 10B are not included in the circuit 100B in FIG. 16. In other words, the circuit 100B in FIG. 16 is not electrically connected to the wirings CL2 and PL, for example. Note that not a wiring VDE14 but the terminal PWC may be electrically connected to a first terminal of a transistor MN55 and a first terminal of a transistor MN56 illustrated in FIG. 16.

The circuit 100B includes a circuit BSPRj, a circuit BSABj, a transistor MN51 to a transistor MN54, a transistor MN57 to a transistor MN59, a capacitor C6, and a capacitor C8, for example. The circuit 100B further includes the terminals IT, CLK1, GT, and the OT, for example.

In the circuit 100B in FIG. 16, the circuit BSAB illustrated in FIG. 2A is employed for the circuit BSABj. The circuit BSABj includes a transistor MN56.

In the circuit 100B in FIG. 16, the circuit BSPR illustrated in FIG. 2A is employed for the circuit BSPRj. The circuit BSPR includes a circuit BBj, the transistor MN55, and a capacitor C7.

For the circuit BBj, the description of the circuit BB included in the circuit BSPR in FIG. 2B can be referred to.

A first terminal of the transistor MN51 is electrically connected to a gate of the transistor MN52 and the terminal IT. A second terminal of the transistor MN51 is electrically connected to a gate of the transistor MN54, a gate of the transistor MN56, and the terminal Bi of the circuit BBj. A gate of the transistor MN51 is electrically connected to a first terminal of the transistor MN53, a first terminal of the capacitor C6, and the terminal CLK1. A first terminal of the transistor MN52 is electrically connected to a gate the transistor MN53 and a second terminal of the capacitor C6, and a second terminal of the transistor MN52 is electrically connected to a wiring VSE6. A second terminal of the transistor MN53 is electrically connected to a first terminal of the transistor MN54, a gate of the transistor MN57, a gate of the transistor MN58, and a first terminal of the capacitor C8. A second terminal of the transistor MN54 is electrically connected to the wiring VSE7, and a second terminal of the capacitor C8 is electrically connected to the wiring VSE8.

A gate of the transistor MN55 is electrically connected to the terminal Bo of the circuit BBj and the first terminal of the capacitor C7, and a first terminal of the transistor MN55 is electrically connected to the wiring VDE14. The first terminal of the transistor MN56 is electrically connected to the wiring VDE14. A second terminal of the transistor MN55 is electrically connected to a second terminal the transistor MN56, a first terminal of the transistor MN57, a gate of the transistor MN59, and the terminals OT and GT. A first terminal of the transistor MN59 is electrically connected to the wiring VDE13, and a first terminal of the transistor MN59 is electrically connected to a second terminal of the transistor MN57 and a first terminal of the transistor MN58. A second terminal of the transistor MN58 is electrically connected to the wiring VSE9.

As described above, the circuit BSABj corresponds to the circuit BSAB illustrated in FIG. 2A, and the circuit BSPRj corresponds to the circuit BSPR illustrated in FIG. 2B. In other words, the pair of circuits BSABj and BSPRj in FIG. 16 corresponds to the circuit BSTR illustrated in FIG. 1A.

Each of the wirings VDE13 and VDE14 serves as a wiring supplying a fixed potential, for example. The fixed potential can be a high-level potential, for example. Note that the wirings VDE13 and VDE14 may supply the same fixed potential or different fixed potentials. For example, in the case where the wirings VDE13 and VDE14 supply the same fixed potential, the wirings VDE13 and VDE14 may be a single wiring.

One or both of the wirings VDE13 and VDE14 may supply a variable potential, instead of a fixed potential.

Each of the wirings VSE6 to VSE9 serves as a wiring supplying a fixed potential, for example. The fixed voltage can be, for example, a low-level potential, the ground potential, or a negative potential. Note that the wirings VSE6 to VSE9 may supply the same fixed potential or different fixed potentials. Alternatively, two or more of the wirings VSE6 to VSE9 may supply the same fixed potential, and the other wiring(s) may supply a potential different from the fixed potential. Furthermore, the two or more of the wirings VSE6 to VSE9 which supply the same fixed potential may be a single wiring. For example, in the case where the wirings VSE6 to VSE9 supply the same fixed potential, the wirings VSE6 to VSE9 may be a single wiring.

One or more of the wirings VSE6 to VSE9 may supply a variable potential, instead of a fixed potential.

As described above, since the circuit BSPRj performing a bootstrap and the circuit BSABj not performing a bootstrap are connected in parallel as in the circuit 100B in FIG. 16, the potentials output from the terminals GT and OT can rise steeply in the circuit 100B.

Configuration Example of Circuit 100C

Figure 17:
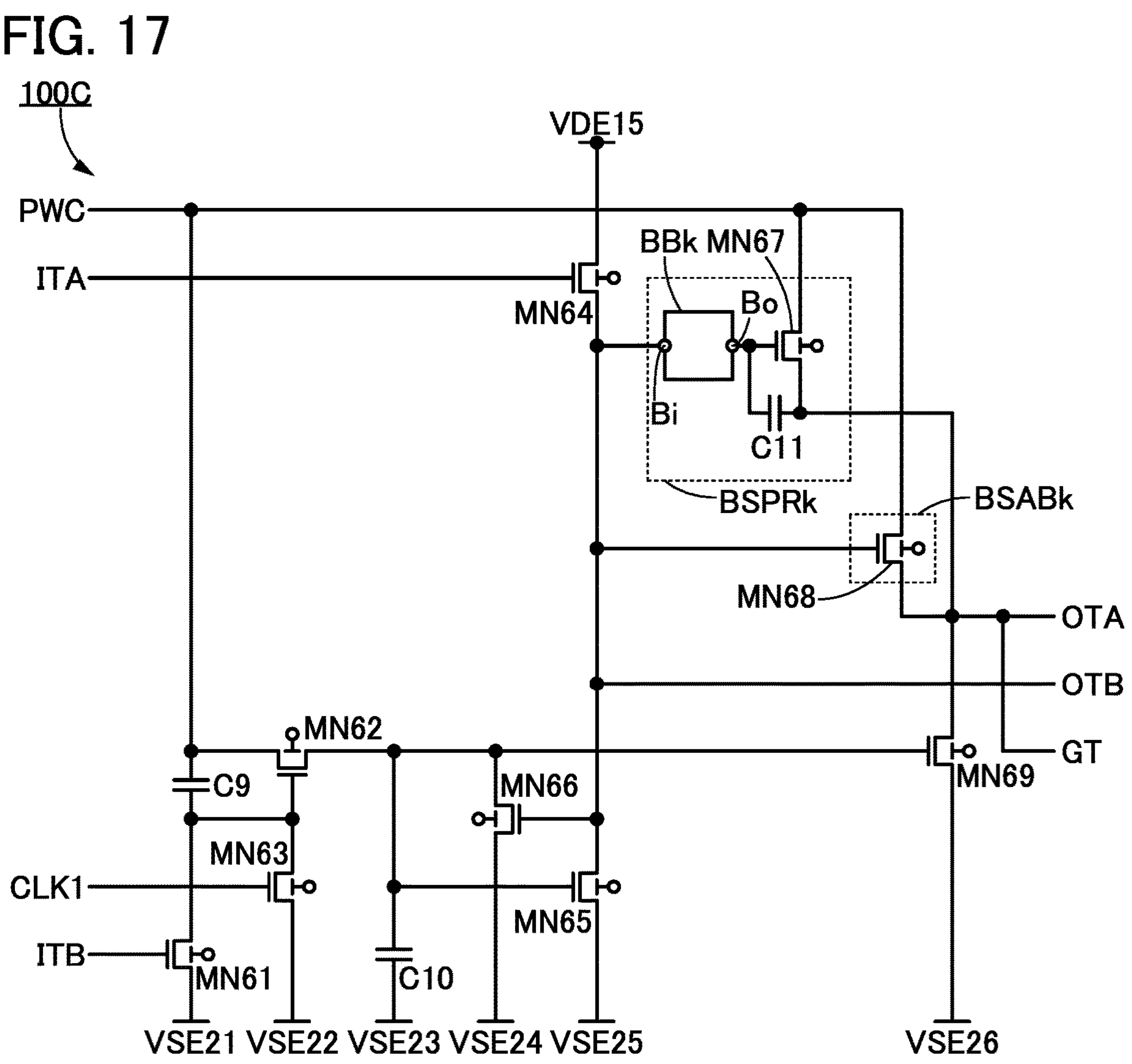
FIG. 17 is a circuit diagram showing an example of a circuit included in a driver circuit.

A circuit 100C in FIG. 17 is different from the circuits 100A, 100A1 to 100A3, and 100B, and can be employed for each of the circuits 100[1] to 100[*m*] included in the driver circuit GD illustrated in each of FIGS. 10A and 10B.

For example, the terminal CLK2 illustrated in each of FIGS. 10A and 10B is not included in the circuit 100C in FIG. 17. In other words, the circuit 100C in FIG. 17 is not electrically connected to the wiring CL2, for example.

A terminal ITA and a terminal ITB illustrated in FIG. 17 are terminals corresponding to the terminals IT illustrated in each of FIGS. 10A and 10B, and a terminal OTA and a terminal OTB illustrated in FIG. 17 are terminals corresponding to the terminals OT illustrated in each of FIGS. 10A and 10B. In other words, the terminals ITA and ITB serve as a pair of input terminals in the circuit 100C, and the terminals OTA and OTB serve as a pair of output terminals in the circuit 100C.

Specifically, in the case where the circuit 100C is used as the driver circuit GD illustrated in each of FIGS. 10A and 10B, the terminal OTA of the circuit 100C in the previous stage is electrically connected to the terminal ITA of the circuit 100C in the subsequent stage and the terminal OTB of the circuit 100C in the previous stage is electrically connected to the terminal ITB of the circuit 100C in the subsequent stage.

The circuit 100C includes a circuit BSABk, a circuit BSPRk, a transistor MN61 to a transistor MN66, a transistor MN69, a capacitor C9, and a capacitor C10, for example. The circuit 100C also includes the terminals PWC and GT, for example. The circuit 100C also includes the terminals ITA, ITB, OTA, and OTB, as described above.

In the circuit 100C in FIG. 17, the circuit BSAB illustrated in FIG. 2A is employed for the circuit BSABk. The circuit BSABk includes a transistor MN68.

In the circuit 100C in FIG. 17, the circuit BSPR illustrated in FIG. 2A is employed for the circuit BSPRk. The circuit BSPR includes a circuit BBk, the transistor MN67, and a capacitor C11.

For the circuit BBk, the description of the circuit BB included in the circuit BSPR in FIG. 2B can be referred to.

A gate of the transistor MN61 is electrically connected to the terminal ITB, and a gate of the transistor MN64 is electrically connected to the terminal ITA. A first terminal of the transistor MN62 is electrically connected to a first terminal of the capacitor C9, a first terminal of the transistor MN67, a first terminal of the transistor MN68, and the terminal PWC. A gate of the transistor MN63 is electrically connected to the terminal CLK1. The second terminal of the capacitor C9 is electrically connected to a first terminal of the transistor MN61, a gate of the transistor MN62, and a first terminal of the transistor MN63. A second terminal of the transistor MN62 is electrically connected to a gate of the transistor MN65, a first terminal of the transistor MN66, a gate of the transistor MN69, and a first terminal of the capacitor C10. A first terminal of the transistor MN64 is electrically connected to the wiring VDE15, and a second terminal of the transistor MN64 is electrically connected to the terminal Bi of the circuit BBk, a gate of the transistor MN68, a gate of the transistor MN66, a first terminal of the transistor MN65, and the terminal OTB.

A gate of the transistor MN67 is electrically connected to the terminal Bo of the circuit BBk and a first terminal of the capacitor C11. A second terminal of the transistor MN67 is electrically connected to a second terminal the transistor MN68, a first terminal of the transistor MN69, and the terminals OTA and GT.

A second terminal of the transistor MN61 is electrically connected to a wiring VSE21. A second terminal of the transistor MN63 is electrically connected to a wiring VSE22. A second terminal of the capacitor C10 is electrically connected to a wiring VSE23. A second terminal of the transistor MN66 is electrically connected to a wiring VSE24. A second terminal of the transistor MN65 is electrically connected to a wiring VSE25. A second terminal of the transistor MN69 is electrically connected to a wiring VSE26.

As described above, the circuit BSABk corresponds to the circuit BSAB illustrated in FIG. 2A, and the circuit BSPRk corresponds to the circuit BSPR illustrated in FIG. 2B. In other words, the pair of circuits BSABk and BSPRk in FIG. 17 corresponds to the circuit BSTR illustrated in FIG. 1A.

The wiring VDE15 serves as a wiring supplying a fixed potential, for example. The fixed potential can be a high-level potential, for example. The wiring VDE15 may supply a variable potential, instead of a fixed potential.

Each of the wirings VSE21 to VSE26 serves as a wiring supplying a fixed potential, for example. The fixed voltage can be, for example, a low-level potential, the ground potential, or a negative potential. Note that the wirings VSE21 to VSE26 may supply the same fixed potential or different fixed potentials. Alternatively, two or more of the wirings VSE21 to VSE26 may supply the same fixed potential, and the other wiring(s) may supply a potential different from the fixed potential. Furthermore, the two or more of the wirings VSE21 to VSE26 which supply the same fixed potential may be a single wiring. For example, in the case where the wirings VSE21 to VSE26 supply the same fixed potential, the wirings VSE21 to VSE26 may be a single wiring.

One or more of the wirings VSE21 to VSE26 may supply a variable potential, instead of a fixed potential.

As described above, since the circuit BSPRk performing a bootstrap and the circuit BSABk not performing a bootstrap are connected in parallel as in the circuit 100C in FIG. 17, the potentials output from the terminals GT and OTA can rise steeply in the circuit 100C.

Configuration Example of Driver Circuit SD

Next, a configuration example of the driver circuit SD is described.

Figure 18:
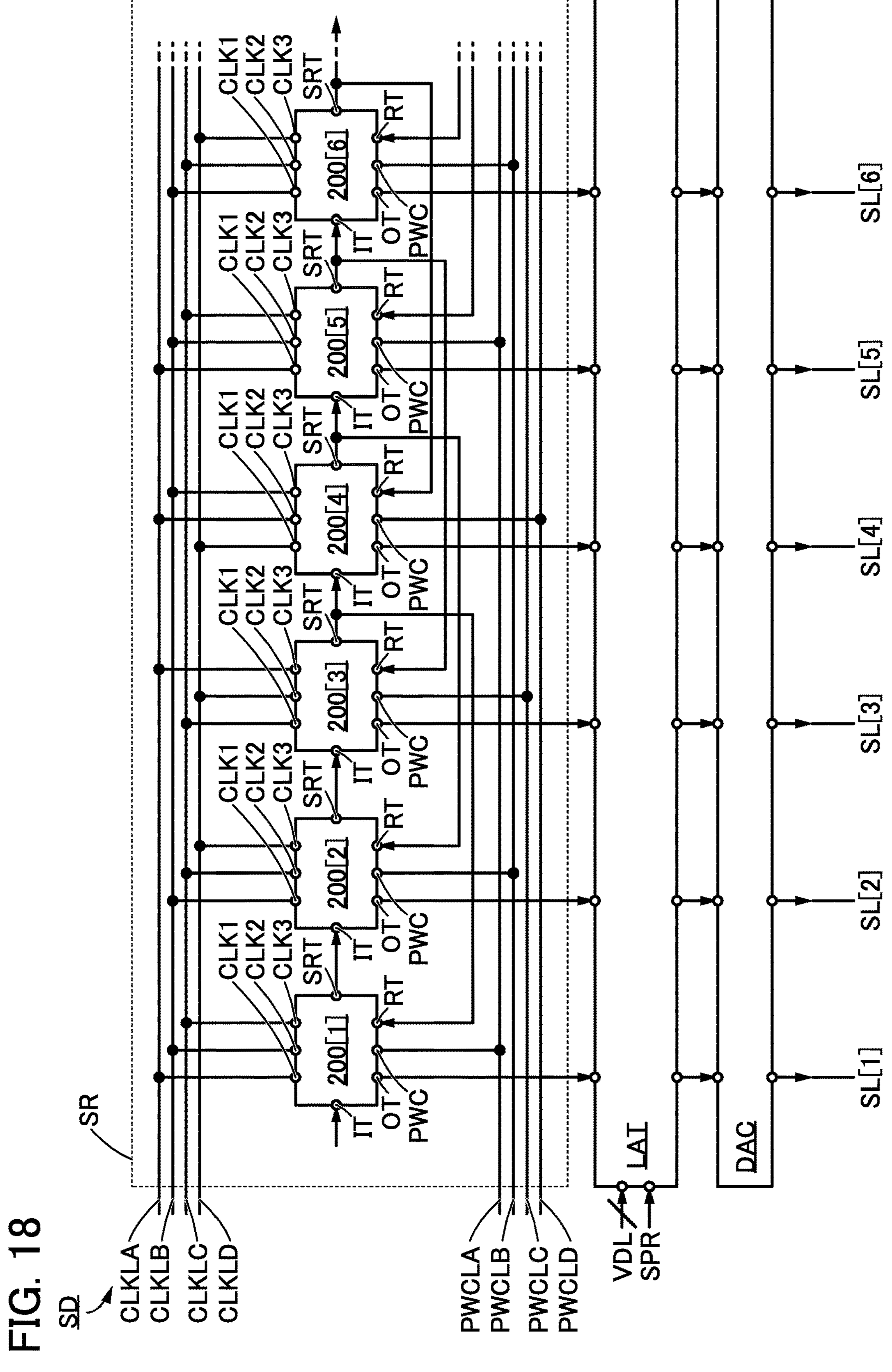
FIG. 18 is a block diagram showing an example of a driver circuit.

FIG. 18 illustrates a configuration example of the driver circuit SD of one embodiment of the present invention which can be used for the display apparatus DSP in FIG. 9. The driver circuit SD illustrated in FIG. 18 includes a circuit SR, a circuit LAT, and a circuit DAC, for example. Specifically, the circuit SR includes a circuit 200[1] to a circuit 200[*n*+2], for example. Note that the circuit 200[*n*+1] is a circuit for transmitting data from a terminal SRT of the circuit 200[*n*+1] to a terminal RT of a circuit 200[*n*−1], and the circuit 200[*n*+2] is a circuit for transmitting data from a terminal SRT of the circuit 200[*n*+2] to a terminal RT of a circuit 200[*n*]. FIG. 18 illustrates the circuit 200[1] to a circuit 200[6] extracted from the circuits 200[1] to 200[*n*+2].

Each of the circuits 200[1] to 200[*n*] includes, for example, the terminals IT, OT, CLK1, CLK2, SRT, PWC, and RT and a terminal CLK3.

In the circuit SR, a wiring CLKLA to a wiring CLKLD and a terminal PWCLA to a terminal PWCLD are extended.

In a circuit 200[4*j*−3], the terminal CLK1 is electrically connected to the wiring CLKLA, the terminal CLK2 is electrically connected to the wiring CLKLB, the terminal CLK3 is electrically connected to the wiring CLKLC, and the terminal PWC is electrically connected to the terminal PWCLA, where k is an integer greater than or equal to 1 and satisfies the formula: 1≤4j−3≤n). In a circuit 200[4*j*−2], the terminal CLK1 is electrically connected to the wiring CLKLB, the terminal CLK2 is electrically connected to the wiring CLKLC, the terminal CLK3 is electrically connected to the wiring CLKLD, and the terminal PWC is electrically connected to the terminal PWCLB, where j is an integer greater than or equal to 1 and satisfies the formula: 2≤4j−2≤n). In a circuit 200[4*j*−1], the terminal CLK1 is electrically connected to the wiring CLKLC, the terminal CLK2 is electrically connected to the wiring CLKLD, the terminal CLK3 is electrically connected to the wiring CLKLA, and the terminal PWC is electrically connected to the terminal PWCLC, where j is an integer greater than or equal to 1 and satisfies the formula: 3≤4j−1≤n). In a circuit 200[4*j*], the terminal CLK1 is electrically connected to the wiring CLKLD, the terminal CLK2 is electrically connected to the wiring CLKLA, the terminal CLK3 is electrically connected to the wiring CLKLB, and the terminal PWC is electrically connected to the terminal PWCLD, where j is an integer greater than or equal to 1 and satisfies the formula: 4≤4j≤n).

A terminal SRT of the circuit 200[*j*] (j is an integer greater than or equal to 1 and less than or equal to n) is electrically connected to the terminal IT of the circuit 200[*j*+1]. The terminal RT of the circuit 200[*j*] is electrically connected to the terminal SRT of a circuit 200[*j*+2].

The terminals OT of the circuits 200[1] to 200[*n*] are electrically connected to the respective input terminals of the circuit LAT. The output terminals of the circuit LAT are electrically connected to input terminals of the circuit DAC. The circuit LAT is electrically connected to a wiring VDL. The circuit LAT is electrically connected to the wiring SPR. Furthermore, output terminals of the circuit DAC are electrically connected to the wirings SL[1] to SL[6].

Each of the circuits 200[1] to 200[*n*] has functions of, for example, retaining data input to the terminal IT and outputting the retained data to one or both of the terminals OT and SRT.

For example, the circuit 200[*j*] has a function of outputting data retained in the circuit 200[*j*] to the terminal SRT when the high-level potential is input to the terminal CLK1. For another example, the circuit 200[*j*] has a function of outputting data retained in the circuit 200[*j*] to the terminal GT when the high-level potential is input to the terminal OT. For another example, the circuit 200[*j*] has a function of resetting data retained in the circuit 100[*i*] when a variable potential is input to the terminals CLK2 and CLK3 or the terminal RT or to the terminals CLK2, CLK3, and RT. The circuit 200[*j*] is preferably configured to retain new data that is input to the terminal IT of the circuit 200[*j*] after the data retained in the circuit 200[*j*] is reset.

Thus, the circuit SR illustrated in FIG. 18 serves as a shift register like the driver circuit GD illustrated in FIGS. 10A and 10B.

The wiring VDL serves as a wiring that transmits a video signal for display in the pixel circuit PX included in the pixel array PA, for example. Note that in FIG. 18, the wiring VDL is illustrated as a wiring that transmits digital data.

The circuit LAT includes retention circuits of n columns, for example. The circuit LAT has a function of retaining a video signals, which are input to the wiring VDL, in retention circuits in response to the signals from the terminals OT of the circuits 200[1] to 200[*n*]. Specifically, for example, when the potential of the terminal OT in the circuit 200[*j*] is a high-level potential, the circuit LAT retains the video signal, which is input to the wiring VDL, in the retention circuit of the j-th column. For example, the circuit LAT has a function of collectively outputting the video signals, which are retained in the retention circuits of the n columns, to the output terminals of the circuit LAT when a high-level potential is input to the wiring SPR.

The circuit DAC has a function of converting a video signal which is digital data output from the output terminals of the circuit LAT into analog data (analog potential), for example. Note that the analog data (analog potential) is transmitted to the wiring SL in the column.

A wiring other than the wirings CLKLA to CLKLD and the wirings PWCLA to PWCLD may be provided in the driver circuit SD illustrated in FIG. 18. The configuration of the driver circuit SD illustrated in FIG. 18 is an example, and the number of wirings, electrical connections, and the like may be modified as appropriate.

Figure 19:
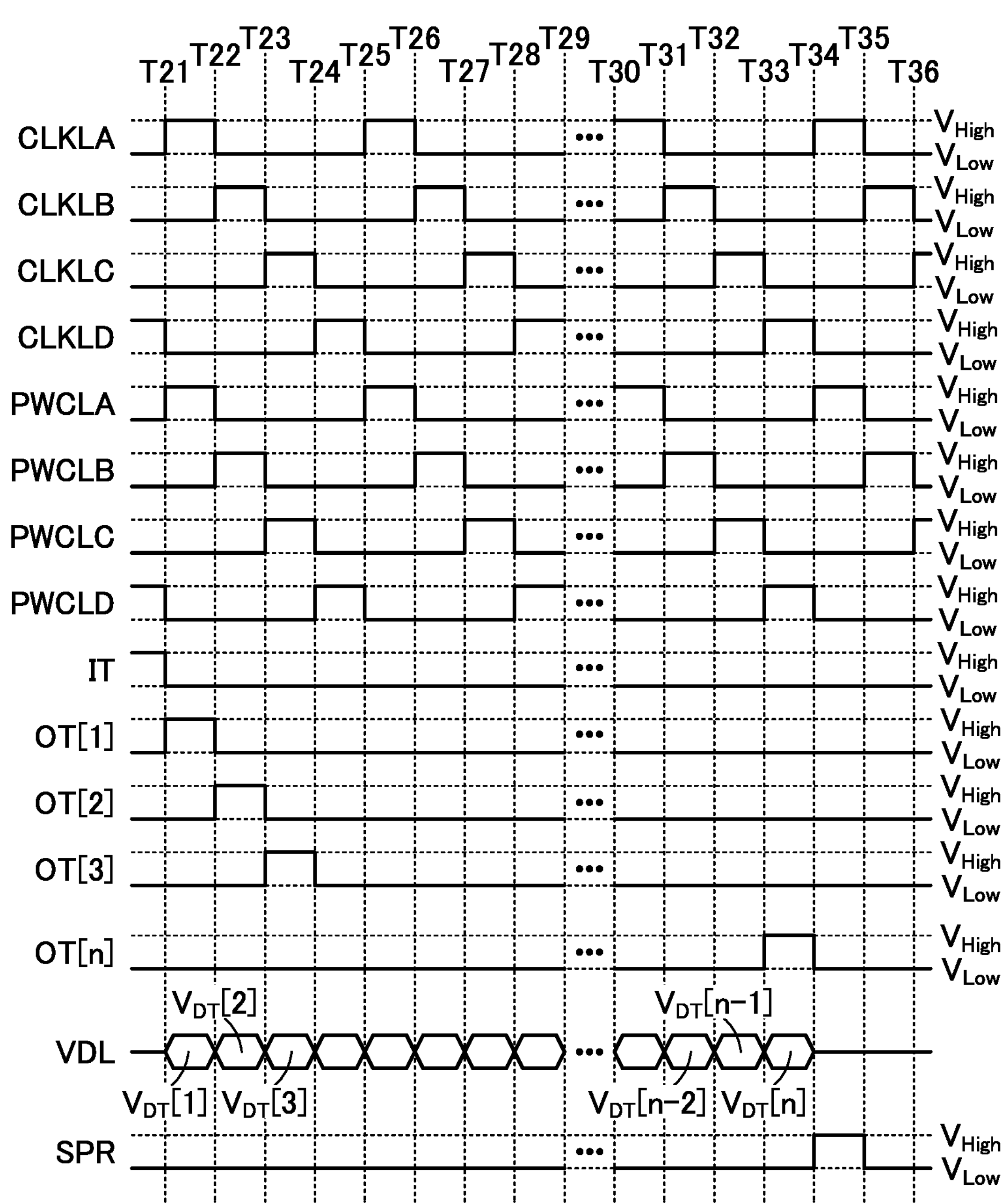
FIG. 19 is a timing chart showing an operation example of a driver circuit.

FIG. 19 is a timing chart showing an operation example of the driver circuit SD. FIG. 19 shows potential changes of the wirings CLKLA to CLKLD and PWCLA to PWCLD, the terminals IT, OT[1], OT[2], OT[3], OT[n], and the wiring SPR in the period from Time T21 to Time T36 and around the period. Note that a terminal OT[j] is the terminal OT included in the circuit 200[*j*]. In the example shown in FIG. 19, a video signal $V_{DT}$[1] to a video signal $V_{DT}$[n] are sequentially input to the wiring VDL.

In the period from Time T21 to Time T22, the high-level potential $V_{High}$ is supplied to the wirings CLKLA and PWCLA. In the period from Time T22 to Time T23, the high-level potential $V_{High}$ is supplied to the wirings CLKLB and PWCLB. In the period from Time T23 to Time T24, the high-level potential $V_{High}$ is supplied to the wirings CLKLC and PWCLC. In the period from Time T24 to Time T25, the high-level potential $V_{High}$ is supplied to the wirings CLKLD and PWCLD. In the period after Time T25, the high-level potential $V_{High}$ is supplied to the wirings CLKLA to CLKLD and PWCLA to PWCLD as in the period from Time T21 to Time T25.

Since the high-level potential $V_{High}$ is supplied to the wirings CLKLA to CLKLD and PWCLA to PWCLD at the above timings, the terminals OT[1] to OT[n] sequentially output the high-level potential $V_{High}$ at predetermined timings when the high-level potential $V_{High}$ is supplied to the terminal IT in the period before Time T21. For example, the terminal OT[1] outputs the high-level potential $V_{High}$ in the period from Time T21 to Time T22, the terminal OT[2] outputs the high-level potential $V_{High}$ in the period from Time T22 to Time T23, and the terminal OT[3] outputs the high-level potential $V_{High}$ in the period from Time T23 to Time T24. For example, the terminal OT[n−2] outputs the high-level potential $V_{High}$ in the period from Time T31 to Time T32, the terminal OT[n−1] outputs the high-level potential $V_{High}$ in the period from Time T32 to Time T33, and the terminal OT[n] outputs the high-level potential $V_{High}$ in the period from Time T33 to Time T34.

The circuit LAT retains the video signal $V_{DT}$[1], which is input to the wiring VDL, in the retention circuit of the first column at the timing when the high-level potential $V_{High}$ is output from the terminal OT[1]. The circuit LAT retains the video signal $V_{DT}$[2], which is input to the wiring VDL, in the retention circuit of the second column at the timing when the high-level potential $V_{High}$ is output from the terminal OT[2], and retains the video signal $V_{DT}$[3], which is input to the wiring VDL, in the retention circuit of the third column at the timing when the high-level potential $V_{High}$ is output from the terminal OT[3]. Similar operations are sequentially continued, and the circuit LAT retains the video signal $V_{DT}$[n], which is input to the wiring VDL, in the retention circuit of the n-th column at the timing when the high-level potential $V_{High}$ is output from the terminal OT[n].

When the potential of the wiring SPR changes to the high-level potential $V_{High}$ in the period from Time T34 to Time T35, the circuit LAT outputs the video signals $V_{DT}$[1] to $V_{DT}$[n], which have been retained in the retention circuits of the n columns in the circuit LAT, to the circuit DAC through the output terminals of the circuit LAT.

The driver circuit SD is capable of transmitting the video signals to the pixel circuits in the pixel array PA by performing the above operation as an example in the timing chart in FIG. 19.

Configuration Example of Circuit 200A

Figure 20:
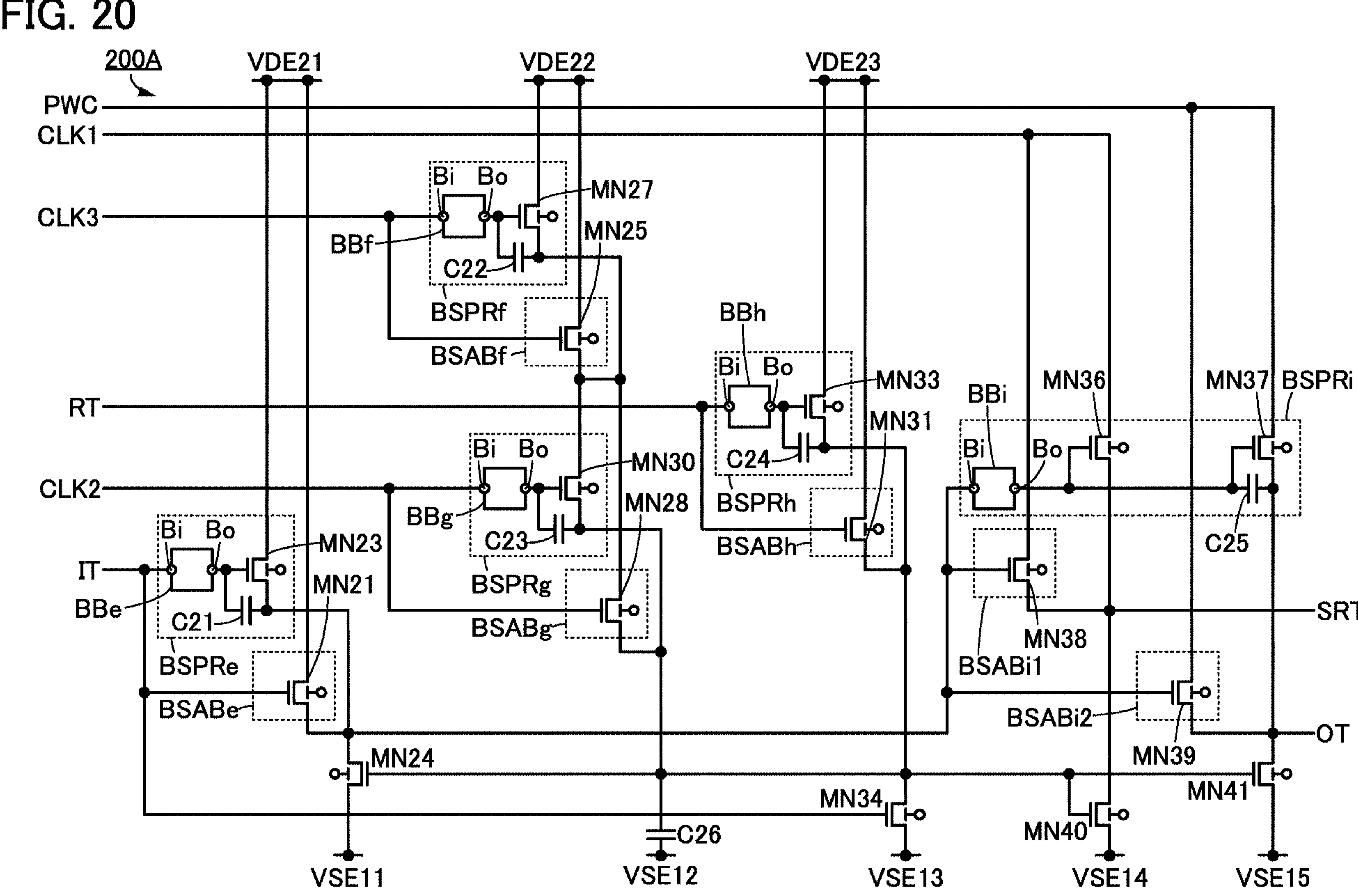
FIG. 20 is a circuit diagram showing an example of a circuit included in a driver circuit.

A circuit 200A in FIG. 20 has a circuit configuration that can be used as the circuits 200[1] to 200[*n*] included in the driver circuit SD.

The circuit 200A includes, for example, a circuit BSABe to a circuit BSABh, a circuit BSABi1, a circuit BSABi2, a circuit BSPRe to a circuit BSPRi, a transistor MN24, a transistor MN34, a transistor MN40, a transistor MN41, and a capacitor C26. The circuit 200A further includes the terminals IT, PWC, CLK1, CLK2, CLK3, RT, SRT, and OT, for example.

In the circuit 200A in FIG. 20, the circuits BSABe to BSABh, BSABi1, and BSABi2 each employ the circuit BSAB illustrated in FIG. 2A. The circuit BSABe includes a transistor MN21, the circuit BSABf includes a transistor MN25, the circuit BSABg includes a transistor MN28, the circuit BSABh includes a transistor MN31, the circuit BSABi1 includes a transistor MN38, and the circuit BSABi2 includes a transistor MN39.

In the circuit 200A in FIG. 20, the circuit BSPR illustrated in FIG. 2B is employed for each of the circuits BSPRe to BSPRi. The circuit BSPRe includes a circuit BBe, a transistor MN23, and a capacitor C21, the circuit BSPRf includes a circuit BBf, a transistor MN27, and a capacitor C22, the circuit BSPRg includes a circuit BBg, a transistor MN30, and a capacitor C23, the circuit BSPRh includes a circuit BBh, a transistor MN33, and a capacitor C24, and the circuit BSPRi includes a circuit BBi, a transistor MN36, a transistor MN37, and a capacitor C25.

For the circuits BBe to BBi, the description of the circuit BB included in the circuit BSPR in FIG. 2B can be referred to.

A gate of the transistor MN21 is electrically connected to the terminal Bi of the circuit BBe, a gate of the transistor MN34, and the terminal IT, and a first terminal of the transistor MN21 is electrically connected to a wiring VDE21. A gate of the transistor MN23 is electrically connected to the terminal Bo of the circuit BBe and a first terminal of the capacitor C21, and a first terminal of the transistor MN23 is electrically connected to the wiring VDE21. A second terminal of the transistor MN23 is electrically connected to a second terminal of the capacitor C21, a second terminal of the transistor MN21, a first terminal of the transistor MN24, a gate of the transistor MN38, a gate of the transistor MN39, and the terminal Bi of the circuit BBi.

A gate of the transistor MN25 is electrically connected to the terminal Bi of the circuit BBf and the terminal CLK3, and a first terminal of the transistor MN25 is electrically connected to a wiring VDE22. Agate of the transistor MN27 is electrically connected to the terminal Bo of the circuit BBf and a first terminal of the capacitor C22, and a first terminal of the transistor MN27 is electrically connected to the wiring VDE22. A second terminal of the transistor MN27 is electrically connected to a second terminal of the capacitor C22, a second terminal of the transistor MN25, a first terminal of the transistor MN28, and a first terminal of the transistor MN30.

A gate of the transistor MN28 is electrically connected to the terminal Bi of the circuit BBg and the terminal CLK2. A gate of the transistor MN30 is electrically connected to the terminal Bo of the circuit BBg and a first terminal of the capacitor C23.

A gate of the transistor MN31 is electrically connected to the terminal Bi of the circuit BBh and the terminal RT, and a first terminal of the transistor MN31 is electrically connected to a wiring VDE23. A gate of the transistor MN33 is electrically connected to the terminal Bo of the circuit BBh and the first terminal of the capacitor C24, and a first terminal of the transistor MN33 is electrically connected to the wiring VDE23. A second terminal of the transistor MN33 is electrically connected to a second terminal of the capacitor C24, a second terminal of the transistor MN31, a second terminal of the transistor MN30, a second terminal of the capacitor C23, a second terminal of the transistor MN28, a gate of the transistor MN24, a first terminal of the capacitor C26, a first terminal of the transistor MN34, a gate of the transistor MN40, and a gate of the transistor MN41.

A first terminal of the transistor MN38 is electrically connected to the terminal CLK1. A gate of the transistor MN36 is electrically connected to the terminal Bo of the circuit BBi, the first terminal of the capacitor C25, and the gate of the transistor MN37, and a first terminal of the transistor MN36 is electrically connected to the wiring CLK1. A second terminal of the transistor MN36 is electrically connected to a second terminal the transistor MN38, a first terminal of the transistor MN40, and the terminal SRT. A second terminal of the transistor MN37 is electrically connected to a second terminal of the capacitor C25, a second terminal of the transistor MN39, a first terminal of the transistor MN41, and the terminal OT.

A second terminal of the transistor MN24 is electrically connected to a wiring VSE11. A second terminal of the capacitor C26 is electrically connected to a wiring VSE12. A second terminal of the transistor MN34 is electrically connected to a wiring VSE13. A second terminal of the transistor MN40 is electrically connected to a wiring VSE14. A second terminal of the transistor MN41 is electrically connected to a wiring VSE15.

As described above, the circuits BSABe to BSABh each correspond to the circuit BSAB illustrated in FIG. 2A, and the circuits BSPRe to BSPRh each correspond to the circuit BSPR illustrated in FIG. 2B. In other words, the circuit BSTR in FIG. 1A corresponds to the pair of circuits BSABe and BSPRe in FIG. 20, the pair of circuits BSABf and BSPRf in FIG. 20, the pair of circuits BSABg and BSPRg in FIG. 20, and the pair of circuits BSABh and BSPRh in FIG. 20.

The transistor MN38 of the circuit BSABi1 is electrically connected to the transistor MN36 of the circuit BSPRi in parallel. Hence, a pair of the circuit BSABi1 and part of the circuit BSPRi corresponds to the circuit BSTR illustrated in FIG. 1A. In addition, the transistor MN39 of the circuit BSABi2 is electrically connected to the transistor MN37 of the circuit BSPRi in parallel. Hence, a pair of the circuit BSABi2 and part of the circuit BSPRi corresponds to the circuit BSTR illustrated in FIG. 1A.

For the wirings VDE21 to VDE23, the description of the wirings VDE11, VDE12, VDE3, and VDE4 can be referred to, for example.

For the wirings VSE11 to VSE15, the description of the wirings VSE11 to VSE15 can be referred to, for example.

As described above, since the circuit BSPR performing a bootstrap and the circuit BSAB not performing a bootstrap are connected in parallel as in the circuit 200A in FIG. 20, the potentials output from the terminals SRT and OT can rise steeply.

Modification Example of Circuit 200A

Figure 21:
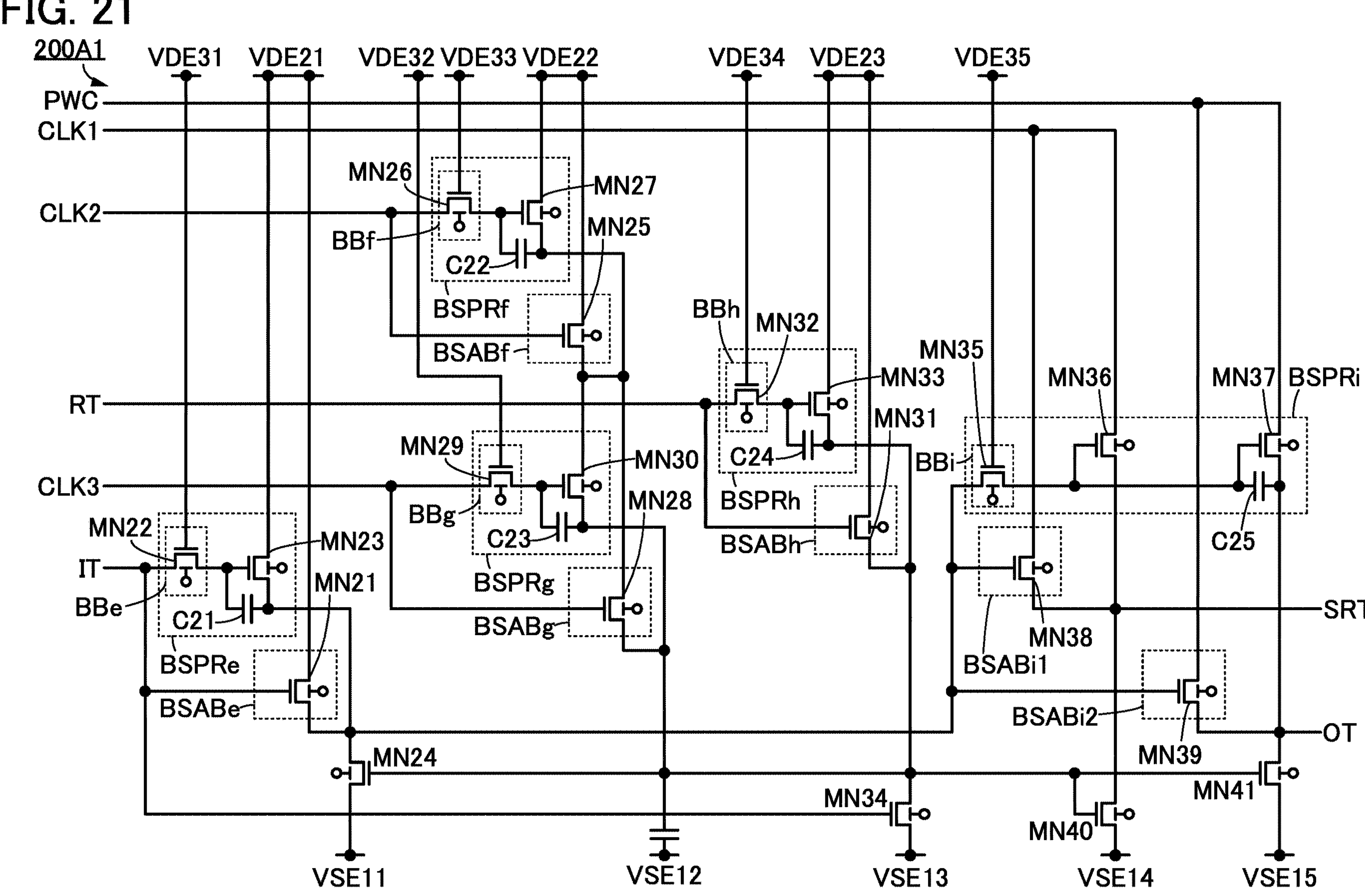
FIG. 21 is a circuit diagram showing an example of a circuit included in a driver circuit.

For example, a circuit 200A1 in FIG. 21 may be employed for each of the circuits 200[1] to 200[*n*] of the driver circuit SD.

The circuit 200A1 is a modification example of the circuit 200A in FIG. 20 and employs a configuration in which the circuit BSPR included in the circuit BSTR1 in FIG. 3A is employed for each of the circuits BSPRe to BSPRi. Thus, the circuit BBe includes the transistor MN22, the circuit BBf includes the transistor MN26, the circuit BBg includes the transistor MN29, the circuit BBh includes the transistor MN32, and the circuit BBi includes the transistor MN35.

A gate of the transistor MN22 is electrically connected to a wiring VDE31. A gate of the transistor MN26 is electrically connected to a wiring VDE33. A gate of the transistor MN29 is electrically connected to a wiring VDE32. A gate of the transistor MN32 is electrically connected to a wiring VDE34. A gate of the transistor MN35 is electrically connected to a wiring VDE35.

For the wirings VDE31 to VDE35, the description of the wirings VDE11, VDE12, VDE3, and VDE4 can be referred to, for example.

Figure 22:
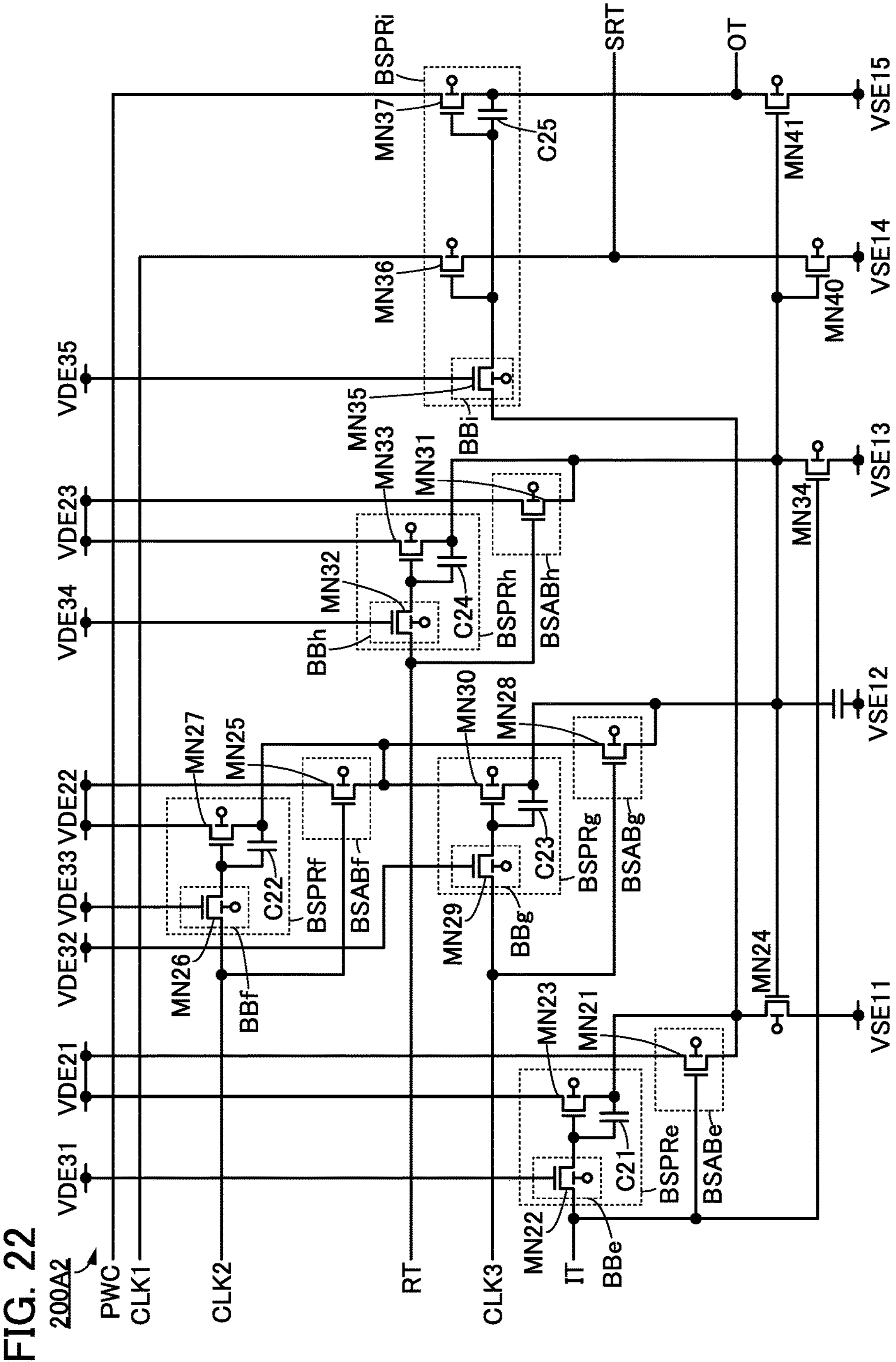
FIG. 22 is a circuit diagram showing an example of a circuit included in a driver circuit.

For example, a circuit 200A2 in FIG. 22 may be employed for each of the circuits 200[1] to 200[*n*] of the driver circuit SD.

A circuit 200A2 is a modification example of the circuit 200A1 in FIG. 21 and different from the circuit 200A1 in not including the circuits BSABi1 and BSABi2.

Since the circuit 200A2 is not provided with the circuit BSABi1 not performing a bootstrap to be paired with part of the circuit BSPRi performing a bootstrap, the potential rise of the terminal SRT to a high-level potential might occur more slowly than that in the circuit 200A1. Since the circuit 200A2 is not provided with the circuit BSABi2 not performing a bootstrap to be paired with part of the circuit BSPRi performing a bootstrap, the potential rise of the terminal SRT to a high-level potential might occur more slowly than that in the circuit 200A1. Meanwhile, since the circuit 200A2 is not provided with the circuits BSABi1 and BSABi2, the circuit areas of the circuits 200[1] to 200[*n*] in the driver circuit SD can be reduced. In other words, in the case where the requirements for the driver circuit SD is not a high operation speed but an area reduction, the circuit 200A2 in FIG. 22 is preferably used as the circuits 200[1] to 200[*n*] in the driver circuit SD.

Note that this embodiment can be combined with any of the other embodiments in this specification as appropriate. For example, the configurations, structures, methods, and the like described in this embodiment can be used in an appropriate combination with any of the configurations, structures, methods, and the like described in the other embodiments and the like.

Embodiment 2

In this embodiment, an amplifier circuit which is a semiconductor device of one embodiment of the present invention and different from that in Embodiment 1 is described.

Figure 23A:
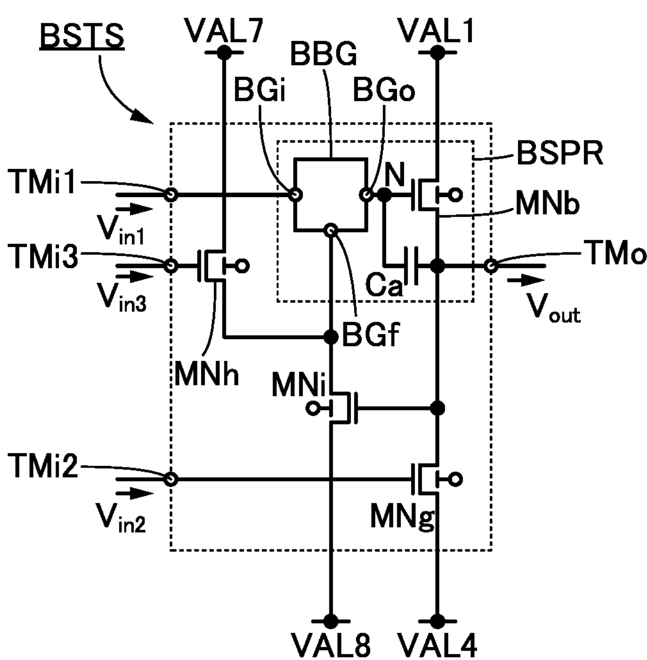
FIGS. 23A and 23B are circuit diagrams each showing an example of a circuit included in a driver circuit.

A circuit BSTS illustrated in FIG. 23A is an example of an amplifier circuit and includes the circuit BSPR illustrated in FIG. 2B. Note that the circuit BSPR illustrated in FIG. 23A is different from the circuit BSPR illustrated in FIG. 2B in including not the circuit BB but a circuit BBG.

The circuit BBG includes, for example, a terminal BGi, a terminal BGo, and a terminal BGf.

The circuit BBG has a function of bringing the node N into a floating state, like the circuit BB illustrated in FIG. 2B. Thus, the circuit BBG can include a switching element, for example. The circuit BBG also has a function of outputting, to the terminal BGo, a potential corresponding to the potential input to the terminal BGi.

The circuit BBG has a function of changing the threshold voltage of a transistor included in the circuit BBG in response to the potential input to the terminal BGf. For example, the threshold voltage of the transistor serving as a switching element in the circuit BBG is reduced, whereby the on-state current of the transistor can be increased. Meanwhile, the threshold voltage of the transistor is increased, whereby the off-state current of the transistor can be reduced.

The circuit BSTS includes, for example, a terminal TMi1, a terminal TMi2, and a terminal TMi3 each serving as an input terminal. The circuit BSTS also includes, for example, a terminal TMo serving as an output terminal.

The circuit BSTS includes, for example, the transistors MNb and MNg, a transistor MNi, a transistor MNh, and the capacitor Ca. Note that the transistor MNb, the capacitor Ca, and the circuit BBG are included in the circuit BSPR.

The terminal BGi of the circuit BBG is electrically connected to the terminal TMi1, a gate of the transistor MNg is electrically connected to the terminal TMi2, and a gate of the transistor MNh is electrically connected to the terminal TMi3. The terminal BGo of the circuit BBG is electrically connected to the gate of the transistor MNb and the first terminal of the capacitor Ca, and the first terminal of the transistor MNb is electrically connected to the wiring VAL1. The second terminal of the transistor MNb is electrically connected to the first terminal of the transistor MNg, a gate of the transistor MNi, the second terminal of the capacitor Ca, and the terminal TMo. A first terminal of the transistor MNh is electrically connected to a wiring VAL7, and a second terminal of the transistor MNh is electrically connected to a first terminal of the transistor MNi and the terminal BGf of the circuit BBG. A second terminal of the transistor MNg is electrically connected to the wiring VAL4, and a second terminal of the transistor MNi is electrically connected to a wiring VAL8.

For the wirings VAL1 and VAL4, the description of the wirings VAL1 and VAL4 in Embodiment 1 can be referred to.

The wirings VAL7 and VAL8 each serve as a wiring supplying a fixed potential or a variable potential, for example. As a fixed potential, for example, a high-level potential, a low-level potential, a ground potential, or a negative potential can be given. As a variable potential, a pulse signal (also referred to as a pulse voltage in some cases) or a clock signal can be given.

In this embodiment, the wirings VAL1 and VAL7 each preferably serve as a wiring supplying a high-level potential as a fixed potential. The wirings VAL4 and VAL8 each preferably serve as a wiring supplying a low-level potential as a fixed potential.

As each of the transistors MNb, MNg, MNh, and MNi of the circuit BSTS in FIG. 23A, the transistor that can be used as the transistor MNb described in Embodiment 1 or the like can be used.

In FIG. 23A, the potential of the terminal TMi1 is denoted by $V_{in1}$ the potential of the terminal TMi2 is denoted by $V_{in2}$, and the potential of the terminal TMi3 is denoted by $V_{in3}$. In FIG. 23A, the potential of the terminal TMo is denoted by $V_{out}$.

As described above, the circuit BSPR has a configuration in which the signal (potential $V_{out}$) output from the terminal TMo is input to the circuit BBG through the gate and first terminal of the transistor MNi. In other words, the circuit BSPR illustrated in FIG. 23A has a function of changing the threshold voltage of the transistor included in the circuit BBG in response to the signal output from the terminal TMo.

Figure 23B:
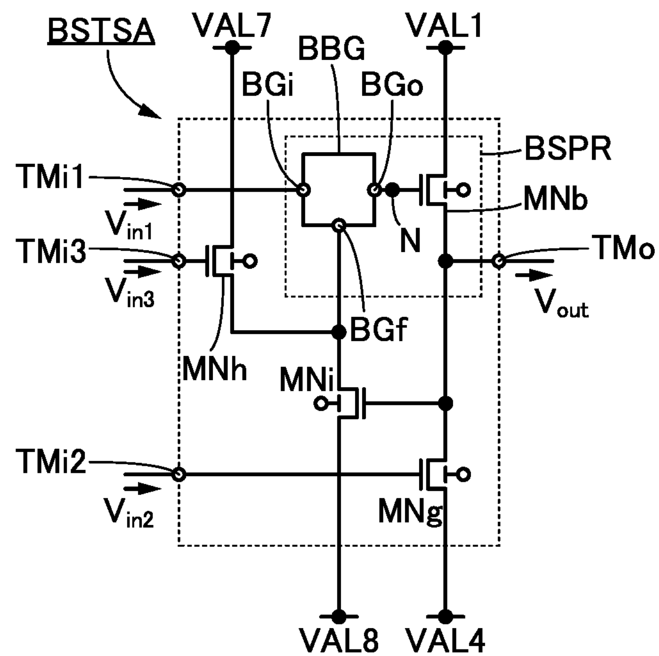

Note that one embodiment of the present invention is not limited to the configuration of the circuit BSTS in FIG. 23A. According to one embodiment of the present invention, for example, the configuration of the circuit BSTS in FIG. 23A can be modified depending on the circumstances. For example, the circuit BSTS in FIG. 23A may have a configuration in which the capacitor Ca is not provided in the circuit BSPR when the gate capacitance of the transistor MNb is large, as in the circuit BSTSA illustrated in FIG. 23B. In other words, in the circuit BSTSA, the potential of the node N can be retained owing to the gate capacitance of the transistor MNb. Owing to the absence of the capacitor Ca in the circuit BSTSA, the circuit area of the circuit BSTSA can be smaller than that of the circuit BSTS illustrated in FIG. 23A.

Configuration Example 1 of Amplifier Circuit

Next, configuration examples of the circuit BSTS illustrated in FIG. 23A are described.

Figure 24:
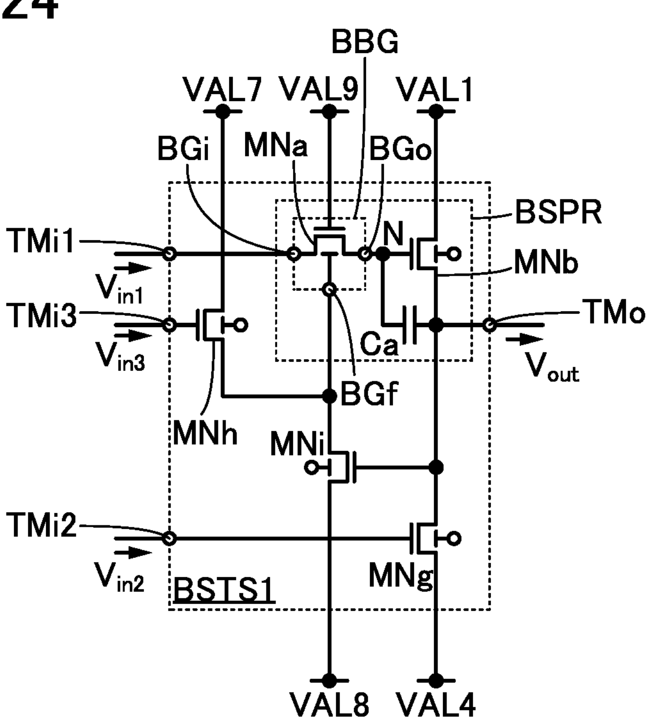
FIG. 24 is a circuit diagram showing an example of a circuit included in a driver circuit.

A circuit BSTS1 illustrated in FIG. 24 includes the transistor MNa in the circuit BBG. As the transistor MNa, a transistor that can be used as the transistor MNa described in Embodiment 1 can be used, for example.

The first terminal of the transistor MNa is electrically connected to the terminal BGi of the circuit BBG, the second terminal of the transistor MNa is electrically connected to the terminal BGo of the circuit BBG, and the gate of the transistor MNa is electrically connected to a wiring VAL9. A back gate of the transistor MNa is electrically connected to the terminal BGf of the circuit BBG.

The wiring VAL9 serves as a wiring supplying a fixed potential or a variable potential, for example, like the wiring VAL1. As a fixed potential, for example, a high-level potential, a low-level potential, a ground potential, or a negative potential can be given. As a variable potential, a pulse signal (also referred to as a pulse voltage in some cases) or a clock signal can be given.

The wiring VAL9 may be electrically connected to the wiring VAL1. In other words, the wirings VAL1 and VAL9 may be a single wiring.

An operation example of the circuit BSTS1 in FIG. 24 is described.

It is assumed that in the initial state of this operation example, the transistor MNb is in an off state and the transistor MNg is in an on state. The wiring VAL1 serves as a wiring supplying the high-level potential $V_{High}$, and the wiring VAL4 serves as a wiring supplying the low-level potential $V_{Low}$. Specifically, the transistor MNb is in an off state because the potential of the node N (the gate of the transistor MNb and the first terminal of the capacitor Ca) is the low-level potential $V_{Low}$. The transistor MNg is in an on state because the high-level potential $V_{High}$ is input to the terminal TMi2 of the circuit BSTS1 ($V_{in2}=V_{High}$). Therefore in this initial state, the potential of the terminal TMo of the circuit BSTS1 is the low-level potential $V_{Low}$ supplied from the wiring VAL4.

In this case, the low-level potential $V_{Low}$ is input to the gate of the transistor MNi, so that the transistor MNi is turned off.

The high-level potential $V_{High}$ is assumed to be input to the input terminal TMi1 of the circuit BSTS1, for example. That is, $V_{in1}=V_{High}$. In addition, the high-level potential $V_{High}$ is assumed to be supplied to the gate of the transistor MNa from the wiring VAL9. The low-level potential $V_{Low}$ is assumed to be input to the input terminal TMi2 of the circuit BSTS1. That is, $V_{in2}=V_{Low}$. Thus, the transistor MNg is turned off.

The transistor MNa is normally off and its threshold voltage is set to $V_{th\_MNa}$. The threshold voltage $V_{th\_MNa}$ is set to satisfy the formula: $V_{High}-V_{Low}>V_{th\_MNa}$.

The gate-source voltage (gate-second terminal voltage here) of the transistor MNa is $V_{High}-V_{Low}$, whereby the transistor MNa is turned on. Consequently, electric charge is accumulated in the node N because of current flowing from the terminal TMi1 through the transistor MNa, so that the potential of the node N increases until the transistor MNa is turned off. Specifically, the transistor MNa is turned off when the gate-source voltage of the transistor MNa increases to $V_{th\_MNa}$; thus, the potential of the node N (the second terminal of the transistor MNa) is $V_{High}-V_{th\_MNa}$. Note that $V_{High}-V_{th\_MNa}$ corresponds to $V_{Mid}$ described in FIG. 2B.

In particular, a high-level potential is preferably supplied to the back gate of the transistor MNa when the transistor MNa is turned on. The supply of a high-level potential to the back gate of the transistor MNa lowers the threshold voltage $V_{th\_MNa}$ of the transistor MNa, increasing the on-state current of the transistor MNa. As a result, electric charge is quickly accumulated in the node N. Here, if the threshold voltage $V_{th\_MNa}$ of the transistor MNa is lower than or equal to 0, the potential of the node N becomes $V_{High}$.

Thus, preferably, the high-level potential $V_{High}$ is input to the terminal TMi3 of the circuit BSTS1 during the period in which the transistor MNa is in an on state (e.g., the potential of the node N is $V_{Low}$ and the high-level potential $V_{High}$ is input to the terminal TMi1 of the circuit BSTS1). That is, $V_{in3}-V_{High}$. In addition, the high-level potential $V_{High}$ is assumed to be supplied to the first terminal of the transistor MNh from the wiring VAL7. Since the transistor MNi is in an off state, electric charge flowing from the wiring VAL7 is accumulated in the terminal BGf of the circuit BBG. Here, when the threshold voltage of the transistor MNh is $V_{th\_MNh}$, the potential of the second terminal of the transistor MNh is $V_{High}-V_{th\_MNh}$.

The potential of the gate of the transistor MNb becomes the high-level potential $V_{High}$ as described above, so that the transistor MNb is turned on. The transistor MNg is in an off state, as described above. Thus, as in the description of the circuit BSPR in FIG. 2B, the potential $V_{out}$ of the terminal TMo of the circuit BSTS1 becomes the high-level potential $V_{High}$ supplied through the wiring VAL1 ($V_{out}=V_{High}$).

In this case, the potential of the gate of the transistor MNi becomes the high-level potential $V_{High}$, so that the transistor MNi is turned on. In addition, the low-level potential $V_{Low}$ is assumed to be supplied to the second terminal of the transistor MNi from the wiring VAL8. Thus, the low-level potential $V_{Low}$ through the wiring VAL8 is supplied to the terminal BGf of the circuit BBG. Consequently, the low-level potential $V_{Low}$ is supplied to the back gate of the transistor MNa, whereby the threshold voltage $V_{th\_MNa}$ of the transistor MNa increases. As a result, the off-state current of the transistor MNa can be reduced. The transistor MNa is particularly preferably turned off due to the increase in the threshold voltage $V_{th\_MNa}$ of the transistor MNa. Accordingly, the leakage of the electric charge accumulated in the node N can be inhibited; the potential of the node N can be retained for a long time.

In particular, when the transistor MNa is turned off, constant supply of a low-level potential to the back gate of the transistor MNa is necessary, and therefore the transistor MNh is preferably in an off state. The low-level potential $V_{Low}$ is preferably input to the terminal TMi3 of the circuit BSPR so that the transistor MNh is in an off state. This means that, preferably, $V_{in}3=V_{Low}$.

As described above, the potential $V_{out}$ of the terminal TMo is input to the circuit BBG through the gate and first terminal of the transistor MNi, whereby the threshold voltage $V_{th\_MNa}$ of the transistor MNa in the circuit BBG can be changed. Especially when the transistor MNa is in an on state, the on-state current of the transistor MNa can be increased by lowering the threshold voltage $V_{th\_MNa}$ of the transistor MNa; when the transistor MNa is in an off state, the off-state current of the transistor MNa can be decreased by increasing the threshold voltage $V_{th\_MNa}$ of the transistor MNa.

Configuration Example 2 of Amplifier Circuit

Figure 25A:
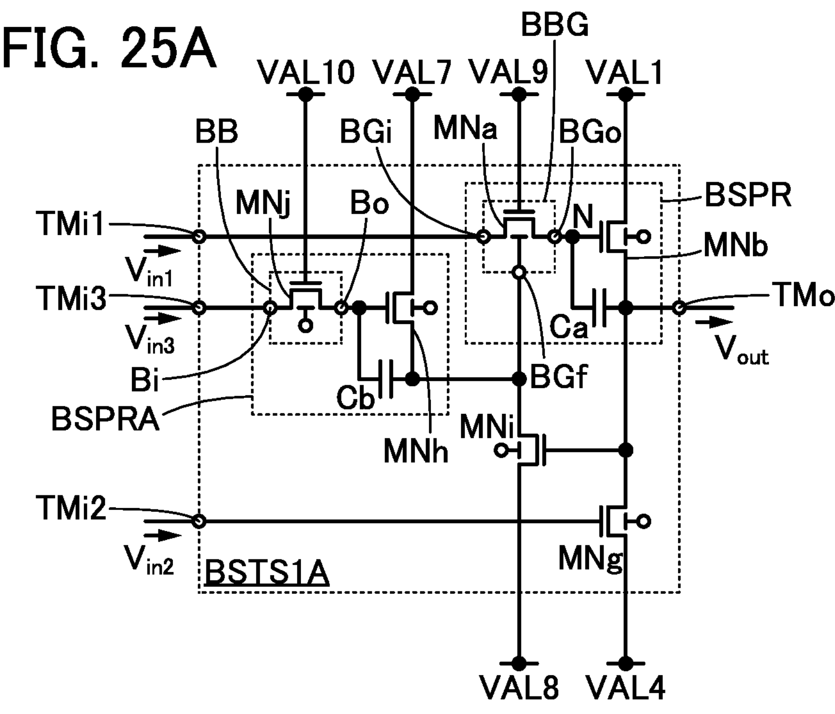
FIGS. 25A and 25B are circuit diagrams each showing an example of a circuit included in a driver circuit.

A circuit BSTS1A illustrated in FIG. 25A is a modification example of the circuit BSTS1 in FIG. 24 and different from the circuit BSTS1 in FIG. 24 in including a circuit BSPRA having a circuit configuration similar to that of the circuit BSPR illustrated in FIG. 2B.

In other words, the circuit BSTS1A in FIG. 25A has a configuration in which the circuit BB and a capacitor Cb are additionally provided in the circuit BSTS1 illustrated in FIG. 24. The gate of the transistor MNh is electrically connected to the terminal Bo of the circuit BB and a first terminal of the capacitor Cb, and the second terminal of the transistor MNh is electrically connected to a second terminal of the capacitor Cb, the terminal BGf of the circuit BBG, and the first terminal of the transistor MNi. The terminal Bi of the circuit BB is electrically connected to the terminal TMi3 of the circuit BSTS1A.

The circuit BB includes a transistor MNj. A first terminal of the transistor MNj is electrically connected to the terminal Bi of the circuit BB, a second terminal of the transistor MNj is electrically connected to the terminal Bo of the circuit BB, and a gate of the transistor MNj is electrically connected to a wiring VAL10.

As the transistor MNj, a transistor that can be used as the transistor MNa can be used, for example.

For the wiring VAL10, the description of the wirings VAL1 and VAL4 in Embodiment 1 can be referred to. In particular, the wiring VAL10 preferably serves as a wiring supplying a potential equivalent to the potential supplied through the wiring VAL9, and the wirings VAL10 and VAL9 are preferably electrically connected to each other.

With the circuit BSTS1A provided with the circuit BSPRA having the circuit configuration similar to that of the circuit BSPR in FIG. 2B, a bootstrap using the capacitor Cb enables an increase in the potential supplied from the wiring VAL7 to the terminal BGf of the circuit BBG through the first and second terminals of the transistor MNh.

For example, in the circuit BSTS1 in FIG. 24, when the high-level potential $V_{High}$ is supplied to the gate of the transistor MNh, the potential of the second terminal of the transistor MNh becomes the potential $V_{High}-V_{th\_MNh}$, which is obtained by subtraction of the threshold voltage $V_{th\_MNh}$ of the transistor MNh from the high-level potential $V_{High}$ supplied from the wiring VAL7. Meanwhile, in the circuit BSTS1A in FIG. 25A, when the transistor MNh is turned on, a bootstrap of the circuit BSPRA enables the potential of the second terminal of the transistor MNh to be increased to the high-level potential $V_{High}$ supplied from the wiring VAL7.

The circuit BSTS1A may further include the circuit BSAB illustrated in FIG. 2A. A circuit BSTS1B in FIG. 25B has a configuration in which the circuit BSTS1A in FIG. 25A is provided with the circuit BSAB and, in particular, the circuits BSPRA and BSAB are electrically connected in parallel. In other words, in the circuit BSTS1B in FIG. 25B, the pair of circuits BSPRA and BSAB has a circuit configuration similar to that of the circuit BSTR illustrated in FIG. 1A.

Figure 25B:
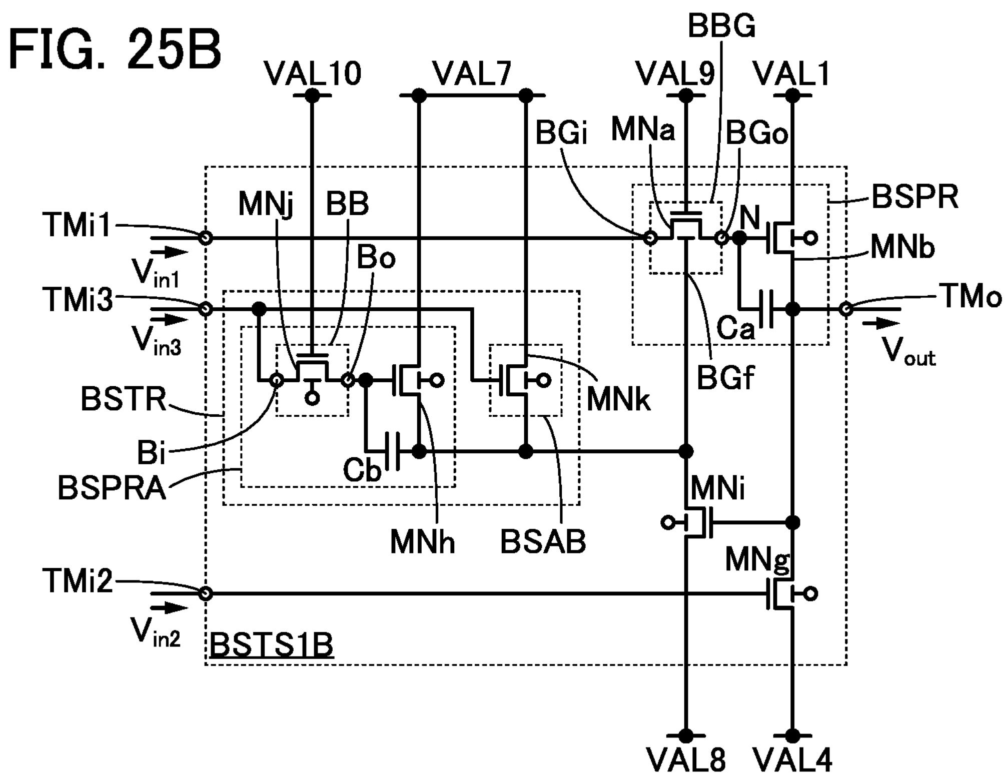

In the circuit BSTS1B in FIG. 25B, the circuit BSAB includes a transistor MNk, for example.

As the transistor MNk, a transistor that can be used as the transistor MNb can be used, for example.

A gate of the transistor MNk is electrically connected to the terminal TMi3, a first terminal of the transistor MNk is electrically connected to the wiring VAL7, and a second terminal of the transistor MNk is electrically connected to the second terminal of the transistor MNh and the second terminal of the capacitor Cb.

As in the circuit BSTS1B in FIG. 25B, the circuit BSPRA performing a bootstrap and the circuit BSAB not performing a bootstrap are electrically connected in parallel, whereby the potential of the terminal BGf of the circuit BBG (the first terminal of the transistor MNi) as the output destination can rise more steeply than that in the circuit BSPRA in FIG. 25A. Furthermore, the circuit BSPRA performing a bootstrap and the circuit BSAB not performing a bootstrap are electrically connected in parallel, whereby the potential of the terminal BGf of the circuit BBG (the back gate of the transistor MNa) as the output destination can be increased to $V_{High}$. Accordingly, the on-state current of the transistor MNa can be increased.

In the circuit BSTS1, a capacitor Cc may be provided. For example, a circuit BSTS1C in FIG. 26 has a configuration in which in the circuit BSTS1 in FIG. 24, a first terminal of the capacitor Cc is electrically connected to the second terminal of the transistor MNh, the first terminal of the transistor MNi, and the terminal BGf of the circuit BBG and a second terminal of the capacitor Cc is electrically connected to a wiring VAL15.

The wiring VAL15 serves as a wiring supplying a fixed potential like the wirings VAL4 and VAL8, for example. As the fixed potential, for example, a low-level potential, a ground potential, or a negative potential can be given. Note that depending on the circumstances, the fixed potential supplied through the wiring VAL15 may be a high-level potential, for example.

Figure 26:
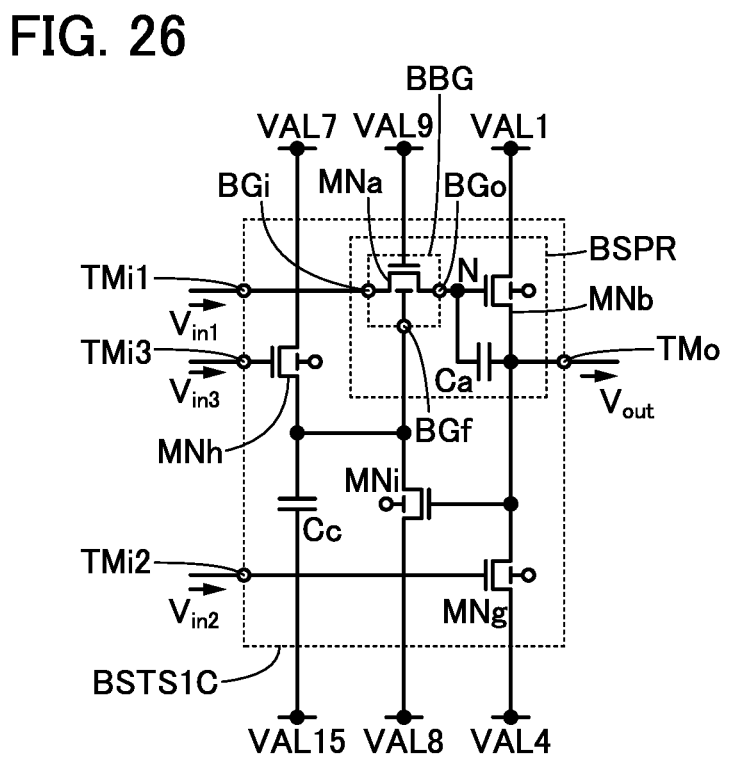

In the circuit BSTS1C in FIG. 26, since the first terminal of the capacitor Cc is electrically connected to the terminal BGf of the circuit BBG, the potential of the terminal BGf of the circuit BBG can be retained in the capacitor Cc. This allows the avoidance of leakage of the electric charge accumulated in the terminal BGf of the circuit BBG, which prevents the unintentional (incidentally possible) change in the threshold voltage of the transistor MNa.

Configuration Example 3 of Amplifier Circuit

Figure 27A:
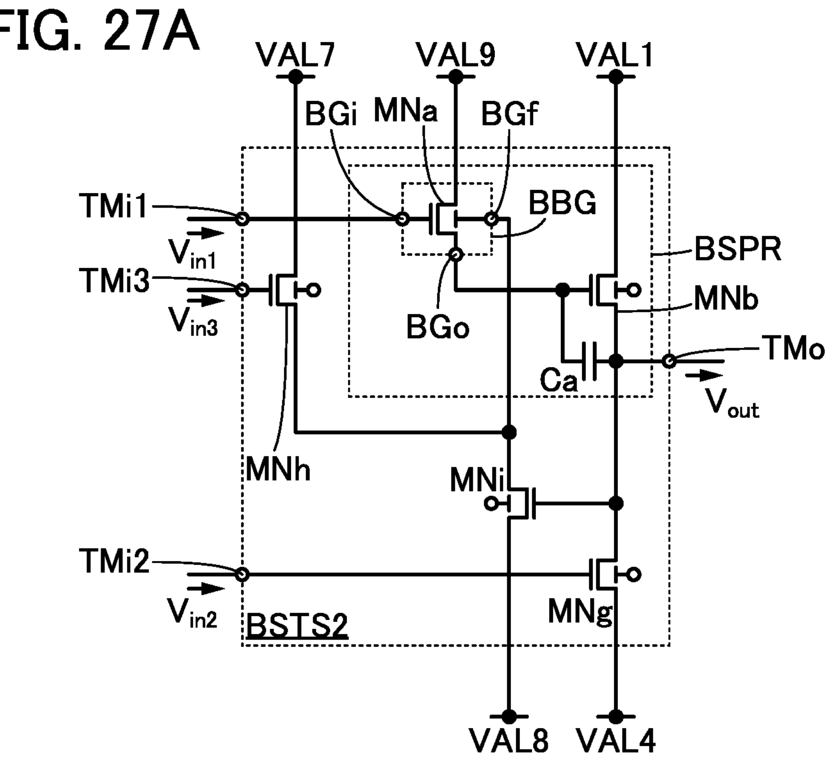
FIGS. 27A and 27B are circuit diagrams each showing an example of a circuit included in a driver circuit.

A circuit BSTS2 illustrated in FIG. 27A is a modification example of the circuit BSTS1 in FIG. 24 and is different from the circuit BSTS1 in that the gate of the transistor MNa is electrically connected not to the wiring VAL9 but to the terminal BGi and that the first terminal of the transistor MNa is electrically connected not to the terminal BGi but to the wiring VAL9.

For the configuration of the circuit BSTS2 in FIG. 27A which is common with the circuit BSTS1 in FIG. 24, the description of the circuit BSTS1 in FIG. 24 can be referred to.

The circuit BSPR included in the circuit BSTS2 in FIG. 27A has a configuration similar to those of the circuit BSPR in FIG. 4A and the circuit BSPR in FIG. 6A which are described in Embodiment 1. Thus, for the operation of the circuit BSPR included in the circuit BSTS2 in FIG. 27A, the description of the circuit BSPR in FIG. 4A and the circuit BSPR in FIG. 6A can be referred to.

In the circuit BSPR included in the circuit BSTS2 in FIG. 27A, for a reduction of the potential of the gate of the transistor MNb (the first terminal of the capacitor Ca) to the low-level potential $V_{Low}$, the gate of the transistor MNb (the first terminal of the capacitor Ca) may be electrically connected to the wiring supplying the low-level potential through the transistor, as in the circuit BSPR in FIG. 4B and the circuit BSPR FIG. 6B. In a circuit BSTS2A in FIG. 27B, the circuit BSTS2 in FIG. 27A is provided with the transistor MNd.

Figure 27B:
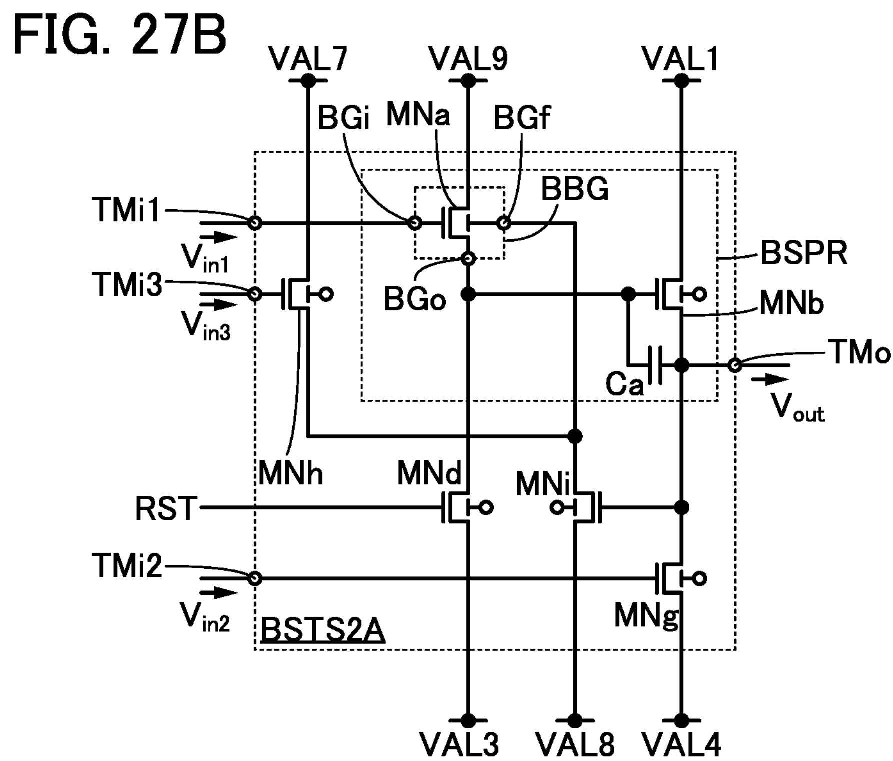

In the circuit BSTS2A in FIG. 27B, the gate of the transistor MNd is electrically connected to the wiring RST, the first terminal of the transistor MNd is electrically connected to the terminal BGo of the circuit BBG, the gate of the transistor MNb, and the first terminal of the capacitor Ca, and the second terminal of the transistor MNd is electrically connected to the wiring VAL3.

For the wiring VAL3, the description of the wiring VAL3 in Embodiment 1 can be referred to. Also for the wiring RST, the description of the wiring RST described in Embodiment 1 can be referred to.

The circuit BB and the capacitor Cb may be additionally provided in the circuit BSTS2 illustrated in FIG. 27A, as in the circuit BSTS1A in FIG. 25A. A circuit BSTS2B illustrated in FIG. 28A has a configuration in which the circuit BB and the capacitor Cb are additionally provided in the circuit BSTS2 illustrated in FIG. 27A to form the circuit BSPRA.

The circuit BB and the capacitor Cb may be additionally provided in the circuit BSTS2A illustrated in FIG. 27B, as in the circuit BSTS1A in FIG. 25A. A circuit BSTS2C illustrated in FIG. 28B has a configuration in which the circuit BB and the capacitor Cb are additionally provided in the circuit BSTS2A illustrated in FIG. 27B to form the circuit BSPRA.

Figure 28A:
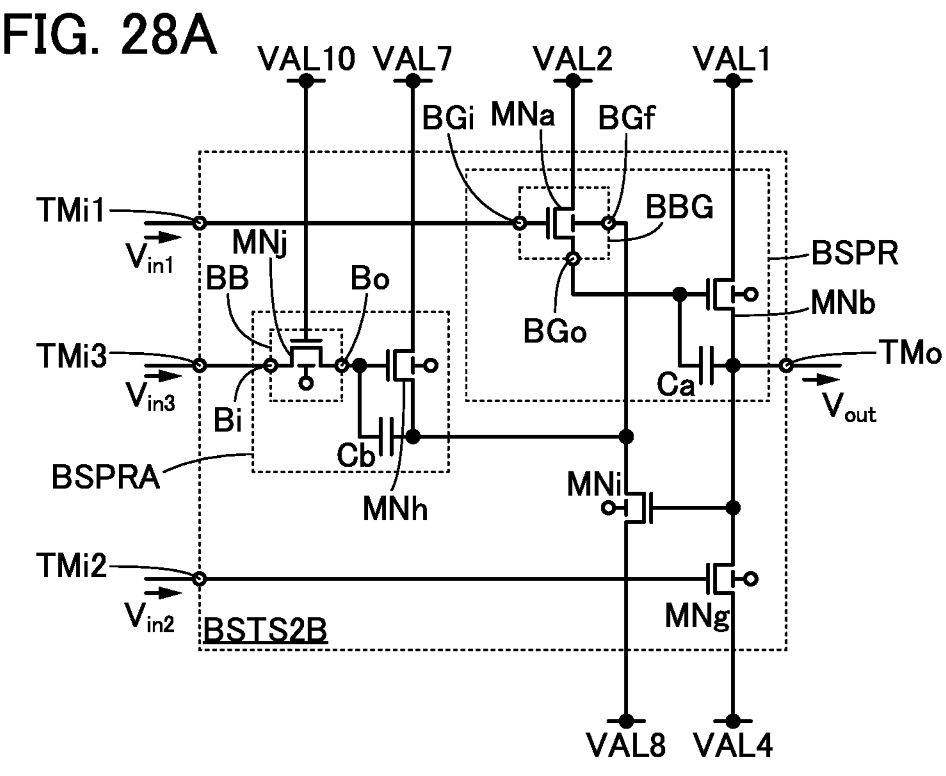
FIGS. 28A and 28B are circuit diagrams each showing an example of a circuit included in a driver circuit.
Figure 28B:
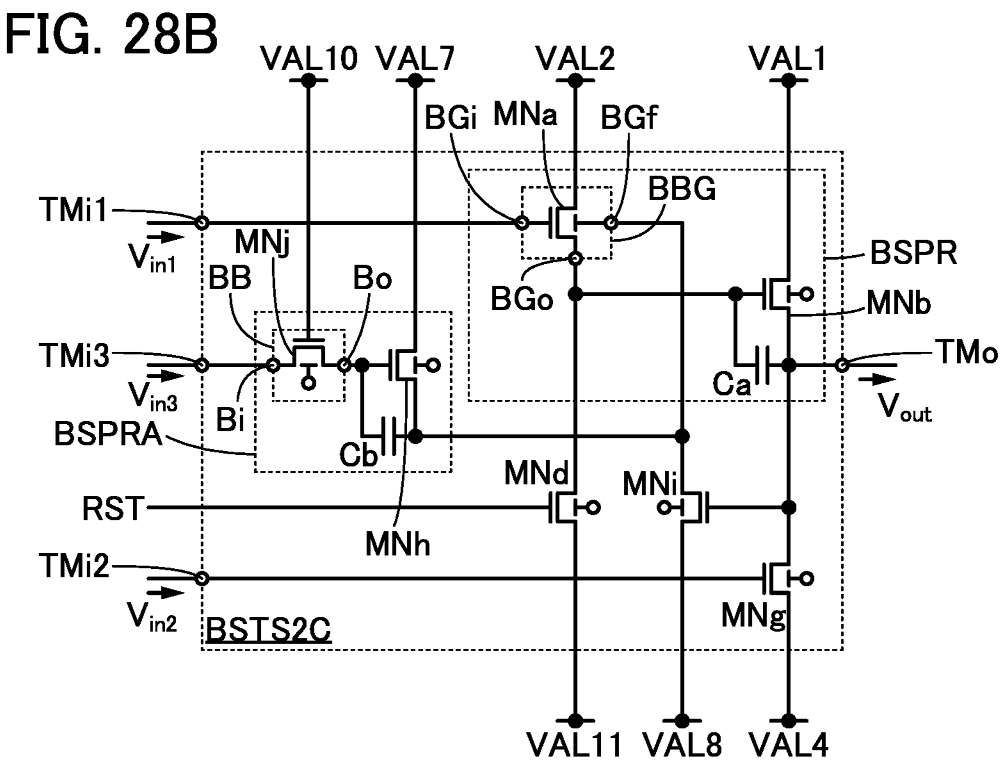

The circuit BSPRA illustrated in each of FIGS. 28A and 28B has a configuration similar to that of the circuit BSPRA in FIG. 25A. For the operation of the circuit BSPRA illustrated in each of FIGS. 28A and 28B, the description of the circuit BSPRA included in the circuit BSTS1A in FIG. 25A can be referred to.

With the circuit BSTS2B in FIG. 28A or the circuit BSTS2C in FIG. 28B, when the transistor MNh is turned on, the potential of the second terminal of the transistor MNh can be increased to the high-level potential $V_{High}$ supplied from the wiring VAL7 by a bootstrap of the circuit BSPRA; accordingly, the potential of the terminal BGf of the circuit BBG (the back gate of the transistor MNa) can be increased to $V_{High}$. Accordingly, the on-state current of the transistor MNa can be increased.

The circuit BSAB may be additionally provided in the circuit BSTS2B illustrated in FIG. 28A, as in the circuit BSTS1B in FIG. 25B. A circuit BSTS2D illustrated in FIG. 29A has a configuration in which the circuit BSAB including the transistor MNk is provided in the circuit BSTS2B in FIG. 28A to form the circuit BSTR.

The circuit BSAB may be additionally provided in the circuit BSTS2C illustrated in FIG. 28B, as in the circuit BSTS1B in FIG. 25B. A circuit BSTS2E illustrated in FIG. 29B has a configuration in which the circuit BSAB including the transistor MNk is provided in the circuit BSTS2C in FIG. 28B to form the circuit BSTR.

Figure 29A:
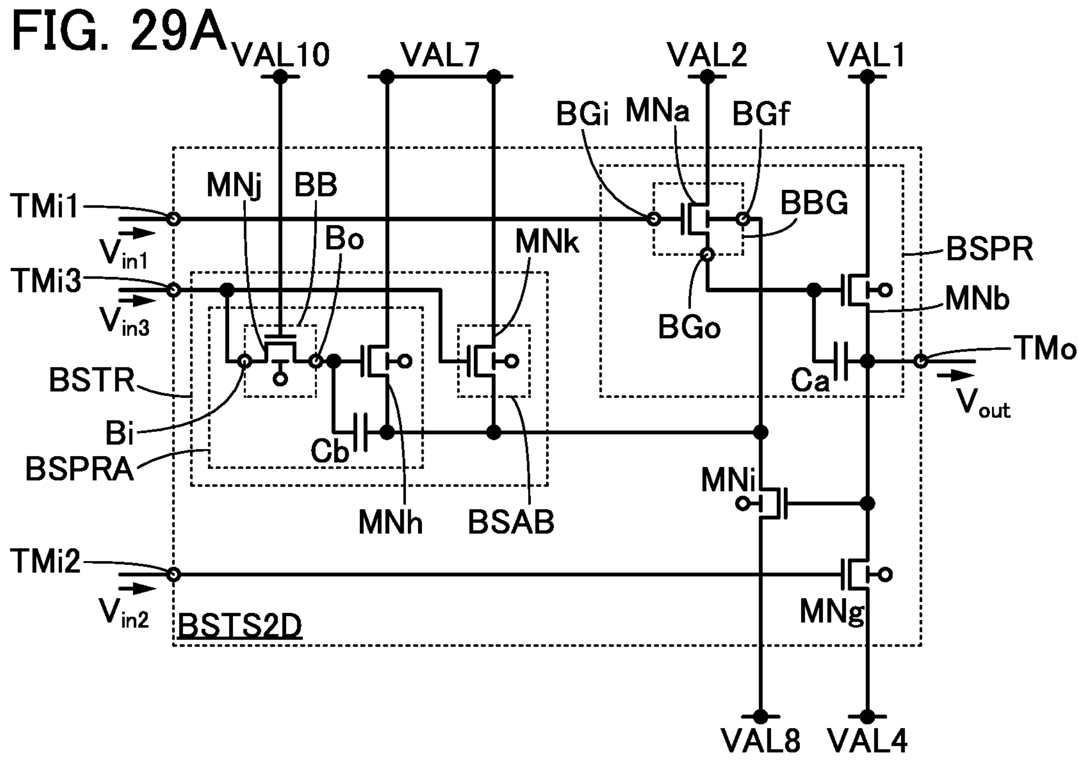
FIGS. 29A and 29B are circuit diagrams each showing an example of a circuit included in a driver circuit.
Figure 29B:
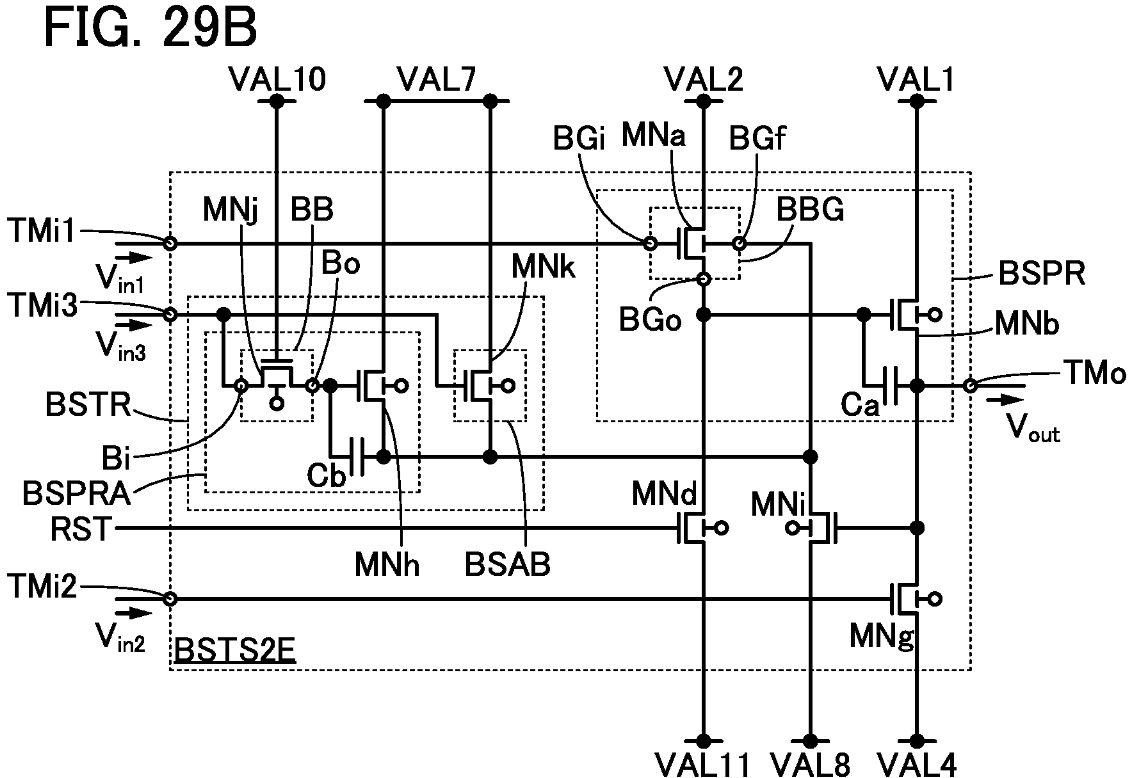

In the circuit BSTR illustrated in each of FIGS. 29A and 29B, the circuit BSPRA performing a bootstrap and the circuit BSAB not performing a bootstrap are electrically connected in parallel, as in the circuit BSTR in FIG. 25B. For the operation of the circuit BSTR illustrated in each of FIGS. 29A and 29B, the description of the circuit BSTR included in the circuit BSTS1B in FIG. 25B can be referred to.

With the circuit BSTS2D in FIG. 29A or the circuit BSTS2E in FIG. 29B, the potential of the terminal BGf of the circuit BBG (the first terminal of the transistor MNi) as the output destination can rise more steeply than that in the circuit BSPRA in each of FIGS. 28A and 28B.

Configuration Example 4 of Amplifier Circuit

Figure 30A:
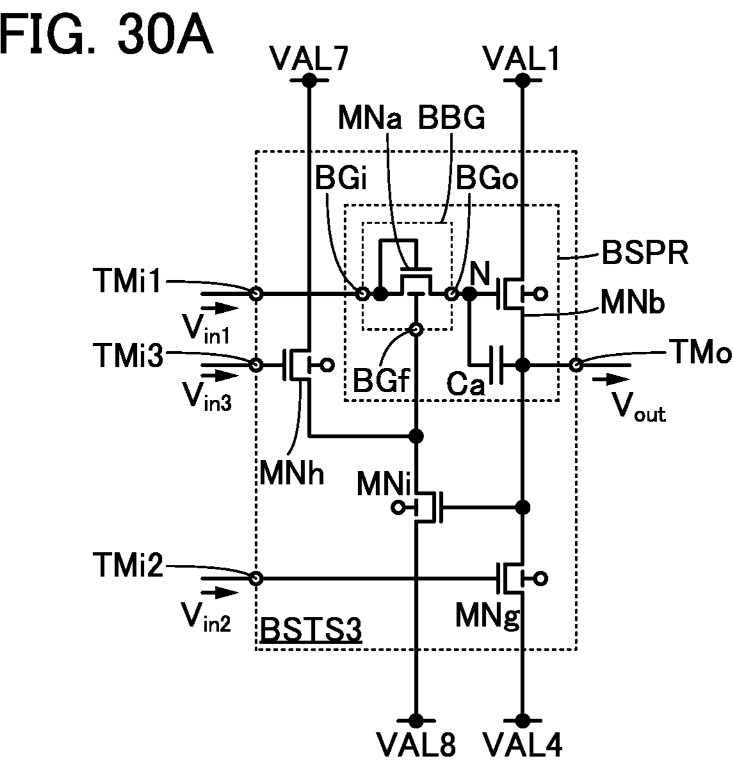
FIGS. 30A and 30B are circuit diagrams each showing an example of a circuit included in a driver circuit.

A circuit BSTS3 illustrated in FIG. 30A is a modification example of the circuit BSTS1 in FIG. 24 and is different from the circuit BSTS1 in that the gate of the transistor MNa is electrically connected not to the wiring VAL9 but to the first terminal of the transistor MNa.

For the configuration of the circuit BSTS3 in FIG. 30A which is common with the circuit BSTS1 in FIG. 24, the description of the circuit BSTS1 in FIG. 24 can be referred to.

The circuit BSPR included in the circuit BSTS3 in FIG. 30A has a configuration similar to that of the circuit BSPR in FIG. 5C which is described in Embodiment 1. Thus, for the operation of the circuit BSPR included in the circuit BSTS3 in FIG. 30A, the description of the circuit BSPR in FIG. 5C can be referred to.

In the circuit BSPR included in the circuit BSTS3 in FIG. 30A, for a reduction of the potential of the gate of the transistor MNb (the first terminal of the capacitor Ca) to the low-level potential $V_{Low}$, the gate of the transistor MNb (the first terminal of the capacitor Ca) may be electrically connected to the wiring supplying the low-level potential through the transistor, as in the circuit BSPR in FIG. 5D. In a circuit BSTS3A in FIG. 30B, the circuit BSTS2 in FIG. 30A is provided with the transistor MNd.

Figure 30B:
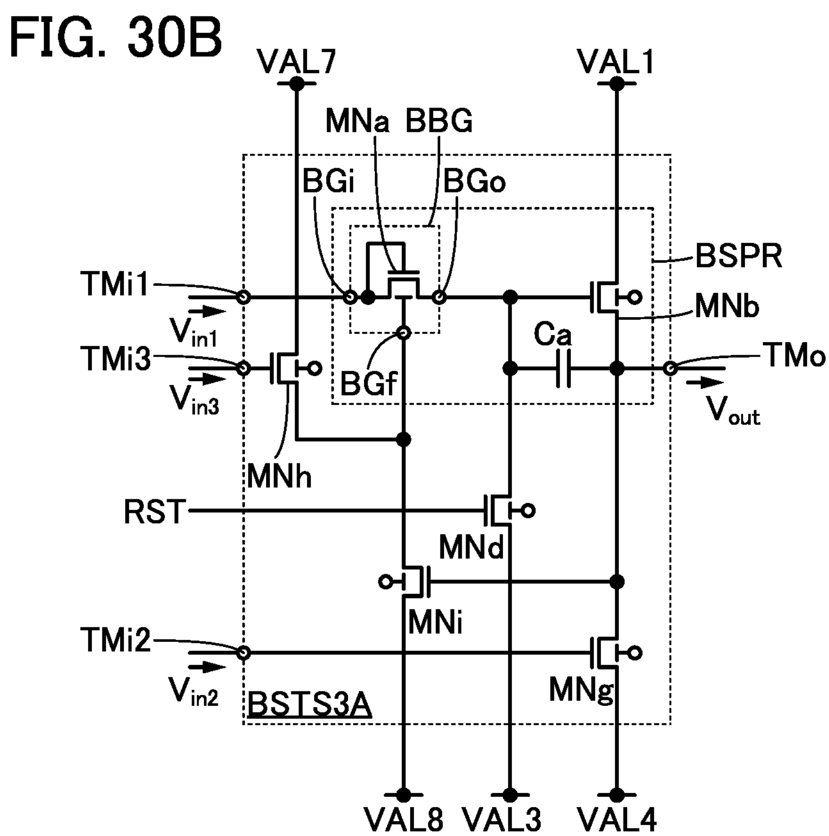

In the circuit BSTS3A in FIG. 30B, the gate of the transistor MNd is electrically connected to the wiring RST, the first terminal of the transistor MNd is electrically connected to the terminal BGo of the circuit BBG, the gate of the transistor MNb, and the first terminal of the capacitor Ca, and the second terminal of the transistor MNd is electrically connected to the wiring VAL3.

For the wiring VAL3, the description of the wiring VAL3 in Embodiment 1 can be referred to. Also for the wiring RST, the description of the wiring RST described in Embodiment 1 can be referred to.

The circuit BB and the capacitor Cb may be additionally provided in the circuit BSTS3 illustrated in FIG. 30A, as in the circuit BSTS1A in FIG. 25A. A circuit BSTS3B illustrated in FIG. 31A has a configuration in which the circuit BB and the capacitor Cb are additionally provided in the circuit BSTS3 illustrated in FIG. 30A to form the circuit BSPRA.

The circuit BB and the capacitor Cb may be additionally provided in the circuit BSTS3A illustrated in FIG. 30B, as in the circuit BSTS1A in FIG. 25A. A circuit BSTS3C illustrated in FIG. 31B has a configuration in which the circuit BB and the capacitor Cb are additionally provided in the circuit BSTS3A illustrated in FIG. 30B to form the circuit BSPRA.

Figure 31A:
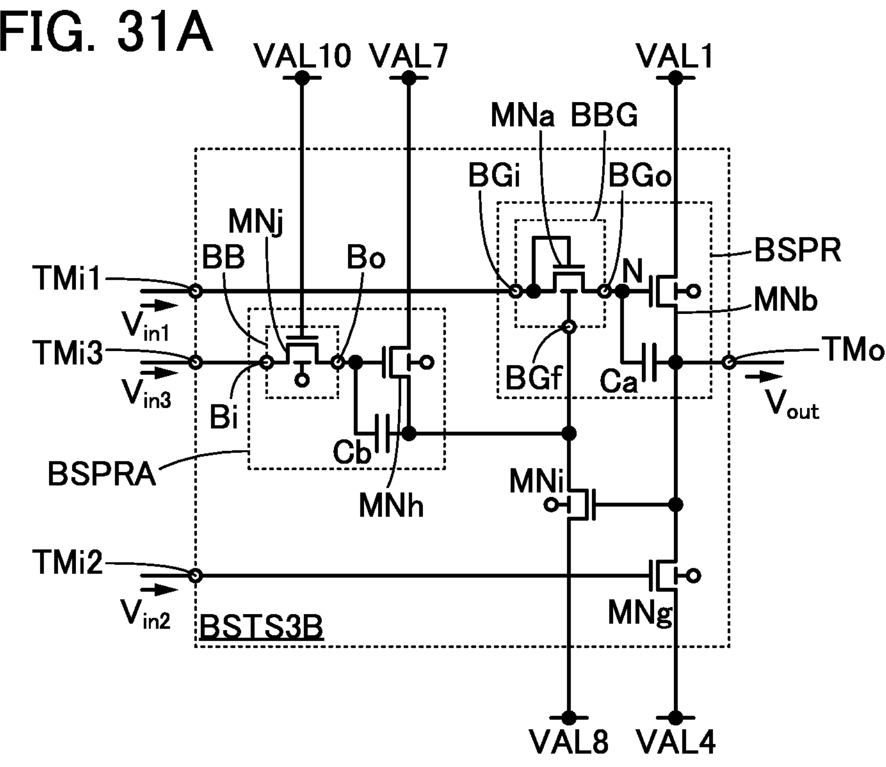
FIGS. 31A and 31B are circuit diagrams each showing an example of a circuit included in a driver circuit.
Figure 31B:
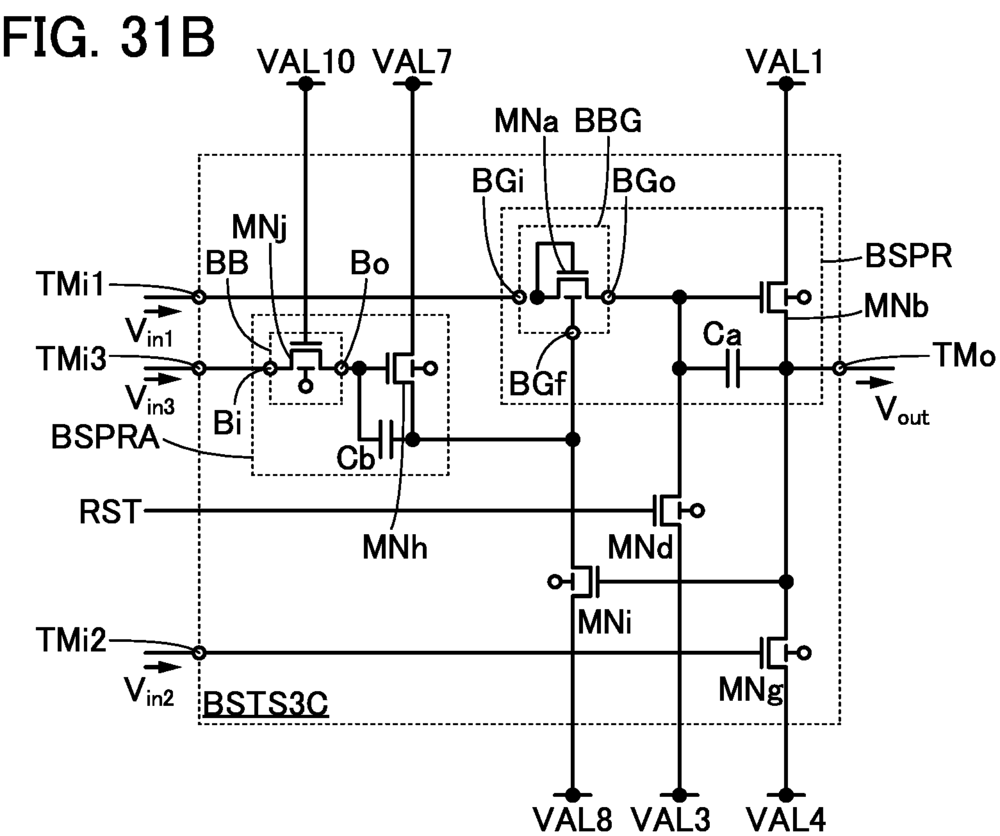

The circuit BSPRA illustrated in each of FIGS. 31A and 31B has a configuration similar to that of the circuit BSPRA in FIG. 25A. For the operation of the circuit BSPRA illustrated in each of FIGS. 31A and 31B, the description of the circuit BSPRA included in the circuit BSTS1A in FIG. 25A can be referred to.

With the circuit BSTS3B in FIG. 31A or the circuit BSTS3C in FIG. 31B, when the transistor MNh is turned on, the potential of the second terminal of the transistor MNh can be increased to the high-level potential $V_{High}$ supplied from the wiring VAL7 by a bootstrap of the circuit BSPRA; accordingly, the potential of the terminal BGf of the circuit BBG (the back gate of the transistor MNa) can be increased to $V_{High}$. Accordingly, the on-state current of the transistor MNa can be increased.

The circuit BSAB may be additionally provided in the circuit BSTS3B illustrated in FIG. 31A, as in the circuit BSTS1B in FIG. 25B. A circuit BSTS3D illustrated in FIG. 32A has a configuration in which the circuit BSAB including the transistor MNk is provided in the circuit BSTS3B in FIG. 31A to form the circuit BSTR.

The circuit BSAB may be additionally provided in the circuit BSTS3C illustrated in FIG. 31B, as in the circuit BSTS1B in FIG. 25B. A circuit BSTS4E illustrated in FIG. 32B has a configuration in which the circuit BSAB including the transistor MNk is provided in the circuit BSTS3C in FIG. 31B to form the circuit BSTR.

Figure 32A:
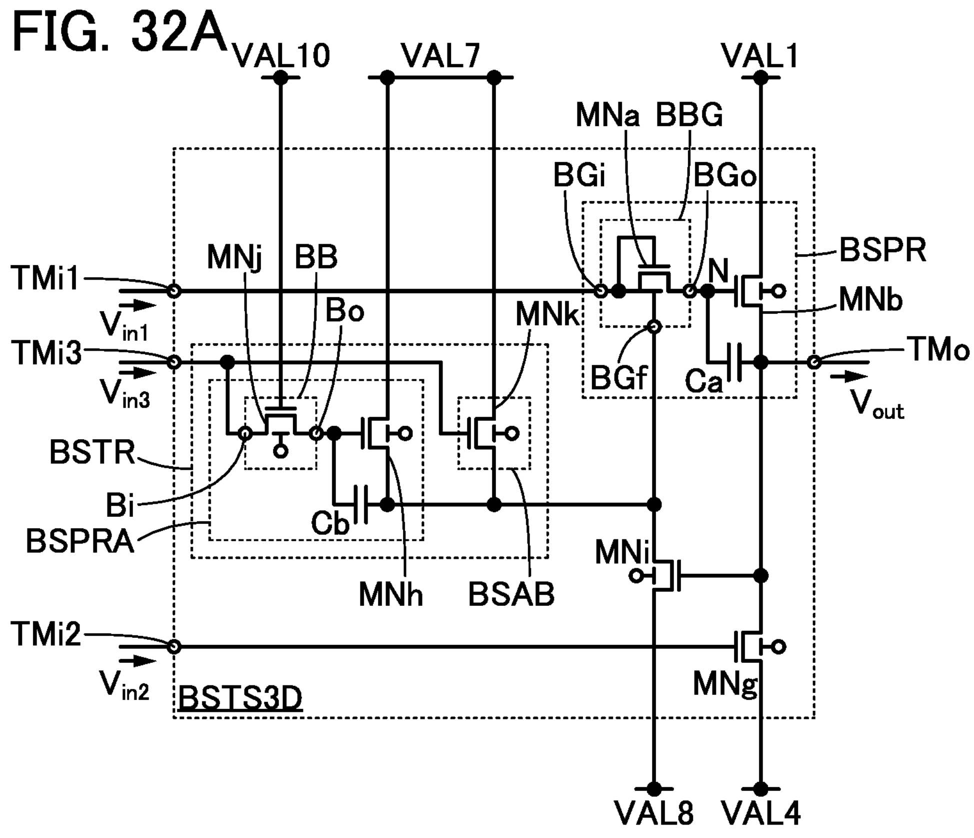
FIGS. 32A and 32B are circuit diagrams each showing an example of a circuit included in a driver circuit.

In the circuit BSTR illustrated in each of FIGS. 32A and 32*n*, the circuit BSPRA performing a bootstrap and the circuit BSAB not performing a bootstrap are electrically connected in parallel, as in the circuit BSTR in FIG. 25B. For the operation of the circuit BSTR illustrated in each of FIGS. 32A and 32B, the description of the circuit BSTR included in the circuit BSTS1B in FIG. 25B can be referred to.

Figure 32B:
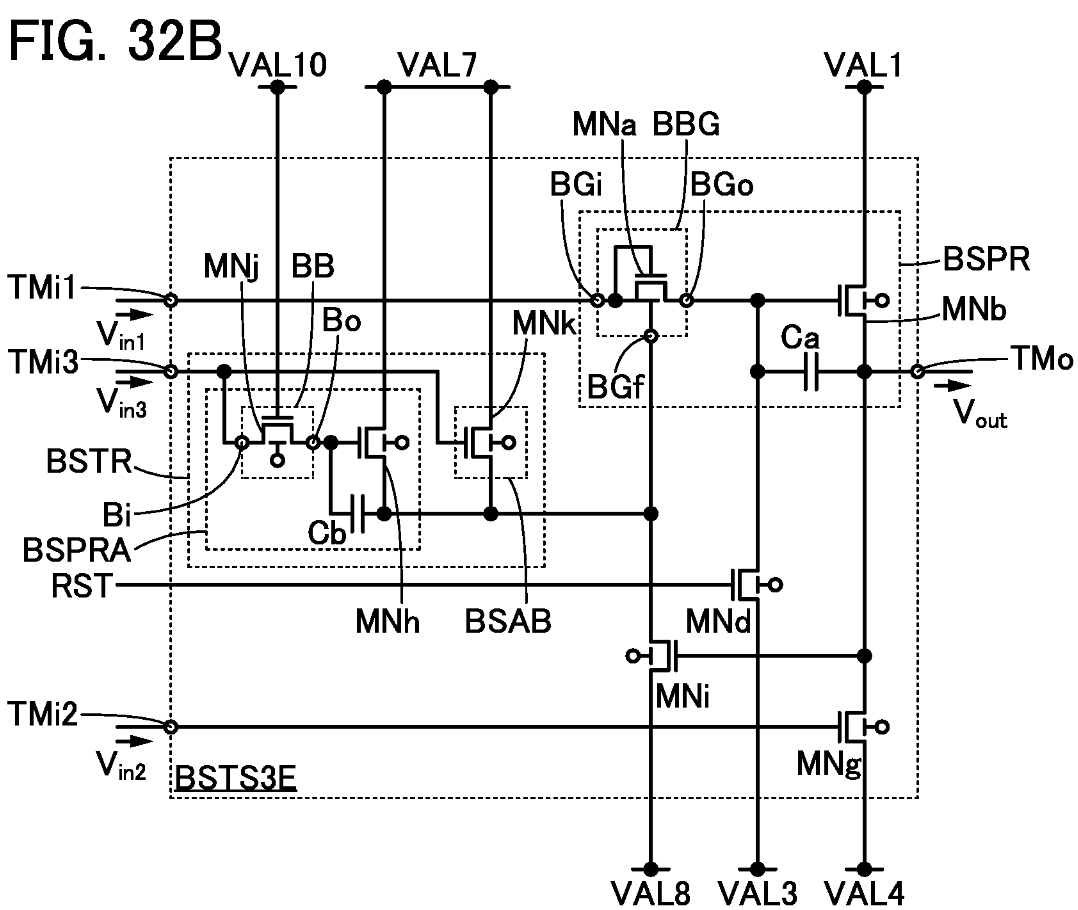

With the circuit BSTS3D in FIG. 32A or the circuit BSTS3E in FIG. 32B, the potential of the terminal BGf of the circuit BBG (the first terminal of the transistor MNi) as the output destination can rise more steeply than that in the circuit BSPRA in each of FIGS. 31A and 31B.

Configuration Example 5 of Amplifier Circuit

Figures 33A, 33B:
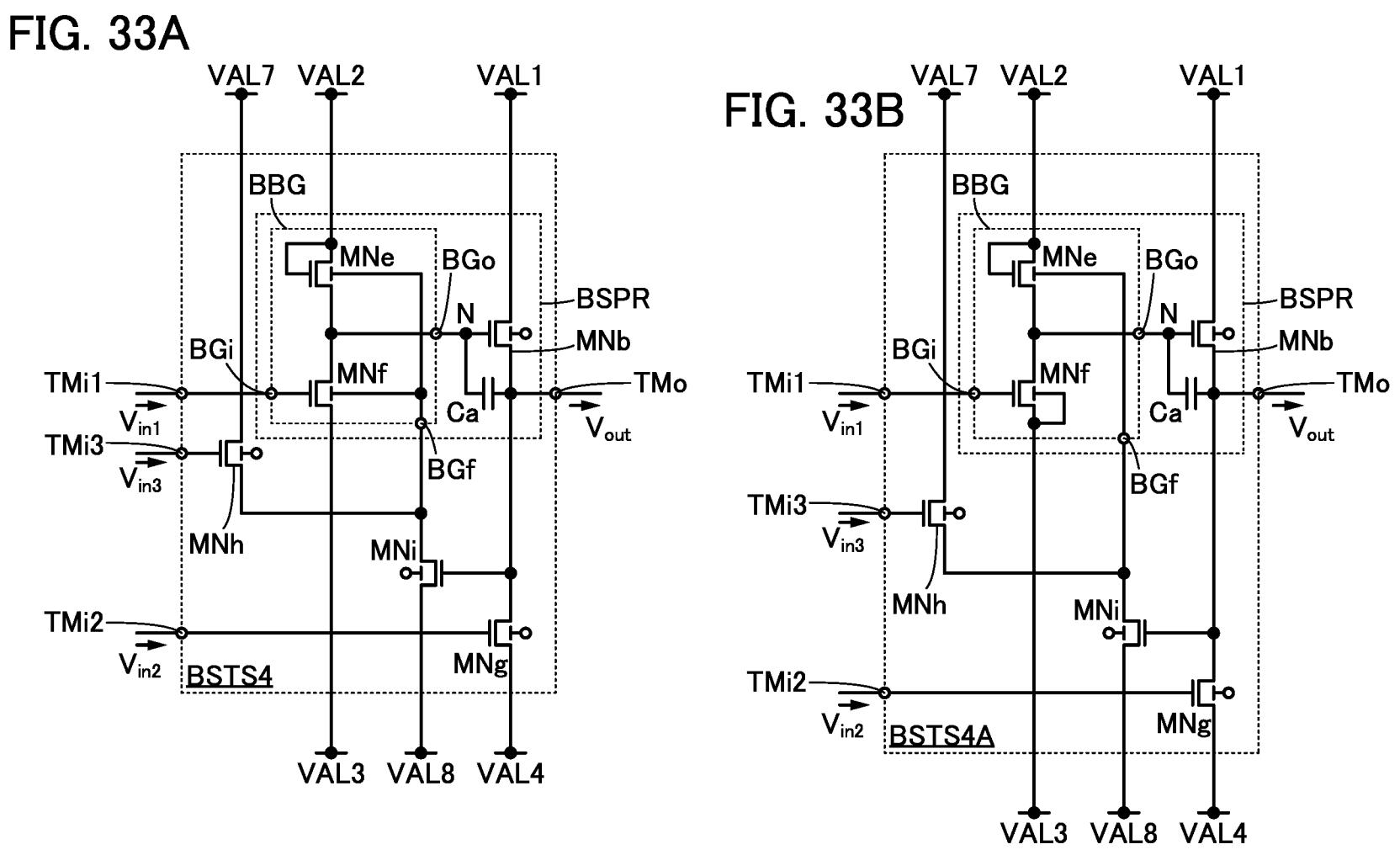

The circuit BSTS4 illustrated in FIG. 33A is an example of the circuit BSTS in FIG. 23A, and the circuit BBG includes an inverter circuit like the circuit BB of the circuit BSTR4 illustrated in FIG. 4C. Specifically, the circuit BBG includes the transistors MNe and MNf, and the transistors MNe and MNf form the inverter circuit.

As each of the transistors MNe and MNf, a transistor that can be used as the transistor MNe or MNf described in Embodiment 1 can be used, for example.

The first terminal of the transistor MNe is electrically connected to the gate of the transistor MNe and the wiring VAL2, and the second terminal of the transistor MNe is electrically connected to the terminal BGo and the first terminal of the transistor MNf. The second terminal of the transistor MNf is electrically connected to the wiring VAL3, and the gate of the transistor MNf is electrically connected to the terminal BGi. A back gate of the transistor MNe is electrically connected to a back gate of the transistor MNf and the terminal BGf.

For the wiring VAL3, the description of the wiring VAL3 of the circuit BSTR4 in FIG. 4C can be referred to.

An operation example of the circuit BSTS4 in FIG. 33A is described. The high-level potential $V_{High}$ is assumed to be input to the first terminal of the transistor MNe from the wiring VAL2, for example. In addition, the low-level potential $V_{Low}$ is assumed to be supplied to the second terminal of the transistor MNf from the wiring VAL3. The potential of the node N (the potential of the gate of the transistor MNb or the potential of the first terminal of the capacitor Ca) is the low-level potential $V_{Low}$.

The transistors MNe and MNf are normally-off transistors. The threshold voltage of the transistor MNe is $V_{th\_MNe}$, and $V_{th\_MNe}$ is the voltage in particular satisfying the formula: $V_{High}-V_{Low}>V_{th\_MNe}$.

First, the high-level potential $V_{High}$ is supplied to the terminal TMi3. This turns on the transistor MNh, and the high-level potential $V_{High}$ from the wiring VAL7 is supplied to the back gate of each of the transistors MNe and MNb. Consequently, the threshold voltage of each of the transistors MNe and MNb increases, which makes the on-state current of each of the transistors MNe and MNb higher and the charging and discharging of the node N faster.

Next, a case is considered in which the low-level potential $V_{Low}$ is input to the terminal TMi1. In this case, $V_{Low}$ is input to the gate of the transistor MNf, so that the transistor MNf is turned off. Since the transistor MNf is turned off, electric charge is accumulated in the node N because of current flowing from the wiring VAL2 through the transistor MNe, so that the potential of the node N increases until the transistor MNe is turned off. Specifically, the transistor MNe is turned off when the gate-source voltage of the transistor MNe increases to $V_{th\_MNe}$; thus, the potential of the node N (the potential of the second terminal of the transistor MNe) is $V_{High}-V_{th\_MNe}$.

A case is considered in which the high-level potential $V_{High}$ is input to the terminal TMi. In this case, $V_{High}$ is input to the gate of the transistor MNf, so that the transistor MNf is turned on. Since the transistor MNf is in the on state, current flows from the node N to the wiring VAL3 through the transistor MNf, whereby the potential of the node N ideally becomes the low-level potential $V_{Low}$ supplied through the wiring VAL3. Note that a reduction in the potential of the second terminal (node N) of the transistor MNe turns on the transistor MNe, so that the potential of the node N actually becomes higher than or equal to the low-level potential $V_{Low}$ and lower than or equal to the high-level potential $V_{High}$.

Then, the low-level potential $V_{Low}$ is supplied to the terminal TMi3, which turns off the transistor MNh. Consequently, the back gate of each of the transistors MNe and MNb are brought into a floating state.

The potential of the node N is determined in the above manner. After the potential of the node N is determined, supply of the high-level potential $V_{High}$ from the wiring VAL1, for example, allows a bootstrap to increase the potential of the terminal TMo of the circuit BSTS4 to the high-level potential $V_{High}$.

When the potential of the terminal TMo becomes the high-level potential $V_{High}$, the transistor MNi is turned on, and the low-level potential $V_{Low}$ from the wiring VAL8 is supplied to the back gate of each of the transistors MNe and MNb. Consequently, the threshold voltage of each of the transistors MNe and MNb decreases, which makes the off-state current of each of the transistors MNe and MNb lower. In other words, when the potential of the terminal TMo becomes the high-level potential $V_{High}$, the electric charge accumulated in the node N hardly leaks, and the potential (high-level potential $V_{High}$) output from the terminal TMo can be stabilized.

There is no limitation on the configuration of the circuit BSTS4 of the circuit BBG in FIG. 33A. For example, as in the circuit BSTS4A illustrated in FIG. 33B, the back gate of the transistor MNf included in the circuit BBG of the circuit BSTS4 can be electrically connected to the second terminal of the transistor MNf. Here, since the low-level potential $V_{Low}$ from the wiring VAL3 is supplied to the back gate of the transistor MNf, the off-state current of the transistor MNf can be decreased.

The circuit BB and the capacitor Cb may be additionally provided in the circuit BSTS4 illustrated in FIG. 33A, as in the circuit BSTS1A in FIG. 25A. A circuit BSTS4B illustrated in FIG. 34A has a configuration in which the circuit BB and the capacitor Cb are additionally provided in the circuit BSTS4 illustrated in FIG. 33A to form the circuit BSPRA.

Figures 34A, 34B:
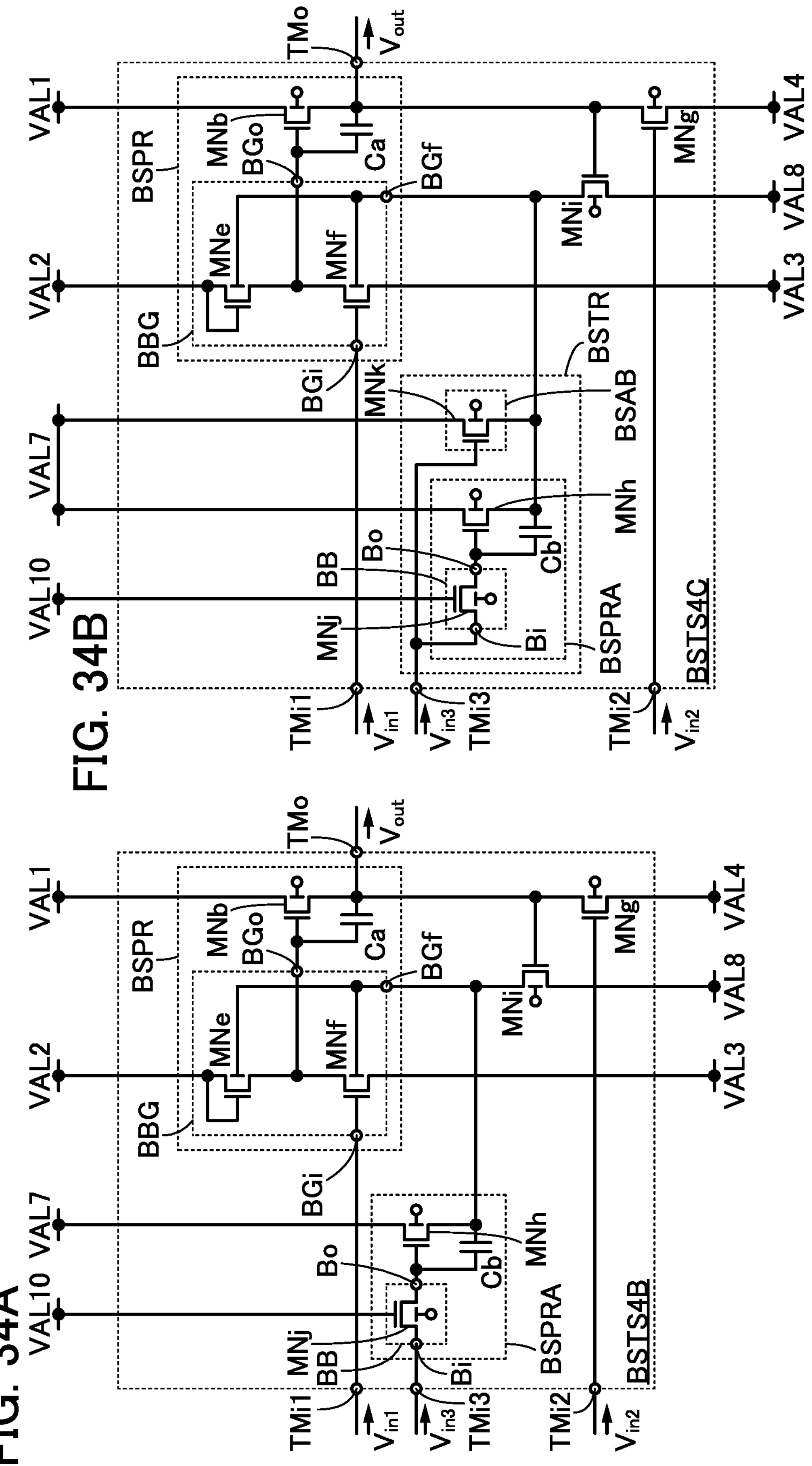
FIGS. 34A and 34B are circuit diagrams each showing an example of a circuit included in a driver circuit.

The circuit BSPRA illustrated in FIG. 34A has a configuration similar to that of the circuit BSPRA in FIG. 25A. For the operation of the circuit BSPRA illustrated in FIG. 34A the description of the circuit BSPRA included in the circuit BSTS1A in FIG. 25A can be referred to.

With the circuit BSTS4B in FIG. 34A, when the transistor MNh is turned on, the potential of the second terminal of the transistor MNh can be increased to the high-level potential $V_{High}$ supplied from the wiring VAL7 by a bootstrap of the circuit BSPRA; accordingly, the potential of the terminal BGf of the circuit BBG (the back gate of each of the transistors MNe and MNf) can be increased to $V_{High}$. Accordingly, the on-state current of each of the transistors MNe and MNf can be increased.

The circuit BSAB may be additionally provided in the circuit BSTS4B illustrated in FIG. 34A, as in the circuit BSTS1B in FIG. 25B. A circuit BSTS4C illustrated in FIG. 34B has a configuration in which the circuit BSAB including the transistor MNk is provided in the circuit BSTS4B in FIG. 34A to form the circuit BSTR.

In the circuit BSTR illustrated in FIG. 34B, the circuit BSPRA performing a bootstrap and the circuit BSAB not performing a bootstrap are electrically connected in parallel, as in the circuit BSTR in FIG. 25B. For the operation of the circuit BSTR illustrated in FIG. 34B, the description of the circuit BSTR included in the circuit BSTS1B in FIG. 25B can be referred to.

With the circuit BSTS4C in FIG. 34B, the potential of the terminal BGf of the circuit BBG (the first terminal of the transistor MNi) as the output destination can be rise more steeply than that in the circuit BSPRA in each of FIG. 34A.

Configuration Example 6 of Amplifier Circuit

Figure 35A:
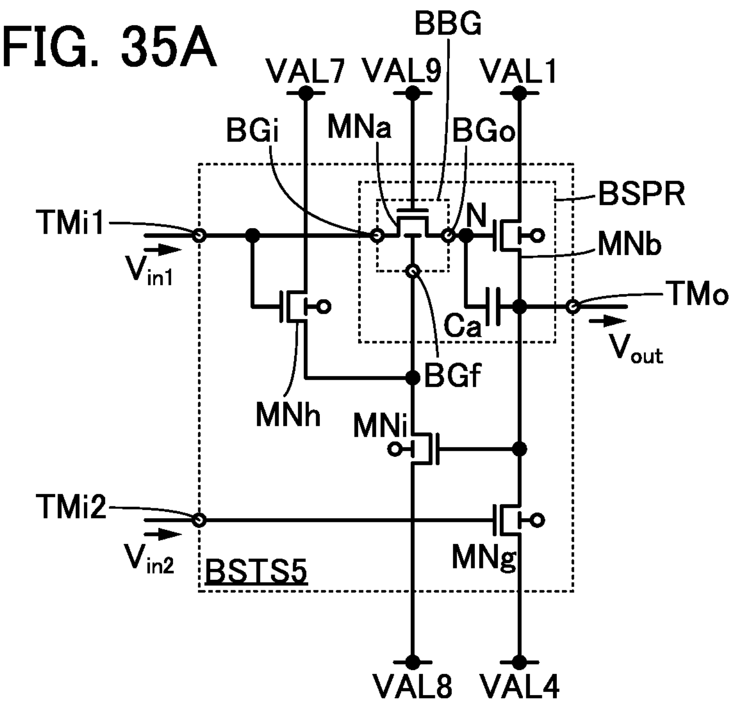
FIGS. 35A and 35B are circuit diagrams each showing an example of a circuit included in a driver circuit.

A circuit BSTS5 illustrated in FIG. 35A is a modification example of the circuit BSTS1 in FIG. 24 and is different from the circuit BSTS1 in that the gate of the transistor MNh is electrically connected not to the wiring VAL7 but to the terminals TMi1 and BGi. In other words, the circuit BSTS5 in FIG. 35A can be said to have a configuration in which the terminals TMi1 and TMi3 in the circuit BSTS1 in FIG. 24 are electrically connected to each other.

For the configuration of the circuit BSTS5 in FIG. 35A which is common with the circuit BSTS1 in FIG. 24, the description of the circuit BSTS1 in FIG. 24 can be referred to.

The circuit BSPR included in the circuit BSTS5 in FIG. 35A has a configuration similar to that of the circuit BSPR in FIG. 5C which is described in Embodiment 1. Thus, for the operation of the circuit BSPR included in the circuit BSTS5 in FIG. 35A, the description of the circuit BSPR in FIG. 5C can be referred to.

For the operation of the circuit BSTS5 in FIG. 35A, the description of the operation example of the circuit BSTS1 in FIG. 24 can be referred to while the potential input to the terminal TMi3 is assumed to correspond to the potential input to the terminal TMi1.

The wiring VAL7 in this configuration preferably serves as, for example, a wiring supplying a variable potential. For example, when the potential of the terminal TMo is a low-level potential and a high-level potential is input to the terminal TMi, the wiring VAL7 is preferably supplied with a high-level potential to increase the potential of the back gate of the transistor MNa whose on-state current is preferably high. When the potential of the terminal TMo is a high-level potential, the wiring VAL7 is preferably supplied with a low-level potential to decrease the potential of the back gate of the transistor MNa whose off-state current is preferably low.

Depending on the circumstances, the wiring VAL7 may serve as a wiring that supplies a fixed potential. The fixed potential can be a high-level potential, for example. In this case, to prevent current flow between the wirings VAL7 and VAL8 which is caused when the transistors MNh and MNi are turned on at the same time, preferably, the wiring VAL9 is a wiring supplying one of a high-level potential and a low-level potential, which supplies a low-level potential to the terminal TMi1 after writing a high-level potential to the node N.

Owing to the absence of the terminal TMi3, the circuit area of the circuit BSTS5 in FIG. 35A can sometimes be smaller than that of the circuit BSTS1 illustrated in FIG. 24.

Next, a modification example of the circuit BSTS5 illustrated in FIG. 35A is described.

Figure 35B:
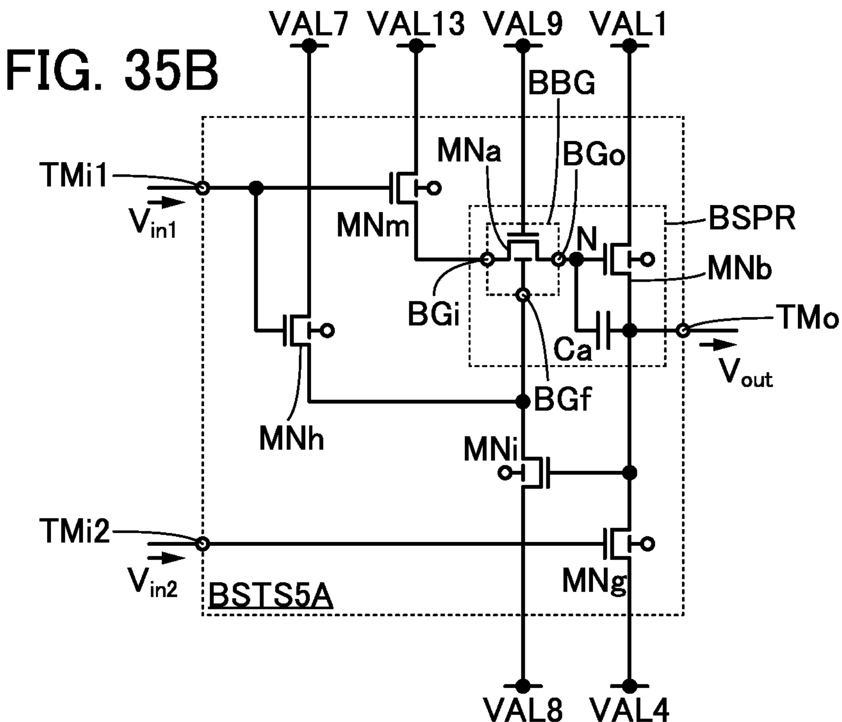

A circuit BSTS5A illustrated in FIG. 35B is a modification example of the circuit BSTS5 in FIG. 35A and different from the circuit BSTS5 in FIG. 35A in that the terminal TMi1 and the gate of the transistor MNh are electrically connected to a gate of a transistor MNm and the terminal BGi is electrically connected to a first terminal of the transistor MNm. A second terminal of the transistor MNm is electrically connected to a wiring VAL13.

The wiring VAL13 serves as a wiring supplying a fixed potential like the wirings VAL1, VAL7, and VAL9, for example. As the fixed potential, for example, a high-level potential can be given. Note that depending on the circumstances, the fixed potential supplied through the wiring VAL13 may be a low-level potential, a ground potential, or a negative potential. Depending on the circumstances, the wiring VAL13 may serve as a wiring that supplies a variable potential.

In the circuit BSTS5A, when a high-level potential is input to the terminal TMi1, the high-level potential is supplied to the gate of the transistor MNm, and accordingly, the potential of the first terminal of the transistor MNm is the potential obtained by subtraction of the threshold voltage of the transistor MNm from the potential supplied from the wiring VAL13.

Thus, the potential of a second terminal of the transistor MNa (node N) is $V_{Mid}$, which is the potential obtained by subtraction of the threshold voltages of the transistors MNm and MNa from the potential supplied from the wiring VAL13.

In the circuit BSTS5A in FIG. 35B, the input impedance is high because the terminal TMi is electrically connected to the gates of the transistors MNm and MNh. Furthermore, after a high-level potential is input to the terminal TMi1 and a potential is written to the node N, the potential of the node N is not changed even when the high-level potential of the terminal TMi1 is changed to a low-level potential. Hence, after the potential is written to the node N, the potential of the terminal TMi1 can be a low-level potential to turn off the transistors MNh and MNm. In addition, such a configuration allows the wiring VAL7 to serve as a wiring supplying not a variable potential but a high-level potential as a fixed potential. In the case where the wiring VAL7 serves as a wiring supplying a high-level potential as a fixed potential, a circuit that generates a variable potential to be transmitted to the wiring VAL7, a timing circuit, or the like is unnecessary, whereby the circuit area and power consumption of the semiconductor device can be reduced.

For the operation other than the above, the description of the operation examples of the circuit BSTS1 in FIG. 24 and the circuit BSTS5 in FIG. 35A can be referred to.

Figure 36A:
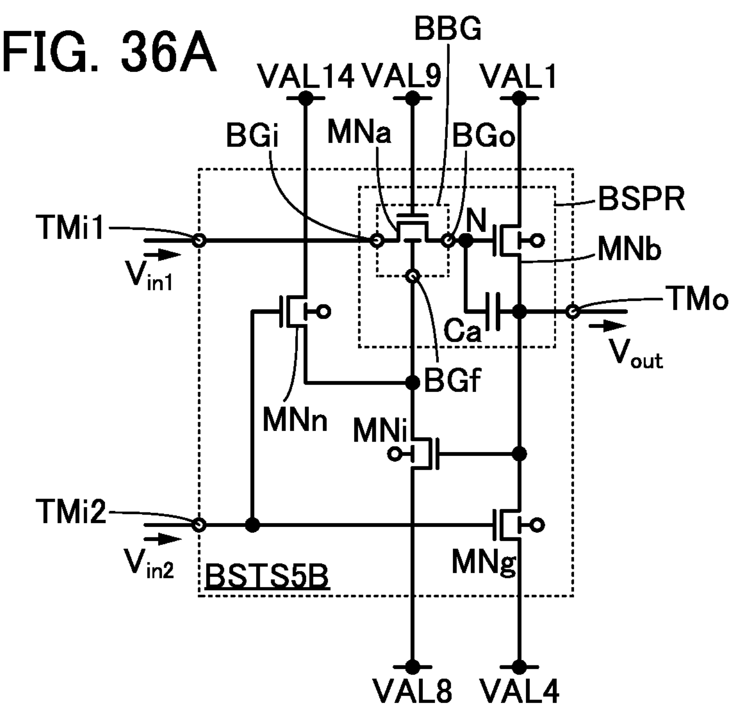
FIGS. 36A and 36B are circuit diagrams each showing an example of a circuit included in a driver circuit.

A circuit BSTS5B illustrated in FIG. 36A is another modification example of the circuit BSTS5 in FIG. 35A different from the circuit BSTS5A in FIG. 35B, and the circuit BSTS5B is different from the circuit BSTS5 in FIG. 35A in including a transistor MNn, instead of the transistor MNh. Note that a gate of the transistor MNn is electrically connected to the terminal TMi2 and the gate of the transistor MNg, a first terminal of the transistor MNn is electrically connected to the first terminal of the transistor MNi and the back gate of the transistor MNa (the terminal BGf of the circuit BBG), and a second terminal of the transistor MNn is electrically connected to a wiring VAL14.

The wiring VAL14 serves as a wiring supplying a fixed potential like the wirings VAL1 and VAL9, for example. As the fixed potential, for example, a high-level potential can be given. Note that depending on the circumstances, the fixed potential supplied through the wiring VAL14 may be a low-level potential, a ground potential, or a negative potential. Depending on the circumstances, the wiring VAL14 may serve as a wiring that supplies a variable potential.

For the operation of the circuit BSTS5B in FIG. 36A, the description of the operation example of the circuit BSTS1 in FIG. 24 can be referred to while the potential input to the terminal TMi3 is assumed to correspond to the potential input to the terminal TMi2.

For example, before a high-level potential is input to the terminal TMi1, a high-level potential is preferably input to the terminal TMi2. This allows the input of a high-level potential to each of the gates of the transistors MNh and MNg. Thus, the potential of the first terminal of the transistor MNi (the terminal BGf of the circuit BBG) is the potential obtained by subtraction of the threshold voltage of the transistor MNh from the potential supplied through the wiring VAL7, and the potential of the first terminal of the transistor MNg (terminal TMo) is the low-level potential supplied through the wiring VAL4. Then, the potential of the terminal TMi2 is changed to a low-level potential to input a high-level potential to the terminal TMi1.

Figure 36B:
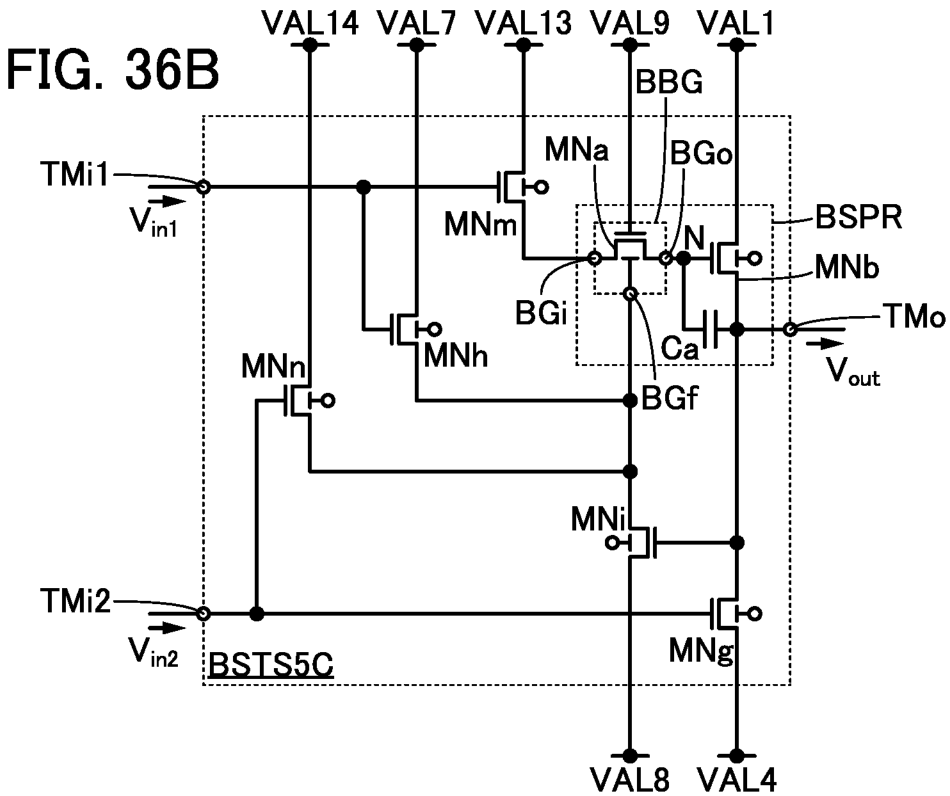

A circuit BSTS5C illustrated in FIG. 36B has a configuration in which the circuit BSTS5A in FIG. 35B and the circuit BSTS5B in FIG. 36A are combined. Specifically, the circuit BSTS5C in FIG. 36B has a configuration in which the circuit BSTS5A in FIG. 35B is provided with the transistor MNn, the gate of the transistor MNn is electrically connected to the terminal TMi2, the first terminal of the transistor MNn is electrically connected to the first terminal of the transistor MNh, the back gate of the transistor MNa, and the first terminal of the transistor MNi, and the second terminal of the transistor MNn is electrically connected to the wiring VAL14.

For the operation example of the circuit BSTS5C in FIG. 36B, the description of the operation examples of the circuit BSTS5A in FIG. 35B and the circuit BSTS5B in FIG. 36A can be referred to.

Example of Application to Display Apparatus

Next, a circuit configuration in which the circuit BSTS in this embodiment (including the amplifier circuits described in Configuration examples 1 to 4 of amplifier circuit) is used as the driver circuit included in the display apparatus in FIG. 9 is described.

Configuration Example of Circuit 100D

Figure 37:
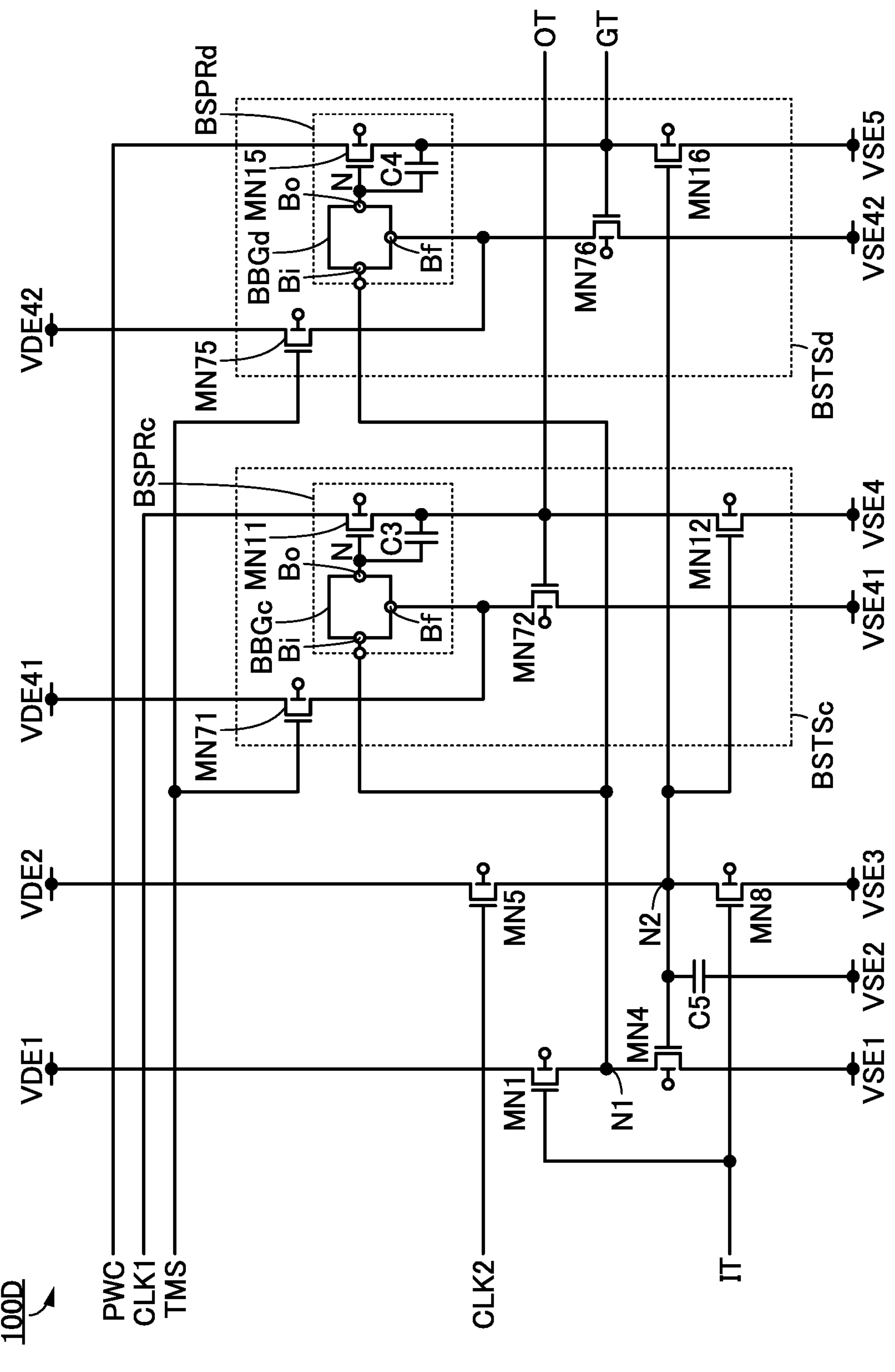
FIG. 37 is a circuit diagram showing an example of a circuit included in a driver circuit.

A circuit 100D in FIG. 37 is a circuit that can be used as the circuit 100 included in the driver circuit GD in each of FIGS. 10A and 10B described in Embodiment 1.

The circuit 100D in FIG. 37 is a modification example of the circuit 100A in FIG. 13 and different from the circuit 100A, for example, in the following points: the circuits BSPRa, BSPRb, BSABc, and BSABd are not provided; a circuit BBGc and a circuit BBGd are provided instead of the circuit BBc and the circuit BBd, respectively; and a transistor MN71, a transistor MN72, a transistor MN75, and a transistor MN76 are provided.

In FIG. 37, the reference numerals BSABa and BSABb denoting the circuits are omitted. In addition, a circuit including the circuit BSPRc and the transistors MN12, MN71, and MN72 is referred to as a circuit BSTSc, and a circuit including the circuit BSPRd and the transistors MN16, MN75, and MN76 is referred to as a circuit BSTSd, with reference to FIG. 37.

The circuits BSTSc and BSTSd each have a circuit configuration similar to that of the circuit BSTS illustrated in FIG. 23A. Specifically, in the circuit BSTSc, the circuit BBGc corresponds to the circuit BBG of the circuit BSTS in FIG. 23A, the transistor MN11 corresponds to the transistor MNb of the circuit BSTS in FIG. 23A, the transistor MN12 corresponds to the transistor MNg of the circuit BSTS in FIG. 23A, the transistor MN71 corresponds to the transistor MNh of the circuit BSTS in FIG. 23A, the transistor MN72 corresponds to the transistor MNi of the circuit BSTS in FIG. 23A, and the capacitor C3 corresponds to the capacitor Ca of the circuit BSTS in FIG. 23A. In the circuit BSTSd, the circuit BBGd corresponds to the circuit BBG of the circuit BSTS in FIG. 23A, the transistor MN15 corresponds to the transistor MNb of the circuit BSTS in FIG. 23A, the transistor MN16 corresponds to the transistor MNg of the circuit BSTS in FIG. 23A, the transistor MN75 corresponds to the transistor MNh of the circuit BSTS in FIG. 23A, the transistor MN76 corresponds to the transistor MNi of the circuit BSTS in FIG. 23A, and the capacitor C4 corresponds to the capacitor Ca of the circuit BSTS in FIG. 23A.

In FIG. 37, a wiring VDE41 and a wiring VDE42 each correspond to the wiring VAL7 in FIG. 23A, the wirings VSE4 and VSE5 each correspond to the wiring VAL4 in FIG. 23A, and a wiring VSE41 and a wiring VSE42 each correspond to the wiring VAL8 in FIG. 23A. It is assumed that the wiring VAL1 in FIG. 23A is electrically connected to the terminal CLK1 or the terminal PWC in FIG. 37.

Thus, the circuit 100D in FIG. 37 is a circuit employing the circuit BSTS in FIG. 23A. Hence, the circuits BSTSc and BSTSd included in the circuit 100D in FIG. 37 can each use any of the circuits illustrated in FIG. 24, FIGS. 25A and 25B, FIG. 26, FIGS. 27A and 27B, FIGS. 28A and 28B, FIGS. 29A and 29B, FIGS. 30A and 30B, FIGS. 31A and 31B, FIGS. 32A and 32B, FIGS. 33A and 33B, FIGS. 34A and 34B, FIGS. 35A and 35B, and FIGS. 36A and 36B described in Configuration examples 1 to 4 of amplifier circuit.

A terminal TMS illustrated in FIG. 37 is electrically connected to gates of the transistors MN71 and MN75. The terminal TMS corresponds to the terminal TMi3 of the circuit BSTS in FIG. 23A. The terminal TMS serves as a terminal supplying a high-level potential or a low-level potential to the gates of the transistors MN71 and MN75. When the terminal TMS is supplied with a high-level potential, the potential from the wiring VDE41 is supplied to a terminal Bf of the circuit BBGc and the potential from the wiring VDE42 is supplied to the terminal Bf of the circuit BBGd.

For the configuration and operation of the circuit 100D in FIG. 37 which are common with the circuit 100A in FIG. 13, the description of the circuit 100A in FIG. 13 can be referred to.

With the use of the circuit BSTS in FIG. 23A as the circuit 100B in FIG. 13 applicable to the driver circuit GD in each of FIGS. 10A and 10B described in Embodiment 1, the potential of the terminal OT can be fed back to a back gate of a transistor included in the circuit BBGc of the circuit BSPRc. As a result, the off-state current of the transistor decreases and thus can be prevented from reducing the potential of the node N in the circuit BSPRc, whereby the potential of the terminal OT can be stabilized. In a similar manner, with the configuration of the circuit 100D in FIG. 37, the potential of the terminal GT can be fed back to a back gate of a transistor included in the circuit BBGd of the circuit BSPRd. As a result, the off-state current of the transistor decreases and thus can be prevented from reducing the potential of the node N in the circuit BSPRd, whereby the potential of the terminal GT can be stabilized.

Configuration Example of Circuit 100E

Figure 38:
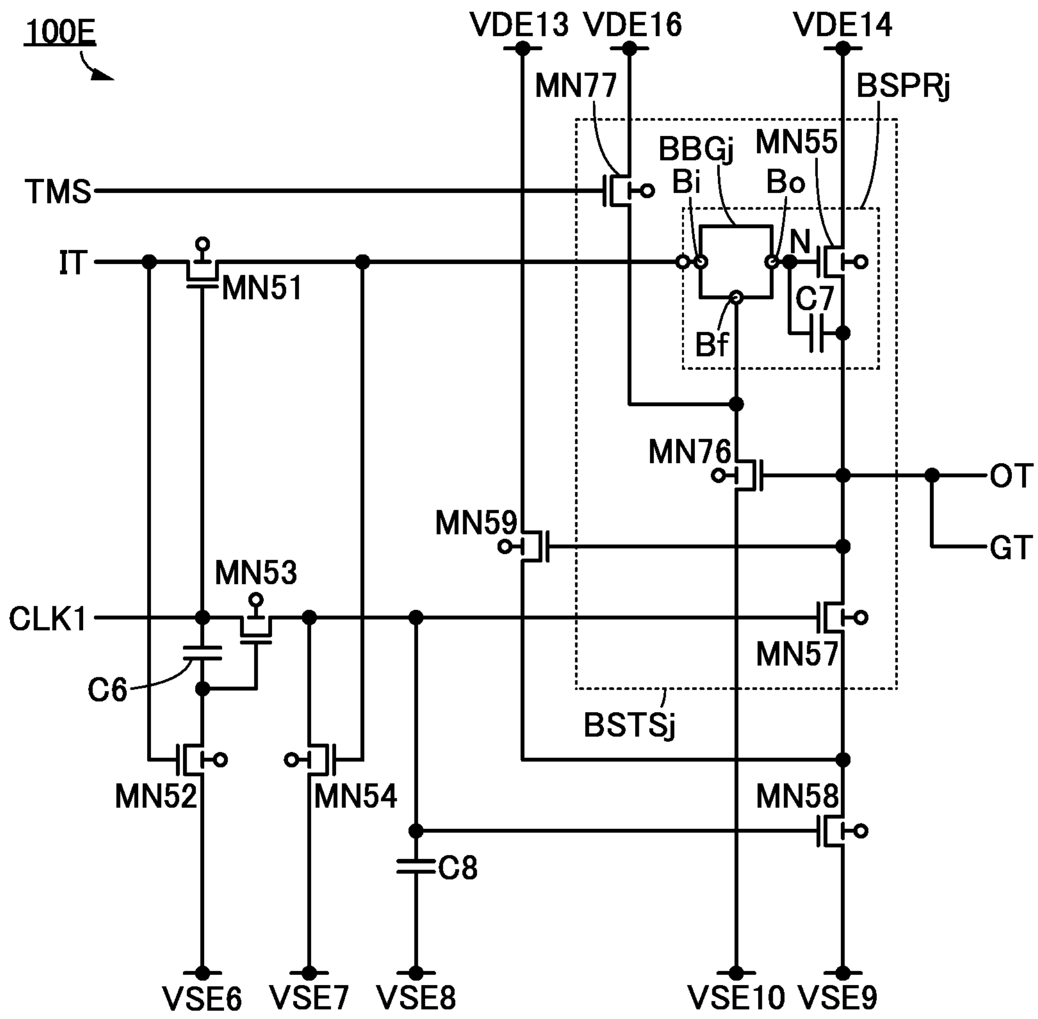
FIG. 38 is a circuit diagram showing an example of a circuit included in a driver circuit.

A circuit 100E in FIG. 38 is different from the circuit 100D in FIG. 37, and can be used as the circuit 100 included in the driver circuit GD in each of FIGS. 10A and 10B described in Embodiment 1.

The circuit 100E in FIG. 38 is a modification example of the circuit 100B in FIG. 16 and different from the circuit 100B, for example, in the following points: the circuit BSABj is not provided; a circuit BBGj is provided instead of the circuit BBj; and the transistor MN76 and a transistor MN77 are provided.

In FIG. 38, a circuit BSTSj is the circuit including the circuit BSPRj and the transistors MN57, MN76, and MN77.

The circuit BSTSj has a circuit configuration similar to that of the circuit BSTS illustrated in FIG. 23A. Specifically, in the circuit BSTSj, the circuit BBGj corresponds to the circuit BBG of the circuit BSTS in FIG. 23A, the transistor MN55 corresponds to the transistor MNb of the circuit BSTS in FIG. 23A, the transistor MN57 corresponds to the transistor MNg of the circuit BSTS in FIG. 23A, the transistor MN77 corresponds to the transistor MNh of the circuit BSTS in FIG. 23A, the transistor MN76 corresponds to the transistor MNi of the circuit BSTS in FIG. 23A, and the capacitor C7 corresponds to the capacitor Ca of the circuit BSTS in FIG. 23A.

In FIG. 38, the wiring VDE14 corresponds to the wiring VAL1 in FIG. 23A, the wiring VDE16 corresponds to the wiring VAL7 in FIG. 23A, the wiring VSE9 corresponds to the wiring VAL4 in FIG. 23A, and a wiring VSE10 corresponds to the wiring VAL8 in FIG. 23A.

Thus, the circuit 100E in FIG. 38 is a circuit employing the circuit BSTS in FIG. 23A. Hence, the circuit BSTSj included in the circuit 100E in FIG. 38 can use any of the circuits illustrated in FIG. 24 to FIGS. 36A and 36B described in Configuration examples 1 to 4 of amplifier circuit.

The terminal TMS illustrated in FIG. 38 is electrically connected to the gate of the transistor MN77. The terminal TMS corresponds to the terminal TMi3 of the circuit BSTS in FIG. 23A. The terminal TMS serves as a terminal supplying a high-level potential or a low-level potential to the gate of the transistor MN77. When the terminal TMS is supplied with a high-level potential, the potential from the wiring VDE16 is supplied to the terminal Bf of the circuit BBGj.

For the configuration and operation of the circuit 100E in FIG. 38 which are common with the circuit 100B in FIG. 16, the description of the circuit 100B in FIG. 16 can be referred to.

With the use of the circuit BSTS in FIG. 23A as the circuit 100B in FIG. 16 applicable to the driver circuit GD in each of FIGS. 10A and 10B described in Embodiment 1, the potential of the terminal OT can be fed back to a back gate of a transistor included in the circuit BBGj of the circuit BSPRj. As a result, the off-state current of the transistor decreases and thus can be prevented from reducing the potential of the node N in the circuit BSPRj, whereby the potential of each of the terminals OT and GT can be stabilized.

Configuration Example of Circuit 100F

Figure 39:
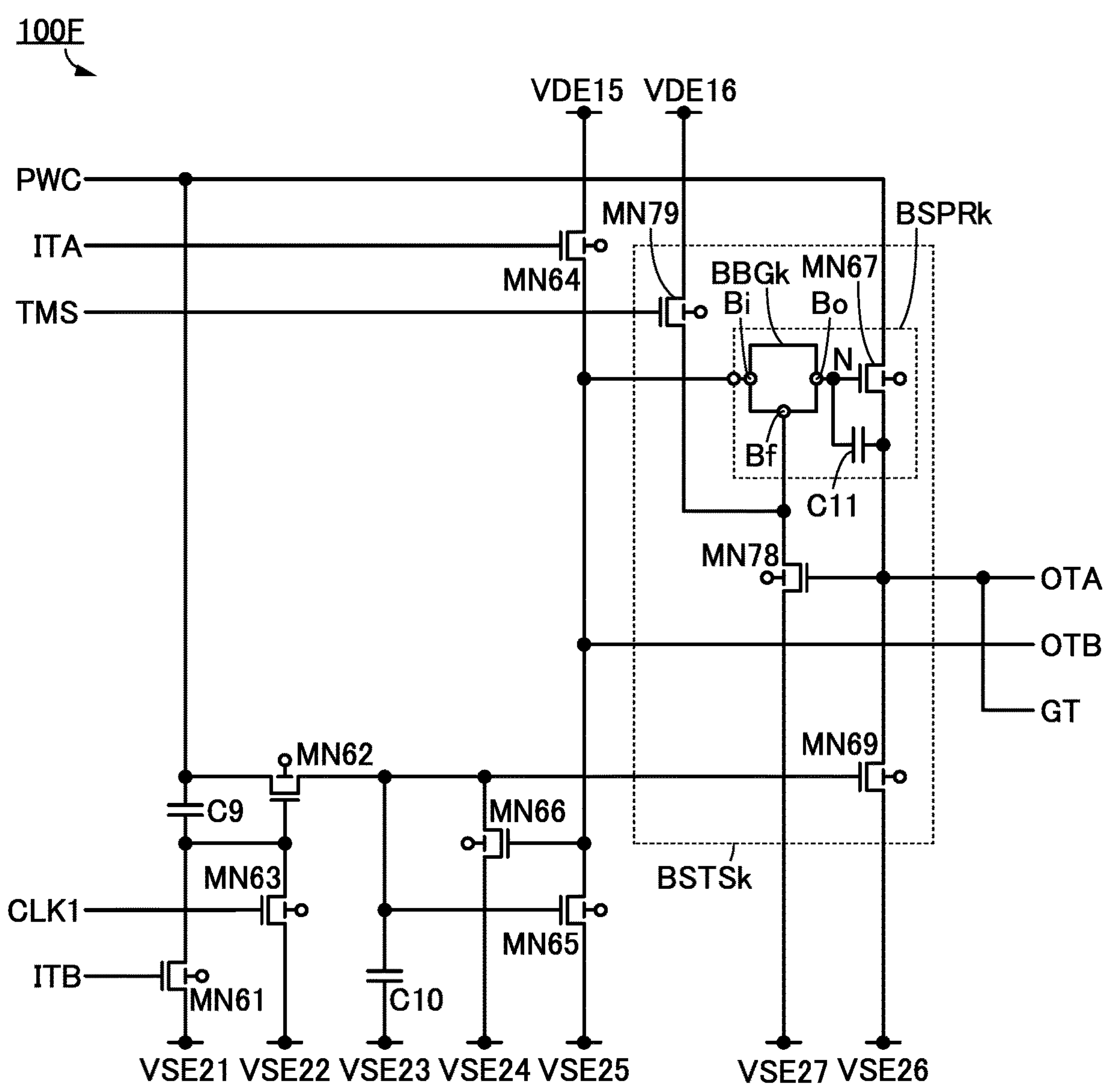
FIG. 39 is a circuit diagram showing an example of a circuit included in a driver circuit.

A circuit 100F in FIG. 39 is different from the circuit 100D in FIG. 37 and the circuit in FIG. 38, and can be used as the circuit 100E included in the driver circuit GD in each of FIGS. 10A and 10B described in Embodiment 1.

The circuit 100F in FIG. 39 is a modification example of the circuit 100C in FIG. 17 and different from the circuit 100C, for example, in the following points: the circuit BSABk is not provided; a circuit BBGk is provided instead of the circuit BBk; and a transistor MN78 and a transistor MN79 are provided.

In FIG. 39, a circuit BSTSk is the circuit including the circuit BSPRk and the transistors MN69, MN78, and MN79.

The circuit BSTSk has a circuit configuration similar to that of the circuit BSTS illustrated in FIG. 23A. Specifically, in the circuit BSTSk, the circuit BBGk corresponds to the circuit BBG of the circuit BSTS in FIG. 23A, the transistor MN67 corresponds to the transistor MNb of the circuit BSTS in FIG. 23A, the transistor MN69 corresponds to the transistor MNg of the circuit BSTS in FIG. 23A, the transistor MN79 corresponds to the transistor MNh of the circuit BSTS in FIG. 23A, the transistor MN78 corresponds to the transistor MNi of the circuit BSTS in FIG. 23A, and the capacitor C11 corresponds to the capacitor Ca of the circuit BSTS in FIG. 23A.

In FIG. 39, the wiring VDE16 corresponds to the wiring VAL7 in FIG. 23A, the wiring VSE26 corresponds to the wiring VAL4 in FIG. 23A, and a wiring VSE27 corresponds to the wiring VAL8 in FIG. 23A. Note that the wiring VAL1 in FIG. 23A is electrically connected to the terminal PWC in FIG. 39.

Thus, the circuit 100F in FIG. 39 is a circuit using the circuit BSTS in FIG. 23A. Hence, the circuit BSTSk included in the circuit 100F in FIG. 39 can use any of the circuits illustrated in FIG. 24 to FIGS. 36A and 36B described in Configuration examples 1 to 4 of amplifier circuit.

The terminal TMS illustrated in FIG. 39 is electrically connected to the gate of the transistor MN79. The terminal TMS corresponds to the terminal TMi3 of the circuit BSTS in FIG. 23A. The terminal TMS serves as a terminal supplying a high-level potential or a low-level potential to the gate of the transistor MN79. When the terminal TMS is supplied with a high-level potential, the potential from the wiring VDE16 is supplied to the terminal Bf of the circuit BBGk.

For the configuration and operation of the circuit 100F in FIG. 39 which are common with the circuit 100C in FIG. 17, the description of the circuit 100C in FIG. 17 can be referred to.

With the use of the circuit BSTS in FIG. 23A as the circuit 100C in FIG. 17 applicable to the driver circuit GD in each of FIGS. 10A and 10B described in Embodiment 1, the potentials of the terminals OTA and GT can be fed back to a back gate of a transistor included in the circuit BBGk of the circuit BSPRk. As a result, the off-state current of the transistor decreases and thus can be prevented from reducing the potential of the node N in the circuit BSPRk, whereby the potential of each of the terminals OTA and GT can be stabilized.

Configuration Example of Circuit 200B

Figure 40:
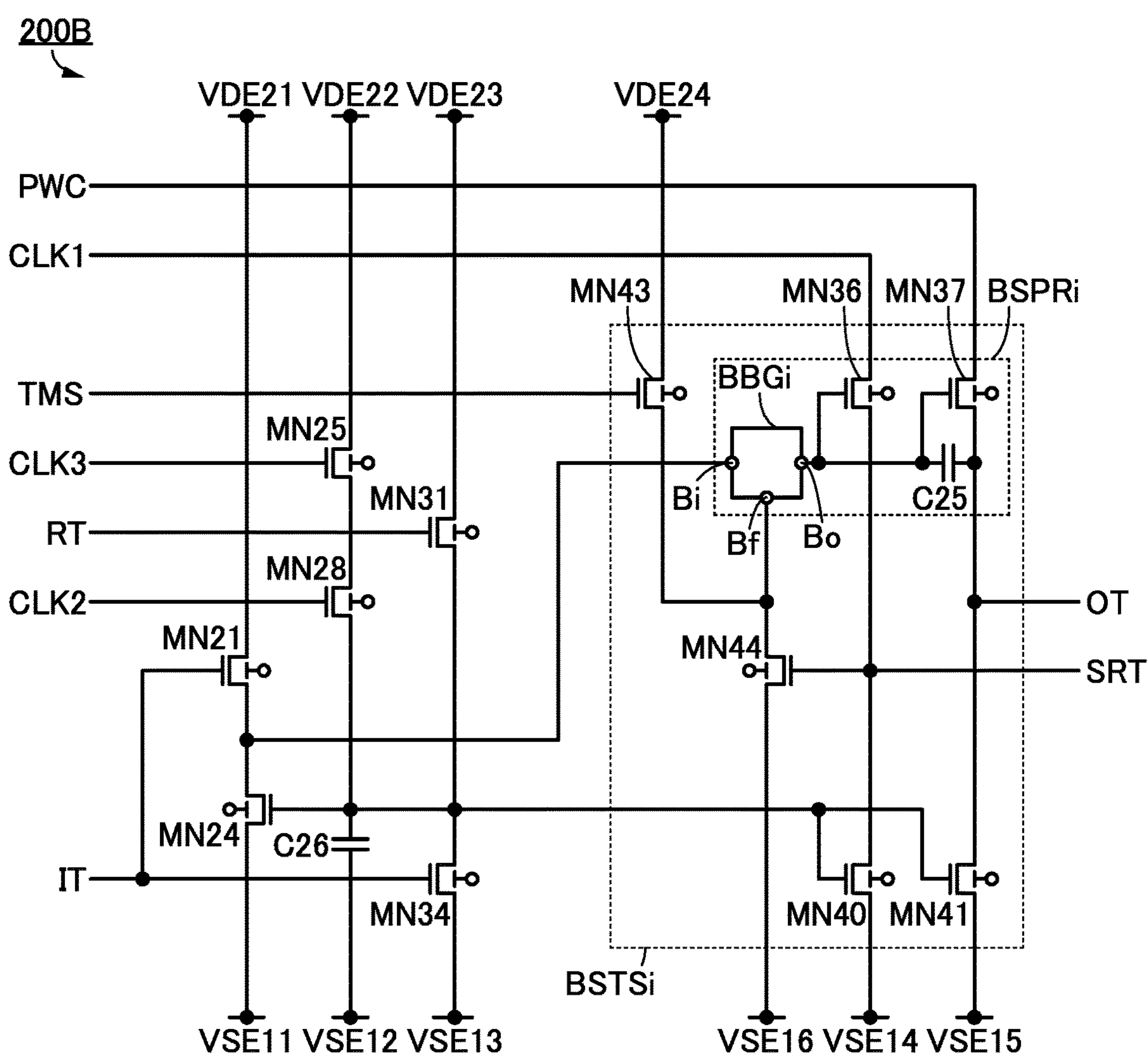
FIG. 40 is a circuit diagram showing an example of a circuit included in a driver circuit.

A circuit 200B in FIG. 40 is a circuit that can be used as the circuit 200 included in the driver circuit SD in FIG. 18 described in Embodiment 1.

The circuit 200B in FIG. 40 is a modification example of the circuit 200A in FIG. 20 and different from the circuit 200A, for example, in the following points: the circuits BSPRe, BSPRf, BSABg, BSABh, BSABi1, and BSABi2 are not provided; a circuit BBGi is provided instead of the circuit BBi; and a transistor MN43 and a transistor MN44 are provided.

In FIG. 40, the reference numerals BSABe, BSABf, BSABg, BSABh, BSABi1, and BSABi2 denoting the circuits are omitted. Also in FIG. 40, a circuit including the circuit BSPRi and the transistors MN40, MN41, MN43, and MN44 is referred to as a circuit BSTSi.

The circuit BSTSi has a configuration modified from that of the circuit BSTS illustrated in FIG. 23A, and is different from the circuit BSTS in FIG. 23A in including two terminals for output. Thus, the circuit BSPRi includes the transistors MN36 and MN37 as two transistors corresponding to the transistor MNb of the circuit BSTS in FIG. 23A. For electrical connection between the transistors MN36, MN37, MN40, and MN41 and the capacitor C25, the description of the circuit 200A in FIG. 20 and the circuit 200A1 in FIG. 21 can be referred to. Note that the circuit BSTSi has a configuration in which the potential of not the terminal OT but the terminal SRT is fed back to a back gate of a transistor included in the circuit BBGi.

In the circuit BSTSi, the circuit BBGi corresponds to the circuit BBG of the circuit BSTS in FIG. 23A, the transistor MN36 corresponds to the transistor MNb of the circuit BSTS in FIG. 23A, the transistor MN40 corresponds to the transistor MNg of the circuit BSTS in FIG. 23A, the transistor MN43 corresponds to the transistor MNh of the circuit BSTS in FIG. 23A, and the transistor MN44 corresponds to the transistor MNi of the circuit BSTS in FIG. 23A. With this configuration, the potential of the terminal SRT is input to the back gate of the transistor included in the circuit BBGi.

The capacitor C25 is provided between the gate and first terminal of the transistor MN37 so that the potential of the first terminal of the transistor MN37 can be increased by a bootstrap. When the potential of the transistor MN37 is increased by the bootstrap, the potential of the transistor MN36 also increases, whereby the potential of the terminal SRT can increase while the potential of the terminal OT increases.

In FIG. 40, a wiring VDE24 corresponds to the wiring VAL7 in FIG. 23A, each of the wirings VSE14 and VSE15 corresponds to the wiring VAL4 in FIG. 23A, and the wiring VSE16 corresponds to the wiring VAL8 in FIG. 23A. Note that the wiring VAL1 in FIG. 23A is electrically connected to the terminal PWC or CLK1 in FIG. 40.

Thus, the circuit 200B in FIG. 40 is a circuit using the circuit BSTS in FIG. 23A. Hence, the circuit BSTSi included in the circuit 200B in FIG. 40 can use any of the circuits illustrated in FIG. 24 to FIGS. 36A and 36B described in Configuration examples 1 to 4 of amplifier circuit.

The terminal TMS illustrated in FIG. 40 is electrically connected to the gate of the transistor MN43. The terminal TMS corresponds to the terminal TMi3 of the circuit BSTS in FIG. 23A. The terminal TMS serves as a terminal supplying a high-level potential or a low-level potential to the gate of the transistor MN43. When the terminal TMS is supplied with a high-level potential, the potential from the wiring VDE24 is supplied to the terminal Bf of the circuit BBGi.

For the configuration and operation of the circuit 200B in FIG. 40 which are common with the circuit 200A in FIG. 20, the description of the circuit 200A in FIG. 20 can be referred to.

With the use of the circuit BSTS in FIG. 23A as the circuit 200 in applicable to the driver circuit SD in FIG. 18 described in Embodiment 1, the potential of the terminal SRT can be fed back to a back gate of a transistor included in the circuit BBGi of the circuit BSPRi. As a result, the off-state current of the transistor decreases and thus can be prevented from reducing the potential of the node N in the circuit BSPRc, whereby the potentials of the terminals SRT and OT can be stabilized. Note that although FIG. 40 shows an example in which the potential of the terminal SRT is fed back to the back gate of the transistor included in the circuit BBGi, not the potential of the terminal SRT but the potential of the terminal OT may be fed back to the back gate of the transistor included in the circuit BBGi. In other words, a gate of the transistor MN44 may be electrically connected not to the terminal SRT, the first terminal of the transistor MN36, and the first terminal of the transistor MN40 but to the terminal OT, the first terminal of the transistor MN37, the first terminal of the transistor MN41, and the second terminal of the capacitor C25.

Note that this embodiment can be combined with any of the other embodiments in this specification as appropriate. For example, the configurations, structures, methods, and the like described in this embodiment can be used in an appropriate combination with any of the configurations, structures, methods, and the like described in the other embodiments and the like.

Embodiment 3

In this embodiment, structure examples of a display apparatus of one embodiment of the present invention will be described.

Structure Example of Display Apparatus

Figure 41A:
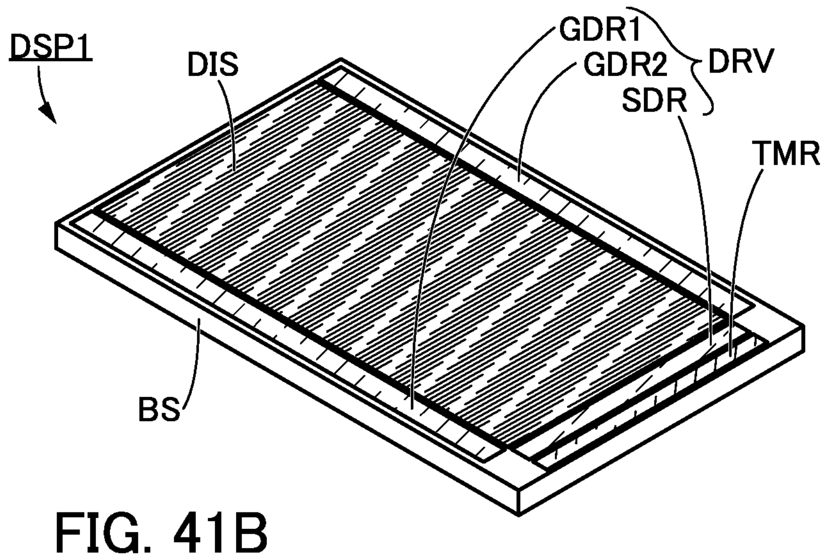
FIGS. 41A and 41B are schematic perspective views each showing a structure example of a display apparatus.

FIG. 41A is a schematic perspective view illustrating a display apparatus according to one embodiment of the present invention. A display apparatus DSP1 includes a display region DIS, a driver circuit region DRV, and a terminal region TMR, for example. The display apparatus DSP1 includes a substrate BS, and the display region DIS, the driver circuit region DRV, and the terminal region TMR are located over the substrate BS.

The driver circuit region DRV includes, for example, a driver circuit GDR1, a driver circuit GDR2, and a driver circuit SDR.

As the substrate BS, a semiconductor substrate (e.g., a single crystal substrate formed of silicon or germanium) can be used, for example. Besides such a semiconductor substrate, any of the following can be used as the substrate BS: a silicon on insulator (SOI) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base film. Examples of the glass substrate include a barium borosilicate glass substrate, an aluminoborosilicate glass substrate, and a soda lime glass substrate. Examples of materials for the flexible substrate, the attachment film, or the base film include plastic typified by polyethylene terephthalate (PET), polyethylene naphthalate (PEN), polyethersulfone (PES), and polytetrafluoroethylene (PTFE). Another example is a synthetic resin such as an acrylic resin. Other examples are polypropylene, polyester, polyvinyl fluoride, and polyvinyl chloride. Other examples are polyamide, polyimide, aramid, an epoxy resin, an inorganic vapor-deposited film, and paper. Note that in the case where the manufacturing process of the display apparatus DSP1 involves heat treatment, a highly heat-resistant material is preferably used for the substrate BS.

For example, in the case where a semiconductor substrate including silicon as a material is used as the substrate BS, transistors included in the display region DIS and the driver circuit region DRV can be Si transistors and can be formed over the substrate BS.

For example, in the case where a glass substrate is used as the substrate BS, transistors included in the display region DIS and the driver circuit region DRV can be OS transistors and can be formed over the substrate BS.

One or more selected from the driver circuits GDR1, GDR2, and SDR included in the driver circuit region DRV may be mounted as an integrated circuit (IC) on the substrate BS by a chip on glass (COG) technique.

The driver circuits GDR1 and GDR2 each serve as a driver circuit for displaying an image on the display region DIS, for example. Specifically, for example, the driver circuits GDR1 and GDR2 each serve as a gate driver circuit for the display region DIS. For example, the driver circuit SDR serves as a source driver circuit for the display region DIS.

Thus, for example, the driver circuit GD in each of FIGS. 10A and 10B described in the above embodiment can be employed for each of the driver circuits GDR1 and GDR2. For example, the driver circuit SD in FIG. 18 described in the above embodiment can be used as the driver circuit SDR.

The terminal region TMR includes a terminal for supplying an image signal and a power supply potential into the display apparatus DSP1 from the outside. A flexible printed circuit (FPC) may be electrically connected to the terminal region TMR. A chip may be provided as an IC over the FPC by a chip on film (COF) technique. The IC, for example, may include a driver circuit for displaying an image on the display region DIS.

The pixel region DIS includes, for example, a plurality of pixels. The plurality of pixels may be arranged in a matrix in the pixel region DIS.

Each of the plurality of pixels can express one color or a plurality of colors. In particular, the plurality of colors can be, for example, three colors of red, green, and blue. Alternatively, the plurality of colors may be two or more colors selected from, for example, red, green, blue, cyan, magenta, yellow, and white. Note that in the case where each of pixels expressing different colors is called a subpixel and white is expressed by a plurality of subpixels expressing different colors, the plurality of subpixels are collectively called a pixel in some cases. In this specification and the like, a subpixel is referred to as a pixel for convenience.

Note that the display apparatus of one embodiment of the present invention is not limited to the structure of the display apparatus DSP1 in FIG. 41A. For example, the display apparatus of one embodiment of the present invention may have the structure of the display apparatus DSP2 illustrated in FIG. 41B.

Figure 41B:
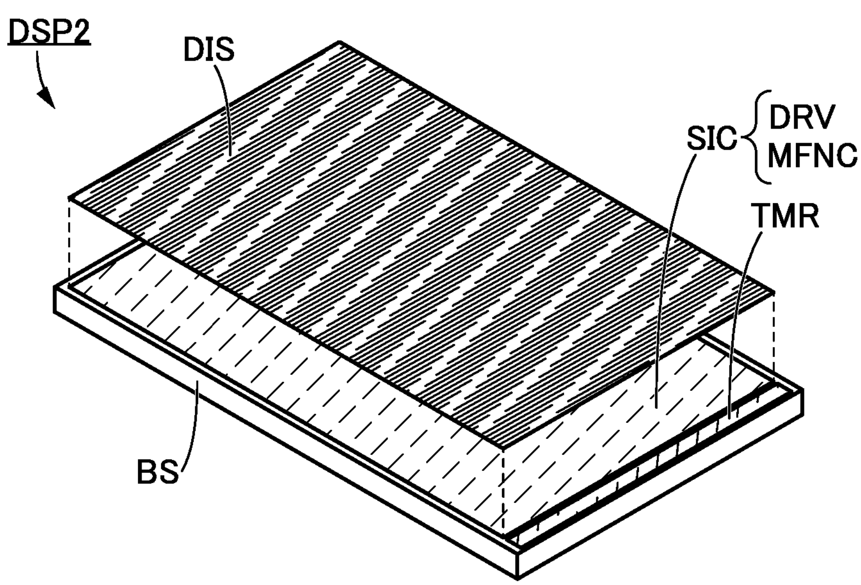

The display apparatus DSP2 in FIG. 41B includes the display region DIS, the circuit region SIC, and the terminal region TMR, for example. The display apparatus DSP2 further includes the substrate BS, like the display apparatus DSP1. The display apparatus DSP2 is different from the display apparatus DSP1 in that the circuit region SIC and the terminal region TMR are provided over the substrate BS and the display region DIS is provided over the circuit region SIC.

The circuit region SIC includes, for example, the driver circuit region DRV described above. The circuit region SIC may include any of a variety of functional circuits other than the driver circuit region DRV In this embodiment, the functional circuit is included in a functional circuit region MFNC.

The functional circuit region MFNC may include a graphics processing unit (GPU), for example. In the case where the display apparatus DSP2 includes a touch panel, the functional circuit region MFNC may include a sensor controller for controlling a touch sensor included in the touch panel.

In the case where a light-emitting device containing an organic EL material is used as the display element of the display apparatus DSP2, an EL correction circuit may be included in the functional circuit region MFNC. The EL correction circuit has a function of appropriately adjusting the amount of current input to the light-emitting device containing an organic EL material. Since the emission luminance of the light-emitting device containing an organic EL material is proportional to the current, when the characteristics of a driving transistor electrically connected to the light-emitting device are not favorable, the luminance of light emitted from the light-emitting device might be lower than a desired luminance. For example, the EL correction circuit monitors the amount of current flowing through the light-emitting device and increases the amount of current when the amount of current is smaller than a desired amount, whereby the luminance of light emitted from the light-emitting device can be increased. By contrast, when the amount of current is larger than a desired amount, the amount of current flowing through the light-emitting device may be adjusted to be small.

In the case where a liquid crystal element is used as the display element of the display apparatus DSP2, a gamma correction circuit may be included in the functional circuit region MFNC.

Figure 42:
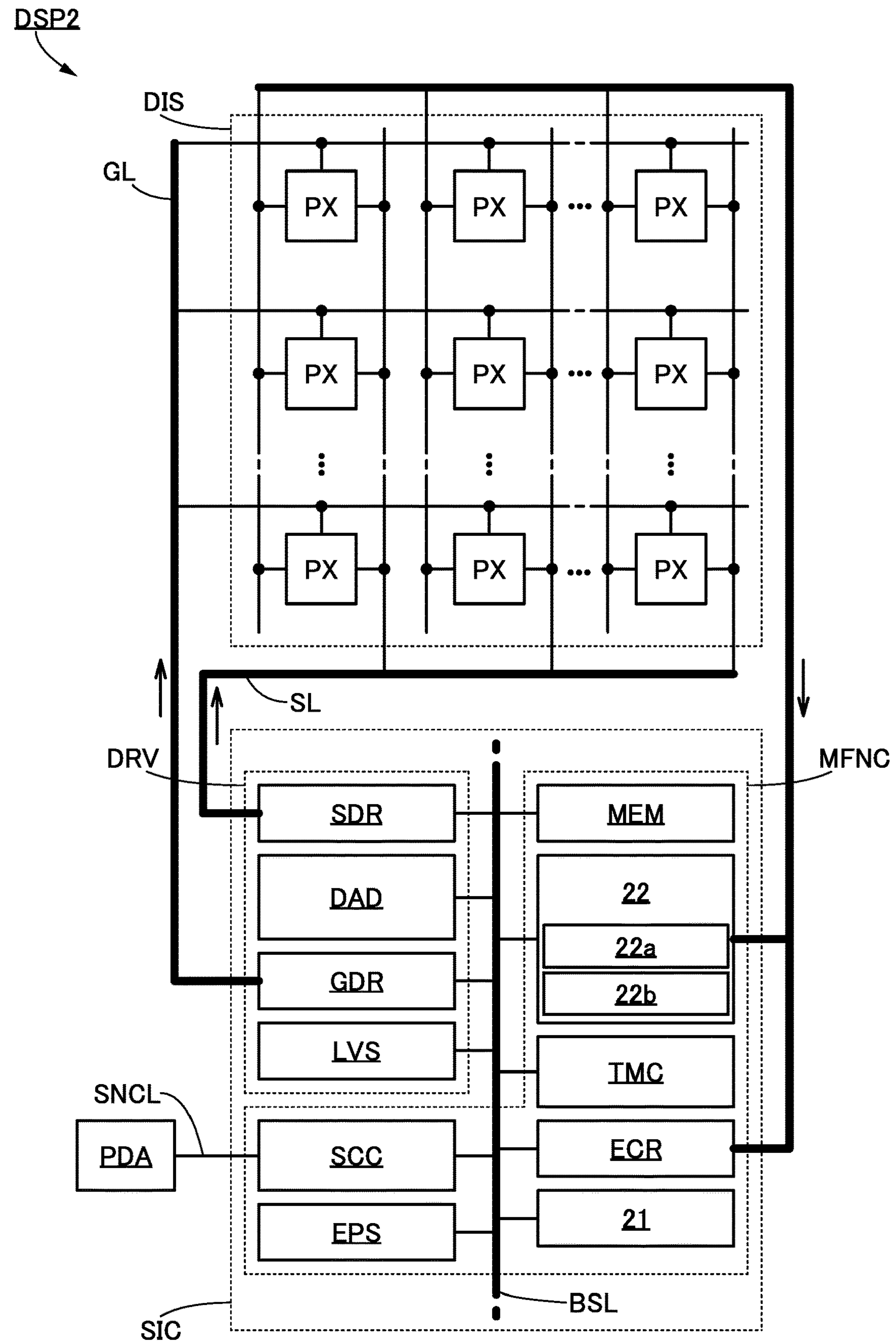
FIG. 42 is a block diagram showing a configuration example of a display apparatus.

FIG. 42 is a block diagram illustrating a configuration example of the display apparatus DSP2 illustrated in FIG. 41B. The display apparatus DSP2 illustrated in FIG. 42 includes a display region DIS and a circuit region SIC, for example. A sensor PDA illustrated in FIG. 42 may be placed inside or outside the display apparatus DSP2.

The display apparatus DSP1 in FIG. 41A may be electrically connected to the functional circuit region MFNC located outside the display apparatus DSP1 through the terminal region TMR. The structure of the display apparatus DSP1 in this case can be regarded as similar to that of the display apparatus DSP2 illustrated in FIG. 42.

In FIG. 42, the thick solid lines denote a plurality of wirings or bus wirings.

In FIG. 42, the display region DIS includes a plurality of pixel circuits PX arranged in a matrix, for example. For example, one or more selected from a liquid crystal display device, a light-emitting device including an organic EL material, and a light-emitting device including a light-emitting diode (e.g., a micro LED) can be used in the pixel circuit PX. Note that in the description in this embodiment, the pixel circuit PX in the display region DIS includes a light-emitting device including an organic EL material.

In FIG. 42, the circuit region SIC includes the driver circuit region DRV and the functional circuit region MFNC, as described above.

The driver circuit region DRV functions as a peripheral circuit for driving the display region DIS, for example. Specifically, the driver circuit region DRV includes, for example, the driver circuit SDR, the digital-analog converter circuit DAD, the driver circuit GDR, and a level shifter LVS. Note that the s driver circuit SDR corresponds to the driver circuit SD in FIGS. 2A and 2B, and the driver circuit GDR corresponds to the driver circuit GD in FIGS. 2A and 2B, for example.

The functional circuit region MFNC can be provided with, for example, a memory device storing image data to be displayed on the display region DIS, a decoder for decoding encoded image data, a GPU for processing image data, a power supply circuit, a correction circuit, and a CPU. In FIG. 42, the functional circuit region MFNC includes a memory device MEM, a GPU 22, an EL correction circuit ECR, a timing controller TMC, a CPU (NoffCPU (registered trademark)) 21, a sensor controller SCC, and a power supply circuit EPS, for example.

In the display apparatus DSP2 shown in FIG. 42, for example, a bus wiring BSL is electrically connected to each of the circuits included in the driver circuit region DRV and each of the circuits included in the functional circuit region MFNC.

The driver circuit SDR has a function of transmitting image data to the pixel circuit PX included in the display region DIS, for example. Thus, the driver circuit SDR is electrically connected to the pixel circuit PX through a wiring SL.

The digital-to-analog converter circuit DAD has a function of, for example, converting image data that has been digitally processed by the GPU or correction circuit described later, into analog data. The image data converted into analog data is transmitted to the display region DIS through the driver circuit SDR. Note that the digital-to-analog converter circuit DAD may be included in the driver circuit SDR, and the image data may be transmitted to the driver circuit SDR, the digital-to-analog converter circuit DAD, and the display region DIS in this order.

The driver circuit GDR has a function of selecting the pixel circuit PX to which image data is to be transmitted in the display region DIS, for example. Thus, the driver circuit GDR is electrically connected to the pixel circuit PX through a wiring GL.

The level shifter LVS has a function of converting the signals to be input to the driver circuit SDR, the digital-to-analog converter circuit DAD, the driver circuit GDR, and the like into signals having appropriate levels, for example.

The memory device MEM has a function of storing image data to be displayed on the display region DIS, for example. Note that the memory device MEM can be configured to store the image data as digital data or analog data.

In the case where the memory device MEM stores image data, the memory device MEM is preferably a nonvolatile memory. In this case, the memory device MEM can be a NAND memory or the like.

In the case where the memory device MEM stores temporary data generated in the GPU 22, the EL correction circuit ECR, the CPU 21, or the like, the memory device MEM is preferably a volatile memory. In that case, a static random access memory (SRAM), a dynamic random access memory (DRAM), or the like can be used as the memory device MEM.

The GPU 22 has a function of performing processing for plotting the image data read from the memory device MEM on the display region DIS, for example. Specifically, the GPU 22 is configured to perform pipeline processing in parallel and can thus perform high-speed processing of the image data to be displayed on the display region DIS. The GPU 22 can also function as a decoder for decoding an encoded image.

The functional circuit region MFNC may include a plurality of circuits that can increase the display quality of the display region DIS. As such circuits, for example, correction circuits (dimming or toning circuits) that detect and correct color irregularity of an image displayed on the display region DIS to optimize the image may be provided. In the case where the pixel in the display region DIS includes a light-emitting device including an organic EL material, the functional circuit region MFNC may be provided with an EL correction circuit. Note that because the description in this embodiment is made on the assumption that the pixel circuit PX in the display region DIS includes the light-emitting device including an organic EL material, the functional circuit region MFNC in this example is provided with the EL correction circuit ECR.

The above-described image correction may be performed using artificial intelligence in the following manner, for example. A current flowing in the display device included in the pixel (or a voltage applied to the display device) is monitored and acquired, an image displayed on the display region DIS is acquired with an image sensor or the like, the current (or voltage) and the image are used as input data in an arithmetic operation of the artificial intelligence (e.g., an artificial neural network), and the output result is used to determine whether the image should be corrected.

Such an arithmetic operation of artificial intelligence can be applied to not only image correction but also upconversion of image data. In this case, upconversion of low-resolution image data in accordance with the resolution of the display region DIS allows a high-display-quality image to be displayed on the display region DIS. The arithmetic operation of artificial intelligence can also be applied to downconversion of image data.

Note that the above-described arithmetic operation of the artificial intelligence can be performed using the GPU 22 included in the functional circuit region MFNC. That is, the GPU 22 can be used to perform arithmetic operations for various kinds of correction (e.g., a color irregularity correction circuit 22*a* and an upconversion circuit 22*b*).

Note that in this specification and the like, a GPU performing an arithmetic operation of the artificial intelligence is referred to as an AI accelerator. That is, the GPU included in the functional circuit region MFNC may be replaced with an AI accelerator in the description in this specification and the like.

The timing controller TMC has a function of changing the frame rate at which an image is displayed on the display region DIS. For example, the display apparatus DSP2 can be driven at a frame rate reduced by the timing controller TMC in the case where the display region DIS displays a still image; for another example, the display apparatus DSP2 can be driven at a frame rate increased by the timing controller TMC in the case where the display region DIS displays a moving image. In other words, the display apparatus DSP2 provided with the timing controller TMC can be driven at a frame rate that is changed depending on which of a still image and a moving image is displayed. Specifically, since the frame rate when the display region DIS displays a still image can be lowered, the power consumption of the display apparatus DSP2 can be reduced.

The CPU 21 has a function of, for example, performing general-purpose processing such as execution of an operating system, control of data, and execution of various arithmetic operations and programs. In the display apparatus DSP2, the CPU 21 has a function of, for example, giving an instruction for an operation for writing or reading image data to/from the memory device MEM, an operation for correcting image data, an operation for a later-described sensor, or the like. Furthermore, the CPU 21 may have a function of, for example, transmitting a control signal to at least one of the circuits included in the functional circuit region MFNC, such as the memory device, the GPU, the correction circuit, the timing controller, and a high frequency circuit.

The CPU 21 may include a circuit for temporarily backing up data (hereinafter referred to as a backup circuit). The backup circuit is preferably capable of retaining the data even after supply of a power supply voltage is stopped. For example, in the case where the display region DIS displays a still image, the CPU 21 can cease to work until an image different from the currently displayed still image is displayed. Accordingly, dynamic power consumption by the CPU 21 can be reduced in such a manner that the data under processing by the CPU 21 is backed up in the backup circuit and then supply of a power supply voltage to the CPU 21 is stopped to stop the CPU 21. In this specification and the like, a CPU including a backup circuit is referred to as a NoffCPU.

The sensor controller SCC has a function of, for example, controlling the sensor PDA. FIG. 42 shows a wiring SNCL as a wiring for electrically connecting the sensor PDA to the sensor controller SCC.

The sensor PDA is, for example, a touch sensor that can be provided above, below, or inside the display region DIS.

Alternatively, the sensor PDA may be an illuminance sensor, for example. Specifically, the illuminance sensor acquiring the intensity of the external light with which the display region DIS is irradiated makes it possible to change the brightness (luminance) of an image displayed on the display region DIS in accordance with the intensity of the external light. For example, under intense external light, the luminance of an image displayed on the display region DIS can be increased to enhance the viewability of the image. By contrast, under weak external light, the luminance of an image displayed on the display region DIS can be lowered to reduce the power consumption.

Alternatively, the sensor PDA can be an image sensor, for example. For example, an image or the like acquired with the image sensor can be displayed on the display region DIS.

The power supply circuit EPS has a function of, for example, generating voltages to be supplied to the circuits included in the driver circuit region DRV, the circuits included in the functional circuit region MFNC, the pixels included in the display region DIS, and the like. Note that the power supply circuit EPS may have a function of selecting a circuit to which a voltage is to be supplied. For example, the power supply circuit EPS stops supply of a voltage to the circuits included in the functional circuit region MFNC (e.g., the driver circuit SDR and the digital-analog converter circuit DAD) and the circuits included in the driver circuit region DRV (e.g., the CPU 21 and the GPU 22) during a period in which the display region DIS displays a still image, whereby the power consumption of the whole display apparatus DSP can be reduced.

Cross-Sectional Structure Example 1 of Display Apparatus

Next, a cross-sectional structure example of the display apparatus DSP1 in FIG. 41A is described.

Figure 43:
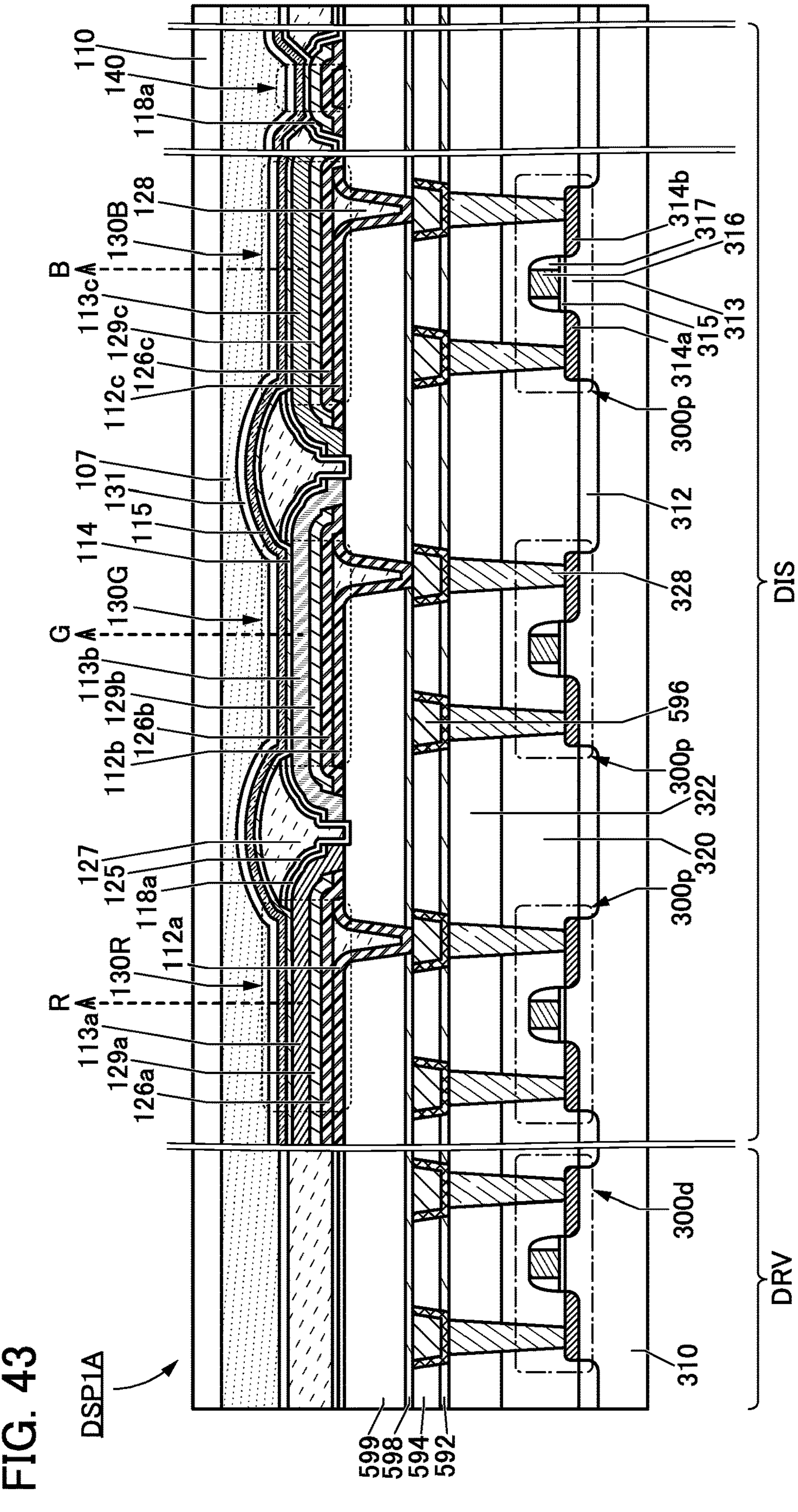
FIG. 43 is a schematic cross-sectional view showing a structure example of a display apparatus.

The display apparatus DSP1A in FIG. 43 is a cross-sectional structure example of the display apparatus DSP1 in FIG. 41A. The display apparatus DSP1A has a structure provided with a pixel circuit, a driver circuit, and the like over a substrate 310. In the display apparatus DSP1A in FIG. 43, the driver circuit region DRV and the display region DIS in FIG. 41A are illustrated.

The substrate 310 in FIG. 43 corresponds to the substrate BS in FIG. 41A. The diagonal size of the display apparatus DSP1A can be determined depending on the kind and the size of the substrate 310, for example. For example, in the case where a display apparatus with a diagonal size greater than or equal to 30 inches, greater than or equal to 50 inches, greater than or equal to 70 inches, or greater than or equal to 100 inches is fabricated for a television device or an electronic device for digital signage application, a glass substrate may be used as the substrate 310. In the case where a display apparatus with a diagonal size of less than or equal to 10 inches, less than or equal to 5 inches, less than or equal to 1.5 inches, or less than or equal to 1 inch is fabricated for a device for XR or a wearable information terminal, a semiconductor substrate may be used as the substrate 310.

In the description of the display apparatus DSP1A in FIG. 43, the substrate 310 is a semiconductor substrate.

There is no particular limitation on the screen ratio (aspect ratio) of the display apparatus DSP1A. For example, the display apparatus DSP1A can be compliant with any of various screen ratios such as 1:1 (square), 4:3, 16:9, 16:10, 21:9, and 32:9.

In the display apparatus DSP1A in FIG. 43, a transistor 300*p* and a transistor 300*d* are formed over the substrate 310. Note that in this specification and the like, the transistors 300*p* and 300*d* are collectively referred to as the transistor 300. Light-emitting devices 130 (a light-emitting device 130R, a light-emitting device 130G, and a light-emitting device 130B in FIG. 43) are provided above the transistors 300*p* and 300*d*.

The transistor 300*p* is located in the display region DIS and serves as, for example, a transistor of the pixel circuit PX. The transistor 300*d* serves as a transistor of the driver circuit region DRV. Thus, the transistor 300*d* can be included in the circuit 100 described in Embodiment 1, for example. The light-emitting device 130 can be included in the pixel circuit PX.

The transistor 300 is provided over the substrate 310 and includes an element isolation layer 312, a conductor 316, an insulator 315, an insulator 317, a semiconductor region 313 that is part of the substrate 310, and low-resistance regions 314*a* and 314*b* functioning as source and drain regions. Thus, the transistor 300 is a Si transistor. Although FIG. 43 illustrates a structure in which one of a source and a drain of the transistor 300 is electrically connected to a conductor 596 and a conductor 112 (conductors 112*a* to 112*c*) to be described later through a conductor 328 to be described later, the electrical connection in the display apparatus of one embodiment of the present invention is not limited thereto. In the display apparatus of one embodiment of the present invention, for example, a gate of the transistor 300 may be electrically connected to the conductor 356 through the conductor 328.

The transistor 300 can have a fin-type structure when, for example, a top surface of the semiconductor region 313 and a side surface thereof in the channel width direction are covered with the conductor 316 with the insulator 315 as a gate insulator therebetween. The effective channel width is increased in the fin-type transistor 300, whereby the on-state characteristics of the transistor 300 can be improved. In addition, contribution of the electric field of the gate electrode can be increased, so that the off-state characteristics of the transistor 300 can be improved. The transistor 300 may have a planar structure instead of a fin-type structure.

Note that the transistor 300 can be a p-channel transistor or an n-channel transistor. Alternatively, both the p-channel transistor 300 and the n-channel transistor 300 may be included.

A region of the semiconductor region 313 where a channel is formed, a region in the vicinity thereof, and the low-resistance regions 314*a* and 314*b* functioning as the source and drain regions preferably contain a silicon-based semiconductor, specifically, preferably contain single crystal silicon. Alternatively, the above-described regions may be formed with germanium, silicon germanium, gallium arsenide, aluminum gallium arsenide, or gallium nitride, for example. Alternatively, the transistor 300 may contain silicon whose effective mass is adjusted by applying stress to the crystal lattice and thereby changing the lattice spacing. Alternatively, the transistor 300 may be a high-electron-mobility transistor (HEMT) including gallium arsenide and aluminum gallium arsenide, for example.

For the conductor 316 functioning as a gate electrode, a semiconductor material such as silicon that contains an element imparting n-type conductivity (e.g., arsenic or phosphorus) or an element imparting p-type conductivity (e.g., boron or aluminum) can be used. For another example, for the conductor 316, a conductive material such as a metal material, an alloy material, or a metal oxide material can be used.

Note that a material used for a conductor determines the work function; thus, selecting the material used for the conductor can adjust the threshold voltage of a transistor. Specifically, one or both of titanium nitride and tantalum nitride is/are preferably used for the conductor. Furthermore, in order to ensure the conductivity and embeddability of the conductor, one or both of tungsten and aluminum is/are preferably stacked over the conductor. In particular, tungsten is preferable in terms of heat resistance.

The element isolation layer 312 is provided to separate a plurality of transistors on the substrate 310 from each other. The element isolation layer can be formed by a local oxidation of silicon (LOCOS) method, a shallow trench isolation (STI) method, or a mesa isolation method.

Over the transistor 300 shown in FIG. 43, an insulator 320 and an insulator 322 are stacked in this order from the substrate 310 side.

For the insulators 320 and 322, one or more selected from silicon oxide, silicon oxynitride, silicon nitride oxide, silicon nitride, aluminum oxide, aluminum oxynitride, aluminum nitride oxide, or aluminum nitride can be used, for example.

Note that in this specification and the like, oxynitride refers to a material in which an oxygen content is higher than a nitrogen content, and nitride oxide refers to a material in which a nitrogen content is higher than an oxygen content. For example, silicon oxynitride refers to a material in which an oxygen content is higher than a nitrogen content, and silicon nitride oxide refers to a material in which a nitrogen content is higher than an oxygen content.

The insulator 322 may function as a planarization film for eliminating a level difference caused by the transistor 300 covered with the insulators 320 and 322. For example, a top surface of the insulator 322 may be planarized by planarization treatment using a chemical mechanical polishing (CMP) method to increase the level of planarity.

An insulator 592 and an insulator 594 are sequentially stacked over the insulator 322.

For the insulator 592, it is preferable to use an insulating film having a barrier property (referred to as a barrier insulating film) which prevents diffusion of impurities such as water and hydrogen from the substrate 310, the transistor 300, or the like to a region above the insulator 592 (e.g., the region including the transistor 500, the light-emitting devices 130R, 130G, and 130B, and the like). Accordingly, the insulator 592 is preferably formed using an insulating material having a function of inhibiting diffusion of impurities such as a hydrogen atom, a hydrogen molecule, and a water molecule, that is, an insulating material which does not easily transmit the above impurities. Alternatively, depending on circumstances, the insulator 592 is preferably formed using an insulating material having a function of inhibiting diffusion of impurities such as a nitrogen atom, a nitrogen molecule, a nitrogen oxide molecule (e.g., $N_2O$, NO, and $NO_2$), and a copper atom, that is, an insulating material which does not easily transmit the above impurities.

The insulator 592 preferably has a function of inhibiting diffusion of oxygen (e.g., at least one of an oxygen atom and an oxygen molecule).

For the film having a barrier property against hydrogen, for example, silicon nitride deposited by a chemical vapor deposition (CVD) method can be used.

The amount of released hydrogen can be measured by thermal desorption spectrometry (TDS), for example. The amount of hydrogen released from the insulator 592 that is converted into hydrogen atoms per unit area of the insulator 592 is less than or equal to $10\times10^{15}$ atoms/cm$^2$, preferably less than or equal to $5\times10^{15}$ atoms/cm$^2$ in TDS analysis in a film-surface temperature range of 50° C. to 500° C., for example.

Note that the dielectric constant of the insulator 594 is preferably lower than that of the insulator 592. For example, the dielectric constant of the insulator 594 is preferably lower than 4, further preferably lower than 3. For example, the dielectric constant of the insulator 594 is preferably 0.7 times or less that of the insulator 592, further preferably 0.6 times or less that of the insulator 592. When a material with a low dielectric constant is used for an interlayer film, the parasitic capacitance generated between wirings can be reduced.

In addition, the conductors 328 and 596 that are connected to the light-emitting devices or the like above the insulator 594 are embedded in the insulators 320, 322, 592, and 594. Note that each of the conductors 328 and 596 functions as a plug or a wiring. A plurality of conductors functioning as plugs or wirings are collectively denoted by the same reference numeral in some cases. In this specification and the like, a wiring and a plug connected to the wiring may be a single component. That is, in some cases, part of a conductor serves as a wiring or part of a conductor functions as a plug.

As a material for each of plugs and wirings (the conductors 328 and 596), one or more conductive materials selected from a metal material, an alloy material, a metal nitride material, and a metal oxide material can be used in a single-layer structure or a stacked-layer structure. It is preferable to use a high-melting-point material that has both heat resistance and conductivity, such as tungsten or molybdenum, and it is particularly preferable to use tungsten. A low-resistance conductive material such as aluminum or copper is preferably used. The use of a low-resistance conductive material can reduce wiring resistance.

An insulator 598 and an insulator 599 are formed over the insulator 594 and the conductor 328.

For example, the insulator 598 is preferably formed using an insulator having a barrier property against at least one of hydrogen, oxygen, and water, like the insulator 592. The insulator 599 is preferably formed using an insulator having a relatively low dielectric constant to reduce the parasitic capacitance generated between wirings, like the insulator 594. The insulator 599 has functions of an interlayer insulating film and a planarization film.

The light-emitting device 130 and a connection portion 140 are formed over the insulator 599.

The connection portion 140 is referred to as a cathode contact portion in some cases, and is electrically connected to cathodes of the light-emitting device 130R, the light-emitting device 130G, and the light-emitting device 130B. The connection portion 140 in FIG. 48 includes one or more conductors selected from conductors 112*a* to 112*c* to be described later, at least one conductor of conductors 126*a* to 126*c* to be described later, one or more conductors selected from conductors 129*a* to 129*c* to be described later, a common layer 114 to be described later, and a common electrode 115 to be described later.

Note that the connection portion 140 may be provided to surround four sides of the display portion or may be provided in the display portion (e.g., between adjacent light-emitting devices 130).

The light-emitting device 130R includes the conductor 112*a*, the conductor 126*a* over the conductor 112*a*, and the conductor 129*a* over the conductor 126*a*. All of the conductors 112*a*, 126*a*, and 129*a* can be referred to as a pixel electrode, or one or two of them can be referred to as a pixel electrode. The light-emitting device 130G includes a conductor 112*b*, a conductor 126*b* over the conductor 112*b*, and a conductor 129*b* over the conductor 126*b*. As in the light-emitting device 130R, all of the conductors 112*b*, 126*b*, and 129*b* can be referred to as a pixel electrode, or one or two of them can be referred to as a pixel electrode. The light-emitting device 130B includes a conductor 112*c*, a conductor 126*c* over the conductor 112*c*, and a conductor 129*c* over the conductor 126*c*. As in the light-emitting devices 130R and 130G, all of the conductors 112*c*, 126*c*, and 129*c* can be referred to as a pixel electrode, or one or two of them can be referred to as a pixel electrode.

For the conductors 112*a* to 112*c* and the conductors 126*a* to 126*c*, a conductive layer functioning as a reflective electrode can be used, for example. For the conductive layer functioning as a reflective electrode, a conductor with high visible-light reflectance such as silver, aluminum, or an alloy film of silver (Ag), palladium (Pd), and copper (Cu) (an Ag—Pd—Cu (APC) film) can be used. The conductors 112*a* to 112*c* and the conductors 126*a* to 126*c* can each be a stacked-layer film in which a pair of titanium films sandwich aluminum (a film in which Ti, Al, and Ti are stacked in this order), or a stacked-layer film in which silver is interposed between a pair of indium tin oxide films (a film in which ITO, Ag, and ITO are stacked in this order).

For example, a conductive layer functioning as a reflective electrode may be used for the conductors 112*a* to 112*c*, and a conductor with a high light-transmitting property may be used for the conductors 126*a* to 126*c*. Examples of the conductor with a high light-transmitting property include an alloy of silver and magnesium and indium tin oxide (indium tin oxide is sometimes referred to as ITO).

A conductive layer functioning as a transparent electrode can be used for the conductors 129*a* to 129*c*. For the conductive layer functioning as a transparent electrode, for example, the above-described conductor with a high light-transmitting property can be used.

A microcavity structure may be provided in the light-emitting device 130 to be described in detail later. The microcavity structure refers to a structure in which the distance between a bottom surface of the light-emitting layer and a top surface of a lower electrode is set to a thickness depending on a wavelength of light emitted from the light-emitting layer. In that case, a light-transmitting and light-reflective conductive material is preferably used for the conductors 129*a* to 129*c* serving as an upper electrode (a common electrode), and a light-reflective conductive material is preferably used for the conductors 112*a* to 112*c* and the conductors 126*a* to 126*c* which serve as lower electrodes (pixel electrodes).

The microcavity structure refers to a structure in which the optical distance between the lower electrode and the light-emitting layer is adjusted to be $(2n-1)\lambda/4$ (n is a natural number greater than or equal to 1, and k is a wavelength of emitted light to be amplified). Thus, light that is reflected back by the lower electrode (reflected light) considerably interferes with light that directly enters the upper electrode from the light-emitting layer (incident light). Accordingly, the phases of the reflected light and the incident light each having the wavelength k can be aligned with each other, and the light emitted from the light-emitting layer can be further amplified. In the case where the reflected light and the incident light have a wavelength other than the wavelength k, their phases are not aligned with each other, resulting in attenuation without resonation.

The conductor 112_a_ is connected to the conductor 596 embedded in the insulator 594 through an opening formed in the insulator 599. The end portion of the conductor 112_a_ is positioned on the outer side of the end portion of the conductor 126_a_. The end portion of the conductor 126_a_ and the end portion of the conductor 129_a_ are aligned or substantially aligned with each other.

Since the conductors 112_b_, 126_b_, and 129_b_ of the light-emitting device 130G and the conductors 112_c_, 126_c_, and 129_c_ of the light-emitting device 130B are similar to the conductors 112_a_, 126_a_, and 129_a_ of the light-emitting device 130R, detailed description of those layers is omitted.

Depression portions are formed in the conductors 112_a_, 112_b_, and 112_c_ to cover the openings provided in the insulator 599. A layer 128 is embedded in the depression portions.

The layer 128 has a function of filling the depression portions of the conductors 112_a_ to 112_c_. The conductors 126_a_, 126_b_, and 126_c_ electrically connected to the conductors 112_a_, 112_b_, and 112_c_, respectively, are provided over the conductors 112_a_, 112_b_, and 112_c_ and the layer 128. Thus, regions overlapping with the depression portions of the conductors 112_a_, 112_b_, and 112_c_ can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer including an organic material can be favorably used as the layer 128. For example, an acrylic resin, a polyimide resin, an epoxy resin, a polyamide resin, a polyimide-amide resin, a siloxane resin, a benzocyclobutene-based resin, a phenol resin, and precursors of these resins can be used for the layer 128. A photosensitive resin can also be used for the layer 128. Examples of the photosensitive resin include positive-type materials and negative-type materials.

When a photosensitive resin is used, the layer 128 can be formed through only light-exposure and development steps, reducing the influence of dry etching or wet etching, on the surfaces of the conductors 112_a_, 112_b_, and 112_c_. When the layer 128 is formed using a negative photosensitive resin, the layer 128 can sometimes be formed using the same photomask (light-exposure mask) as the photomask used for forming the opening in the insulator 599.

Figure 44A:
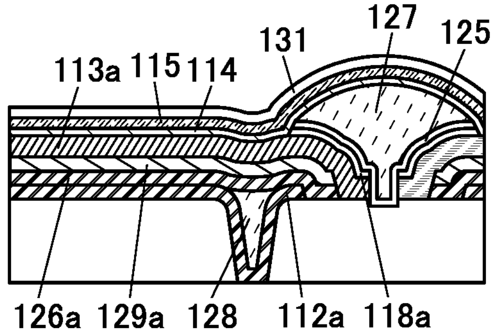
FIGS. 44A to 44C are schematic cross-sectional views each showing a structure example of a display apparatus.
Figure 44B:
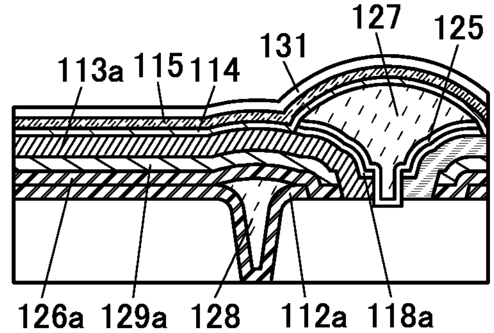
Figure 44C:
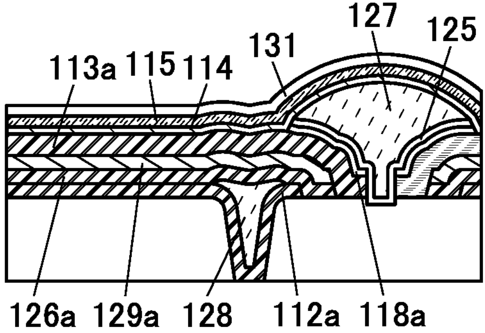

Although FIG. 43 illustrates an example in which the top surface of the layer 128 includes a flat portion, the shape of the layer 128 is not particularly limited. As illustrated in FIG. 44A, the middle and the vicinity of the top surface of the layer 128 may be concave in the cross section. As illustrated in FIG. 44B, the middle and the vicinity of the layer 128 may be convex in the cross section. As illustrated in FIG. 44C, the middle and the vicinity of the layer 128 may be concave and convex in the cross section.

The light-emitting device 130R includes a first layer 113_a_, the common layer 114 over the first layer 113_a_, and the common electrode 115 over the common layer 114. The light-emitting device 130G includes a second layer 113_b_, the common layer 114 over the second layer 113_b_, and the common electrode 115 over the common layer 114. The light-emitting device 130B includes a third layer 113_c_, the common layer 114 over the third layer 113_c_, and the common electrode 115 over the common layer 114.

The first layer 113_a_ is formed to cover a top surface and a side surface of the conductor 126_a_ and a top surface and a side surface of the conductor 129_a_. Similarly, the second layer 113_b_ is formed to cover a top surface and a side surface of the conductor 126_b_ and a top surface and a side surface of the conductor 129_b_. Similarly, the third layer 113_c_ is formed to cover a top surface and a side surface of the conductor 126_c_ and a top surface and a side surface of the conductor 129_c_. Accordingly, regions provided with the conductors 126_a_, 126_b_, and 126_c_ can be entirely used as the light-emitting regions of the light-emitting devices 130R, 130G, and 130B, respectively, increasing the aperture ratio of the pixels.

In the light-emitting device 130R, the first layer 113_a_ and the common layer 114 can be collectively referred to as an EL layer. Similarly, in the light-emitting device 130G, the second layer 113_b_ and the common layer 114 can be collectively referred to as an EL layer. Similarly, in the light-emitting device 130B, the third layer 113_c_ and the common layer 114 can be collectively referred to as an EL layer.

There is no particular limitation on the structure of the light-emitting device in this embodiment, and the light-emitting device can have a single structure or a tandem structure.

The first layer 113_a_, the second layer 113_b_, and the third layer 113_c_ each have an island shape after being processed by a photolithography method, for example. At each of end portions of the first layer 113_a_, the second layer 113_b_, and the third layer 113_c_, an angle between the top surface and the side surface is approximately 90°. By contrast, for example, an organic film formed using a fine metal mask (FMM) tends to have a thickness that gradually decreases with decreasing distance to an end portion, and has a top surface forming a slope in an area extending greater than or equal to 1 μm and less than or equal to 10 μm from the end portion, for example; thus, such an organic film has a shape whose top surface and side surface cannot be easily distinguished from each other.

The top surface and the side surface of each of the first layer 113_a_, the second layer 113_b_, and the third layer 113_c_ are clearly distinguished from each other. Accordingly, as for the first layer 113_a_ and the second layer 113_b_ which are adjacent to each other, one of the side surfaces of the first layer 113_a_ and one of the side surfaces of the second layer 113_b_ face to each other. This applies to a combination of any two of the first layer 113_a_, the second layer 113_b_, and the third layer 113_c_.

Each of the first layer 113_a_, the second layer 113_b_, and the third layer 113_c_ includes at least a light-emitting layer. Preferably, the first layer 113_a_, the second layer 113_b_, and the third layer 113_c_ include a red-light-emitting layer, a green-light-emitting layer, and a blue-light-emitting layer, respectively, for example. Other than the above colors, cyan, magenta, yellow, or white can be employed as colors of light emitted from the light-emitting layers.

The first layer 113_a_, the second layer 113_b_, and the third layer 113_c_ each preferably include a light-emitting layer and the carrier-transport layer (electron-transport layer or hole-transport layer) over the light-emitting layer. Since the surfaces of the first layer 113a, the second layer 113b, and the third layer 113c are exposed in the manufacturing process of the display apparatus in some cases, providing the carrier-transport layer over the light-emitting layer prevents the light-emitting layer from being exposed on the outermost surface, so that damage to the light-emitting layer can be reduced. Thus, the reliability of the light-emitting device can be increased.

The common layer 114 includes, for example, an electron-injection layer or a hole-injection layer. Alternatively, the common layer 114 may include a stack of an electron-transport layer and an electron-injection layer, or may include a stack of a hole-transport layer and a hole-injection layer. The common layer 114 is shared between the light-emitting device 130R, the light-emitting device 130G, and the light-emitting device 130B.

The common electrode 115 is shared between the light-emitting device 130R, the light-emitting device 130G, and the light-emitting device 130B. As illustrated in FIG. 43, the common electrode 115 that is included in common in the plurality of light-emitting devices is electrically connected to the conductor included in the connection portion 140.

The insulator 125 preferably has a function of a barrier insulating film against at least one of water and oxygen. Alternatively, the insulator 125 preferably has a function of inhibiting the diffusion of at least one of water and oxygen. Alternatively, the insulator 125 preferably has a function of capturing or fixing (also referred to as gettering) at least one of water and oxygen. When the insulator 125 has a function of the barrier insulating layer or a gettering function, entry of impurities (typically, at least one of water and oxygen) that would diffuse into the light-emitting devices from the outside can be inhibited. In this structure, a highly reliable light-emitting device, furthermore, a highly reliable display panel can be provided.

The insulator 125 preferably has a low impurity concentration. Accordingly, degradation of the EL layer, which is caused by entry of impurities into the EL layer from the insulator 125, can be suppressed. In addition, when the impurity concentration is reduced in the insulator 125, a barrier property against at least one of water and oxygen can be increased. For example, one or both of the hydrogen concentration and the carbon concentration in the insulator 125 are preferably low.

As the insulator 127, an insulating layer containing an organic material can be suitably used. As the organic material, a photosensitive organic resin is preferably used; for example, a photosensitive resin composition containing an acrylic resin may be used. The viscosity of the material of the insulator 127 is greater than or equal to 1 cP and less than 1500 cP, and is preferably greater than or equal to 1 cP and less than or equal to 12 cP. By setting the viscosity of the material of the insulator 127 in the above range, the insulator 127 having a tapered shape, which is to be described later, can be formed relatively easily. Note that in this specification and the like, an acrylic resin refers to not only a polymethacrylic acid ester or a methacrylic resin, but also all the acrylic polymer in a broad sense.

In this specification and the like, a tapered shape indicates a shape in which at least part of a side surface of a structure is inclined to a substrate surface. For example, a tapered shape preferably includes a region where the angle between the inclined side surface and the substrate surface (such an angle is also referred to as a taper angle) is less than 90°.

Note that the organic material usable for the insulator 127 is not limited to the above description as long as the insulator 127 has a taper-shaped side surface as described later. For example, for the insulator 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used in some cases. An organic material such as polyvinyl alcohol (PVA), polyvinylbutyral (PVB), polyvinylpyrrolidone, polyethylene glycol, polyglycerin, pullulan, water-soluble cellulose, or an alcohol-soluble polyamide resin can be used for the insulator 127 in some cases. A photoresist, which is a photosensitive resin, can be used for the insulator 127 in some cases. Examples of the photosensitive resin include positive-type materials and negative-type materials.

The insulator 127 may be formed using a material absorbing visible light. When the insulator 127 absorbs light emitted by the light-emitting device, leakage of light (stray light) from the light-emitting device to the adjacent light-emitting device through the insulator 127 can be inhibited. Thus, the display quality of the display panel can be improved. Since no polarizing plate is required to improve the display quality, the weight and thickness of the display panel can be reduced.

Examples of the material absorbing visible light include materials containing pigment of black or the like, materials containing dye, light-absorbing resin materials (e.g., polyimide), and resin materials that can be used for color filters (color filter materials). Using the resin material composed of stacked color filter materials of two or three or more colors is particularly preferred, in which case the effect of blocking visible light is enhanced. In particular, mixing color filter materials of three or more colors enables the formation of a black or nearly black resin layer.

For example, the insulator 127 can be formed by a wet film-formation method such as spin coating, dipping, spray coating, ink-jetting, dispensing, screen printing, offset printing, doctor blade coating, slit coating, roll coating, curtain coating, or knife coating. Specifically, an organic insulating film that is to be the insulator 127 is preferably formed by spin coating.

The insulator 127 is formed at a temperature lower than the allowable temperature limit of the EL layer. The typical substrate temperature in formation of the insulator 127 is lower than or equal to 200° C., preferably lower than or equal to 180° C., further preferably lower than or equal to 160° C., still further preferably lower than or equal to 150° C., yet still further preferably lower than or equal to 140° C.

A structure of the insulator 127 between the light-emitting device 130R and the light-emitting device 130G, for example, is described below. The same applies to the insulator 127 between the light-emitting device 130G and the light-emitting device 130B, the insulator 127 between the light-emitting device 130B and the light-emitting device 130R, and the like. In the description below, an end portion of the insulator 127 over the second layer 113b is used as an example in some cases, and the same applies to an end portion of the insulator 127 over the first layer 113a and an end portion of the insulator 127 over the third layer 113c.

In the cross-sectional view of the display apparatus, the side surface of the insulator 127 preferably has a tapered shape with a taper angle θ1. The taper angle θ1 is an angle formed by the side surface of the insulator 127 and the substrate surface. However, without limitation to the substrate surface, the taper angle θ1 may be an angle formed by the side surface of the insulator 127 and a top surface of a flat portion of the insulator 125 or a top surface of a flat portion of the second layer 113b. When the side surface of the insulator 127 has a tapered shape, a side surface of the insulator 125 and a side surface of the mask layer 118*a* also have a tapered shape in some cases.

The taper angle θ1 of the insulator 127 is less than 90°, preferably less than or equal to 60°, and further preferably less than or equal to 45°. Such a forward tapered shape of the end portion of the side surface of the insulator 127 can prevent disconnection, local thinning, or the like from occurring in the common layer 114 and the common electrode 115 which are provided over the end portion of the side surface of the insulator 127, leading to film formation with good coverage. The common layer 114 and the common electrode 115 can have improved in-plane uniformity in this manner, whereby the display apparatus can have improved display quality.

In the cross-sectional view of the display apparatus, a top surface of the insulator 127 preferably has a convex shape. The convex shape of the top surface of the insulator 127 is preferably a gently bulging shape toward the center. The central projecting surface of the top surface of the insulator 127 is preferably smoothly connected to the tapered end portion of the side surface. With such a shape of the insulator 127, the common layer 114 and the common electrode 115 over the entire insulator 127 can be formed with good coverage.

The insulator 127 is formed in a region between two EL layers (e.g., a region between the first layer 113*a* and the second layer 113*b*). In that case, part of the insulator 127 is positioned between an end portion of a side surface of one of the two EL layers (e.g., the first layer 113*a*) and an end portion of a side surface of the other of the two EL layers (e.g., the second layer 113*b*).

One end portion of the insulator 127 preferably overlaps with the conductor 126*a* serving as a pixel electrode, and the other end portion of the insulator 127 preferably overlaps with the conductor 126*b* serving as a pixel electrode. With such a structure, the end portion of the insulator 127 can be formed over a substantially flat region of the first layer 113*a* (the second layer 113*b*). In the above manner, the insulator 127 can be processed into a tapered shape relatively easily.

By forming the insulator 127 and the like in the above manner, a disconnected portion and a locally thinned portion can be prevented from being formed in the common layer 114 and the common electrode 115 from a substantially flat region in the first layer 113*a* to a substantially flat region in the second layer 113*b*. Thus, between the light-emitting devices, a connection defect caused by the disconnected portion and an increase in electric resistance caused by the locally thinned portion can be inhibited from occurring in the common layer 114 and the common electrode 115.

In the display apparatus of this embodiment, the distance between the light-emitting devices can be narrowed. Specifically, the distance between the light-emitting devices, the distance between the EL layers, or the distance between the pixel electrodes can be less than 10 μm, 8 μm or less, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display apparatus in this embodiment includes a region where a distance between two adjacent island-shaped EL layers is 1 μm or less, preferably 0.5 μm (500 nm) or less, further preferably 100 nm or less. The distance between the light-emitting devices is shortened in this manner, whereby a display apparatus with high definition and a high aperture ratio can be provided.

A protective layer 131 is provided over the light-emitting device 130. The protective layer 131 serves as a passivation film for protecting the light-emitting devices 130. Providing the protective layer 131 that covers the light-emitting devices can inhibit entry of impurities such as water and oxygen into the light-emitting devices, thereby increasing the reliability of the light-emitting devices 130. For the protective layer 131, aluminum oxide, silicon nitride, or silicon nitride oxide can be used, for example.

The protective layer 131 and the substrate 110 are bonded to each other with an adhesive layer 107. A solid sealing structure, a hollow sealing structure, or the like can be employed to seal the light-emitting devices. In FIG. 43, a solid sealing structure is employed, in which a space between the substrate 310 and the substrate 110 is filled with the adhesive layer 107. Alternatively, a hollow sealing structure may be employed, in which the space is filled with an inert gas (e.g., nitrogen or argon). In this case, the adhesive layer 107 may be provided not to overlap with the light-emitting devices. Alternatively, the space may be filled with a resin other than the frame-like adhesive layer 107.

As the adhesive layer 107, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene-vinyl acetate (EVA) resin. In particular, a material with low moisture permeability, such as an epoxy resin, is preferred. A two-component-mixture-type resin may be used. An adhesive sheet may be used.

The display apparatus DSP1A has a top-emission structure. Light emitted from the light-emitting device is emitted toward the substrate 110. For this reason, a material having a high visible-light-transmitting property is preferably used for the substrate 110. For example, a substrate having a high visible-light-transmitting property may be selected as the substrate 110 among substrates usable as the substrate 310 and the substrate BS. The pixel electrode contains a material that reflects visible light, and the counter electrode (the common electrode 115) contains a material that transmits visible light.

Cross-Sectional Structure Example 2 of Display Apparatus

Next, a cross-sectional structure example of the display apparatus DSP1 in FIG. 41A which is different from the display apparatus DSP1A in FIG. 43 is described. A display apparatus DSP1B illustrated in FIG. 45 is a modification example of the display apparatus DSP1A and different from the display apparatus DSP1A in the structure of the transistor provided over the substrate 310.

Figure 45:
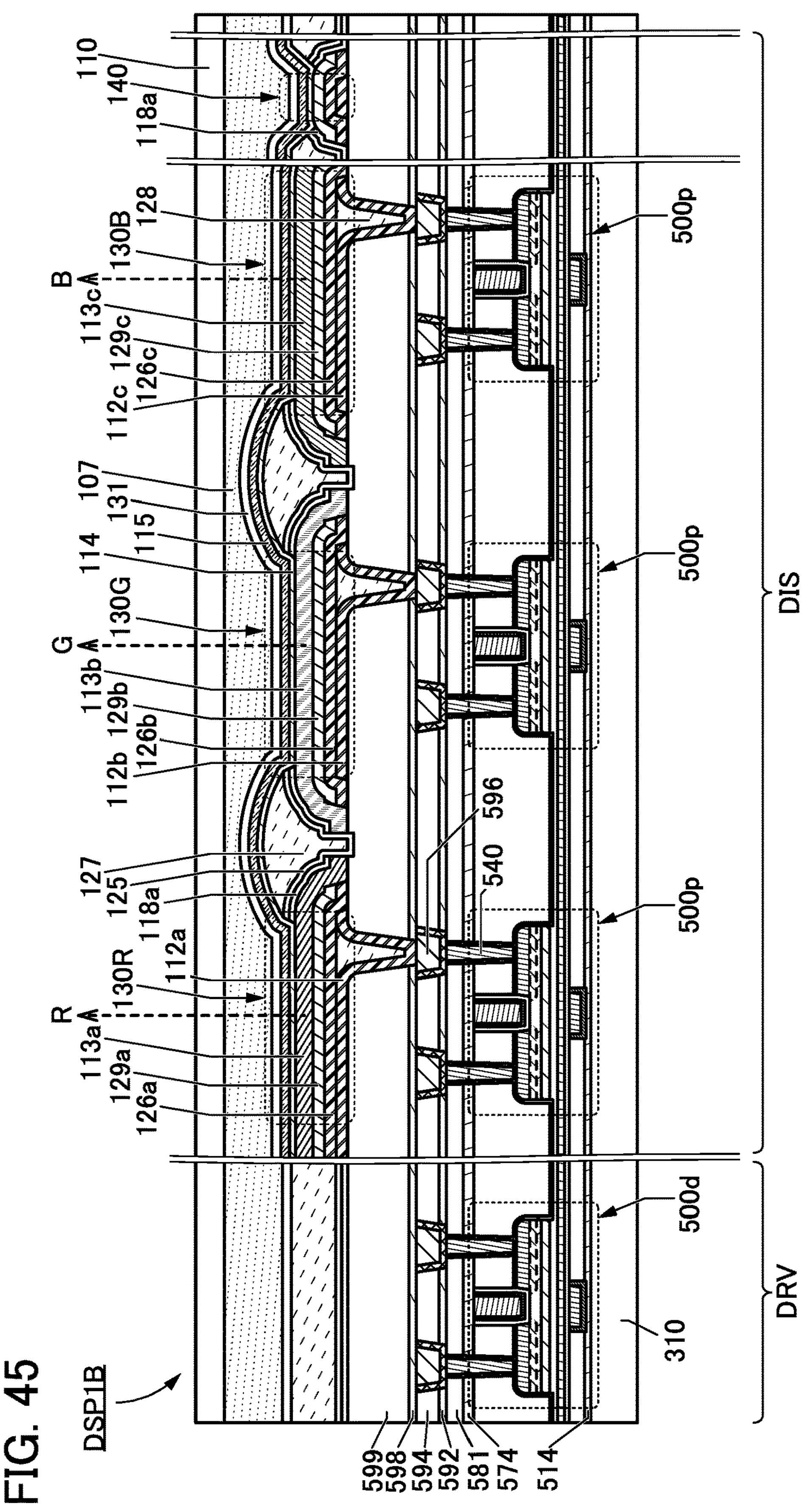
FIG. 45 is a schematic cross-sectional view showing a structure example of a display apparatus.

A substrate that can be used as the substrate BS is preferably used as the substrate 310 in the display apparatus DSP1B in FIG. 45. In the description of the display apparatus DSP1B, the substrate 310 is a glass substrate.

In the display apparatus DSP1B in FIG. 45, a transistor 500*p* and a transistor 500*d* are formed over the substrate 310. Note that in this specification and the like, the transistors 500*p* and 500*d* are collectively referred to as the transistor 500. The transistor 500*p* in the display apparatus DSP1B corresponds to the transistor 300*p* in the display apparatus DSP1A, and the transistor 500*d* in the display apparatus DSP1B corresponds to the transistor 300*d* in the display apparatus DSP1A.

For the light-emitting devices 130 (the light-emitting devices 130R, 130G, and 130B in FIG. 45) above the transistors 500*p* and 500*d*, the description of the light-emitting devices 130 in FIG. 43 can be referred to.

An insulator 574 is formed over the transistor 500, and an insulator 581 is formed over the insulator 574. The insulators 574 and 581 include openings and the conductors 540 provided so as to be embedded in the openings. Note that the insulators 574 and 581 and the conductor 540 are described later.

The insulators 592 and 594 and the conductor 596 are formed over the insulator 581 and the conductor 540. For the insulators 592 and 594 and the conductor 596, the description of the insulators 592 and 594 in FIG. 43 can be referred to. For the conductor 596, the description of the conductor 596 in FIG. 43 can be referred to.

Structure Example of Transistor 500

Figure 46A:
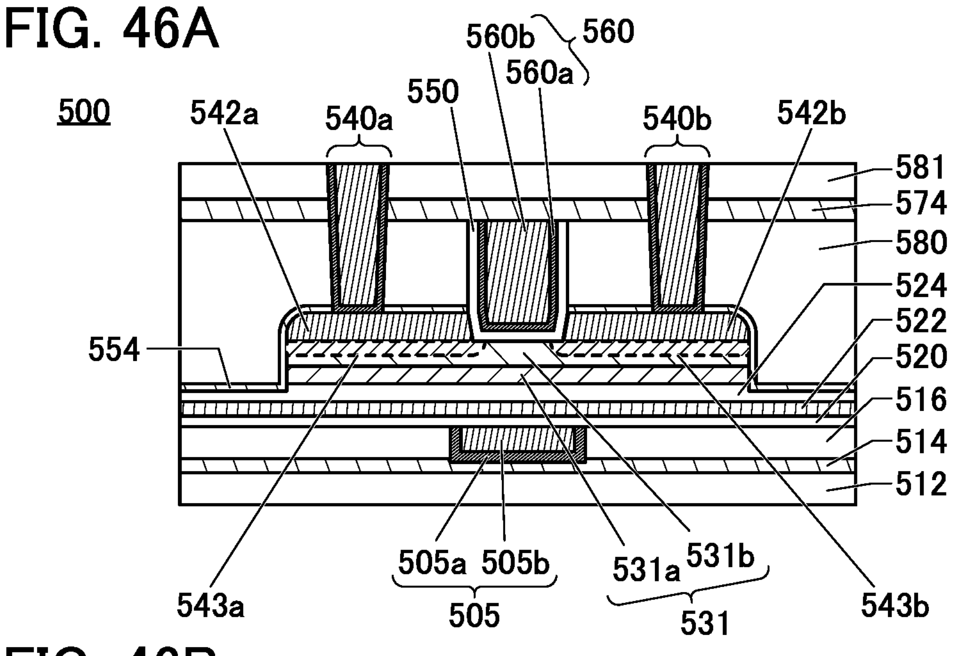
FIGS. 46A and 46B are cross-sectional views each showing a structure example of a transistor included in a semiconductor device.
Figure 46B:
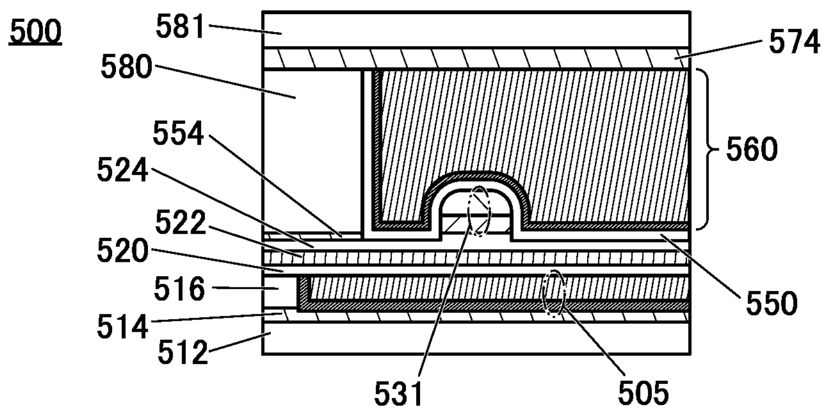

FIG. 46A is a cross-sectional view in the channel length direction of the transistor 500 that can be included in the display apparatus DSP1B, and FIG. 46B is a cross-sectional view in the channel width direction of the transistor 500. Note that in FIGS. 46A and 46B, the transistor 500 is provided over not the substrate 310 but the insulator 512.

As illustrated in FIGS. 46A and 46B, the transistor 500 includes a metal oxide 531*a*, a metal oxide 531*b*, a conductor 505, a conductor 542*a*, a conductor 542*b*, a conductor 560, an insulator 514, an insulator 516, an insulator 520, an insulator 522, an insulator 524, an insulator 550, an insulator 554, the insulator 574, an insulator 580, and the insulator 581, for example. Note that the transistor 500 does not necessarily include all the above components. For example, the transistor 500 may have a structure without the insulator 520.

The conductor 505 (a conductor 505*a* and a conductor 505*b*) and the insulator 516 are placed above a substrate (not illustrated). In particular, the conductor 505 is preferably provided to be embedded in the insulator 516. Specifically, the conductor 505*a* is preferably provided in contact with a bottom surface and a side wall of an opening provided in the insulator 516. The conductor 505*b* is preferably provided to be embedded in a depressed portion formed by the conductor 505*a*. In the transistor 500 in each of FIGS. 46A and 46B, a top surface of the conductor 505*b* is substantially level with a top surfaces of the conductor 505*a* and the insulator 516.

The metal oxide 531 and the conductor 560 are located in a region overlapping with the conductor 505. The metal oxide 531*b* is provided over the metal oxide 531*a*. The conductor 542*a* and the conductor 542*b* are provided to be apart from each other over the metal oxide 531*b*. The insulator 580 is provided over the conductor 542*a* and the conductor 542*b*. Specifically, an opening is formed in the insulator 580 in a region between the conductor 542*a* and the conductor 542*b*. The conductor 560 is provided in the opening. The insulator 550 is provided between the conductor 560 and the metal oxide 531*b*, the conductor 542*a*, the conductor 542*b*, and the insulator 580. Here, as illustrated in FIGS. 46A and 46B, a top surface of the conductor 560 is substantially level with top surfaces of the insulator 550 and the insulator 580. Note that in the following description, the conductors 505*a* and 505*b* are sometimes collectively referred to as a conductor 505. Note that in the following description, the metal oxides 531*a* and 531*b* are sometimes collectively referred to as a metal oxide 531. The conductors 542*a* and 542*b* are sometimes collectively referred to as a conductor 542.

As illustrated in FIG. 46A, a region 543*a* is sometimes formed as a low-resistance region at and near the interface between the metal oxide 531*b* and the conductor 542*a*. In addition, a region 543*b* is sometimes formed as a low-resistance region at and near the interface between the metal oxide 531*b* and the conductor 542*b*. In that case, the region 543*a* serves as one of a source region and a drain region, and the region 543*b* serves as the other of the source region and the drain region. A channel formation region is formed in a region between the region 543*a* and the region 543*b*.

When the conductor 542*a* (conductor 542*b*) is provided in contact with the metal oxide 531, the oxygen concentration of the region 543*a* (region 543*b*) sometimes decreases. In addition, a metal compound layer that contains the metal contained in the conductor 542*a* (conductor 542*b*) and the component of the metal oxide 531 is sometimes formed in the region 543*a* (region 543*b*). In such a case, the region 543*a* and the region 543*b* each have increased carrier density to be a low-resistance region.

In the transistor 500 illustrated in FIGS. 46A and 46B, side surfaces of the conductor 542*a* and the conductor 542*b* on the conductor 560 side are substantially perpendicular. Note that the transistor 500 illustrated in FIGS. 46A and 46B is not limited thereto, and the angle formed between the side surfaces and the bottom surfaces of the conductor 542*a* and the conductor 542*b* may be greater than or equal to 100 and less than or equal to 80°, preferably greater than or equal to 30° and less than or equal to 60°. The side surfaces of the conductor 542*a* and the conductor 542*b* that face each other may have a plurality of surfaces.

In the transistor 500, two layers of the metal oxide 531*a* and the metal oxide 531*b* are stacked in and around the region where the channel is formed (hereinafter also referred to as channel formation region); however, the present invention is not limited thereto. For example, a single-layer structure of the metal oxide 531*b* or a stacked-layer structure of three or more layers may be employed. Alternatively, each of the metal oxide 531*a* and the metal oxide 531*b* may have a stacked-layer structure of two or more layers.

Here, the conductor 560 functions as a first gate electrode (sometimes referred to as a top gate electrode or a front gate electrode) of the transistor, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. Here, the positions of the conductor 560, the conductor 542*a*, and the conductor 542*b* are selected in a self-aligned manner with respect to the opening of the insulator 580. In other words, in the transistor 500, the first gate electrode can be positioned between the source electrode and the drain electrode in a self-aligned manner. Thus, the conductor 560 can be formed without an alignment margin, resulting in a reduction in the area occupied by the transistor 500. Accordingly, the display apparatus can have higher definition. In addition, the display apparatus can have a narrow bezel.

The conductor 505 sometimes serves as a second gate electrode (sometimes referred to as a bottom gate electrode or a second gate electrode). In that case, by changing a potential applied to the conductor 505 independently of a potential applied to the conductor 560, $V_{th}$ of the transistor 500 can be controlled. In particular, by applying a negative potential to the conductor 505, the threshold voltage $V_{th}$ of the transistor 500 can be increased and the off-state current can be reduced. Thus, a drain current at the time when a potential applied to the conductor 560 is 0 V can be lower in the case where a negative potential is applied to the conductor 505 than in the case where the negative potential is not applied to the conductor 505.

The conductor 505 is preferably provided to be larger than the channel formation region in the metal oxide 531. In particular, it is preferable that the conductor 505 extend as a wiring beyond an end portion of the metal oxide 531 that intersects with the channel width direction, as illustrated in FIG. 46B. In other words, the conductor 505 and the conductor 560 preferably overlap with each other with the insulator positioned therebetween, in a region outside the side surface of the metal oxide 531 in the channel width direction.

As illustrated in FIGS. 46A, the conductor 560 preferably includes a conductor 560*a* provided inside the insulator 550 and a conductor 560*b* provided to be embedded inside the conductor 560*a*. Although the conductor 560 has a two-layer structure in FIGS. 46A and 46B, the present invention is not limited to this. For example, the conductor 560 may have a single-layer structure or a stacked-layer structure of three or more layers.

As illustrated in FIGS. 46A and 46B, the transistor 500 preferably includes the insulator 512 positioned over the substrate (not illustrated); the insulator 514 positioned over the insulator 512; the insulator 516 positioned over the insulator 514; a conductor 505 positioned to be embedded in the insulator 516; the insulator 520 positioned over the insulator 516 and the conductor 505; the insulator 522 positioned over the insulator 520; and the insulator 524 positioned over the insulator 522. The metal oxide 531*a* is preferably provided over the insulator 524.

As illustrated in FIGS. 46A and 46B, an insulator 554 is preferably provided between the insulator 580 and the insulator 524, the metal oxide 531*a*, the metal oxide 531*b*, the conductor 542*a*, and the conductor 542*b*. Here, as illustrated in FIGS. 46A and 46B, the insulator 554 is preferably in contact with a side surface of the insulator 550, the top and side surfaces of the conductor 542*a*, the top and side surfaces of the conductor 542*b*, and the side and top surfaces of the metal oxide 531*a*, the metal oxide 531*b*, and the insulator 524.

The insulator 574 and the insulator 581 functioning as interlayer films are preferably provided over the transistor 500. Here, the insulator 574 is preferably provided in contact with the top surfaces of the conductor 560, the insulator 550, and the insulator 580. Here, the top surface of the insulator 580 is preferably planarized.

A conductor 540 (a conductor 540*a* and a conductor 540*b*) that is electrically connected to the transistor 500 and functions as a plug is preferably provided. Thus, the conductor 540 is provided in contact with the inner wall of each opening in the insulators 554, 574, 580, and 581. In particular, structure may be employed in which a first conductor of the conductor 540 is provided in contact with the inner wall and a second conductor of the conductor 540 is provided on the side surface of the first conductor. Here, the top surface of the conductor 540 and a top surface of the insulator 581 can be substantially level with each other.

Specifically, for example, a first conductor of the conductor 540*a* is provided in contact with the inner wall the inner wall of one of the openings in the insulators 554, 574, 580, and 581, and the second conductor of the conductor 540*a* is provided in contact with the side surface of the first conductor. Note that the conductor 542*a* is positioned on part of the bottom portion of the opening, and the conductor 540*a* is in contact with the conductor 542*a*. Similarly, for example, a first conductor of the conductor 540*b* is provided in contact with the inner wall the inner wall of the other of the openings in the insulators 554, 574, 580, and 581, and the second conductor of the conductor 540*b* is provided in contact with the side surface of the first conductor. Note that the conductor 542*b* is positioned on part of the bottom portion of the opening, and the conductor 540*b* is in contact with the conductor 542*b*.

Although the transistor 500 has a structure in which the first conductor of the conductor 540 and the second conductor of the conductor 540 are stacked, the present invention is not limited thereto. For example, the conductor 540 may have a single-layer structure or a stacked-layer structure of three or more layers. In the case where a component has a stacked-layer structure, layers may be distinguished by ordinal numbers corresponding to the formation order.

As illustrated in FIG. 46B, the side surface of the metal oxide 531 is covered with the conductor 560 in a region where the metal oxide 531*b* does not overlap with the conductor 542, that is, the channel formation region of the metal oxide 531. Accordingly, electric fields of the conductor 560 functioning as the first gate electrode are likely to act on the side surface of the metal oxide 531. With this structure, the electric field of the conductor 560 serving as a first gate electrode is easily applied to the side surface of the metal oxide 531, and consequently, the channel formation region of the metal oxide 531 can be electrically surrounded by the electric field of the conductor 560. Thus, the on-state current of the transistor 500 can be increased and the frequency characteristics can be improved.

<<Materials for Transistor>>

Materials that can be used for the transistor 500 will be described.

[Metal Oxide (Oxide Semiconductor)]

In the transistor 500, a metal oxide functioning as an oxide semiconductor (hereinafter also referred to as an oxide semiconductor) is preferably used for the metal oxide 531 including the channel formation region (the metal oxide 531*a* and the metal oxide 531*b*). For example, it is preferable to use a metal oxide having a band gap of 2 eV or more, preferably 2.5 eV or more as the metal oxide to be the channel formation region of the metal oxide 531.

The metal oxide preferably contains at least indium or zinc. In particular, the metal oxide preferably contains indium and zinc. In addition to them, an element M is preferably contained. As the element M, one or more selected from aluminum, gallium, yttrium, tin, copper, vanadium, boron, titanium, iron, nickel, germanium, zirconium, molybdenum, lanthanum, cerium, neodymium, hafnium, tantalum, tungsten, magnesium, cobalt, and antimony can be used. In particular, the element M is preferably one or more of aluminum, gallium, yttrium, and tin. Furthermore, the element M preferably contains one or both of gallium and tin.

As described, the metal oxide 531 includes the metal oxide 531*a* and the metal oxide 531*b* over the metal oxide 531*a*. When the metal oxide 531 includes the metal oxide 531*a* under the metal oxide 531*b*, it is possible to inhibit diffusion of impurities into the metal oxide 531*b* from the components formed below the metal oxide 531*a*.

Note that the metal oxide 531 preferably has a stacked-layer structure of a plurality of oxide layers that differ in the atomic ratio of metal atoms. For example, in the case where the metal oxide 531 contains at least indium (In) and an element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably higher than the atomic ratio of the element M to In in the metal oxide 531*b*.

The energy of the conduction band minimum of each of the metal oxide 531*a* is preferably higher than that of the metal oxide 531*b*. In other words, the electron affinity of each of the metal oxide 531*a* is preferably smaller than that of the metal oxide 531*b*.

Here, the energy level of the conduction band minimum gently changes at junction portions between the metal oxide 531*a* and the metal oxide 531*b*. In other words, the energy level of the conduction band minimum at junction portions between the metal oxide 531*a* and the metal oxide 531*b* is continuously varied or are continuously connected. This can be achieved by decreasing the density of defect states in a mixed layer formed at the interface between the metal oxide 531*a* and the metal oxide 531*b*.

Specifically, when the metal oxide 531*a* and the metal oxide 531*b* contain the same element (as a main component) in addition to oxygen, a mixed layer with a low density of defect states can be formed. For example, in the case where the metal oxide 531*b* is an In—Ga—Zn oxide (indium-gallium-zinc oxide), an In—Ga—Zn oxide, a Ga—Zn oxide, or gallium oxide can be used as the metal oxide 531*a*.

Specifically, as the metal oxide 531*a*, a metal oxide with In:Ga:Zn=1:3:4 [atomic ratio], 1:3:2 [atomic ratio], or 1:1:0.5 [atomic ratio] can be used. As the metal oxide 531*b*, a metal oxide with In:Ga:Zn=1:1:1 [atomic ratio], 4:2:3 [atomic ratio], or 3:1:2 [atomic ratio] can be used.

At this time, the metal oxide 531*b* serves as a main carrier path. When the metal oxide 531*a* has the above structure, the density of defect states at the interface between the metal oxide 531*a* and the metal oxide 531*b* can be made low. This reduces the influence of interface scattering on carrier conduction, and the transistor 500 can have a high on-state current and high frequency characteristics.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such a case, the carrier density of the region in the metal oxide 531 in the vicinity of the conductor 542 increases, and the region becomes a low-resistance region.

The metal oxide 531*b* in a region that does not overlap with the conductor 542 sometimes have smaller thickness than the metal oxide 531*b* in a region that overlaps with the conductor 542. The thin region is formed when part of a top surface of the metal oxide 531*b* is removed at the time of forming the conductor 542*a* and the conductor 542*b*. When a conductive film to be the conductor 542 is formed, a low-resistance region is sometimes formed on the top surface of the metal oxide 531*b* in the vicinity of the interface with the conductive film. Removing the low-resistance region positioned between the conductor 542*a* and the conductor 542*b* on the top surface of the metal oxide 531*b* in this manner can prevent formation of the channel in the region.

[Conductor]

For a conductor, it is preferable to use, for example, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing two or more selected from the above metal elements; or the like. Alternatively, for the conductor, it is preferable to use, for example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Alternatively, for the conductor, silicide (e.g., nickel silicide) or a semiconductor with high electrical conductivity typified by polycrystalline silicon containing an impurity element (e.g., phosphorus) may be used, for example.

A plurality of conductors formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed. Further alternatively, a stacked-layer structure combining a material containing the above metal element, a conductive material containing oxygen, and a conductive material containing nitrogen may be employed.

The conductor 505*a* serving as a second gate electrode is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 505*a* is preferably formed using a conductive material having a function of inhibiting diffusion of oxygen (e.g., oxygen atoms, oxygen molecules, or both).

When the conductor 505*a* is formed using a conductive material having a function of inhibiting diffusion of hydrogen, impurities such as hydrogen contained in the conductor 505*b* can be prevented from diffusing into the metal oxide 531 through the insulator 524. When the conductor 505*a* is formed using a conductive material having a function of inhibiting diffusion of oxygen, the conductivity of the conductor 505*b* can be inhibited from being lowered because of oxidation. Examples of the conductive material having a function of inhibiting diffusion of oxygen include titanium, titanium nitride, tantalum, tantalum nitride, ruthenium, and ruthenium oxide. Thus, the conductor 505*a* may be a single layer or a stacked layer of the above conductive materials. For example, titanium nitride may be used for the conductor 505*a*.

A conductive material containing tungsten, copper, or aluminum as its main component is preferably used for the conductor 505*b*. For example, tungsten may be used for the conductor 505*b*.

The conductor 542 (the conductor 542*a* and the conductor 542*b*) functioning as the source electrode and the drain electrode is provided. It is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; or an alloy containing two or more selected from the above metal elements. For example, for the conductor 542, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even when absorbing oxygen.

The conductor 560*a* serving as the first gate electrode is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., an oxygen atom, an oxygen molecule, or both).

When the conductor 560*a* has a function of inhibiting diffusion of oxygen, the conductivity of the conductor 560*b* can be inhibited from being lowered because of oxidation due to oxygen contained in the insulator 550. Examples of a conductive material having a function of inhibiting oxygen diffusion include tantalum, tantalum nitride, titanium, titanium nitride, ruthenium, and ruthenium oxide. When the conductive material containing oxygen is provided as the conductor 560*a*, oxygen released from the conductive material is easily supplied to the channel formation region.

Moreover, a conductive material containing tungsten, copper, or aluminum as its main component is preferably used for the conductor 560*b*. The conductor 560 also serves as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of titanium or titanium nitride and the above conductive material.

For example, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used for the conductor 560. As another example, indium gallium zinc oxide containing nitrogen may be used for the conductor. With the use of such a material, hydrogen contained in the metal oxide where the channel is formed can be captured in some cases. Alternatively, hydrogen entering from an external insulator or the like can be captured in some cases.

Although the conductor 560 has a two-layer structure in FIGS. 46A and 46B, the conductor 560 may have a single-layer structure or a stacked-layer structure of three or more layers.

The conductors 540*a* and 540*b* serving as a plug are preferably formed using a conductive material containing tungsten, copper, or aluminum as its main component. The conductors 540*a* and 540*b* may have a stacked-layer structure.

In the case where the conductor 540 has a stacked structure, for a conductor in contact with the conductor 542, the insulator 554, the insulator 580, the insulator 574, and the insulator 581, the above-described conductor having a function of inhibiting diffusion of impurities such as water and hydrogen is preferably used. For example, tantalum, tantalum nitride, titanium, titanium nitride, ruthenium, or ruthenium oxide is preferably used for the conductor. The conductive material having a function of inhibiting diffusion of impurities such as water and hydrogen may have a single-layer structure or a stacked structure. The use of the conductor can inhibit oxygen added to the insulator 580 from being absorbed by the conductors 540*a* and 540*b*. Moreover, impurities such as water and hydrogen can be inhibited from entering the metal oxide 531 through the conductors 540*a* and 540*b* from a layer above the insulator 581.

[Insulator]

Examples of an insulator include an oxide, a nitride, an oxynitride, a nitride oxide, a metal oxide, a metal oxynitride, and a metal nitride oxide, each of which has an insulating property.

The insulator 514 preferably functions as a barrier insulating film that inhibits the entry of impurities such as water and hydrogen to the transistor 500 from the substrate side. Accordingly, it is preferable to use, for the insulator 514, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of oxygen (e.g., an oxygen atom, an oxygen molecule, or both) (an insulating material through which the oxygen is less likely to pass).

An insulator having a function of inhibiting the passage of oxygen and impurities such as water and hydrogen can be formed to have a single layer or a stacked layer including an insulator containing one or more selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum. Specifically, as the insulator having a function of inhibiting the passage of oxygen and impurities such as water and hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide can be used. Other examples of the insulator having a function of inhibiting the passage of oxygen and impurities such as water and hydrogen include oxides containing aluminum and hafnium (hafnium aluminate). Other examples of the insulator having a function of inhibiting the passage of oxygen and impurities such as water and hydrogen include metal nitrides such as aluminum nitride, aluminum titanium nitride, titanium nitride, silicon nitride oxide, and silicon nitride.

In particular, aluminum oxide or silicon nitride is preferably used for the insulator 514. Accordingly, it is possible to inhibit diffusion of impurities such as water and hydrogen to the transistor 500 side from the substrate side through the insulator 514. Alternatively, it is possible to inhibit diffusion of oxygen contained in the insulator 524 and the like to the substrate side through the insulator 514.

The insulator 520, 522, and the insulator 524 serves as a second gate insulator.

Here, the second gate insulator in contact with the metal oxide 531 preferably release oxygen by heating. In this specification, oxygen that is released by heating is referred to as excess oxygen in some cases. For example, silicon oxide or silicon oxynitride can be used as appropriate for the insulator 524 serving as the second gate insulator. When an insulator containing oxygen is provided in contact with the metal oxide 531, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS. Note that the temperature of the film surface in the TDS is preferably in the range of 100° C. to 700° C. or 100° C. to 400° C.

Like the insulator 514, the insulator 522 preferably serves as a barrier insulating film that inhibits the entry of impurities such as water and hydrogen into the transistor 500 from the substrate side. The insulator 522 preferably has lower hydrogen permeability than the insulator 524, for example.

Furthermore, it is preferable that the insulator 522 have a function of inhibiting diffusion of oxygen (e.g., an oxygen atom, an oxygen molecule, or both) (it is preferable that the above oxygen be less likely to pass through the insulator 522). For example, the insulator 522 preferably has a lower oxygen permeability than the insulator 524. The insulator 522 preferably has a function of inhibiting diffusion of oxygen, in which case oxygen contained in the metal oxide 531 can be preventing from diffusing to the substrate side. Moreover, the conductor 505 can be inhibited from reacting with oxygen contained in the insulator 524 or the metal oxide 531.

As the insulator 522, an insulator containing an oxide of one or both of aluminum and hafnium, which is an insulating material, is preferably used. Examples of the insulator containing an oxide of one or both of aluminum and hafnium include aluminum oxide, hafnium oxide, and an oxide containing aluminum and hafnium (hafnium aluminate). In the case where the insulator 522 is formed using such a material, the insulator 522 functions as a layer inhibiting release of oxygen from the metal oxide 531 and the entry of impurities such as hydrogen into the metal oxide 531 from the periphery of the transistor 500.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 522 may be a single layer or a stacked layer using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). Alternatively, for the insulator 522, an oxide containing aluminum and hafnium, an oxynitride containing aluminum and hafnium, an oxide containing silicon and hafnium, an oxynitride containing silicon and hafnium, or a nitride containing silicon and hafnium may be used as the insulator having a high relative permittivity. With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant. In other words, the insulator 520 may be formed using any of the materials that can be used for the insulator 524.

Note that one or more selected from the insulators 520, 522, and 524 may each have a stacked-layer structure of two or more layers. In that cases, without limitation to a stacked-layer structure formed of the same material, a stacked-layer structure formed of different materials may be employed.

The dielectric constant of each of the insulators 512, 516, 580, and 581 each serving as an interlayer film is preferably lower than that of the insulator 514. In the case where a material with a low dielectric constant is used for an interlayer film, the parasitic capacitance between wirings can be reduced. The concentration of impurities such as water and hydrogen in the insulators 516, 580, and 581 is preferably reduced.

For example, silicon oxide, silicon oxynitride, silicon nitride oxide, or silicon nitride can be used for the insulators 512, 516, 580, and 581. For example, silicon oxide to which fluorine is added, silicon oxide to which carbon is added, silicon oxide to which carbon and nitrogen are added, or silicon oxide having pores can be used for the insulators 512, 516, 580, and 581. In particular, silicon oxide and silicon oxynitride are preferable because they are thermally stable. In particular, materials such as silicon oxide, silicon oxynitride, and porous silicon oxide are preferably used, in which case a region containing oxygen released by heating can be easily formed. A material combined with any of the above materials as appropriate may be used for the insulators 512, 516, 580, and 581.

Like the insulators 514 and 522, the insulators 554 and 574 preferably have a function of inhibiting diffusion of impurities such as water and hydrogen (e.g., hydrogen atoms, hydrogen molecules, or both). In other words, each of the insulators 554 and 574 preferably serves as a barrier insulating film that inhibits the entry of the impurities into transistor 500. The insulators 554 and 574 preferably have a function of inhibiting diffusion of oxygen (e.g., oxygen atoms and/or oxygen molecules). For example, the insulators 554 and 574 preferably have a lower oxygen permeability than the insulator 524, the insulator 550, and the insulator 580. In other words, the insulators 554 and 574 preferably have a function of inhibiting oxygen released from the metal oxide 531 from diffusing to the outside of the insulator 554 or in the upward direction above the insulator 580. Thus, for the insulators 554 and 574, a material that can be used for the insulator 514 or 524 can be used.

Thus, when the insulator 524, the metal oxide 531, and the insulator 550 are surrounded by the insulator 522, the insulator 554, and the insulator 574, entry of impurities such as water or hydrogen into the transistor 500 from the outside can be inhibited. Furthermore, outward diffusion of oxygen from the inside of the transistor 500 can be inhibited.

The insulator 550 serves as a first gate insulating film. The insulator 550 is preferably provided in contact with the top surface of the metal oxide 531*b*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. Silicon oxide and silicon oxynitride are particularly preferable in terms of high thermal stability.

As in the insulator 524, the concentration of impurities such as water or hydrogen in the insulator 550 is preferably reduced. The thickness of the insulator 550 is preferably greater than or equal to 1 nm and less than or equal to 20 nm.

An insulator may be provided between the insulator 550 and the insulator 580, the insulator 554, the conductor 542, and the metal oxide 531*b*. For example, aluminum oxide or hafnium oxide is preferably used for the insulator. Providing the insulator can inhibit release of oxygen from the metal oxide 531*b*, excessive supply of oxygen to the metal oxide 531*b*, oxidation of the conductor 542, or the like.

A metal oxide may be provided between the insulator 550 and the conductor 560. The metal oxide preferably inhibits oxygen diffusion from the insulator 550 into the conductor 560. Accordingly, oxidation of the conductor 560 due to oxygen in the insulator 550 can be inhibited.

The metal oxide functions as part of the gate insulator in some cases. Therefore, when silicon oxide or silicon oxynitride is used for the insulator 550, a metal oxide that is a high-k material with a high relative permittivity is preferably used as the metal oxide. When the gate insulator has a stacked-layer structure of the insulator 550 and the metal oxide, the stacked-layer structure can be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used for the oxide. In particular, an insulator containing an oxide of one or both of aluminum and hafnium, such as aluminum oxide, hafnium oxide, or an oxide containing aluminum and hafnium (hafnium aluminate) is preferably used for the metal oxide.

A barrier insulating film that inhibits diffusion of impurities such as water, hydrogen, and oxygen may be provided between the conductor 540 and the conductor 544, the insulator 580, the insulator 574, and the insulator 581. Thus, impurities such as water and hydrogen in the insulator 580 can be inhibited from entering the metal oxide 531 through the conductors 540*a* and 540*b*. Furthermore, oxygen contained in the insulator 580 can be prevented from being absorbed by the conductors 540*a* and 540*b*.

Although not illustrated, a conductor functioning as a wiring may be provided in contact with the top surfaces of the conductors 540*a* and 540*b*. For the conductor functioning as a wiring, a conductive material containing tungsten, copper, or aluminum as its main component is preferably used. Furthermore, the conductor may have a stacked-layer structure and may be a stack of titanium or a titanium nitride and any of the above conductive materials, for example. Note that the conductor may be formed to be embedded in an opening provided in an insulator.

Modification Example of Transistor 500

Figure 47:
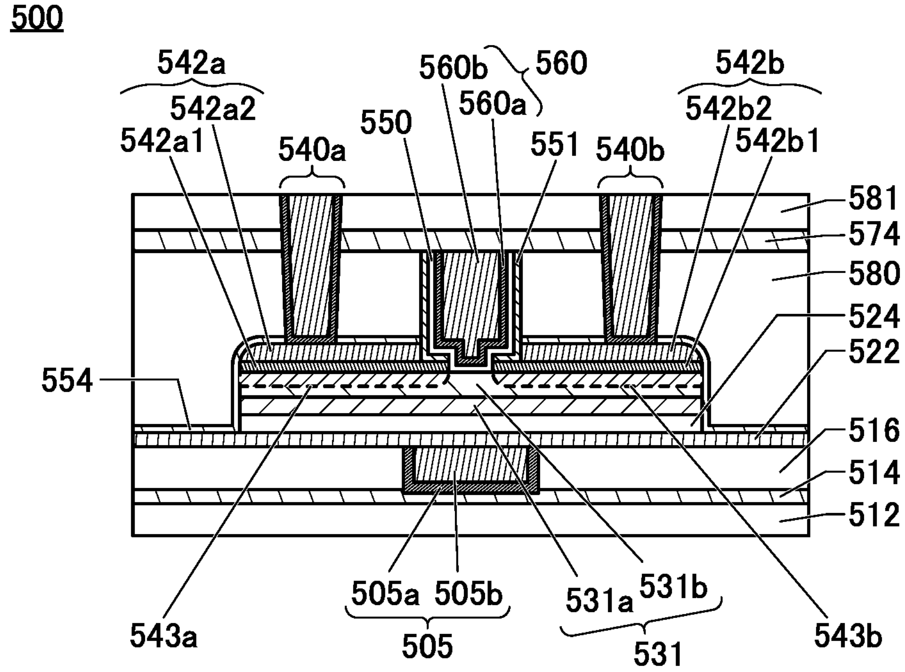
FIG. 47 is a cross-sectional view showing a structure example of a transistor included in a semiconductor device.

The structure of the transistor for the semiconductor device of one embodiment of the present invention is not limited to that of the transistor 500 illustrated in each of FIGS. 46A and 46B. For example, the transistor 500 in FIG. 47 may be used as the transistor for the semiconductor device of one embodiment of the present invention. The transistor 500 in FIG. 47 is a modification example of the transistor 500 in FIGS. 46A and 46B and different from the transistor 500 in FIGS. 46A and 46B in that an insulator 551 is provided and the conductor 542*a* (a conductor 542*a*1 and a conductor 542*a*2) and the conductor 542*b* (a conductor 542*b*1 and a conductor 542*b*2) have a stacked-layer structure.

The conductor 542*a* has a stacked-layer structure of the conductor 542*a*1 and the conductor 542*a*2 over the conductor 542*a*1, and the conductor 542*b* has a stacked-layer structure of the conductor 542*b*1 and the conductor 542*b*2 over the conductor 542*b*1. The conductors 542*a*1 and 542*b*1 in contact with the metal oxide 531*b* are preferably conductors that are less likely to be oxidized, such as metal nitride. Thus, excessive oxidation of the conductors 542*a* and 542*b* due to oxygen contained in the metal oxide 531*b* can be prevented. The conductors 542*a*2 and 542*b*2 are preferably conductors having higher conductivity than the conductors 542*a*1 and 542*b*1, such as a metal layer. Thus, the conductors 542*a* and 542*b* can function as a wiring or an electrode with high conductivity. In this manner, a semiconductor device in which the conductors 542*a* and 542*b* which function as a wiring or an electrode are provided in contact with a top surface of the metal oxide 531 functioning as an active layer can be provided.

For the conductors 542*a*1 and 542*b*1), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

The conductors 542*a*2 and 542*b*2 preferably have higher conductivity than the conductors 542*a*1 and 542*b*1. For example, the conductors 542*a*2 and 542*b*2 preferably have a larger thickness than the conductors 542*a*1 and 542*b*1. For the conductors 542*a*2 and 542*b*2, a conductor that can be used as the conductor 560*b* may be used. The above-described structure can reduce the resistance of the conductors 542*a*2 and 542*b*2.

As described above, tantalum nitride or titanium nitride can be used for the conductors 542*a*1 and 542*b*1, and tungsten can be used for the conductors 542*a*2 and 542*b*2.

In the cross-sectional view of the transistor 500 in the channel length direction in FIG. 47, the distance between the conductors 542*a*1 and 542*b*1 is shorter than the distance between the conductors 542*a*2 and 542*b*2. With such a structure, the distance between a source and a drain can be shortened, and the channel length can also be shortened in accordance with the distance. Therefore, the frequency characteristics of the transistor 500 can be improved. By miniaturization of the semiconductor device in this manner, the semiconductor device can have improved operation speed.

The insulator 551 is preferably an insulator that is not easily oxidized, such as nitride. The insulator 551 is formed in contact with the side surface of the conductor **542*a*2 and the side surface of the conductor 542*b*2, and has a function of protecting the conductors 542*a*2 and 542*b*2. The insulator 551 is preferably an inorganic insulator that is less likely to be oxidized because it is exposed to an oxidation atmosphere. Furthermore, the insulator 551 is preferably an inorganic insulator that is less likely to oxidize the conductors 542*a*2 and 542*b*2 because it is in contact with the conductors 542*a*2 and 542*b*2. Therefore, for the insulator 551, an insulating material having a barrier property against oxygen is preferably used. For example, silicon nitride can be used for the insulator 551**.

In the transistor 500 in FIG. 47, with a first mask, an opening is formed in the insulators 554, 580, 574, and 581 to form the conductors **542*a*2 and 542*b*2. The insulator 551 is formed in contact with a sidewall of the opening. After that, the conductors 542*a*1 and 542*b*1 are formed with a second mask, whereby the transistor 500 is formed. The opening overlaps with a region between the conductors 542*a*2 and 542*b*2. In addition, a part of the conductor 542*a*1 and a part of the conductor 542*b*1 are formed to extend in the opening. Thus, in this opening, the insulator 551 is in contact with the top surfaces of the conductors 542*b*1 and 542*a*1 and the side surfaces of the conductors 542*a*2 and 542*b*2. In addition, the insulator 551 is in contact with the top surface of the metal oxide 531 in a region between the conductors 542*a*1 and 542*b*1**.

After the formation of the conductors **542*a*1 and 542*b*1, the formation of the insulator 550 is preferably preceded by heat treatment in an atmosphere containing oxygen. This supplies oxygen to the metal oxides 531*a* and 531*b*, and reduces oxygen vacancies. Furthermore, since the insulator 551 is formed in contact with the side surfaces of the conductor 542*a*2 and the conductor 542*b*2, excessive oxidation of the conductors 542*a*2 and 542*b*2** can be prevented. Accordingly, the transistor can have more favorable electrical characteristics and high reliability. In addition, variations in electrical characteristics of transistors formed over the same substrate can be reduced.

In the transistor 500, the insulator 524 may be formed into an island shape, as illustrated in FIG. 47. Here, the insulator 524 may be formed so that its side surface is substantially the same as the side surface of the metal oxide 531.

In the transistor 500, the insulator 522 may be in contact with the insulator 516 and the conductor 505, as illustrated in FIG. 47. In other words, the insulator 520 illustrated in FIGS. 46A and 46B may be omitted.

Cross-Sectional Structure Example 3 of Display Apparatus

Next, a cross-sectional structure example of the display apparatus DSP1 in FIG. 41A which is different from the display apparatus DSP1A in FIG. 43 and the display apparatus DSP1B in FIG. 45 is described. A display apparatus DSP1C illustrated in FIG. 48 is a modification example of the display apparatus DSP1A and different from the display apparatus DSP1A and the display apparatus DSP1B in the structure of the transistor provided over the substrate 310.

Figure 48:
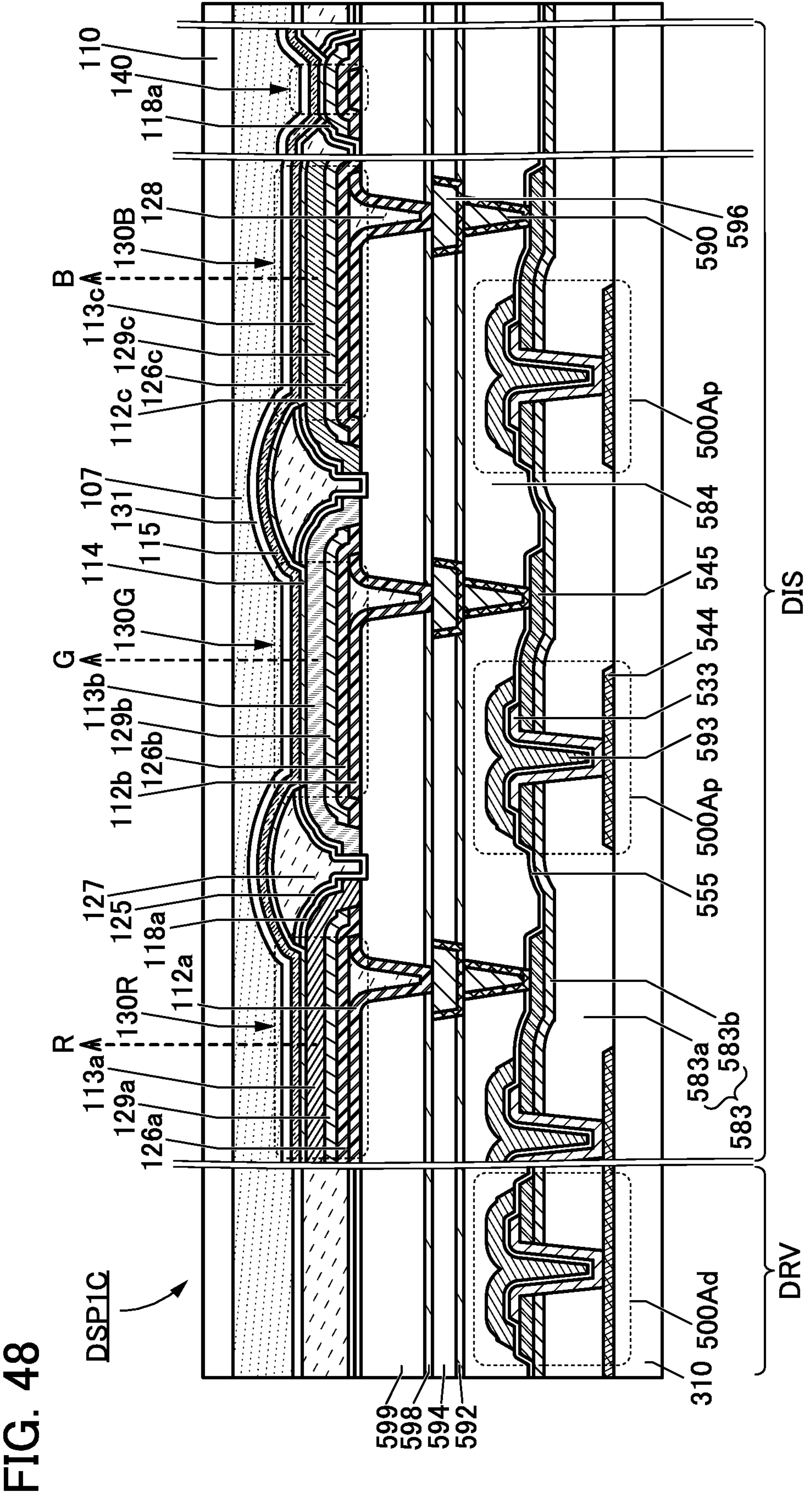
FIG. 48 is a schematic cross-sectional view showing a structure example of a display apparatus.

A substrate that can be used as the substrate BS is preferably used as the substrate 310 in the display apparatus DSP1C in FIG. 48. In the description of the display apparatus DSP1C, the substrate 310 is a glass substrate.

In the display apparatus DSP1C in FIG. 48, a transistor 500Ap and a transistor 500Ad are formed over the substrate 310. Note that in this specification and the like, the transistors 500Ap and 500Ad are collectively referred to as a transistor 500A. The transistor 500Ap in the display apparatus DSP1C corresponds to the transistor **500*p* in the display apparatus DSP1B, and the transistor 500Ad in the display apparatus DSP1C corresponds to the transistor 500*d*** in the display apparatus DSP1B.

For the light-emitting devices 130 (the light-emitting devices 130R, 130G, and 130B in FIG. 48) above the transistors 500Ap and 500Ad, the description of the light-emitting devices 130 in FIG. 43 can be referred to.

Over the transistor 500A, an insulator 584, the insulators 592 and 594, and the conductor 596 are formed. For the insulator 584 in FIG. 48, the description of the insulator 594 in FIG. 43 can be referred to. For the insulators 592 and 594 in FIG. 48, the description of the insulators 592 and 594 in FIG. 43 can be referred to.

An opening overlapping with part of the conductor 545 is provided in the insulator 584, and a conductor 590 is embedded in the opening. The conductor 590 serves as a wiring or a plug and can be formed using the material that can be used for the conductor 596, for example.

Structure Example of Transistor 500A

In the transistor 500A, the channel length direction is not substantially parallel to the substrate 310 but along the side surface of the opening provided in the insulators.

Figures 49A, 49B, 49C, 49D:
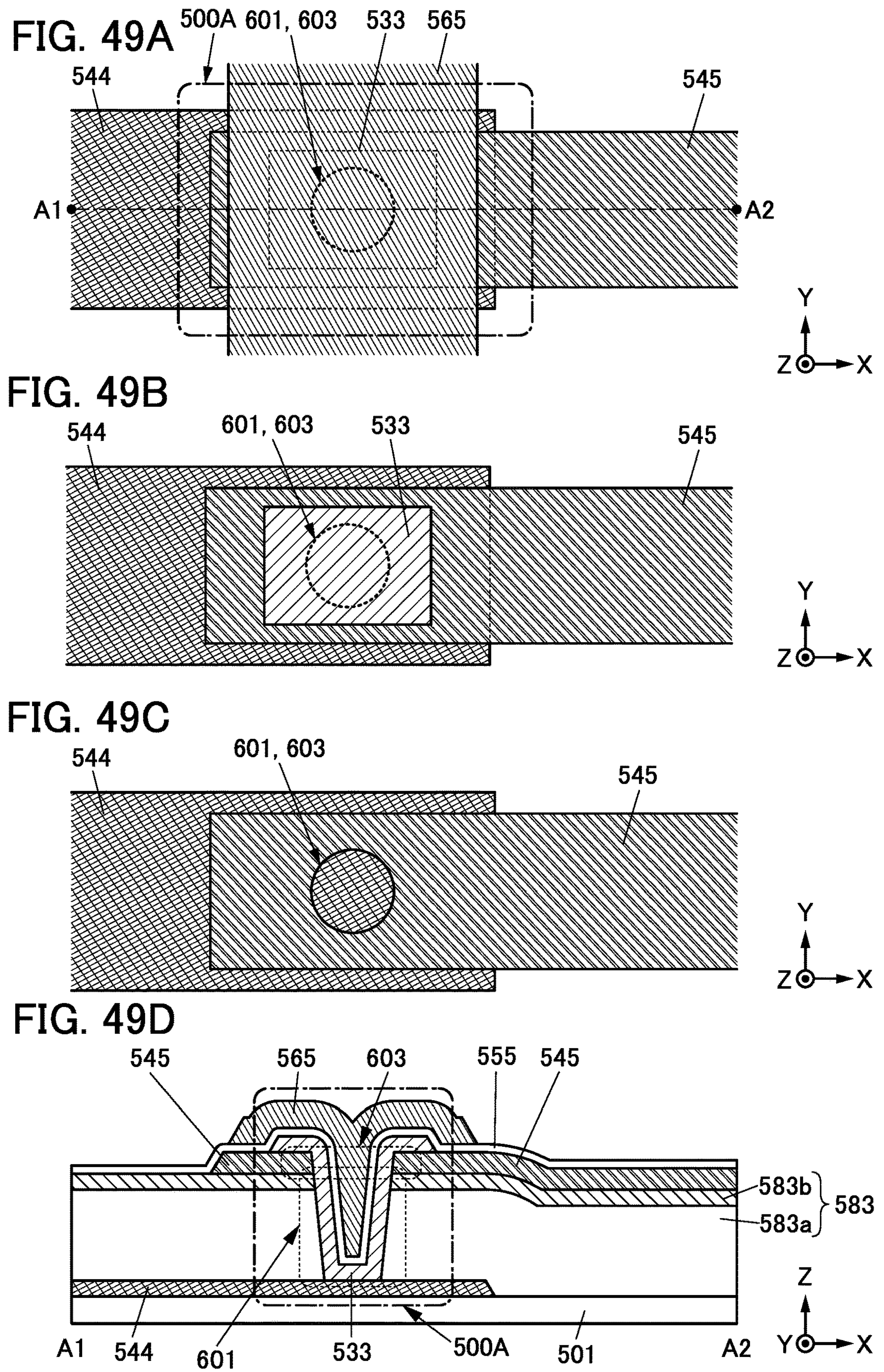
FIGS. 49A to 49C are plan views showing structure examples of a transistor included in a semiconductor device.
FIG. 49D is a cross-sectional view showing a structure example of a transistor included in a semiconductor device.

FIG. 49A is a plan view illustrating a structure example of the transistor 500A that can be included in the display apparatus described in the above embodiment and the vicinity of the transistor 500A. FIG. 49D is a cross-sectional view taken along the dashed-dotted line A1-A2 in FIG. 49A. Note that in FIG. 49A, for example, some components of the transistor 500A such as an insulator are not illustrated. Also in the other plan views of the transistor, some components such as an insulator are not illustrated.

The transistor 500A is provided over an insulator 501, for example. The transistor 500A includes the conductors 544 and 545, a metal oxide 533, an insulator 555, and a conductor 565. In the example in FIG. 49A, the conductor 545 extends in the direction parallel to the conductor 544 and in the direction perpendicular to the conductor 565.

For the insulator 501, for example, the material that can be used for any of the insulators 514, 516, 522, 524, 550, 554, 574, 580, and 581 included in the transistor 500 can be used. For the insulator 555, for example, the material that can be used for the insulator 550 included in the transistor 500 can be used.

For the conductors 544 and 545, for example, the material that can be used for the conductor 542 included in the transistor 500 can be used. For the conductor 565, for example, the material that can be used for the insulator 550 included in the transistor 500 can be used.

For the metal oxide 533, for example, the material that can be used for the metal oxide 531 included in the transistor 500 can be used.

In FIGS. 49A and 49D, the direction where the conductor 545 extends is referred to as the x direction. The direction perpendicular to the x direction and parallel to the top surface of the insulator 501, for example, is referred to as the y direction. The direction perpendicular the top surface of the insulator 501 is referred to as the z direction. The definition of the x, y, and z directions applies in some drawings and does not apply in other drawings. The x, y, and z directions can be regarded as perpendicular to one another. In the description of a plan view in this specification and the like, the x direction may be referred to as the right side or the left side and the y direction may be referred to as the upper side or the lower side. Conversely, the right side and the left side may be referred to as the x direction and the upper side and the lower side may be referred to as the y direction in some cases.

The conductor 544 serves as one of the source electrode and the drain electrode of the transistor 500A. The conductor 545 serves as the other of the source electrode and the drain electrode of the transistor 500A. The insulator 555 serves as a gate insulating layer of the transistor 500A. The conductor 565 serves as the gate electrode of the transistor 500A.

In the metal oxide 533, the whole region that is between the source electrode and the drain electrode and overlaps with the gate electrode with the gate insulating layer therebetween serves as a channel formation region. In the metal oxide 533, a region in contact with the source electrode serves as a source region and a region in contact with the drain electrode serves as a drain region.

The conductor 544 is provided over the insulator 501, the insulator 583 is provided over the insulator 501 and the conductor 544, and the conductor 545 is provided over the insulator 583. The insulator 583 can have a function of an interlayer insulating layer. The interlayer insulating layer here can be an interlayer film for separation of the source and gate electrodes in the transistor 500A. The insulator 584 serves as an interlayer film for providing a circuit element or a wiring above the transistor 500A.

For the insulator 583, for example, the material that can be used for any of the insulators 514, 516, 522, 524, 550, 554, 574, 580, and 581 included in the transistor 500 can be used.

Specifically, for example, an oxide or an oxynitride is preferably used for the insulator 583*a*. The insulator 583*a* is preferably formed using a film from which oxygen is released by heating. A silicon oxide film or a silicon oxynitride film can be suitably used as the insulator 583*a*, for example. Oxygen released from the insulator 583*a* can be supplied to the metal oxide 533 from the insulator 583*a*. When oxygen is supplied from the insulator 583*a* to the metal oxide 533, in particular, the channel formation region of the metal oxide 533, oxygen vacancies in the metal oxide 533 and hydrogen that enters the oxygen vacancies can be reduced. Consequently, the transistor 500A can have favorable electrical characteristics and high reliability.

Specifically, silicon nitride, silicon nitride oxide, or aluminum oxide can be suitably used for the insulator 583*b*, for example. The insulator 583*b* preferably includes a region containing more nitrogen than the insulator 583*a*. A material containing more nitrogen than the insulator 583*a* can be used for the insulator 583*b*. A nitride or a nitride oxide is preferably used for the insulator 583*b*. Silicon nitride or silicon nitride oxide can be suitably used for the insulator 583*b*, for example. When silicon nitride or silicon nitride oxide is used for the insulator 583*b*, the insulator 583*b* can serve as a blocking film that inhibits release of oxygen from the insulator 583*a*. When silicon nitride or silicon nitride oxide is used for the insulator 583*b*, the insulator 583*b* can serve as a blocking film that inhibits diffusion of hydrogen into the metal oxide 533 through the insulator 583.

The insulator 583 includes an opening 601 reaching the conductor 544. The conductor 545 includes an opening 603 reaching the opening 601. Thus, the opening 603 includes a region overlapping with the opening 601.

FIG. 49A illustrates, as the components of the transistor 500A, the conductors 544 and 545, the metal oxide 533, the conductor 565, and the openings 601 and 603. A structure example in which the conductor 565 is excluded from the components illustrated in FIG. 49A is shown in FIG. 49B. In other words, FIG. 49B illustrates the conductors 544 and 545, the metal oxide 533, and the openings 601 and 603. A structure example in which the metal oxide 533 is excluded from the components illustrated in FIG. 49B is shown in FIG. 49C. In other words, FIG. 49C illustrates the conductors 544 and 545 and the openings 601 and 603.

As illustrated in FIGS. 49C and 49D, the conductor 545 includes the opening 603 in a region overlapping with the conductor 544. As illustrated in FIG. 49C, the conductor 545 can be formed to entirely surround the periphery of the opening 601 in plan view. The conductor 545 is preferably absent in the opening 601. In other words, preferably, the conductor 545 is not in contact with the side surface of the insulator 583 on the opening 601 side.

FIGS. 49A to 49C each show an example in which each of the openings 601 and 603 are circular in plan view. High processing accuracy to form each of the openings 601 and 603 in a minute size is possible when the planar shapes of the openings 601 and 603 are each circular. Note that in this specification and the like, a circle is not limited to a perfect circle. For example, the planar shapes of the openings 601 and 603 may be elliptical, any shape including a curve, or polygonal.

In the example in FIG. 49D, the end portion of the conductor 545 in the opening 603 is the same or substantially the same as the end portion of the insulator 583 on the opening 601 side. In other words, the planar shape of the opening 603 is the same or substantially the same as that of the opening 601. The end portion of the conductor 545 in the opening 603 here refers to the end portion of the bottom surface of the conductor 545 in the opening 603. The bottom surface of the conductor 545 refers to the surface on the insulator 583 side. The end portion of the insulator 583 on the opening 601 side refers to the end portion of the top surface of the insulator 583. The top surface of the insulator 583 refers to the surface on the conductor 545 side. The planar shape of the opening 603 refers to that of the end portion of the bottom surface of the conductor 545 in the opening 603. The planar shape of the opening 601 refers to that of the end portion of the top surface of the insulator 583 on the opening 601 side.

In the case where end portions are the same or substantially the same, the end portions can also be said to be aligned or substantially aligned with each other. In the case where end portions are aligned or substantially aligned with each other and the case where planar shapes are the same or substantially the same, it can be said that outlines of stacked layers overlap with each other at least partly in plan view. For example, the case of patterning or partly patterning an upper layer and a lower layer with the use of the same mask pattern is included. The expression "end portions are aligned or substantially aligned with each other" or "planar shapes are the same or substantially the same" also includes the case where the outlines do not completely overlap with each other; for instance, the end portion of the upper layer may be positioned on the inner side or the outer side compared to the end portion of the lower layer.

The opening 601 can be formed with a resist mask used in the formation of the opening 603, for example. Specifically, after the conductor 544 is formed over the insulator 501, the insulator 583 over the insulator 501 and the conductor 544, a conductive film to be the conductor 545 over the insulator 583, and the resist mask over the conductive film are formed. Then, the opening 603 is formed in the conductive film with the use of the resist mask, and then the opening 601 is formed in the insulator 583 with the use of the resist mask, whereby the end portions of the openings 601 and 603 can be the same or substantially the same. With such a structure, the process can be simplified.

The metal oxide 533 is provided to include a region located inside the openings 601 and 603 to cover them. The metal oxide 533 has a shape along the top and side surfaces of the conductor 545, the side surface of the insulator 583, and the top surface of the conductor 544. The metal oxide 533 includes, for example, a region in contact with the top and side surfaces of the conductor 545, the side surface of the insulator 583, and the top surface of the conductor 544.

The metal oxide 533 preferably covers the end portion of the conductor 545 in the opening 603. For example, in FIG. 49D, the end portions of the metal oxide 533 are located over the conductor 545. The end portions of the metal oxide 533 can be said to be in contact with the top surface of the conductor 545.

Although the metal oxide 533 has a single-layer structure in FIG. 49D, for example, one embodiment of the present invention is not limited thereto. The metal oxide 533 may have a stacked-layer structure of two or more layers.

The insulator 555 serving as the gate insulating layer of the transistor 500A is provided to include regions positioned inside the openings 601 and 603 so as to cover the openings 601 and 603. The insulator 555 is provided over the metal oxide 533, the conductor 545, and the insulator 583. The insulator 555 can include a region in contact with the top and side surfaces of the metal oxide 533, the top and side surfaces of the conductor 545, and the top surface of the insulator 583. The insulator 555 has a shape along the top surface of the insulator 583, the top and side surfaces of the conductor 545, and the top and side surfaces of the metal oxide 533.

The conductor 565 serving as the gate electrode of the transistor 500A is provided over the insulator 555 and can include a region in contact with the top surface of the insulator 555. The conductor 565 includes a region overlapping with the metal oxide 533 with the insulator 555 provided therebetween. The conductor 565 has a shape along the top surface of the insulator 555.

For example, as illustrated in FIG. 49D, the conductor 565 includes a region overlapping with the metal oxide 533 with the insulator 555 provided therebetween in the openings 601 and 603. In the example in FIG. 49D, the conductor 565 includes a region overlapping with the conductors 544 and 545 with the insulator 555 and the metal oxide 533 provided therebetween. The conductor 565 covers the entire metal oxide 533. With such a structure, a gate electric field can be applied to the entire metal oxide 533, which allows the transistor 500A to have better electrical characteristics, such as higher on-state current.

The transistor 500A is a so-called top-gate transistor, in which the gate electrode is provided above the metal oxide 533. Furthermore, since a bottom surface of the metal oxide 533 includes a region in contact with the source electrode and the drain electrode, the transistor 500A can be referred to as a top-gate bottom-contact (TGBC) transistor.

The transistor 500A can be used as, for example, one or both of the transistor included in the pixel circuit PX and the transistor included in the driver circuit region DRV. The transistor 500A may be used as, for example, the transistor included in the driver circuit region DRV or the functional circuit region MFNC, such as the transistor included in the driver circuit SDR, the transistor included in the driver circuit GDR, or the transistor included in the power supply circuit EPS.

Figure 50A:
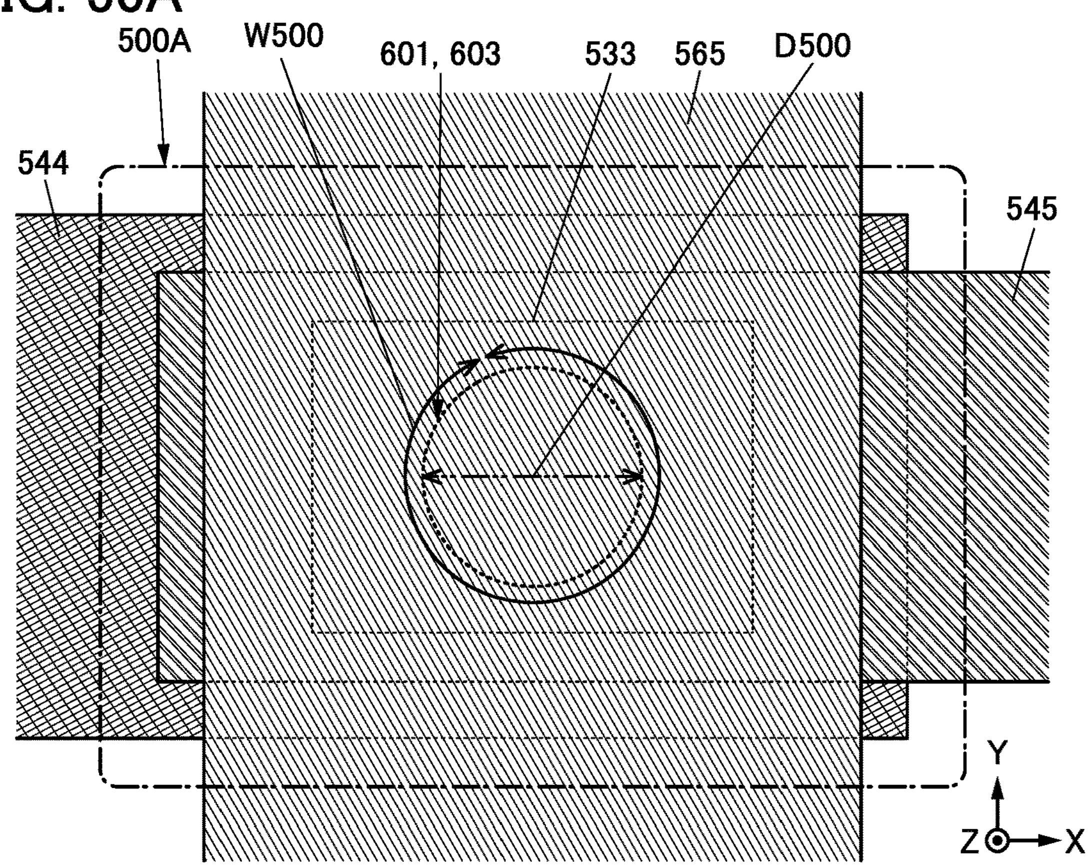
FIGS. 50A and 50B are a plan view and a cross-sectional view, respectively, showing a structure example of a transistor included in a semiconductor device.
Figure 50B:
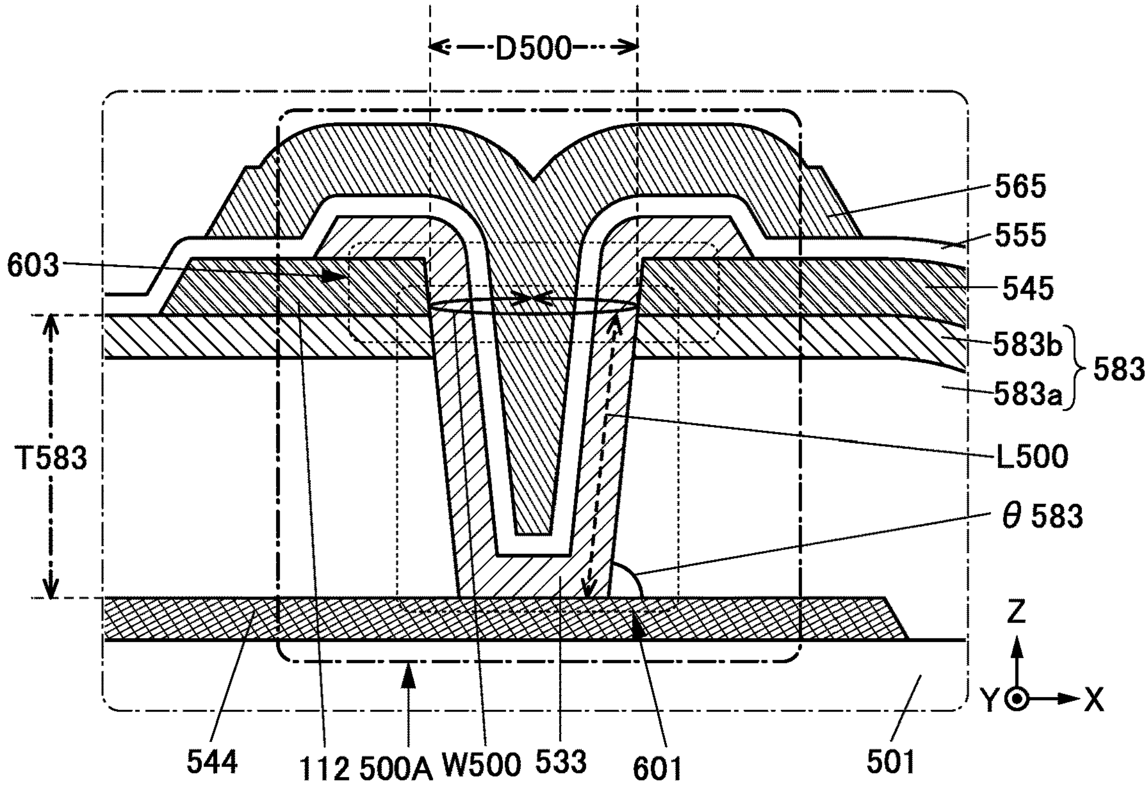

The channel length and channel width of the transistor 500A are described with reference to FIGS. 50A and 50B. FIG. 50A is an enlarged view of the plan view of FIG. 49A showing the structure example of the transistor 500A and the vicinity thereof. FIG. 50B is an enlarged view of the transistor 500A illustrated in FIG. 49D and the vicinity thereof.

In the metal oxide 533, a region in contact with the conductor 544 serves as one of a source region and a drain region, a region in contact with the conductor 545 serves as the other of the source region and the drain region, and a region between the source region and the drain region serves as a channel formation region.

The channel length of the transistor 500A is a distance between the source region and the drain region. In FIG. 50B, a channel length L500 of the transistor 500A is indicated by a dashed double-headed arrow. In the cross section, the channel length L500 is a distance between an end portion of the region where the metal oxide 533 is in contact with the conductor 544 and an end portion of the region where the metal oxide 533 is in contact with the conductor 545.

The channel length L500 of the transistor 500A corresponds to the length of the side surface of the insulator 583 on the opening 601 side when seen from the xz plane. That is, the channel length L500 is determined depending on a thickness T583 of the insulator 583 and an angle θ583 formed between the side surface of the insulator 583 on the opening 601 side and the formation surface of the insulator 583 (top surface of the conductor 544 here), and is not affected by the performance of a light-exposure apparatus used for manufacturing the transistor. Thus, the channel length L500 can be a smaller value than the resolution limit of the light-exposure apparatus and thus the transistor can be miniaturized. For example, the channel length L500 is preferably greater than or equal to 0.010 μm and less than 3.0 μm, further preferably greater than or equal to 0.050 μm and less than 3.0 μm, further preferably greater than or equal to 0.10 μm and less than 3.0 μm, further preferably greater than or equal to 0.15 μm and less than 3.0 μm, further preferably greater than or equal to 0.20 μm and less than 3.0 μm, further preferably greater than or equal to 0.20 μm and less than 2.5 μm, further preferably greater than or equal to 0.20 μm and less than 2.0 μm, further preferably greater than or equal to 0.20 μm and less than 1.5 μm, further preferably greater than or equal to 0.30 μm and less than 1.5 μm, further preferably greater than or equal to 0.30 μm and less than or equal to 1.2 μm, further preferably greater than or equal to 0.40 μm and less than or equal to 1.2 μm, further preferably greater than or equal to 0.40 μm and less than or equal to 1.0 μm, further preferably greater than or equal to 0.50 μm and less than or equal to 1.0 μm. In FIG. 50B, the thickness T583 of the insulator 583 is denoted by a dashed-dotted double-headed arrow.

When the transistor 500A is used as the transistor included in the pixel circuit PX in the display region DIS, the transistor included in the pixel circuit PX can be miniaturized, and the pixel circuit PX can be miniaturized. Thus, the display device DSP1C can have high resolution. The transistor 500A with a short channel length L500 can have a high on-state current. Thus, with the use of the transistor 500A as the transistor included in the display apparatus DSP1C, such as the transistor included in the pixel circuit PX, the display apparatus DSP1C can be driven at high speed.

The channel length L500 can be changed by adjustment of the thickness T583 of the insulator 583 and the angle θ583.

The thickness T583 of the insulator 583 is preferably greater than or equal to 0.010 μm and less than 3.0 μm, further preferably greater than or equal to 0.050 μm and less than 3.0 μm, further preferably greater than or equal to 0.10 μm and less than 3.0 μm, further preferably greater than or equal to 0.15 μm and less than 3.0 μm, further preferably greater than or equal to 0.20 μm and less than 3.0 μm, further preferably greater than or equal to 0.20 μm and less than 2.5 μm, further preferably greater than or equal to 0.20 μm and less than 2.0 μm, further preferably greater than or equal to 0.20 μm and less than 1.5 μm, further preferably greater than or equal to 0.30 μm and less than 1.5 μm, further preferably greater than or equal to 0.30 μm and less than or equal to 1.2 μm, further preferably greater than or equal to 0.40 μm and less than or equal to 1.2 μm, further preferably greater than or equal to 0.40 μm and less than or equal to 1.0 μm, further preferably greater than or equal to 0.50 μm and less than or equal to 1.0 μm.

The side surface of the insulator 583 on the opening 601 side preferably has a tapered shape. The angle θ583 formed by the side surface of the insulator 583 on the opening 601 side and the formation surface of the insulator 583 (the top surface of the conductor 544 here) is preferably less than 90°. By reducing the angle θ583, coverage with the layer (e.g., the metal oxide 533) over the insulator 583 can be improved. However, reducing the angle θ583 might reduce the contact area between the metal oxide 533 and the conductor 544 to increase the contact resistance between the metal oxide 533 and the conductor 544. The angle θ583 is preferably greater than or equal to 450 and less than 90°, further preferably greater than or equal to 500 and less than 90°, further preferably greater than or equal to 550 and less than 90°, further preferably greater than or equal to 600 and less than 90°, further preferably greater than or equal to 600 and less than or equal to 85°, further preferably greater than or equal to 650 and less than or equal to 85°, further preferably greater than or equal to 650 and less than or equal to 80°, further preferably greater than or equal to 700 and less than or equal to 80°. With the angle 0583 set in the above range, coverage with the layer (e.g., the metal oxide 533) over the conductor 544 and the insulator 583 can be improved, which can prevent defects such as step disconnection or a void from being generated in the layer. In addition, the contact resistance between the metal oxide 533 and the conductor 544 can be reduced.

In this specification and the like, step disconnection refers to a phenomenon in which a layer, a film, or an electrode is split because of the shape of the formation surface (e.g., a step).

Although FIG. 50B illustrate a structure in which the side surface of the insulator 583 on the opening 601 side is linear in the cross section, for example, one embodiment of the present invention is not limited thereto. In the cross section, the side surface of the insulator 583 on the opening 601 side may be curved or include both a linear region and a curved region.

The channel width of the transistor 500A is the width of the source region or the drain region in a direction perpendicular to the channel length direction. In other words, the channel width is the width of the region where the metal oxide 533 is in contact with the conductor 544 or the width of the region where the metal oxide 533 is in contact with the conductor 545 in the direction perpendicular to the channel length direction. Here, the channel width of the transistor 500A is described as the width of the region where the metal oxide 533 is in contact with the conductor 545 in the direction perpendicular to the channel length direction. In FIGS. 50A and 50B, a channel width W500 of the transistor 500A is indicated by a solid double-headed arrow. The channel width W500 is the length of the end portion of the bottom surface of the conductor 545 in the opening 603 in plan view.

The channel width W500 is determined depending on the planar shape of the opening 603. In FIGS. 50A and 50B, a width D500 of the opening 603 is denoted by a dashed double-dotted double-headed arrow. The width D500 is the shorter side of the smallest rectangle circumscribing the opening 603 in plan view. When the opening 603 is formed by a photolithography method, the width D500 of the opening 603 is greater than or equal to the resolution limit of the light-exposure apparatus. For example, the channel width W500 is preferably greater than or equal to 0.20 μm and less than 5.0 μm, further preferably greater than or equal to 0.20 μm and less than 4.5 μm, further preferably greater than or equal to 0.20 μm and less than 4.0 μm, further preferably greater than or equal to 0.20 μm and less than 3.5 μm, further preferably greater than or equal to 0.20 μm and less than 3.0 μm, further preferably greater than or equal to 0.20 μm and less than 2.5 μm, further preferably greater than or equal to 0.20 μm and less than 2.0 μm, further preferably greater than or equal to 0.20 μm and less than 1.5 μm, further preferably greater than or equal to 0.30 μm and less than 1.5 μm, further preferably greater than or equal to 0.30 μm and less than or equal to 1.2 μm, further preferably greater than or equal to 0.40 μm and less than or equal to 1.2 μm, further preferably greater than or equal to 0.40 μm and less than or equal to 1.0 μm, further preferably greater than or equal to 0.50 μm and less than or equal to 1.0 μm. Note that when the planar shape of the opening 603 is circular, the width D500 corresponds to the diameter of the opening 603, the channel width W500 can be equal to the length of the periphery of the opening 603 in plan view and calculated to be "D500×7."

Since the size of the transistor 500A is small, a display apparatus using the transistor 500A can achieve high resolution. Since the on-state current of the transistor 500A is high, a display apparatus using the transistor 500A can achieve high luminance. Since the operation speed of the transistor 500A is high, a display apparatus using the transistor 500A can achieve a high driving speed. Since the on-state current of the transistor 500A is high, a display apparatus using the transistor 500A can achieve high luminance. Since the off-state current of the transistor 500A is low, a display apparatus using the transistor 500A can achieve low power consumption.

Cross-Sectional Structure Example 4 of Display Apparatus

Figure 51:
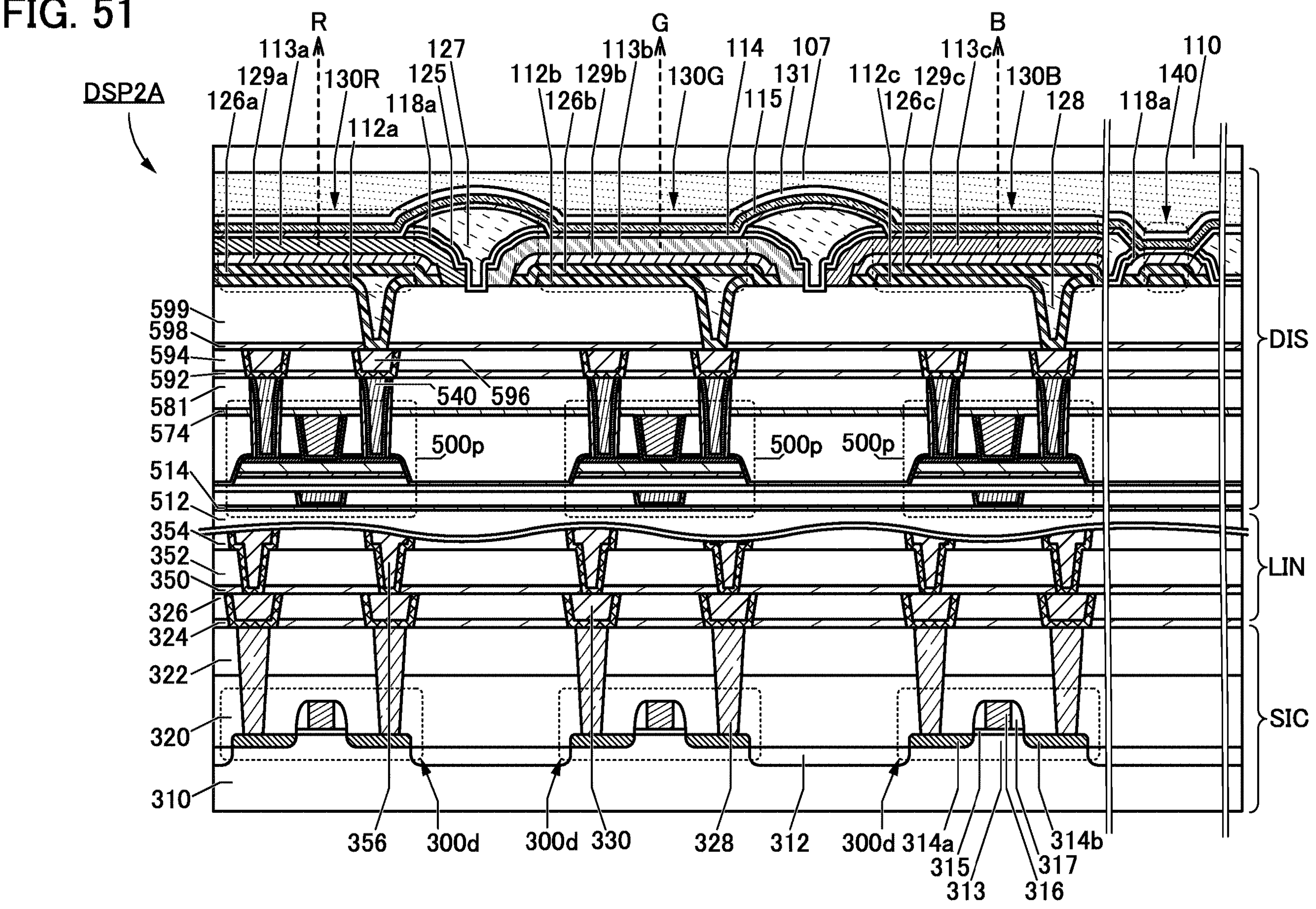
FIG. 51 is a schematic cross-sectional view showing a structure example of a display apparatus.

The display apparatus DSP2A in FIG. 51 is a cross-sectional structure example of the display apparatus DSP2 in FIG. 41B. The display apparatus DSP2A has a structure provided with a pixel circuit, a driver circuit, and the like over a substrate 310. Note that in FIG. 51 of the display apparatus DSP2A, not only the circuit region SIC and the display region DIS illustrated in FIG. 41B but also a wiring region LIN are illustrated.

For example, the circuit region SIC includes the substrate 310 on which a transistor 300*d* is formed. Above the transistor 300*d* is provided the wiring region LIN that includes wirings that electrically connect the transistor 300*d*, a transistor 500*p*, and light-emitting devices 130R, 130G, and 130B. Above the wiring region LIN is provided the display region DIS that includes, for example, the transistor 500Ap and a light-emitting device 130 (the light-emitting devices 130R, 130G, and 130B in FIG. 52).

The transistor 300*d* can be a transistor included in the circuit region SIC. The transistor 500*p* can be a transistor included in the pixel circuit PX. The light-emitting device 130 can be a light-emitting device included in the pixel circuit PX.

For the light-emitting devices 130 (the light-emitting devices 130R, 130G, and 130B in FIG. 51) above the transistor 500*p*, the description of the light-emitting devices 130 in FIG. 43 can be referred to.

As the substrate 310, a substrate that can be used as the substrate BS can be used, for example. In the description of this embodiment, the substrate 310 is a semiconductor substrate containing silicon as a material. Therefore, a transistor included in the circuit region SIC can be a transistor including silicon in a channel formation region.

For the screen ratio (aspect ratio) of the display apparatus DSP2A, the description of the screen ratio of the display apparatus DSP1 can be referred to. For the diagonal size of the display apparatus DSP2A, the description of the diagonal size of the display apparatus DSP1 can be referred to.

For the transistor 300*d*, the description of the transistor 300 of the display apparatus DSP1A in FIG. 43 can be referred to.

In the display apparatus DSP2A, the wiring region LIN is provided over the transistor 300*d*. The wiring region LIN includes, for example, the insulators 324, 326, 350, 352, and 354 and the conductors 330 and 356.

For example, over the insulators 322 and 328, the insulators 324 and 326 are stacked in this order. An opening is formed in the insulators 324 and 326 in each of a region overlapping with the conductor 328. In addition, the conductor 330 is embedded in the opening.

Over the insulator 326 and the conductor 330, the insulators 350, 352, and 354 are stacked in this order. An opening is formed in the conductor 330 and the insulators 350, 352, and 354 are stacked in this order in each of a region overlapping with the conductor 330. The conductor 356 is embedded in the opening.

The conductors 330 and 356 serve as a plug or a wiring that is connected to the transistor 300*d*. Note that the conductors 330 and 356 can be formed using a material similar to that for the conductors 328 and 596.

Note that for example, the insulators 324 and 350 are preferably formed using an insulator having a barrier property against at least one of hydrogen, oxygen, and water, like the insulator 592. The insulators 326, 352, and 354 are preferably formed using an insulator having a relatively low dielectric constant to reduce the parasitic capacitance generated between wirings, like the insulator 594. The insulators 326, 352, and 354 have functions of an interlayer insulating film and a planarization film. Furthermore, the insulators 326, 352, and 354 preferably include an insulator having a barrier property against at least one of hydrogen, oxygen, and water.

A conductor having a barrier property against hydrogen is preferably used for the conductors 330 and 356, and tantalum nitride given above is preferably used as the conductor, for example. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

An insulator 512 is provided above the insulator 354 and the conductor 356. An insulator 514 is provided over the insulator 512, and the transistor 500*p* is provided over the insulator 514. An insulator 574 is formed over the transistor 500*p*, and an insulator 581 is formed over the insulator 574.

For the transistor 500*p*, an insulator in the vicinity of the transistor 500*p*, and the like, the description of the transistor 500 of the display apparatus DSP1B in FIG. 45 can be referred to.

Figure 52:
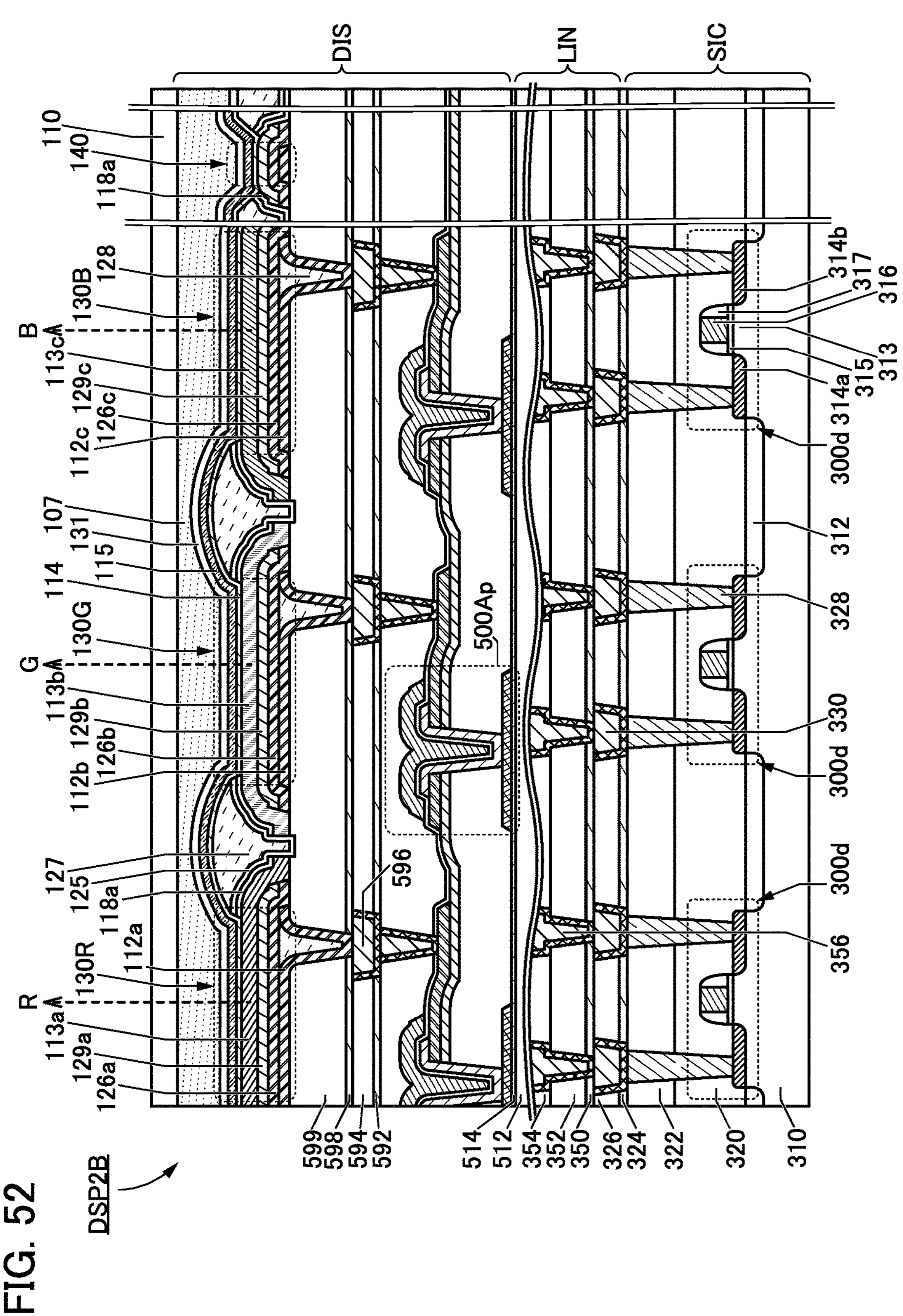
FIG. 52 is a schematic cross-sectional view showing a structure example of a display apparatus.

The transistor 500*p* in the display apparatus DSP2A in FIG. 51 may have the structure of the transistor 500A of the display apparatus DSP1C illustrated in FIG. 48. The display apparatus DSP2B in FIG. 52 is a modification example of the display apparatus DSP2A in FIG. 51, and the transistor 500*p* has the structure of the transistor 500A of the display apparatus DSP1C in FIG. 48.

When the above structure example is applied to a display apparatus, the display apparatus can achieve high resolution and high definition. Specifically, for example, a display apparatus with a resolution of HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320) can be achieved in some cases. Furthermore, specifically, for example, a display apparatus with a definition greater than or equal to 100 ppi, greater than or equal to 300 ppi, greater than or equal to 500 ppi, greater than or equal to 1000 ppi, greater than or equal to 2000 ppi, greater than or equal to 3000 ppi, greater than or equal to 5000 ppi, or greater than or equal to 6000 ppi can be achieved in some cases.

Note that this embodiment can be combined with any of the other embodiments in this specification as appropriate. For example, the configurations, structures, methods, and the like described in this embodiment can be used in an appropriate combination with any of the configurations, structures, methods, and the like described in the other embodiments and the like.

Embodiment 4

In this embodiment, electronic devices each including a display apparatus fabricated using one embodiment of the present invention will be described. Electronic devices described in this embodiment as examples are each provided with a display apparatus of one embodiment of the present invention in a display portion. Thus, the electronic devices achieve high definition.

One embodiment of the present invention includes the display apparatus and one or more selected from an antenna, a battery, a housing, a camera, a speaker, a microphone, a touch sensor, and an operation button.

The electronic device of one embodiment of the present invention may include a secondary battery. It is preferable that the secondary battery be capable of being charged by non-contact power transmission.

Examples of the secondary battery include a lithium ion secondary battery (such as a lithium polymer battery using a gel electrolyte (lithium ion polymer battery)), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, or the like on a display portion. When the electronic device includes an antenna and a secondary battery, the antenna may be used for contactless power transmission.

The display portion of the electronic device of one embodiment of the present invention can display, for example, an image with full high definition, 4K2K, 8K4K, 16K8K, or higher resolution.

As examples of the electronic device, electronic devices having a relatively large screen, such as a television device, a laptop personal computer, a monitor device, digital signage, a pachinko machine, and a game machine are given. In addition, as the electronic device, such as a digital camera, a digital video camera, a digital photo frame, a mobile phone device, a portable game machine, a portable information terminal, and an audio reproducing device are given.

An electronic device to which one embodiment of the present invention is applied can be incorporated along an inner wall or an outer wall of a house or a building. The electronic device can be incorporated along a flat surface or a curved surface of an interior or an exterior of an automobile or the like.

[Mobile Phone]

Figures 53A, 53B, 53C, 53D, 53E, 53F, 53G, 53H, 53I:
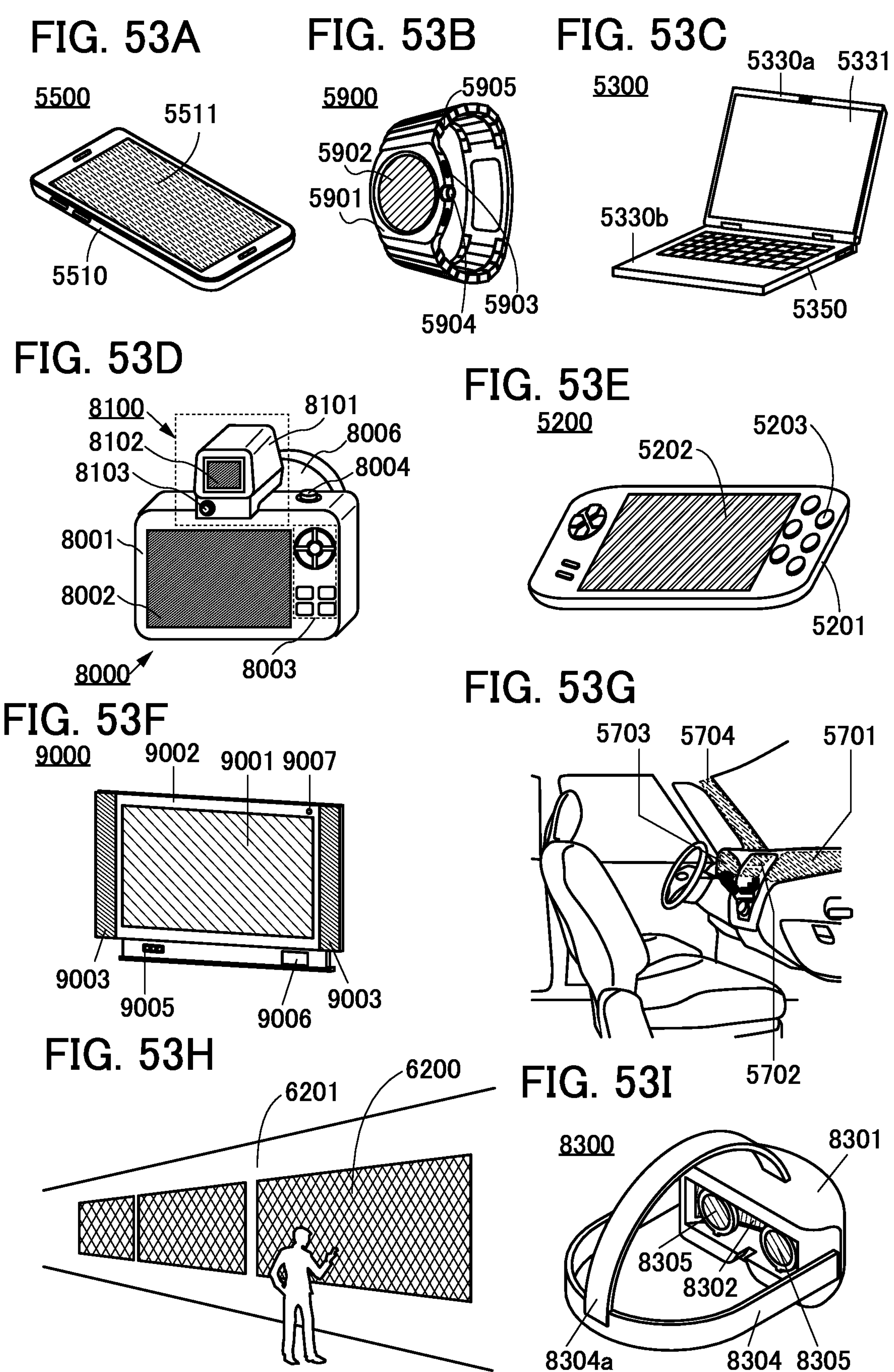
FIGS. 53A to 53I are perspective views showing examples of electronic devices.

An information terminal 5500 illustrated in FIG. 53A is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

[Wearable Terminal]

FIG. 53B is an external view of an information terminal 5900 as an example of a wearable terminal. The information terminal 5900 includes a housing 5901, a display portion 5902, an operation button 5903, a crown 5904, and a band 5905.

[Information Terminal]

FIG. 53C illustrates a notebook information terminal 5300. The notebook information terminal 5300 in FIG. 53C includes, for example, a display portion 5331 in a housing 5330*a* and a keyboard portion 5350 in a housing 5330*b*.

Note that although FIGS. 53A to 53C illustrate a smartphone, a wearable terminal, and a notebook information terminal as examples of electronic device, one embodiment of the present invention can also be applied to an information terminal other than a smartphone, a wearable terminal, and a notebook information terminal. Examples of the information terminals other than a smartphone, a wearable terminal, and a notebook information terminal include a personal digital assistant (PDA), a desktop information terminal, and a workstation.

[Camera]

FIG. 53D is an external view of a camera 8000 to which a finder 8100 is attached. The camera 8000 includes a housing 8001, a display portion 8002, operation buttons 8003, and a shutter button 8004. Furthermore, a detachable lens 8006 is attached to the camera 8000. The finder 8100 includes a housing 8101, a display portion 8102, and a button 8103.

Note that the lens 8006 may be included in the housing of the camera 8000.

Images can be taken with the camera 8000 at the press of the shutter button 8004 or the touch of the display portion 8002 serving as a touch panel.

The housing 8001 includes a mount including an electrode, so that a stroboscope, for example, as well as the finder 8100 can be connected to the housing.

The housing 8101 is attached to the camera 8000 by a mount for engagement with the mount of the camera 8000. The finder 8100 can display an image received from the camera 8000 on the display portion 8102.

The button 8103 functions as a power supply button.

The display apparatus of one embodiment of the present invention can be used in the display portion 8002 of the camera 8000 and the display portion 8102 of the finder 8100. Note that a finder may be incorporated in the camera 8000.

[Game Machine]

FIG. 53E is an external view of a portable game machine 5200 as an example of a game machine. The portable game machine 5200 includes a housing 5201, a display portion 5202, and a button 5203.

An image displayed on the portable game machine 5200 can be output with a display apparatus included in a television device, a personal computer display, a game display, or a head-mounted display.

The portable game machine 5200 can have low power consumption by including the display apparatus described in the above embodiment. Furthermore, heat generation from a circuit can be reduced owing to low power consumption; thus, the influence of heat generation on the circuit, the peripheral circuit, and the module can be reduced.

Although FIG. 53E illustrates the portable game machine as an example of a game machine, the electronic device of one embodiment of the present invention is not limited thereto. Examples of the electronic device of one embodiment of the present invention include a stationary game machine, an arcade game machine installed in an entertainment facility (e.g., a game center or an amusement park), and a throwing machine for batting practice installed in sports facilities.

[Television Device]

FIG. 53F is a perspective view illustrating a television device. The television device 9000 includes a housing 9002, a display portion 9001, a speaker 9003, an operation key 9005 (including a power switch or an operation switch), a connection terminal 9006, a sensor 9007 (a sensor having a function of measuring or detecting force, displacement, position, speed, acceleration, angular velocity, rotational frequency, distance, light (including infrared rays), liquid, magnetism, temperature, chemical substance, sound, time, hardness, electric field, current, voltage, power, radiation, flow rate, humidity, gradient, oscillation, odor, or light (including visible light, invisible light such as infrared rays or ultraviolet rays)). The display apparatus of one embodiment of the present invention can be provided in the television device. The television device can include the display portion 9001 having a screen size of, for example, 50 inches or more, or 100 inches or more.

The television device 9000 to which the display apparatus described in the above embodiment is applied achieves low power consumption. Furthermore, heat generation from a circuit can be reduced owing to low power consumption; thus, the influence of heat generation on the circuit, the peripheral circuit, and the module can be reduced.

[Moving Vehicle]

The display apparatus of one embodiment of the present invention can be used around a driver's seat in a car, which is a moving vehicle.

FIG. 53G illustrates a windshield and its vicinity inside a car. FIG. 53G shows a display panel 5701, a display panel 5702, and a display panel 5703 which are attached to a dashboard, and a display panel 5704 attached to a pillar.

The display panels 5701 to 5703 can provide various kinds of information by displaying navigation data, a speedometer, a tachometer, a mileage, a fuel meter, a gearshift state, air-conditioning settings, and the like. Items displayed on the display panel and their layout can be changed as appropriate to suit the user's preferences, resulting in more sophisticated design. The display panels 5701 to 5703 can also be used as lighting devices.

The display panel 5704 can compensate for the view obstructed by the pillar (blind areas) by showing an image taken by an imaging unit provided for the car body. That is, displaying an image taken by the imaging unit provided on the outside of the car body leads to elimination of blind areas and enhancement of safety. Moreover, showing an image to compensate for the area that a driver cannot see makes it possible for the driver to confirm safety more easily and comfortably. The display panel 5704 can also be used as a lighting device.

The display apparatus of one embodiment of the present invention can be used for the display panels 5701 to 5704, for example.

Although a car is described above as an example of a moving vehicle, moving vehicles are not limited to a car. Examples of the moving vehicles include a train, a monorail train, a ship, and a flying object (a helicopter, an unmanned aircraft (a drone), an airplane, and a rocket), and these moving vehicles can use the display apparatus of one embodiment of the present invention.

[Digital Signage]

FIG. 53H illustrates an example of a digital signage that can be attached to a wall. FIG. 53H illustrates a state where a digital signage 6200 is attached to a wall 6201. The display apparatus of one embodiment of the present invention can be used in a display portion in the digital signage 6200, for example. An interface such as a touch panel may be provided in the digital signage 6200.

Note that an electronic device attachable to a wall is described above as an example of a digital signage, the kind of the digital signage is not limited thereto. Examples of the digital signage include a digital signage mounted on a pillar, a freestanding digital signage placed on the ground, and a digital signage mounted on a rooftop or a side wall of a building.

[Head-Mounted Display]

FIG. 53I is an external view of an electronic device 8300 which is a head-mounted display. The electronic device 8300 includes the housing 8301, a display portion 8302, a band-like fixing member 8304, a fixture member 8304*a* worn on a head, and a pair of lenses 8305.

Although not illustrated in FIG. 53I, the electronic device 8300 may include an interface such as an operation button or a power button.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax can be performed. Note that the number of the display portions 8302 is not limited to one; two display portions 8302 may be provided for user's respective eyes.

As the display portion 8302, a display apparatus with high definition is preferably used, for example. With use of a display apparatus with extremely high definition for the display portion 8302, even when the display portion 8302 is enlarged by the lens 8305, a more realistic image can be displayed without user's visual recognition of pixels.

The head-mounted display, which is an electronic device of one embodiment of the present invention, may be an electronic device which is a glasses-type head-mounted display, instead of the electronic device 8300 in FIG. 53I, which is a goggle-type head-mounted display.

Note that this embodiment can be combined with any of the other embodiments in this specification as appropriate. The configurations, structures, methods, and the like described in this embodiment can be used in an appropriate combination with any of the configurations, structures, methods, and the like described in the other embodiments and the like.

This application is based on Japanese Patent Application Serial No. 2022-113595 filed with Japan Patent Office on Jul. 15, 2022, and Japanese Patent Application Serial No. 2023-064030 filed with Japan Patent Office on Apr. 11, 2023, the entire contents of which are hereby incorporated by reference.

What is claimed is:

1. A semiconductor device comprising:
a first transistor;
a second transistor;
a third transistor; and
a first capacitor,
wherein one of a source and a drain of the third transistor is directly connected to a gate of the second transistor,
wherein the other of the source and the drain of the third transistor is directly connected to a gate of the first transistor and a first terminal of the first capacitor,
wherein one of a source and a drain of the first transistor is directly connected to one of a source and a drain of the second transistor, and
wherein the other of the source and the drain of the first transistor is directly connected to the other of the source and the drain of the second transistor and a second terminal of the first capacitor.

2. The semiconductor device according to claim 1, further comprising a fifth transistor,
wherein one of a source and a drain of the fifth transistor is electrically connected to the other of the source and the drain of the first transistor.

3. The semiconductor device according to claim 2, further comprising:
a sixth transistor;
a seventh transistor;
an eighth transistor; and
a second capacitor,
wherein one of a source and a drain of the eighth transistor is directly connected to a gate of the sixth transistor and a first terminal of the second capacitor,
wherein a gate of the seventh transistor is directly connected to the other of the source and the drain of the first transistor, and
wherein one of a source and a drain of the sixth transistor is directly connected to one of a source and a drain of the seventh transistor and a second terminal of the second capacitor.

4. The semiconductor device according to claim 2, further comprising:
a sixth transistor;
a seventh transistor;
an eighth transistor; and
a second capacitor, wherein one of a source and a drain of the eighth transistor is directly connected to a gate of the sixth transistor and a first terminal of the second capacitor, wherein the other of the source and the drain of the eighth transistor is directly connected to the other of the source and the drain of the first transistor, wherein one of a source and a drain of the sixth transistor is directly connected to one of a source and a drain of the seventh transistor and a second terminal of the second capacitor, and wherein a gate of the seventh transistor is directly connected to a gate of the fifth transistor.

5. The semiconductor device according to claim 4, further comprising a ninth transistor, wherein a gate of the ninth transistor is directly connected to the one of the source and the drain of the first transistor, wherein one of a source and a drain of the ninth transistor is directly connected to the other of the source and the drain of the sixth transistor, and wherein the other of the source and the drain of the ninth transistor is directly connected to the one of the source and the drain of the sixth transistor.

6. A display apparatus comprising:

a driver circuit; and a display device, wherein the driver circuit comprises the semiconductor device according to claim 1, and wherein the driver circuit is configured to transmit a signal for image display to the display device.

7. The display apparatus according to claim 6, wherein the display device comprises one of a light-emitting device and a liquid crystal display device.

8. An electronic device comprising:

the display apparatus according to claim 7; and a housing.

9. A semiconductor device comprising:

a first transistor;

a second transistor;

a third transistor;

a fourth transistor; and a first capacitor, wherein one of a source and a drain of the third transistor is directly connected to a gate of the second transistor and a gate of the third transistor, wherein the other of the source and the drain of the third transistor is directly connected to a gate of the first transistor, one of a source and a drain of the fourth transistor, and a first terminal of the first capacitor, wherein one of a source and a drain of the first transistor is directly connected to one of a source and a drain of the second transistor, and wherein the other of the source and the drain of the first transistor is directly connected to the other of the source and the drain of the second transistor and a second terminal of the first capacitor.

10. The semiconductor device according to claim 9, further comprising a fifth transistor, wherein one of a source and a drain of the fifth transistor is electrically connected to the other of the source and the drain of the first transistor.

11. The semiconductor device according to claim 10, further comprising:

a sixth transistor;

a seventh transistor;

an eighth transistor; and a second capacitor, wherein one of a source and a drain of the eighth transistor is directly connected to a gate of the sixth transistor and a first terminal of the second capacitor, wherein a gate of the seventh transistor is directly connected to the other of the source and the drain of the first transistor, and wherein one of a source and a drain of the sixth transistor is directly connected to one of a source and a drain of the seventh transistor and a second terminal of the second capacitor.

12. The semiconductor device according to claim 10, further comprising:

a sixth transistor;

a seventh transistor;

an eighth transistor; and a second capacitor, wherein one of a source and a drain of the eighth transistor is directly connected to a gate of the sixth transistor and a first terminal of the second capacitor, wherein the other of the source and the drain of the eighth transistor is directly connected to the other of the source and the drain of the first transistor, wherein one of a source and a drain of the sixth transistor is directly connected to one of a source and a drain of the seventh transistor and a second terminal of the second capacitor, and wherein a gate of the seventh transistor is directly connected to a gate of the fifth transistor.

13. The semiconductor device according to claim 12, further comprising a ninth transistor, wherein a gate of the ninth transistor is electrically connected to the one of the source and the drain of the first transistor, wherein one of a source and a drain of the ninth transistor is electrically connected to the other of the source and the drain of the sixth transistor, and wherein the other of the source and the drain of the ninth transistor is electrically connected to the one of the source and the drain of the sixth transistor.

14. A display apparatus comprising:

a driver circuit; and a display device, wherein the driver circuit comprises the semiconductor device according to claim 9, and wherein the driver circuit is configured to transmit a signal for image display to the display device.

15. The display apparatus according to claim 14, wherein the display device comprises one of a light-emitting device and a liquid crystal display device.

16. An electronic device comprising:

the display apparatus according to claim 15; and a housing.

17. A semiconductor device comprising:

a first transistor;

a second transistor;

a third transistor;

a fourth transistor; and a first capacitor, wherein a gate of the third transistor is directly connected to a gate of the second transistor, wherein one of a source and a drain of the third transistor is directly connected to a gate of the first transistor, one of a source and a drain of the fourth transistor, and a first terminal of the first capacitor, wherein one of a source and a drain of the first transistor is directly connected to one of a source and a drain of the second transistor, and wherein the other of the source and the drain of the first transistor is directly connected to the other of the source and the drain of the second transistor and a second terminal of the first capacitor.

18. The semiconductor device according to claim 17, further comprising a fifth transistor, wherein one of a source and a drain of the fifth transistor is electrically connected to the other of the source and the drain of the first transistor.

19. The semiconductor device according to claim 18, further comprising:

a sixth transistor;

a seventh transistor;

an eighth transistor; and a second capacitor, wherein one of a source and a drain of the eighth transistor is directly connected to a gate of the sixth transistor and a first terminal of the second capacitor, wherein a gate of the seventh transistor is directly connected to the other of the source and the drain of the first transistor, and wherein one of a source and a drain of the sixth transistor is directly connected to one of a source and a drain of the seventh transistor and a second terminal of the second capacitor.

20. The semiconductor device according to claim 18, further comprising:

a sixth transistor;

a seventh transistor;

an eighth transistor; and a second capacitor, wherein one of a source and a drain of the eighth transistor is directly connected to a gate of the sixth transistor and a first terminal of the second capacitor, wherein the other of the source and the drain of the eighth transistor is directly connected to the other of the source and the drain of the first transistor, wherein one of a source and a drain of the sixth transistor is directly connected to one of a source and a drain of the seventh transistor and a second terminal of the second capacitor, and wherein a gate of the seventh transistor is directly connected to a gate of the fifth transistor.

21. The semiconductor device according to claim 20, further comprising a ninth transistor, wherein a gate of the ninth transistor is electrically connected to the one of the source and the drain of the first transistor, wherein one of a source and a drain of the ninth transistor is electrically connected to the other of the source and the drain of the sixth transistor, and wherein the other of the source and the drain of the ninth transistor is electrically connected to the one of the source and the drain of the sixth transistor.

22. A display apparatus comprising:

a driver circuit; and a display device, wherein the driver circuit comprises the semiconductor device according to claim 17, and wherein the driver circuit is configured to transmit a signal for image display to the display device.

23. The display apparatus according to claim 22, wherein the display device comprises one of a light-emitting device and a liquid crystal display device.

24. An electronic device comprising:

the display apparatus according to claim 23; and a housing.

* * * * *